US011201300B2

(12) United States Patent
Kim et al.

(10) Patent No.: US 11,201,300 B2
(45) Date of Patent: Dec. 14, 2021

(54) CONDENSED CYCLIC COMPOUND AND ORGANIC LIGHT-EMITTING DEVICE INCLUDING CONDENSED CYCLIC COMPOUND

(71) Applicants: Samsung Electronics Co., Ltd., Suwon-si (KR); Samsung SDI Co., Ltd., Yongin-si (KR)

(72) Inventors: Sangmo Kim, Hwaseong-si (KR); Eunsuk Kwon, Suwon-si (KR); Jongsoo Kim, Seoul (KR); Jhunmo Son, Yongin-si (KR); Dongseon Lee, Suwon-si (KR); Soonok Jeon, Suwon-si (KR); Yeonsook Chung, Seoul (KR); Yongsik Jung, Yongin-si (KR)

(73) Assignees: SAMSUNG ELECTRONICS CO., LTD., Gyeonggi-do (KR); SAMSUNG SDI CO., LTD., Gyeonggi-do (KR)

( * ) Notice: Subject to any disclaimer, the term of this patent is extended or adjusted under 35 U.S.C. 154(b) by 300 days.

(21) Appl. No.: 16/299,549

(22) Filed: Mar. 12, 2019

(65) Prior Publication Data

US 2020/0044168 A1 Feb. 6, 2020

(30) Foreign Application Priority Data

Jul. 31, 2018 (KR) .................. KR10-2018-0089505

(51) Int. Cl.

*H01L 51/00* (2006.01)
*C07F 7/08* (2006.01)
*H01L 51/50* (2006.01)

(52) U.S. Cl.

CPC ........ *H01L 51/0094* (2013.01); *C07F 7/0812* (2013.01); *H01L 51/5016* (2013.01);
(Continued)

(58) Field of Classification Search

None
See application file for complete search history.

(56) References Cited

U.S. PATENT DOCUMENTS 9,184,399 B2 11/2015 Dyatkin et al.
2006/0177691 A1 8/2006 Tai et al.
(Continued)

FOREIGN PATENT DOCUMENTS

JP 2011140475 A * 7/2011 ................ C07F 7/10
JP 2013093432 A * 5/2013 ............ H01L 51/50
(Continued)

OTHER PUBLICATIONS

Machine translation of WO-2016043394, translation generated Feb. 2021, 43 pages. (Year: 2021).*
(Continued)

*Primary Examiner* — Robert S Loewe
(74) *Attorney, Agent, or Firm* — Cantor Colburn LLP

(57) ABSTRACT

A condensed cyclic compound represented by Formula 1:

Formula 1

(Continued)

wherein, in Formula 1, groups and variables are the same as described in the specification.

20 Claims, 1 Drawing Sheet

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5096* (2013.01)

(56) References Cited

U.S. PATENT DOCUMENTS

| | | | | |
|---|---|---|---|---|
| 2012/0214269 | A1* | 8/2012 | Harding | C07F 7/0812 438/46 |
| 2012/0298966 | A1* | 11/2012 | Zeng | H01L 51/0073 257/40 |
| 2015/0171353 | A1* | 6/2015 | Jeong | H01L 51/0094 257/40 |
| 2015/0221882 | A1* | 8/2015 | Ueno | C07F 7/081 257/40 |
| 2016/0028030 | A1* | 1/2016 | Jung | C07F 7/0816 257/40 |
| 2016/0276604 | A1* | 9/2016 | Kwong | H01L 51/0074 |
| 2017/0170408 | A1* | 6/2017 | Park | H01L 51/0058 |
| 2017/0207396 | A1* | 7/2017 | Park | H01L 51/0067 |
| 2017/0237023 | A1 | 8/2017 | Kim et al. | |
| 2017/0279056 | A1* | 9/2017 | Kim | H01L 51/0077 |
| 2018/0123049 | A1* | 5/2018 | Lee | C07D 403/10 |
| 2018/0294421 | A1* | 10/2018 | Wolohan | C09K 11/06 |

FOREIGN PATENT DOCUMENTS

| | | | | |
|---|---|---|---|---|
| KR | 10-2007-0106082 | A | 11/2007 | |
| KR | 10-2010-0118700 | A | 11/2010 | |
| KR | 10-2013-0124217 | A | 11/2013 | |
| KR | 10-2014-0145452 | A | 12/2014 | |
| KR | 10-2017-0094652 | A | 8/2017 | |
| WO | 2010-126234 | A1 | 11/2010 | |
| WO | WO-2010126234 | A1 * | 11/2010 | C09K 11/06 |
| WO | WO-2016043394 | A1 * | 3/2016 | C09K 11/06 |

OTHER PUBLICATIONS

Hiroshi Fujimoto et al. "Influence of material impurities in the hole-blocking layer on the lifetime of organic light-emitting diodes", Appl. Phys. Lett. 109, 243302 (2016), 5 pp.

Ming-Kuan YAN et al. "Computational design and selection of optimal building blocks and linking topologies for construction of high-performance host materials", RSC Advances, 2012, 2, 7860-7867.

* cited by examiner

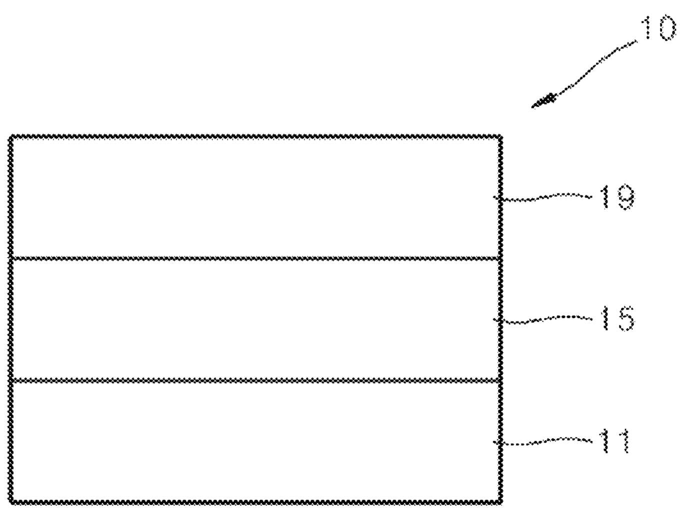
10
19
15
11

CONDENSED CYCLIC COMPOUND AND ORGANIC LIGHT-EMITTING DEVICE INCLUDING CONDENSED CYCLIC COMPOUND

CROSS-REFERENCE TO RELATED APPLICATION

This application claims priority to Korean Patent Application No. 10-2018-0089505, filed on Jul. 31, 2018, in the Korean Intellectual Property Office, and all the benefits accruing therefrom under 35 U.S.C. § 119, the content of which is incorporated herein in its entirety by reference.

BACKGROUND

1. Field

The present disclosure relates to a condensed cyclic compound and an organic light-emitting device including the condensed cyclic compound.

2. Description of the Related Art

Organic light-emitting devices (OLEDs) are self-emission devices which have wide viewing angles, high contrast ratios, short response times, and excellent brightness, driving voltage, and response speed characteristics, and which produce full-color images.

OLEDs include an anode, a cathode, and an organic layer between the anode and the cathode and including an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

Various types of organic light emitting devices are known. However, there still remains a need in OLEDs having low driving voltage, high efficiency, high brightness, and long lifespan.

SUMMARY

Provided are a condensed cyclic compound and an organic light-emitting device including the condensed cyclic compound.

Additional aspects will be set forth in part in the description which follows and, in part, will be apparent from the description, or may be learned by practice of the presented embodiments.

According to an aspect of an embodiment, a condensed cyclic compound may be represented by Formula 1:

Formula 1

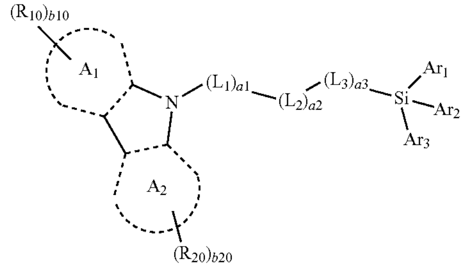

-continued

Formula 2

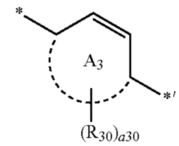

Formula 3

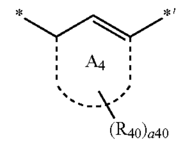

Formula 4

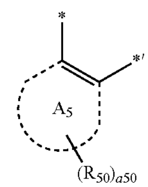

wherein in Formulae 1 to 4, $Ar_1$ to $Ar_3$ may each independently be $-(L_4)_{a4}-(R_{60})_{a60}$, $L_1$ to $L_4$ may each independently be a group represented by one selected from Formulae 2 to 4, a1 and a3 may each independently be an integer from 1 to 3, a2 and a4 may each independently be an integer from 0 to 3, rings $A_1$ to $A_5$ may each independently be a $C_5$-$C_{60}$ carbocyclic group or a $C_2$-$C_{60}$ heterocyclic group, $R_{10}$, $R_{20}$, $R_{30}$, $R_{40}$, $R_{50}$, and $R_{60}$ may each independently be selected from hydrogen, deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_1)(Q_2)(Q_3)$, $-N(Q_4)(Q_5)$, and $-B(Q_6)(Q_7)$, wherein at least one selected from $R_{10}$, $R_{20}$, $R_{30}$, $R_{40}$, $R_{50}$, and $R_{60}$ may be a cyano group, b10, b20, b30, b40, b50, and b60 may each independently be an integer from 1 to 10, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{11})(Q_{12})(Q_{13})$, $—N(Q_{14})(Q_{15})$, and $—B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{21})(Q_{22})(Q_{23})$, $—N(Q_{24})(Q_{25})$, and $—B(Q_{26})(Q_{27})$; and $—Si(Q_{31})(Q_{32})(Q_{33})$, $—N(Q_{34})(Q_{35})$, and $—B(Q_{36})(Q_{37})$, wherein $Q_1$ to $Q_7$, $Q_{11}$ to $Q_{17}$, $Q_{21}$ to $Q_{27}$, and $Q_{31}$ to 037 may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

According to an aspect of another embodiment, an organic light-emitting device may include:

a first electrode;

a second electrode; and an organic layer disposed between the first electrode and the second electrode, wherein the organic layer includes an emission layer and at least one condensed cyclic compound represented by Formula 1.

BRIEF DESCRIPTION OF THE DRAWINGS

These and/or other aspects will become apparent and more readily appreciated from the following description of the embodiments, taken in conjunction with the FIGURE which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, a condensed cyclic compound is provided. The condensed cyclic compound may be represented by Formula 1:

Formula 1

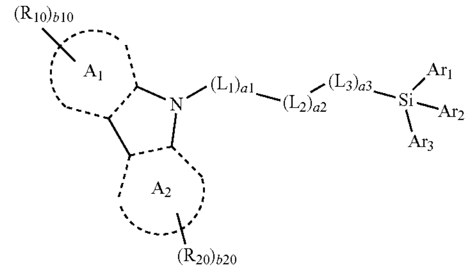

In Formula 1, $Ar_1$ to $Ar_3$ may each independently be $-(L_4)_{a4}-(R_{60})_{a60}$. $L_4$, a4, $R_{60}$, and a60 are described below.

In Formula 1, $L_1$ to $L_4$ may each independently be a group represented by one selected from Formulae 2 to 4, Formula 2

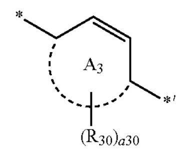

Formula 3

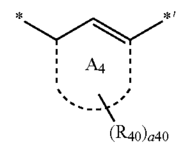

Formula 4

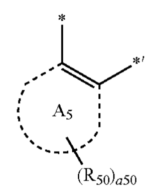

In Formula 1, a1 and a3 may respectively indicate the number of $L_1$ and $L_3$. a1 and a3 may each independently be an integer from 1 to 3. When a1 is 2 or greater, at least two groups $L_1$ may be identical to different from each other. When a3 is 2 or greater, at least two groups $L_3$ may be identical to different from each other.

In some embodiments, a1 and a3 may each be 1.

In Formula 1, a2 and a4 may each respectively the number of $L_2$ and $L_4$. a2 and a4 may each independently be an integer from 0 to 3. When a2 is 2 or greater, at least two groups $L_2$ may be identical to different from each other. When a4 is 2 or greater, at least two groups $L_4$ may be identical to different from each other.

In some embodiments, a2 may be 0, 1, or 2.

In some embodiments, a4 may be 1, 2, or 3.

In Formulae 1 to 4, rings $A_1$ to $A_5$ may each independently be a $C_5$-$C_{60}$ carbocyclic group or a $C_2$-$C_{60}$ heterocyclic group.

In some embodiments, rings $A_1$ to $A_5$ may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In some embodiments, rings $A_1$ and $A_2$ may each independently be selected from a benzene group, a naphthalene group, a fluorene group, a pyridine group, a pyrazine group, a pyrimidine group, a pyridazine group, a carbazole group, a triazine group, a dibenzofuran group, and a dibenzothiophene group.

In some embodiments, rings $A_3$ to $A_5$ may each be a benzene group.

In some embodiments, $L_1$ to $L_3$ may each independently be a group represented by one selected from Formulae 3-1 to 3-9:

3-1

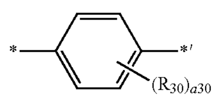

3-2

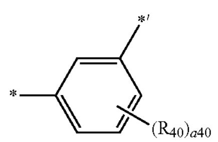

3-3

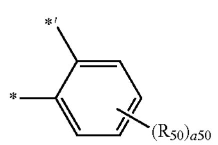

3-4

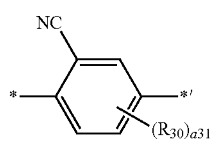

3-5

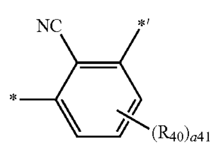

3-6

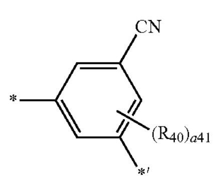

3-7

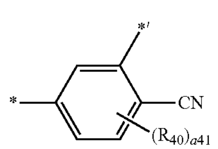

3-8

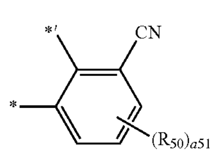

-continued 3-9

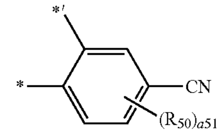

wherein, in Formulae 3-1 to 3-9, $R_{30}$, $R_{40}$, $R_{50}$, a30, a40, and a50 may be understood by referring to the descriptions for those provided herein, a30, a40, and a50 may each independently be an integer from 1 to 4, and a31, a41, and a51 may each independently be an integer from 1 to 3.

In Formulae 1 to 4, $R_{10}$, $R_{20}$, $R_{30}$, $R_{40}$, $R_{50}$, and $R_{60}$ may each independently be selected from hydrogen, deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, and —$B(Q_6)(Q_7)$, and at least one selected from $R_{10}$, $R_{20}$, $R_{30}$, $R_{40}$, $R_{50}$, and $R_{60}$ may be a cyano group.

In some embodiments, $R_{10}$, $R_{20}$, $R_{30}$, $R_{40}$, $R_{50}$, and $R_{60}$ may each independently be selected from hydrogen, deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, a pyrimidinyl group, a pyrazinyl group, a pyridazinyl group, and a triazinyl group;

a cyclopentyl group, a cyclohexyl group, a cyclopentenyl group, a cyclohexenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, imidazopyridimidinyl group, and an imidazopyridinyl group; and a cyclopentyl group, a cyclohexyl group, a cyclopentenyl group, a cyclohexenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, imidazopyridimidinyl group, and an imidazopyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group, and at least one selected from $R_{10}$, $R_{20}$, $R_{30}$, $R_{40}$, $R_{50}$, and $R_{60}$ may be a cyano group.

According to another embodiment, $R_{10}$, $R_{20}$, $R_{30}$, $R_{40}$, $R_{50}$, and $R_{60}$ may each independently be selected from hydrogen, deuterium, a cyano group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, a cyano group, a phenyl group, a biphenyl group, a terphenyl group, and a naphthyl group;

a cyclopentyl group, a cyclohexyl group, a cyclopentenyl group, a cyclohexenyl group, a cycloheptenyl group, a phenyl group, a biphenyl group, a terphenyl group, a naphthyl group, a fluorenyl group, a carbazolyl group, a dibenzofuranyl group, and a dibenzothiophenyl group; and a cyclopentyl group, a cyclohexyl group, a cyclopentenyl group, a cyclohexenyl group, a cycloheptenyl group, a phenyl group, a biphenyl group, a terphenyl group, a naphthyl group, a fluorenyl group, a carbazolyl group, a dibenzofuranyl group, and a dibenzothiophenyl group, each substituted with at least one selected from deuterium, a cyano group, a $C_1$-$C_{20}$ alkyl group, a $C_1$-$C_{20}$ alkoxy group, a phenyl group, a biphenyl group, a terphenyl group, and a naphthyl group, and at least one selected from $R_{10}$, $R_{20}$, $R_{30}$, $R_{40}$, $R_{50}$, and $R_{60}$ may be a cyano group.

In Formulae 1 to 4, b10, b20, b30, b40, b50, and b60 may respectively indicate the number of $R_{10}$, $R_{20}$, $R_{30}$, $R_{40}$, $R_{50}$, and $R_{60}$. b10, b20, b30, b40, b50, and b60 may each independently be an integer from 1 to 10. When b10 is 2 or greater, at least two groups $R_{10}$ may be identical to different from each other. When b20 is 2 or greater, at least two groups $R_{20}$ may be identical to different from each other. When b30 is 2 or greater, at least two groups $R_{30}$ may be identical to different from each other. When b40 is 2 or greater, at least two groups $R_{40}$ may be identical to different from each other. When b50 is 2 or greater, at least two groups $R_{50}$ may be identical to different from each other. When b60 is 2 or greater, at least two groups $R_{60}$ may be identical to different from each other.

In some embodiments, in the condensed cyclic compound represented by Formula 1, groups $R_{10}$ in the number of b10, groups $R_{20}$ in the number of b20, groups $R_{30}$ in the number of b30, groups $R_{40}$ in the number of b40, groups $R_{50}$ in the number of b50, and groups $R_{60}$ in the number of b60 may each be a cyano group.

In some embodiments, b10, b20, b30, b40, b50, and b60 may each be 1, 2, 3, or 4.

In some embodiments, the number of cyano groups included in the condensed cyclic compound represented by Formula 1 may be 1 to 5. In some embodiments, the number of cyano groups included in the condensed cyclic compound represented by Formula 1 may be 1 to 3.

In some embodiments, (i) at least one selected from $R_{10}$ and $R_{20}$ may be a cyano group, and $R_{30}$, $R_{40}$, and $R_{50}$ may each independently be a cyano group, (ii) at least one selected from $R_{30}$, $R_{40}$, and $R_{50}$ may be a cyano group, and $R_{10}$ and $R_{20}$ may each independently be a cyano group, or (iii) $R_{60}$ may be a cyano group.

According to another embodiment, at least one selected from $R_{10}$ and $R_{20}$ and at least one selected from $R_{30}$, $R_{40}$, and $R_{50}$ may each be a cyano group.

In some embodiments, the condensed cyclic compound represented by Formula 1 may be represented by Formula 10:

Formula 10

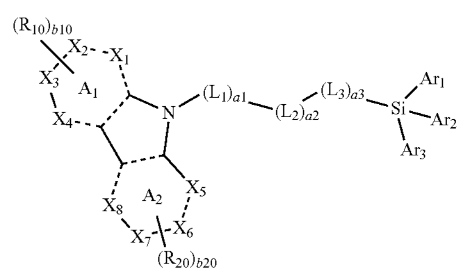

wherein, in Formula 10, $A_1$, $A_2$, $R_{10}$, $R_{20}$, b10, b20, $L_1$, $L_2$, $L_3$, a1, a2, a3, and $Ar_1$ to $Ar_3$ may be understood by referring to the descriptions for those provided herein, $X_1$ to $X_4$ may each independently be selected from carbon (C) and nitrogen (N), and
$X_5$ to $X_8$ may each independently be selected from C and N.
According to another embodiment, the condensed cyclic compound represented by Formula 1 may be represented by one of Formulae 10-1 to 10-9:
Formula 10-1
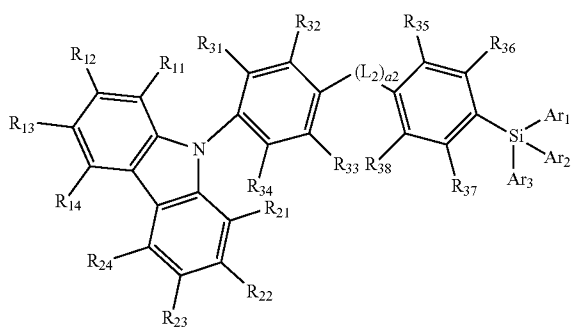
Formula 10-2
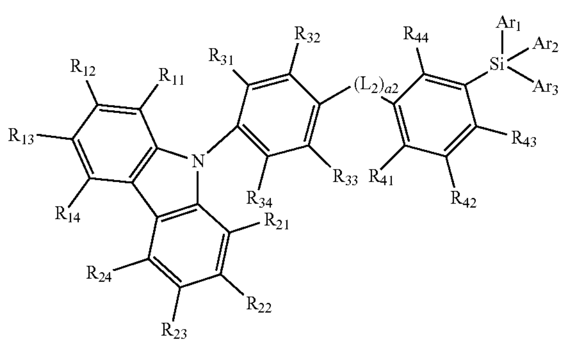
Formula 10-3
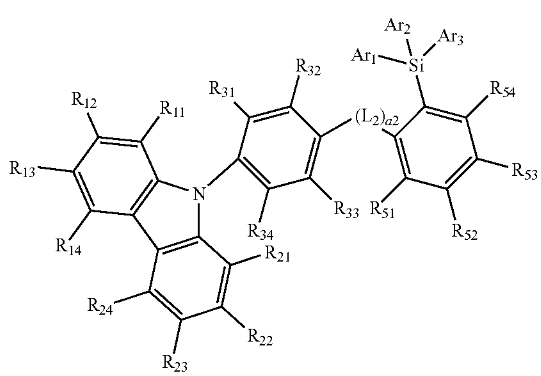
Formula 10-4
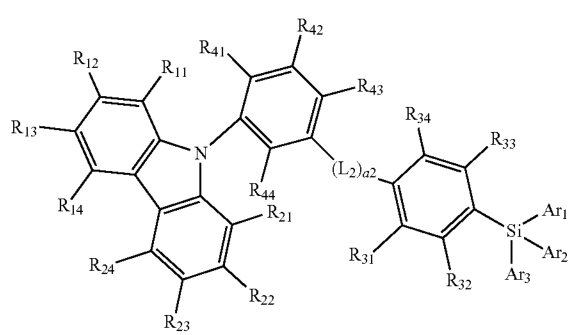
-continued
Formula 10-5
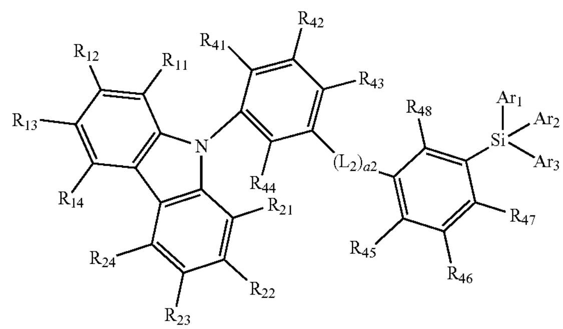
Formula 10-6
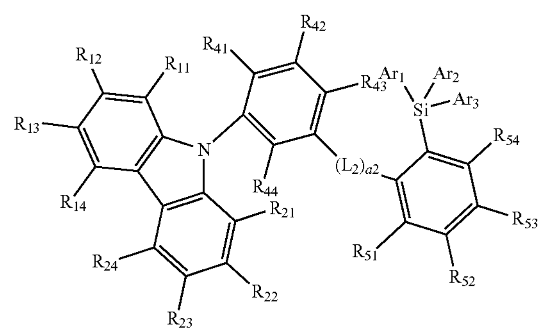
Formula 10-7
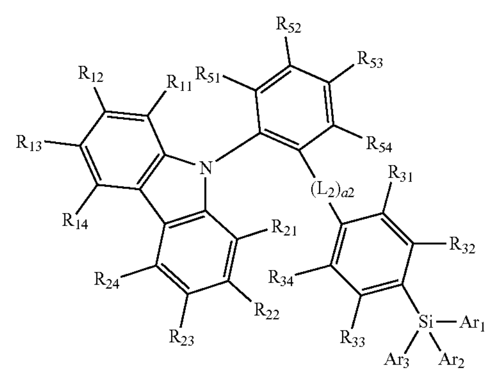
Formula 10-8
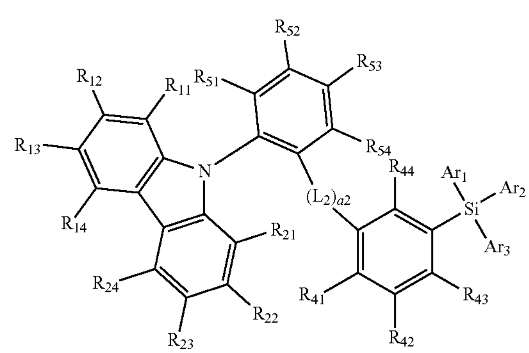

-continued

Formula 10-9

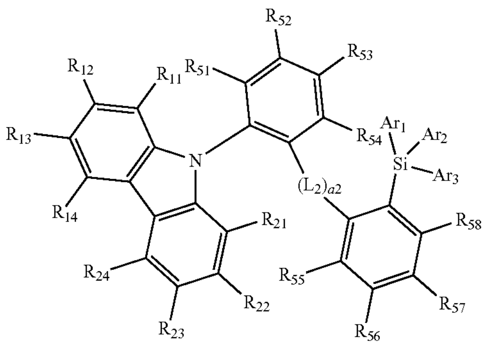

wherein, in Formulae 10-1 to 10-9, $L_2$, a2, and $Ar_1$ to $Ar_3$ may be understood by referring to the descriptions for those provided herein, $R_{11}$ to $R_{14}$ may be understood by referring to the descriptions for $R_{10}$ provided herein, $R_{21}$ to $R_{24}$ may be understood by referring to the descriptions for $R_{20}$ provided herein, $R_{31}$ to $R_{38}$ may be understood by referring to the descriptions for $R_{30}$ provided herein, $R_{41}$ to $R_{48}$ may be understood by referring to the descriptions for $R_{40}$ provided herein, $R_{51}$ to $R_{58}$ may be understood by referring to the descriptions for $R_{50}$ provided herein, and at least one selected from $R_{11}$ to $R_{14}$, $R_{21}$ to $R_{24}$, $R_{31}$ to $R_{38}$, $R_{41}$ to $R_{48}$, $R_{51}$ to $R_{58}$, and $R_{60}$ may be a cyano group.

In an embodiment, the condensed cyclic compound may be selected from Compounds 1 to 671:

1

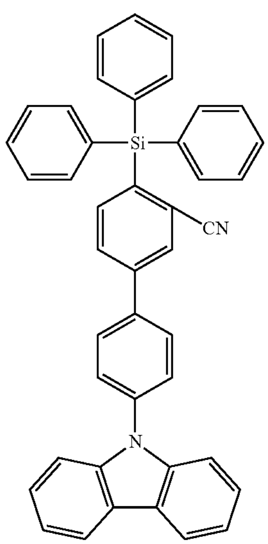

-continued

2

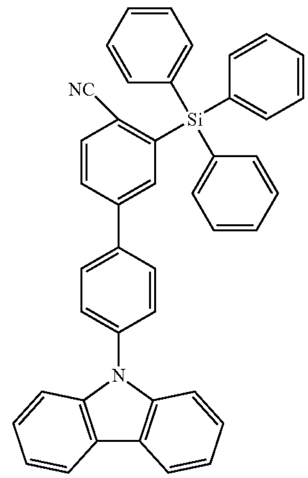

3

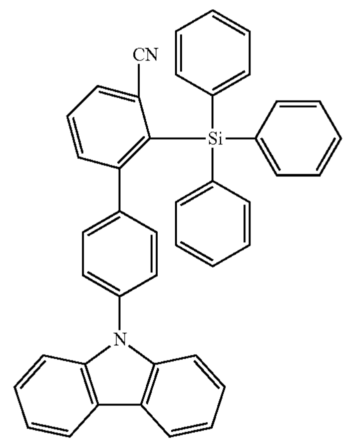

4

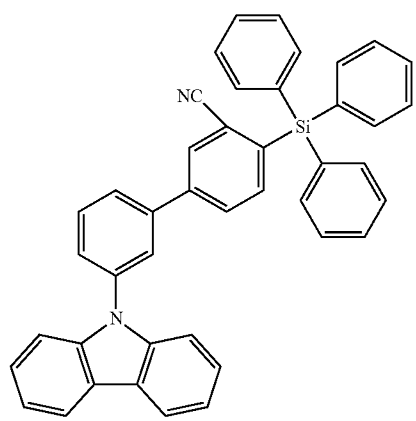

-continued
5
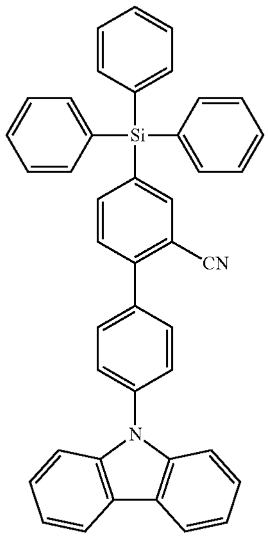
6
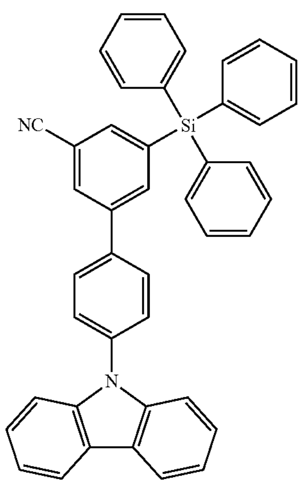
7
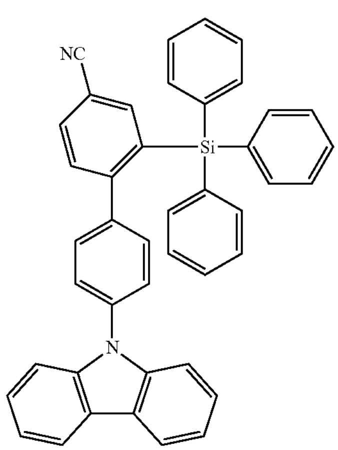
8
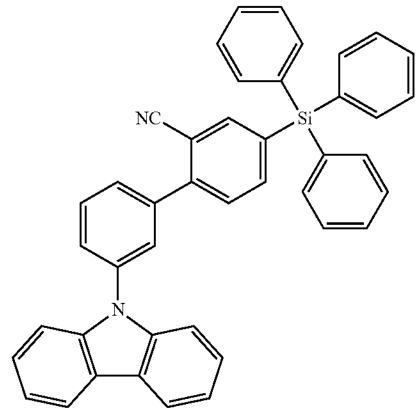
9
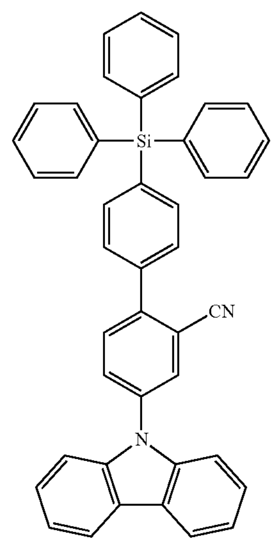
10
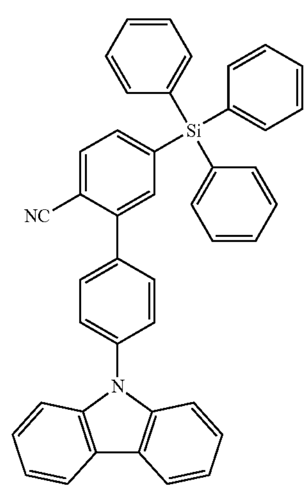

-continued
11
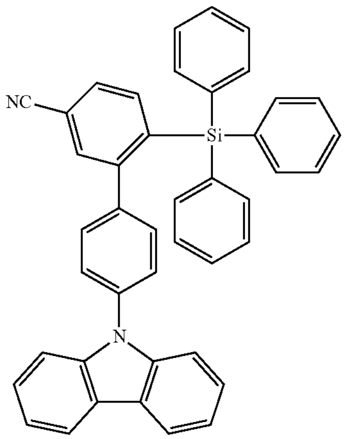
12
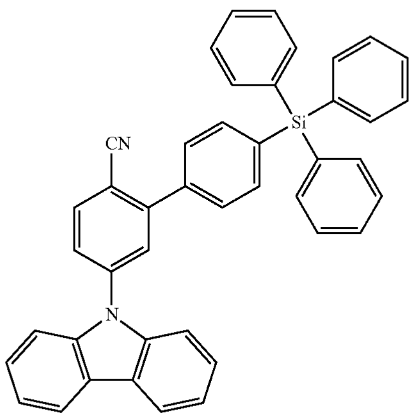
13
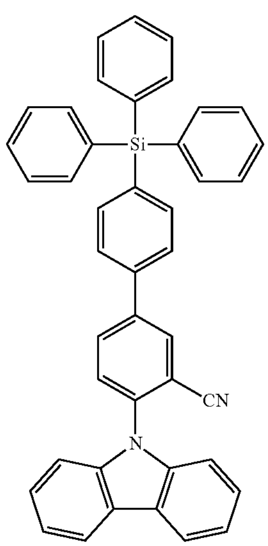
-continued
14
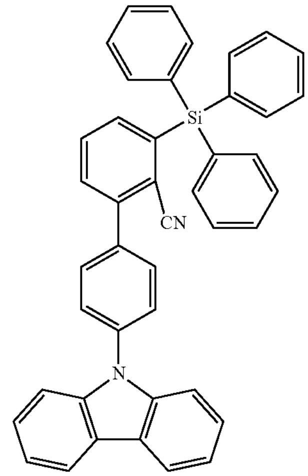
15
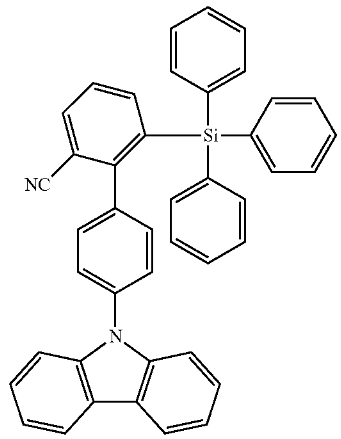
16
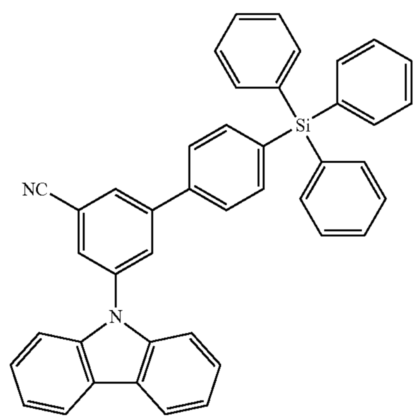
17
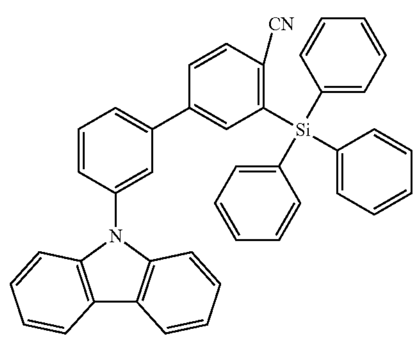

-continued
18
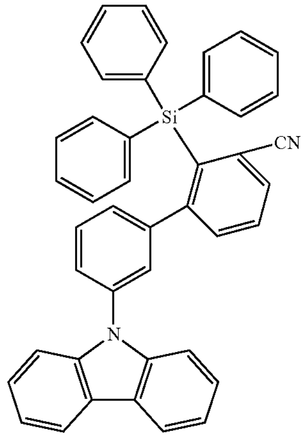
19
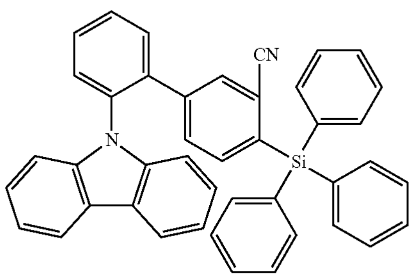
20
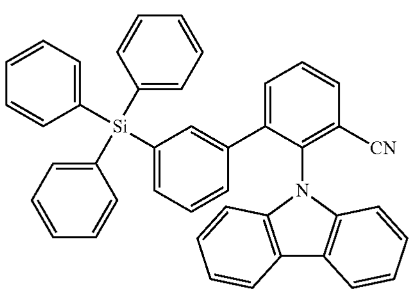
21
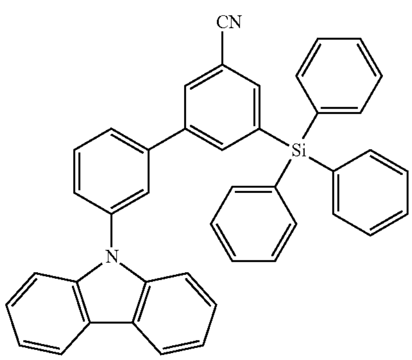
-continued
22
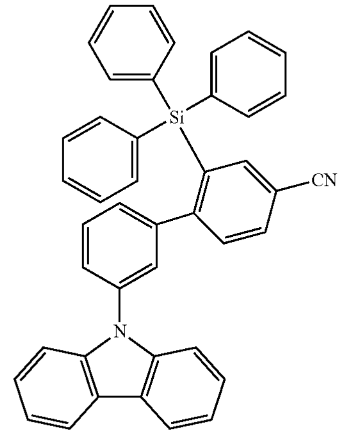
23
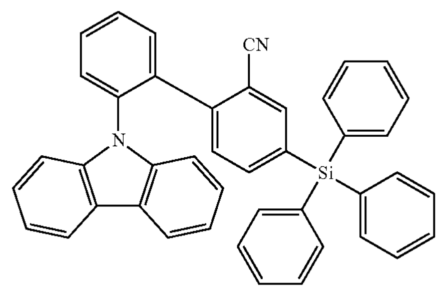
24
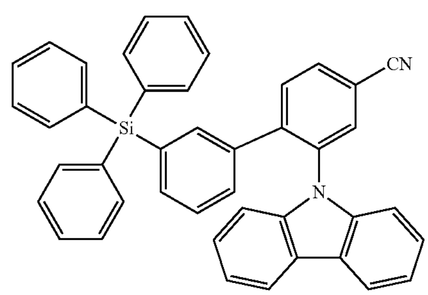
25
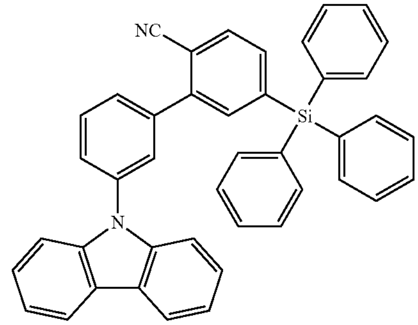

-continued
26
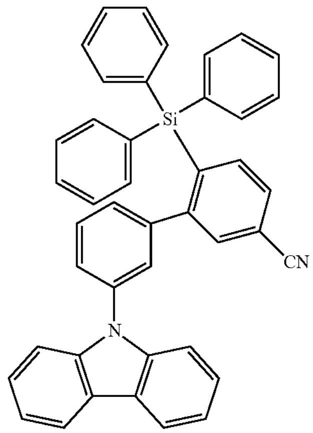
-continued
30
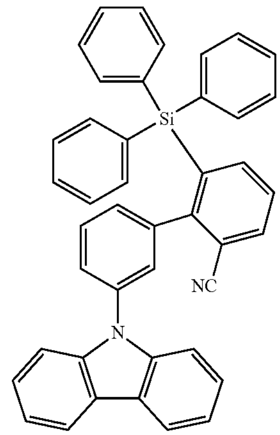
27
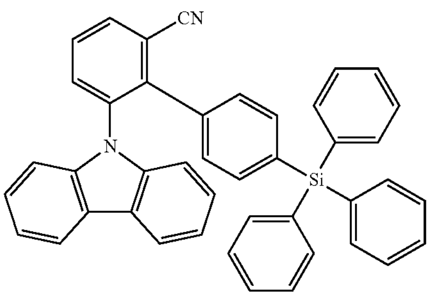
31
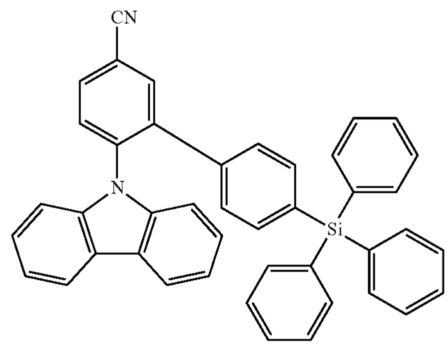
28
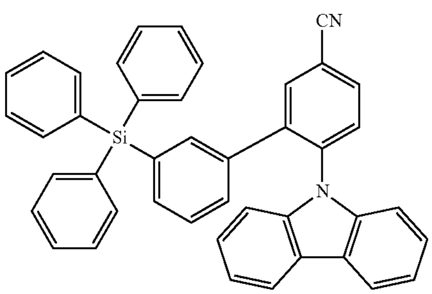
32
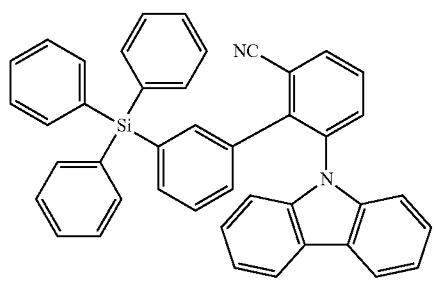
29
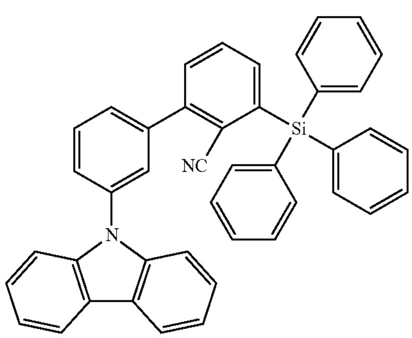
33
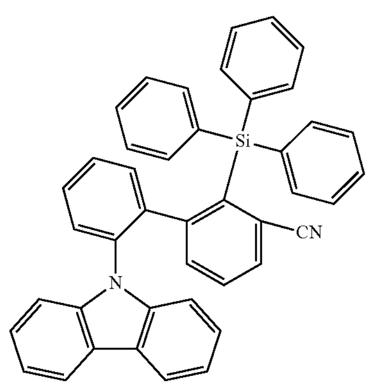

-continued
34
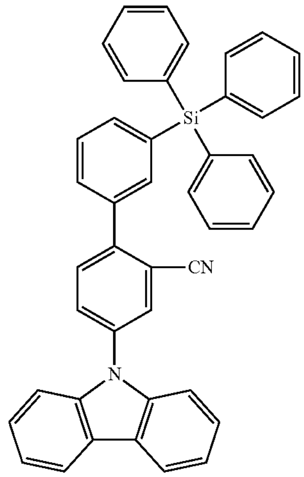
35
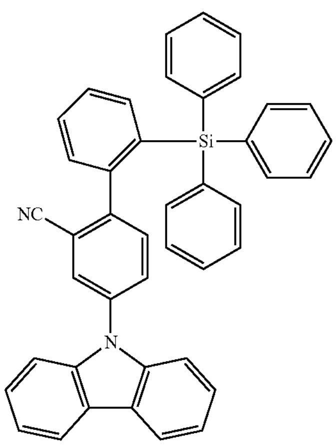
36
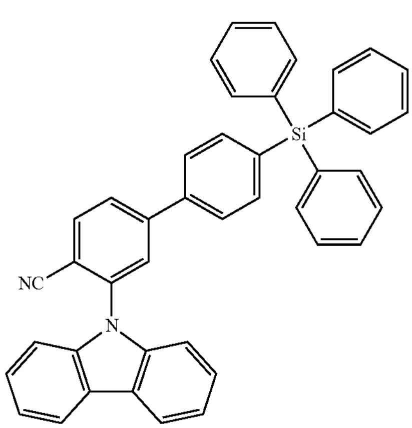
-continued
37
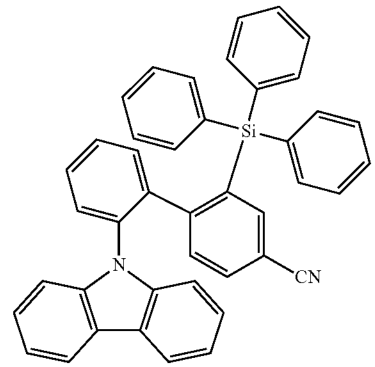
38
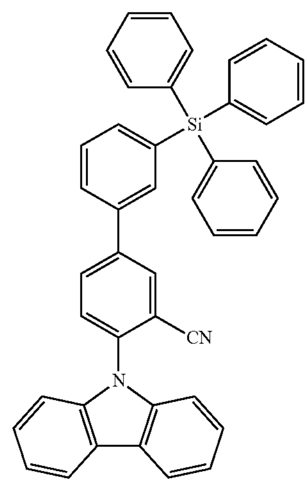
39
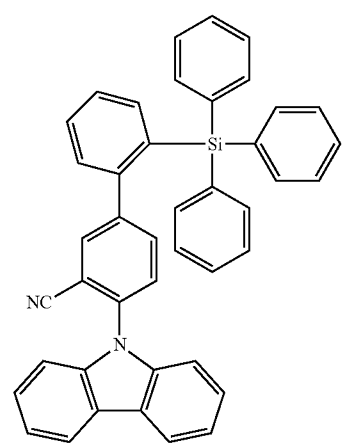

-continued
40
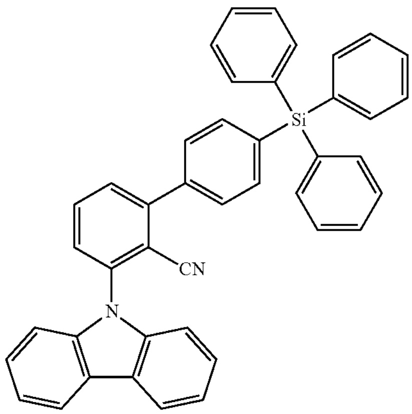
41
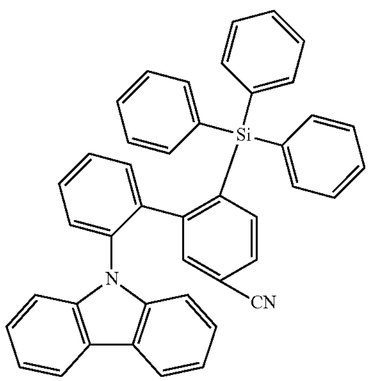
42
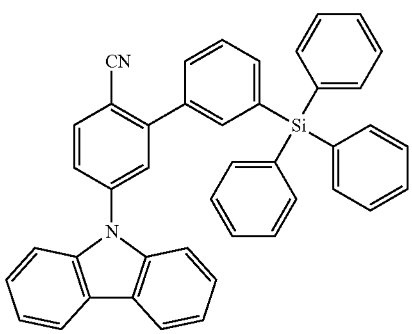
43
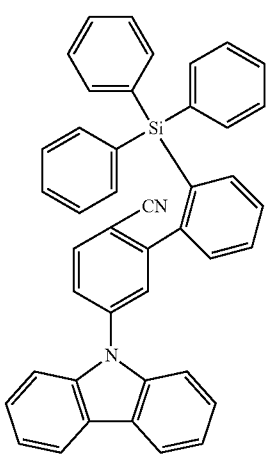
-continued
44
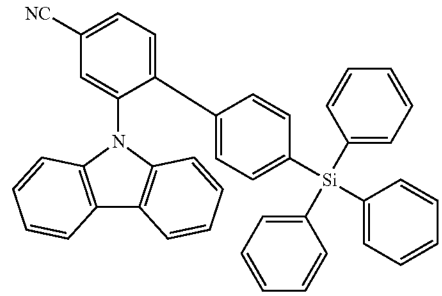
45
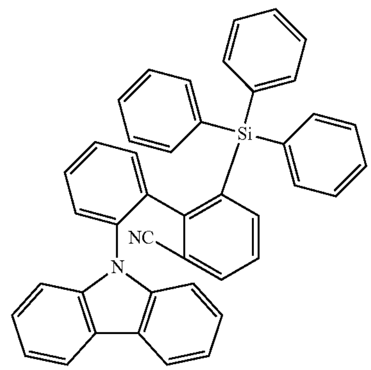
46
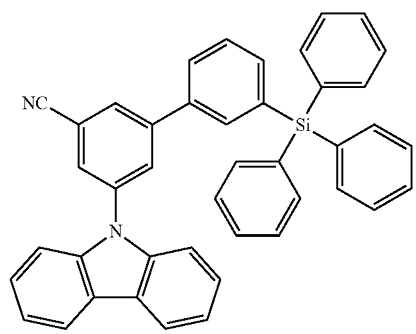
47
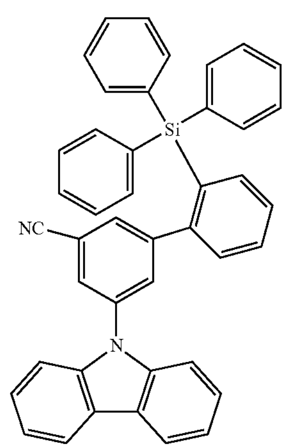

-continued
48
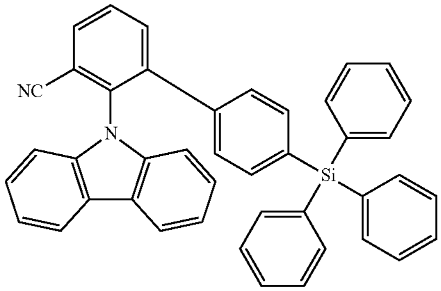
49
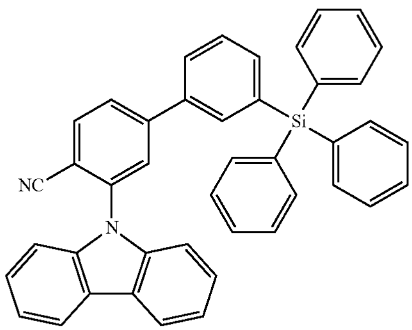
50
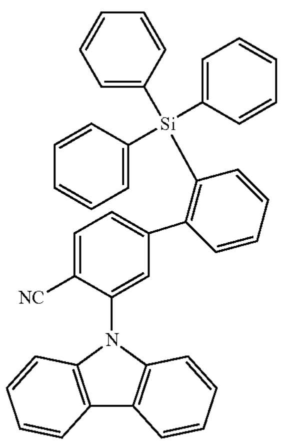
51
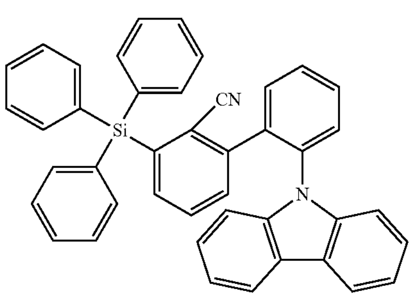
-continued
52
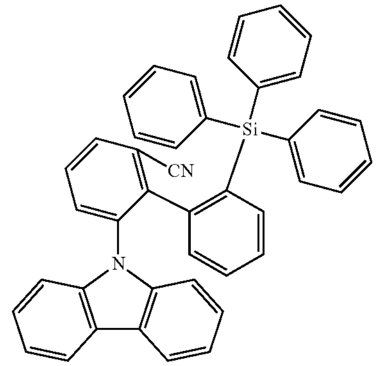
53
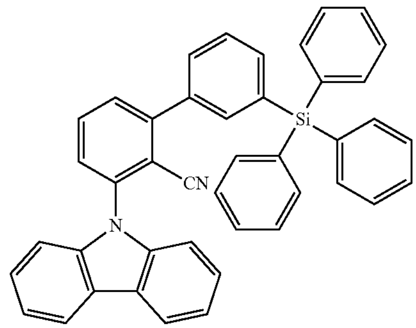
54
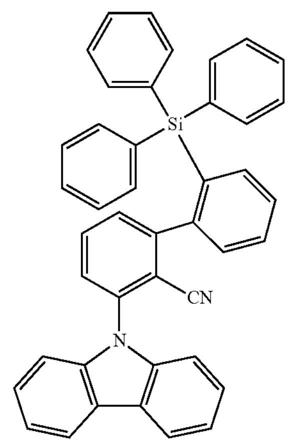
55
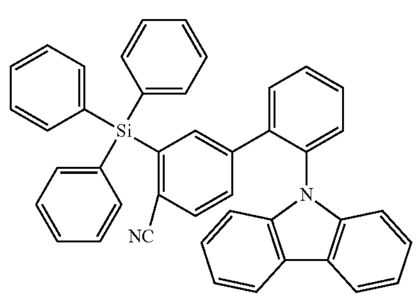

-continued
56
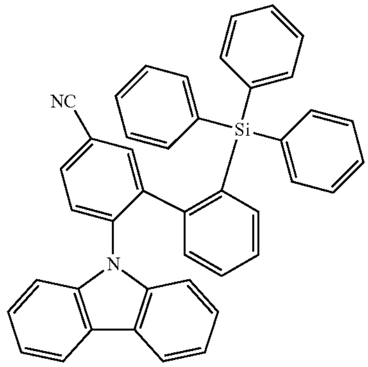
57
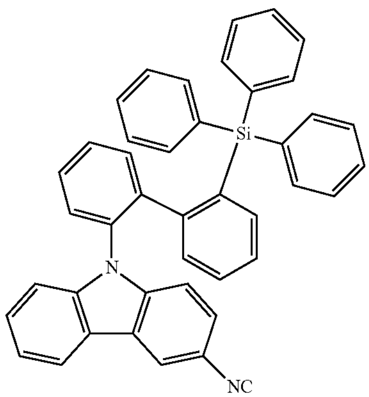
58
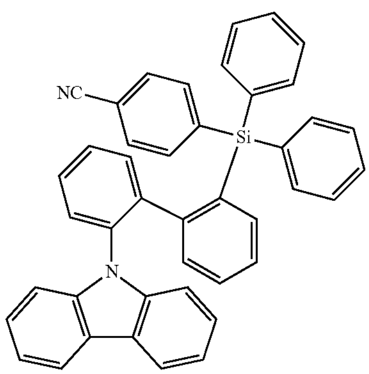
59
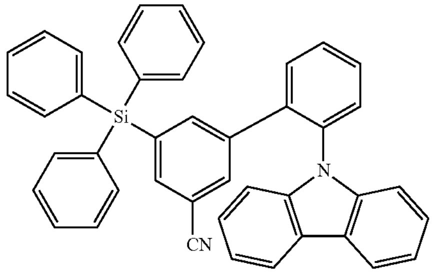
-continued
60
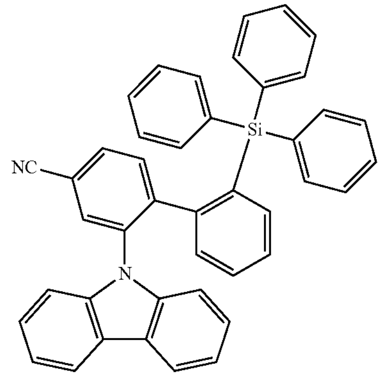
61
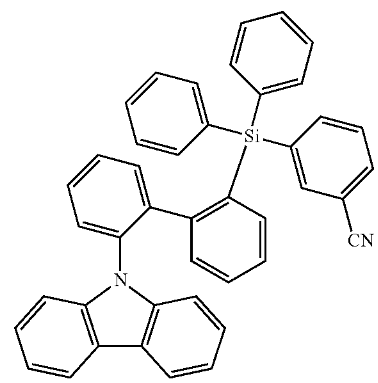
62
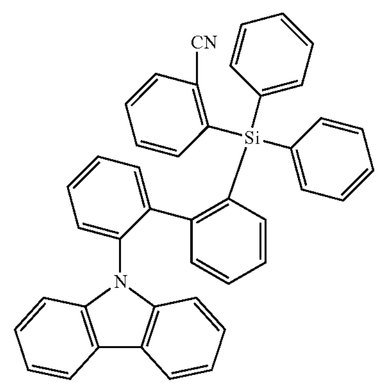
63
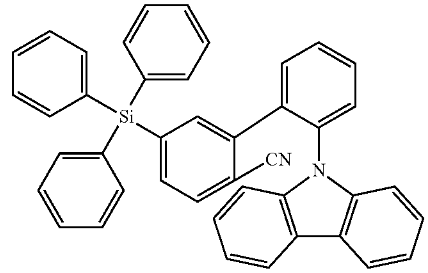

-continued
64
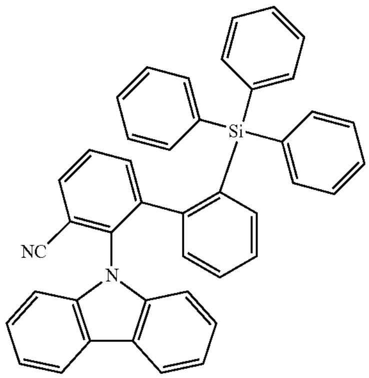
65
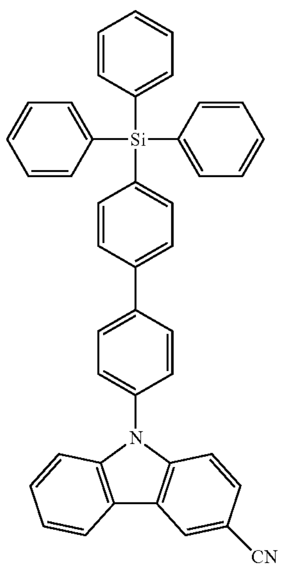
66
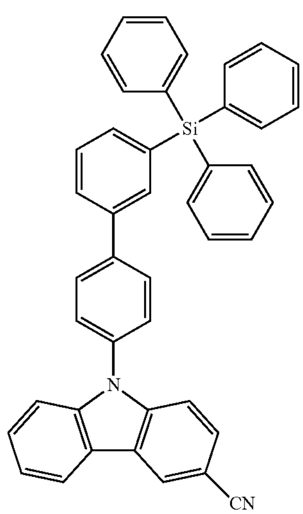
-continued
67
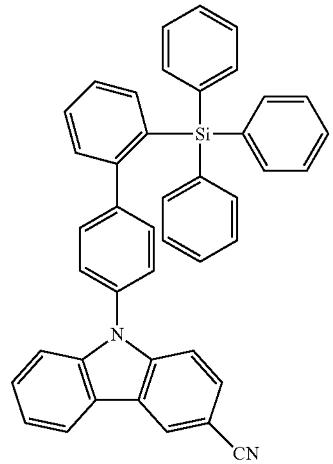
68
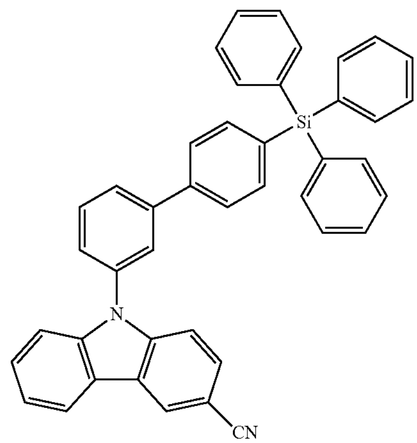
69
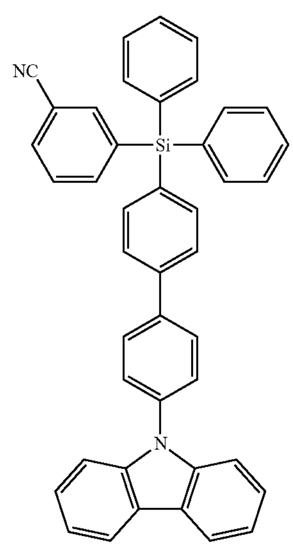

70
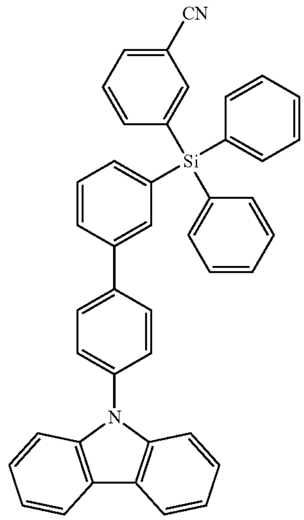
71
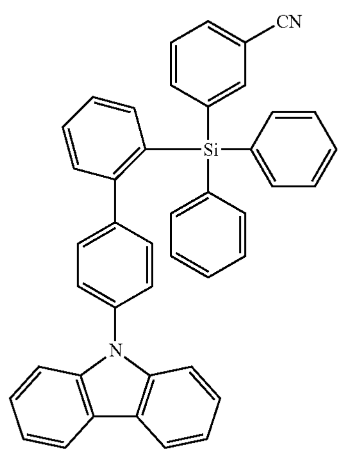
72
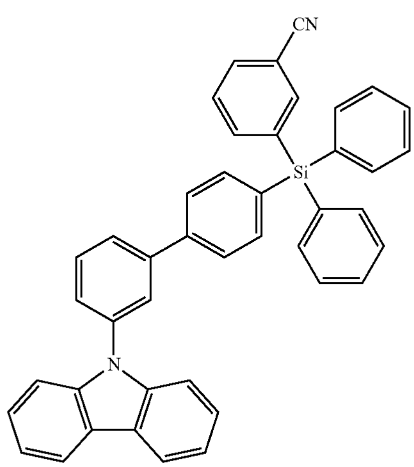
73
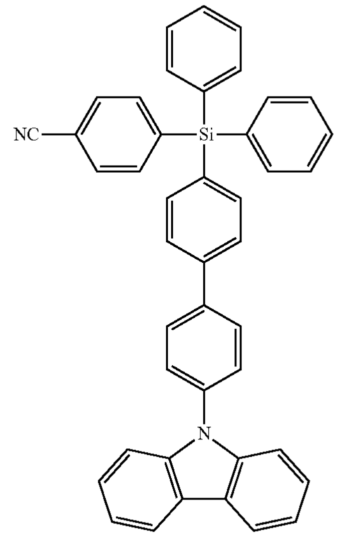
74
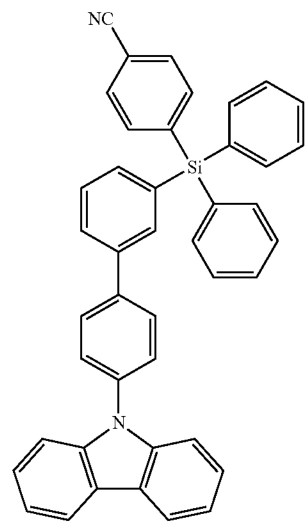
75
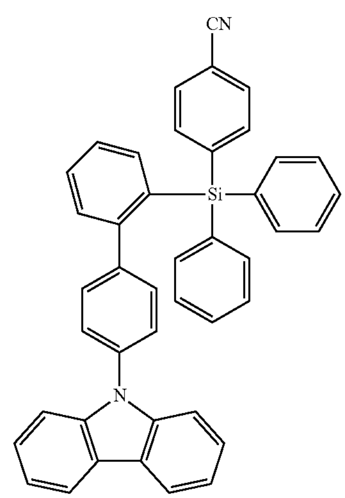

-continued
76
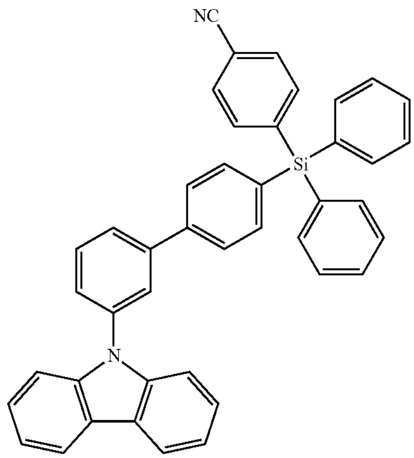
77
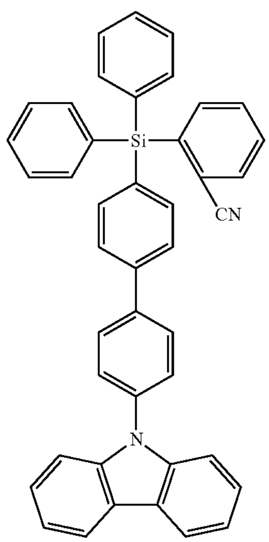
78
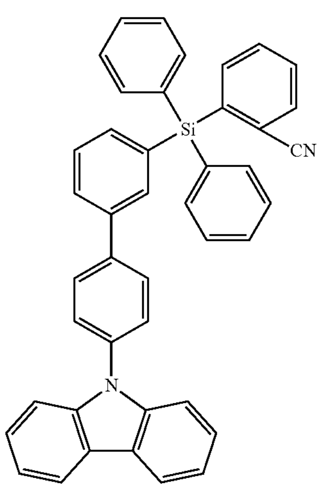
-continued
79
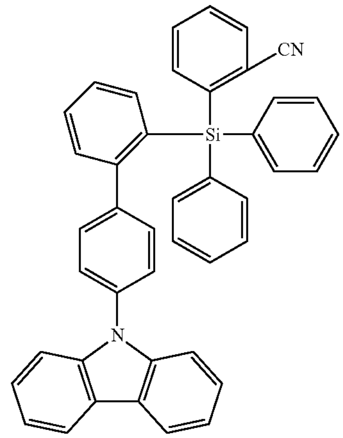
80
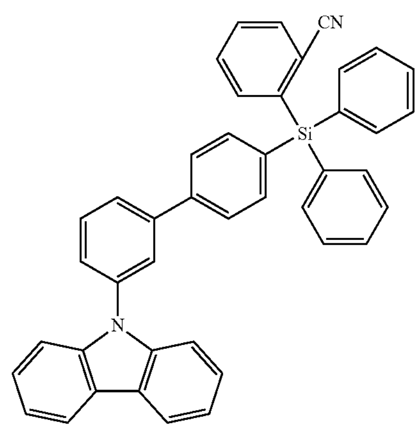
81
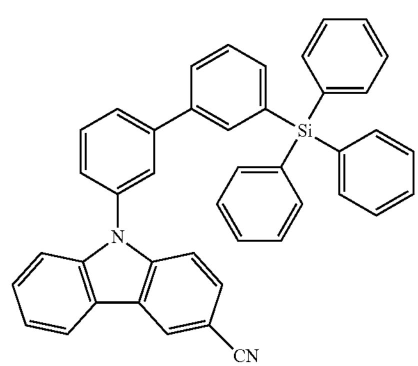

-continued
82
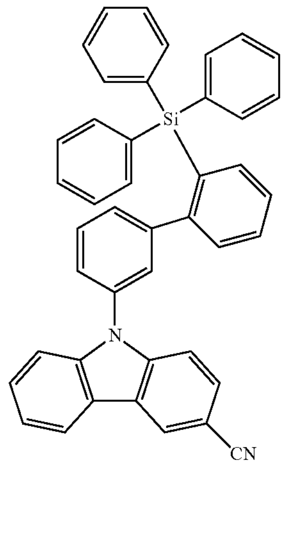
83
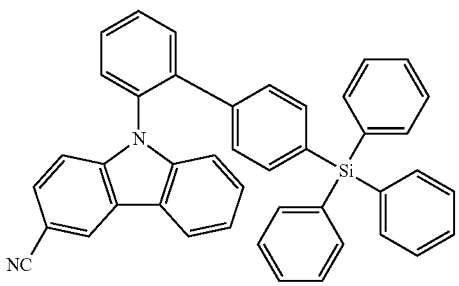
84
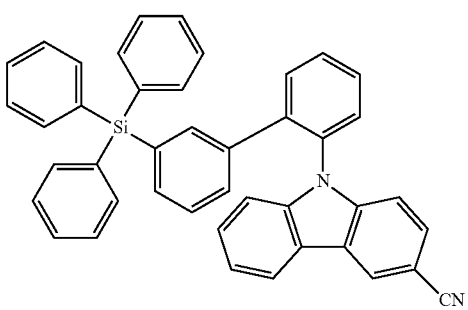
85
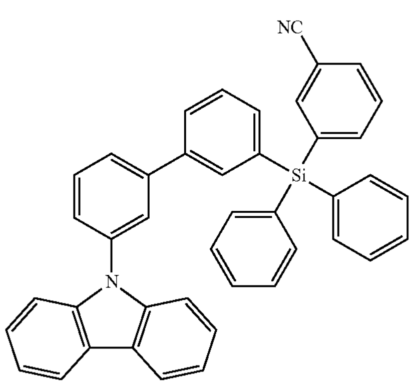
-continued
86
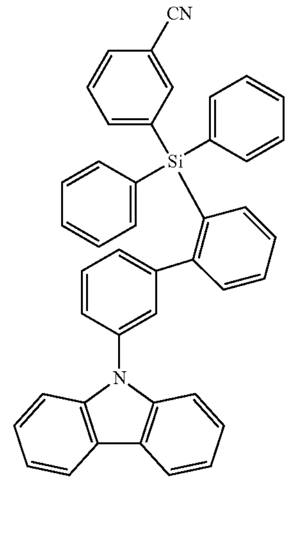
87
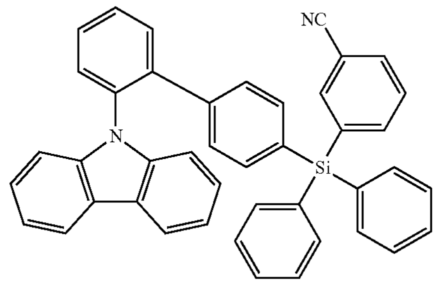
88
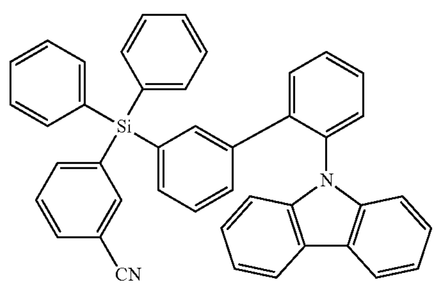
89
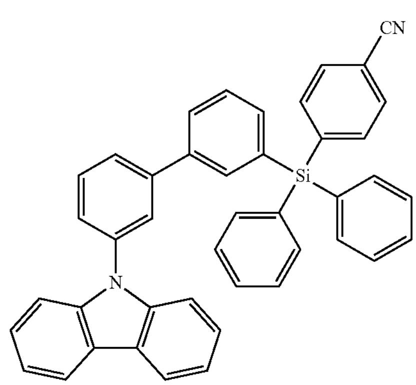

-continued
90
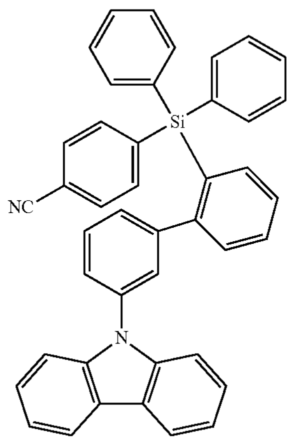
91
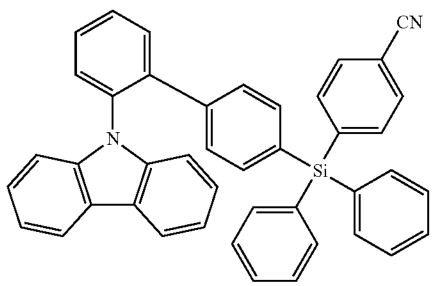
92
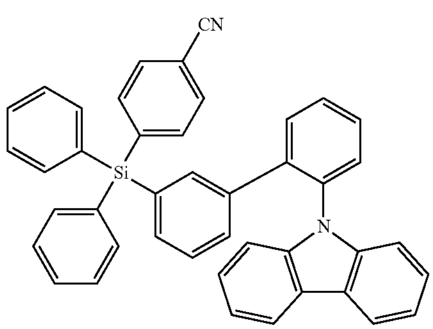
93
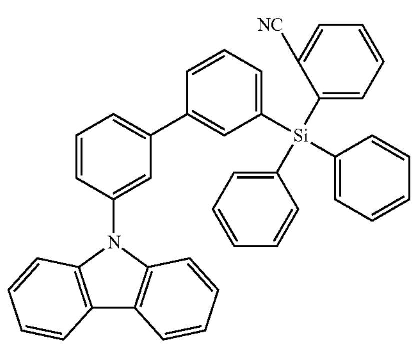
-continued
94
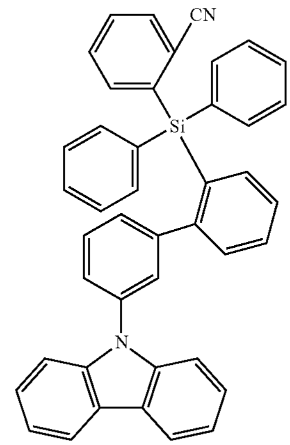
95
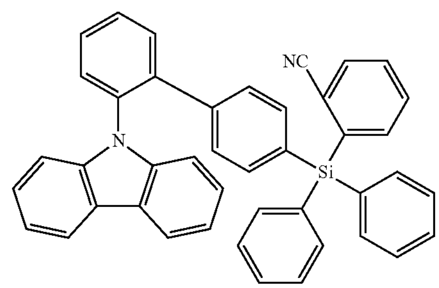
96
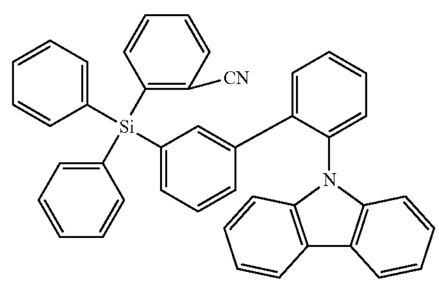
97
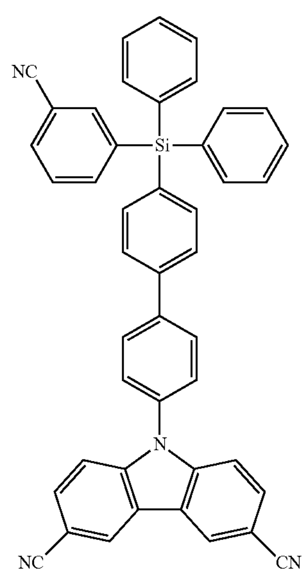

98
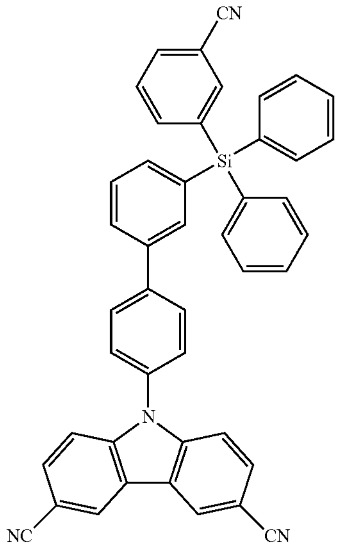
99
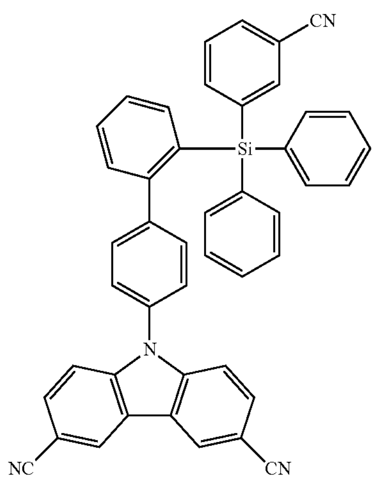
100
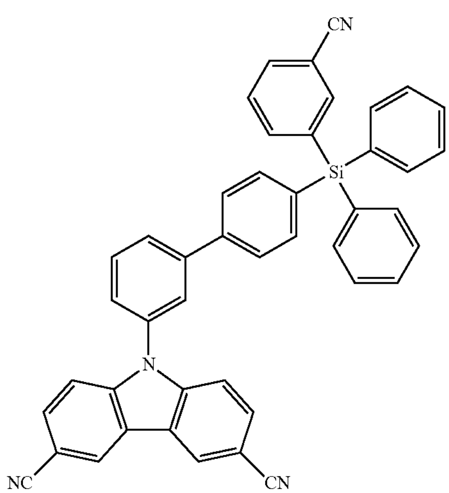
101
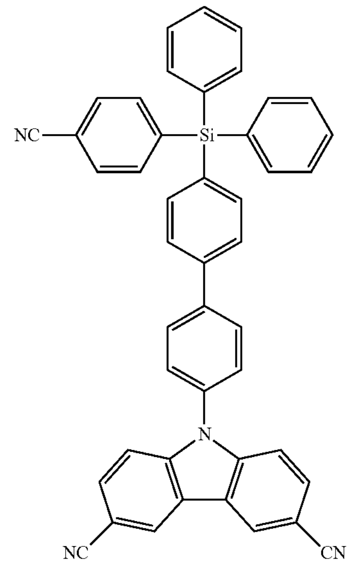
102
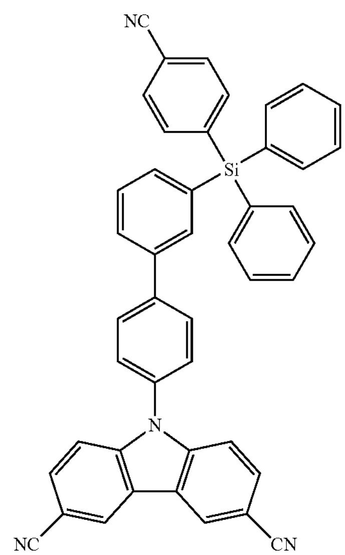
103
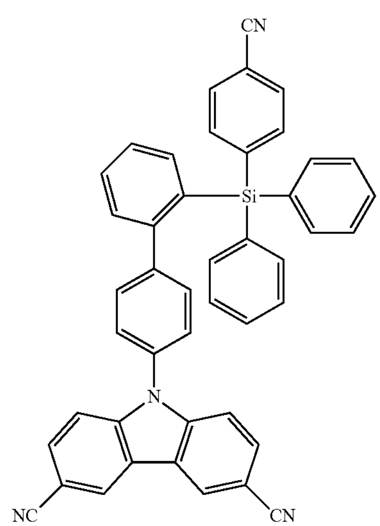

-continued
104
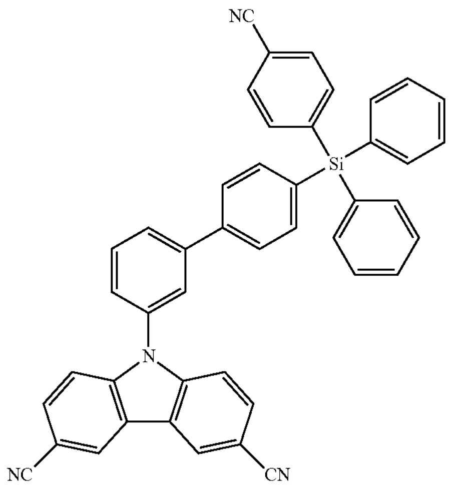
105
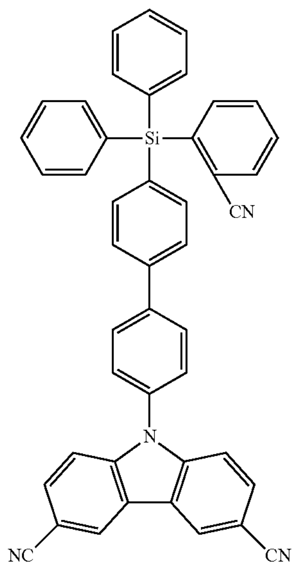
106
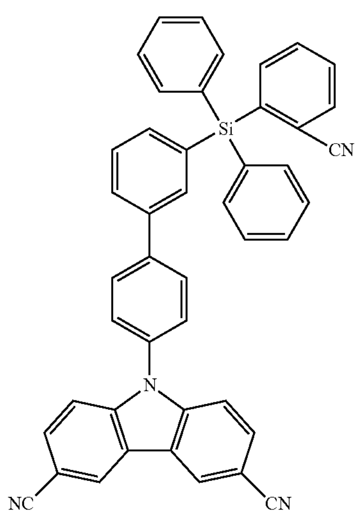
-continued
107
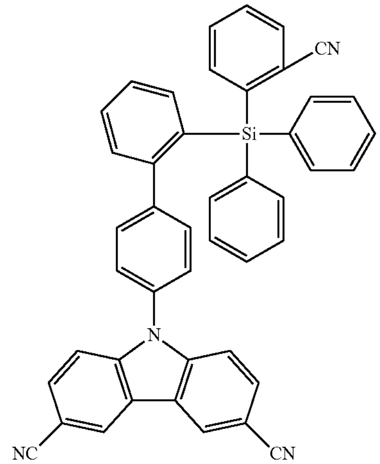
108
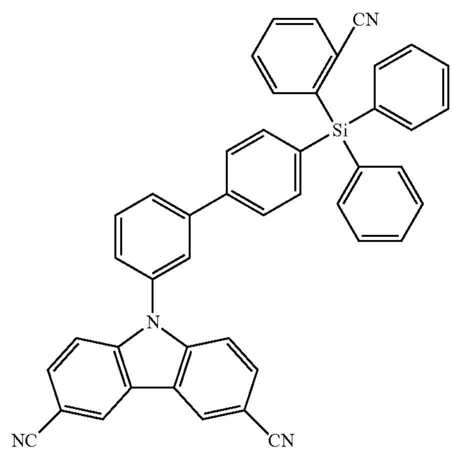
109
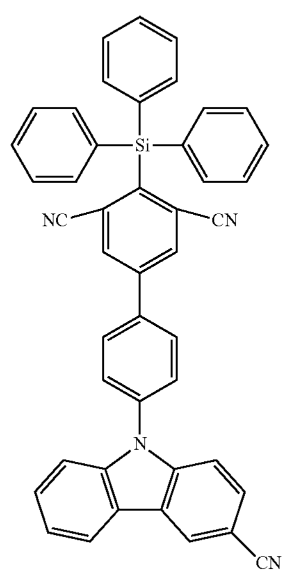

110
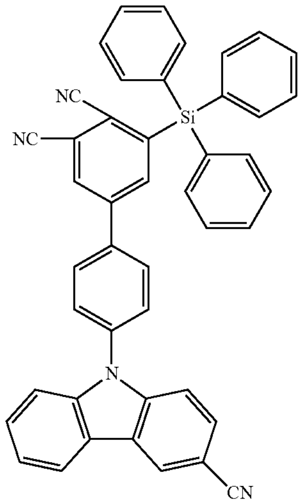
111
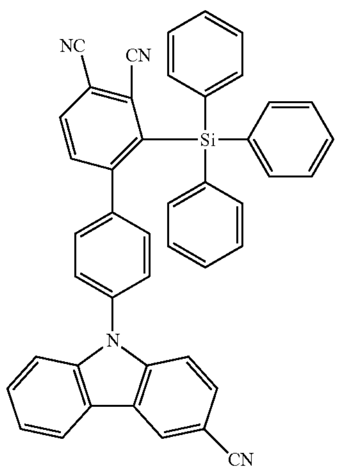
112
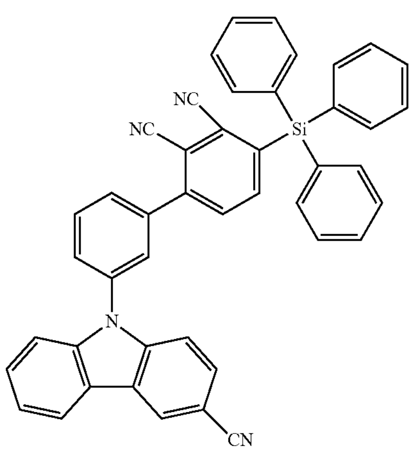
113
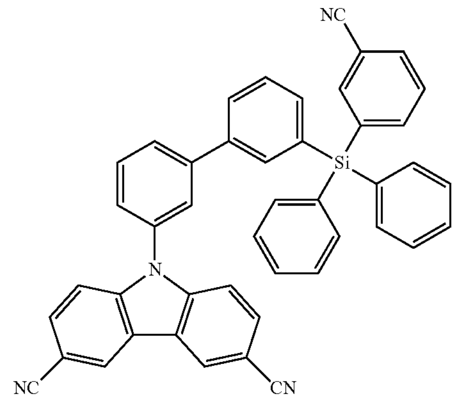
114
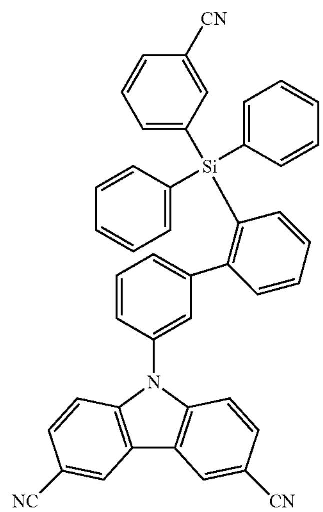
115
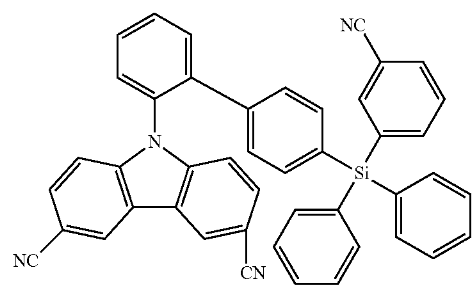
116
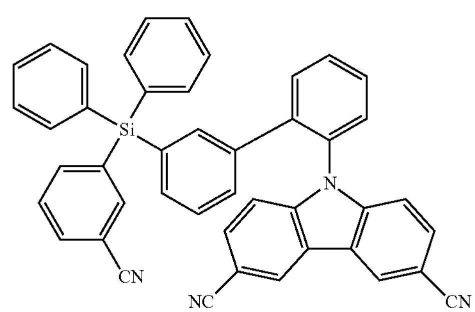

-continued
117
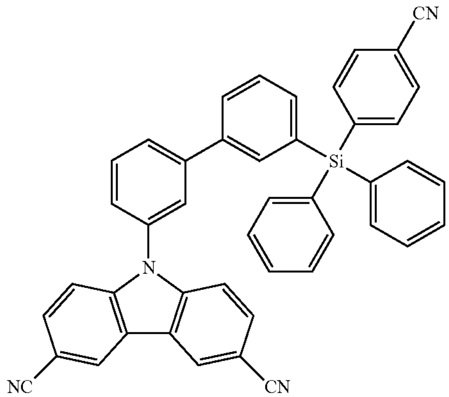
118
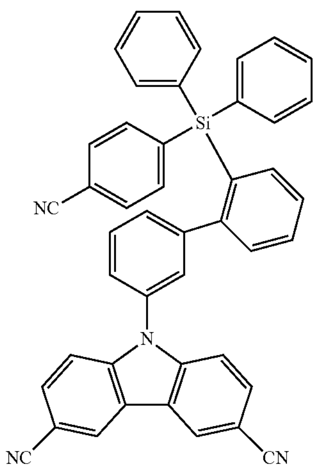
119
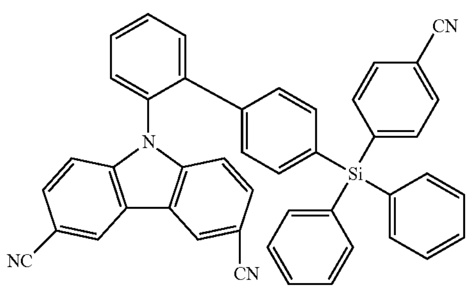
120
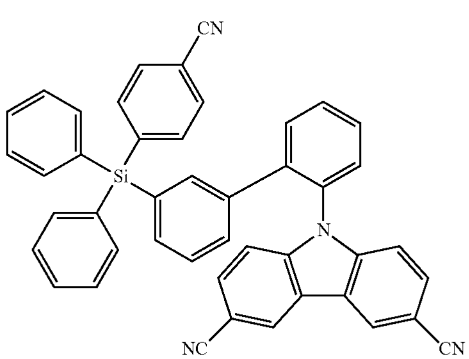
-continued
121
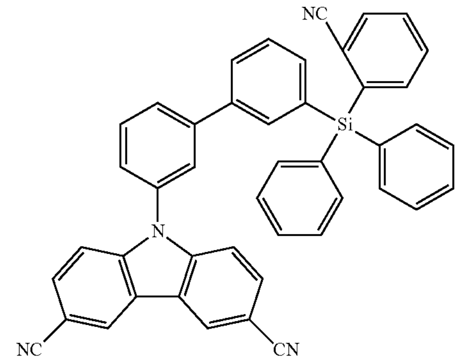
122
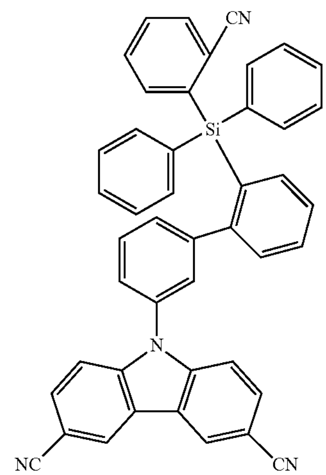
123
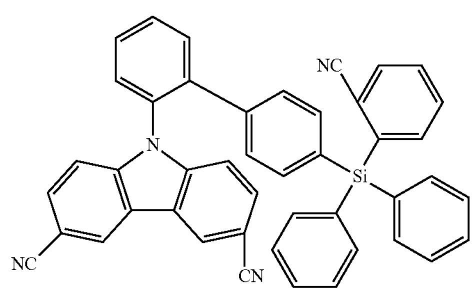
124
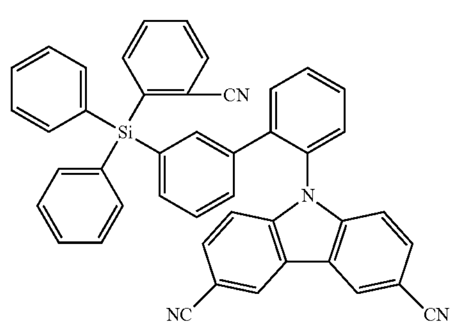

125
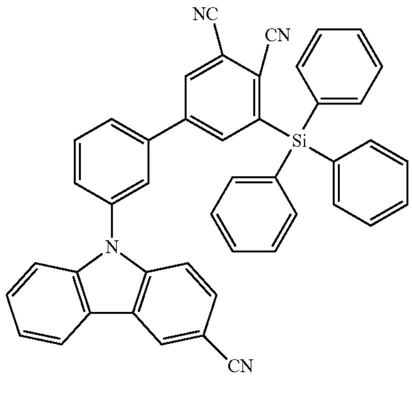
126
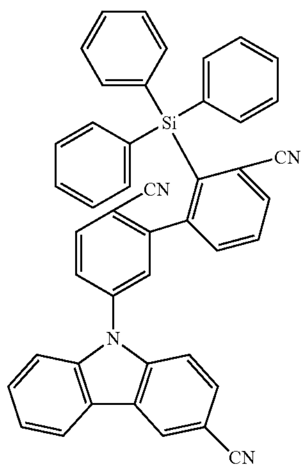
127
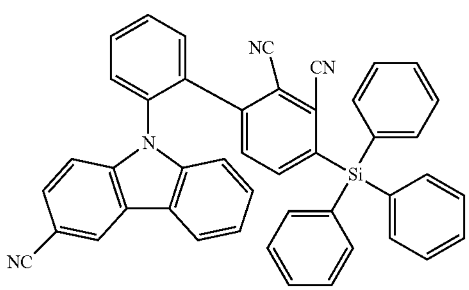
128
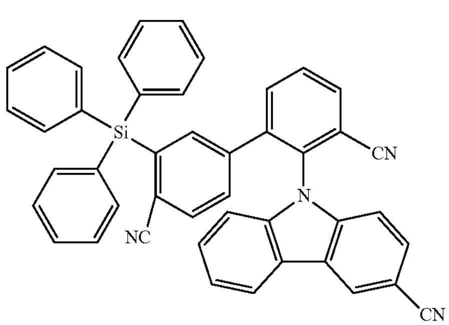
129
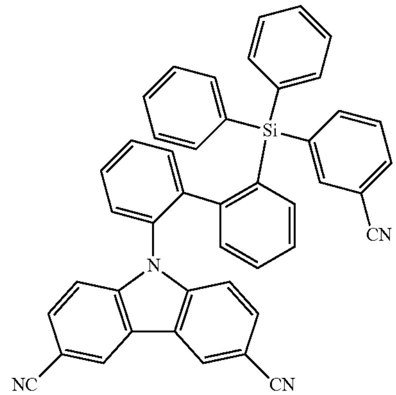
130
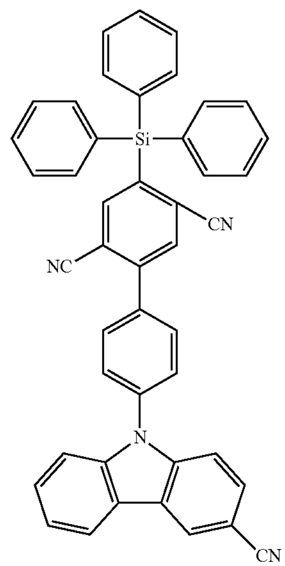
131
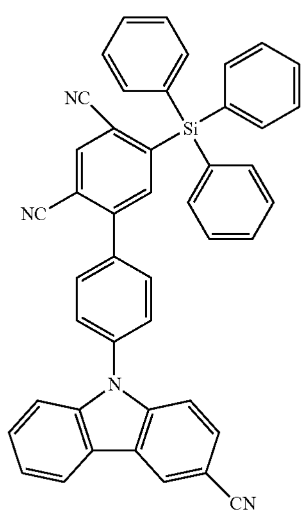

132
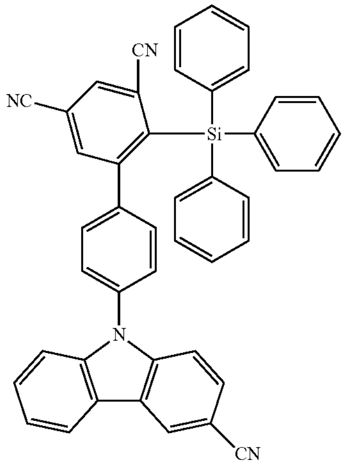
133
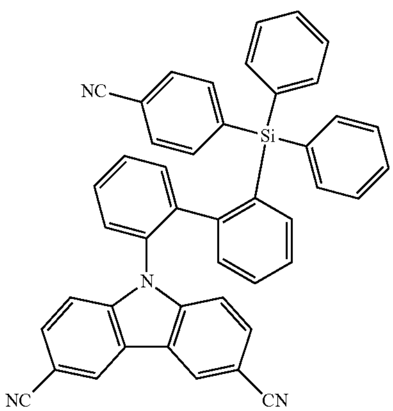
134
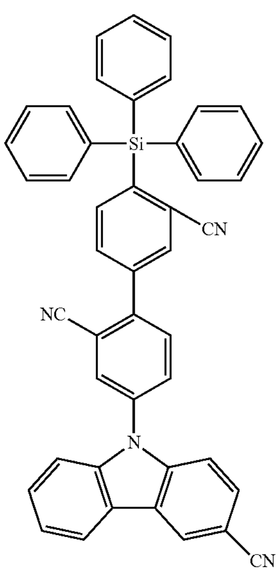
135
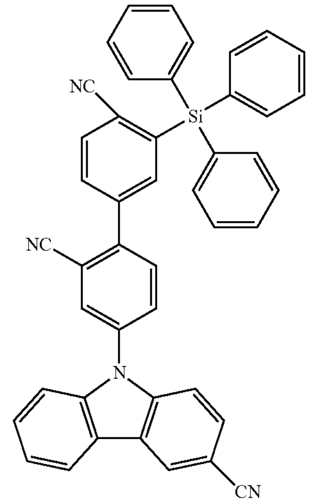
136
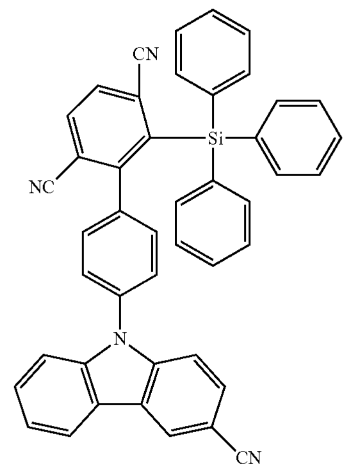
137
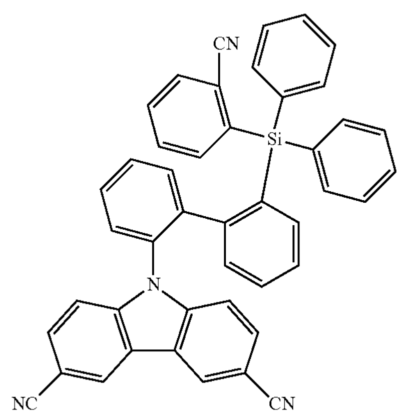

138
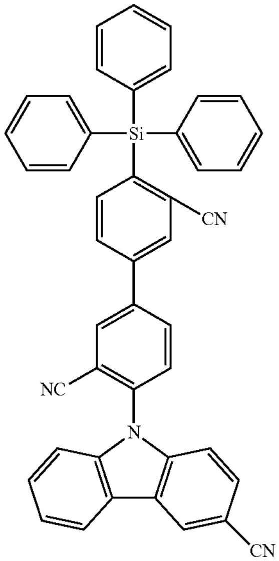
139
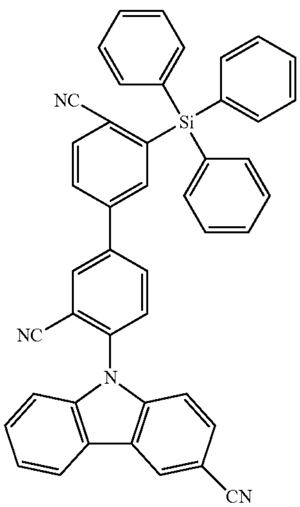
140
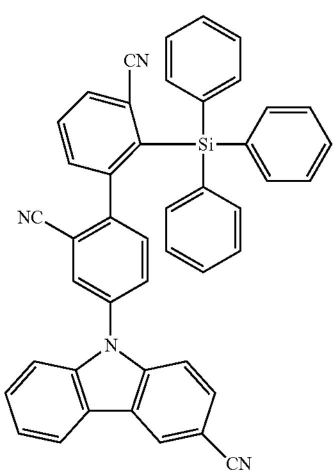
141
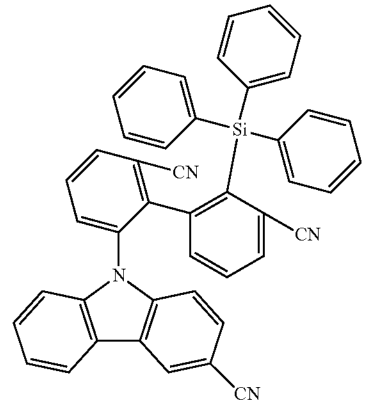
142
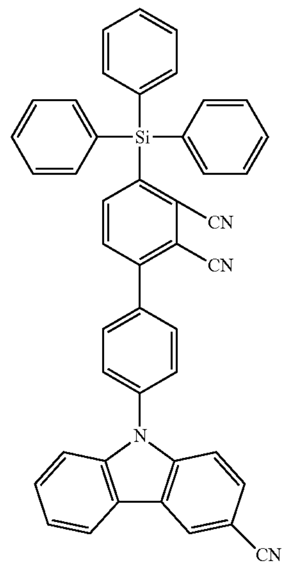
143
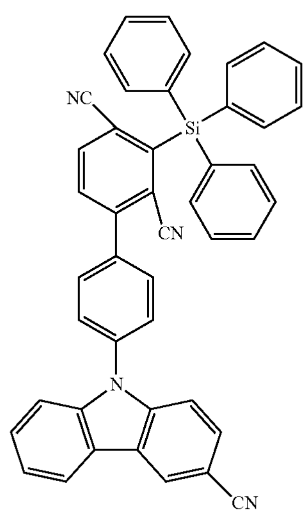

144
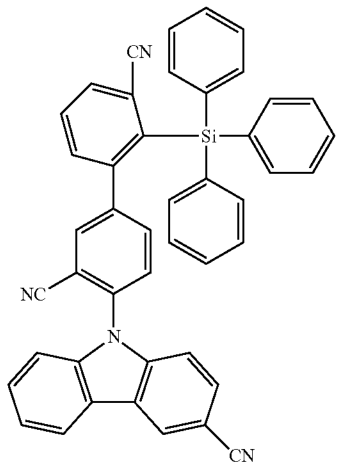
145
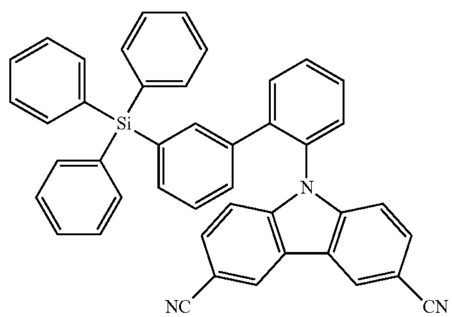
146
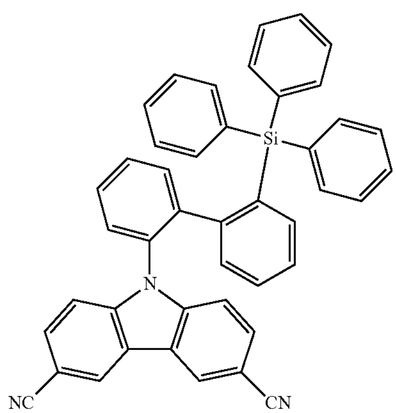
147
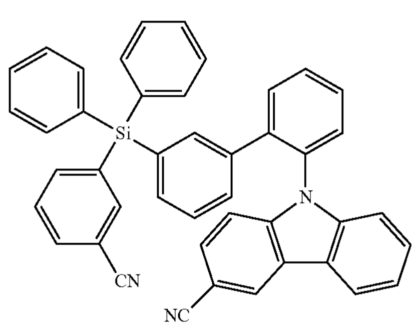
148
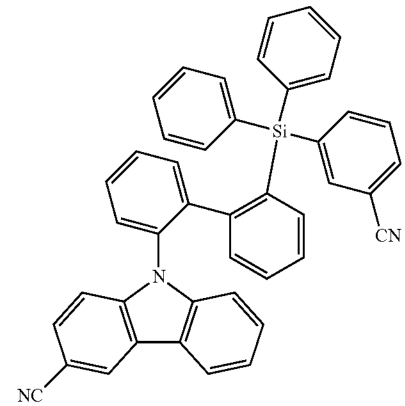
149
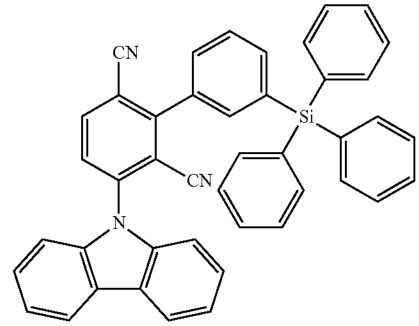
150
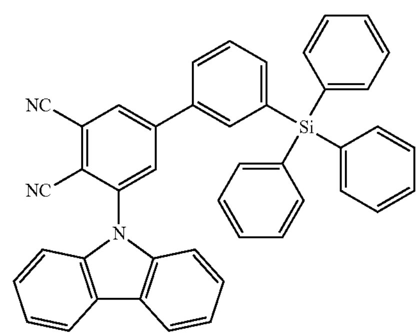
151
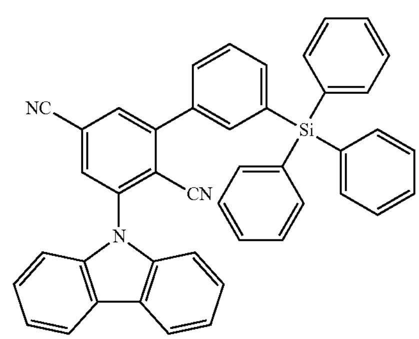

-continued
152
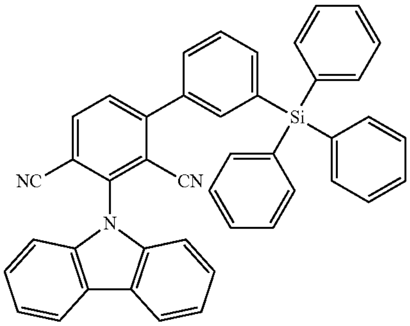
153
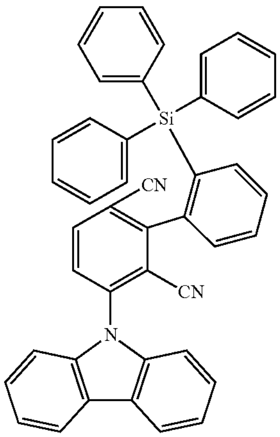
154
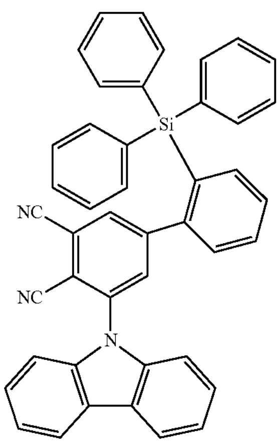
155
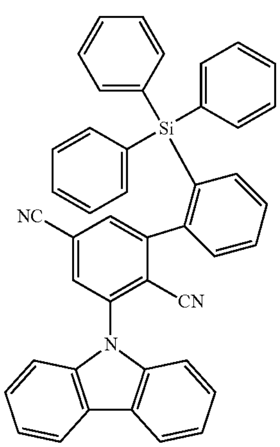
-continued
156
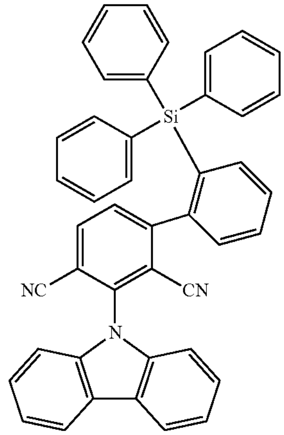
157
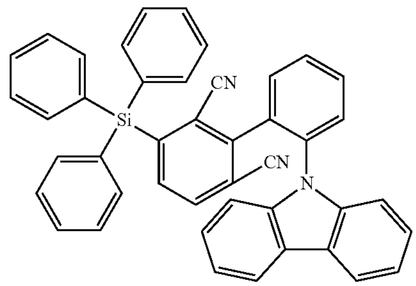
158
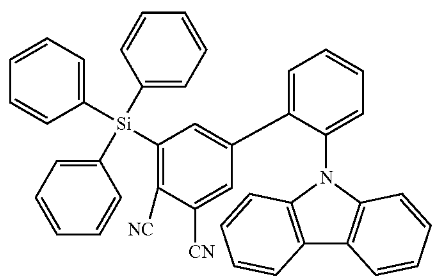
159
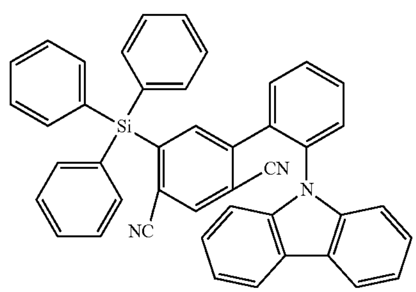
160
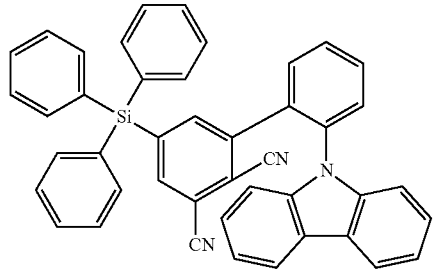

-continued
161
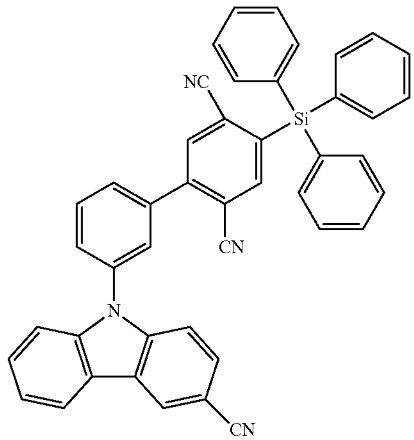
162
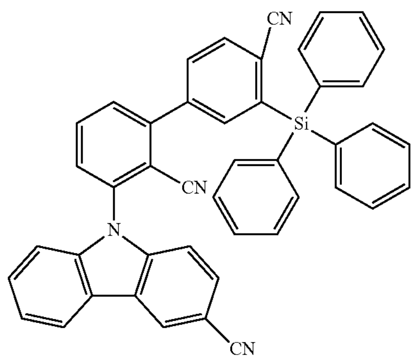
163
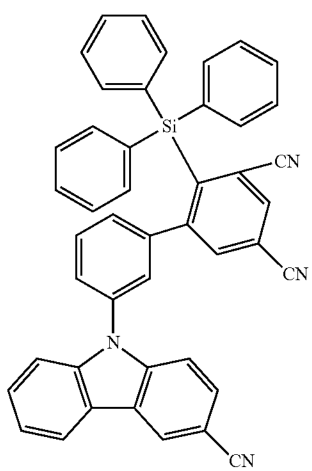
164
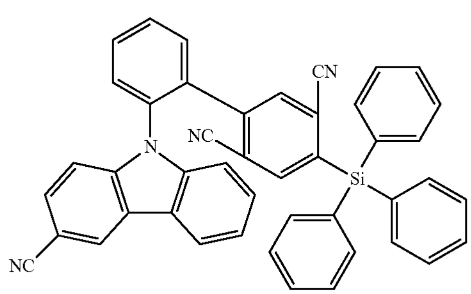
-continued
165
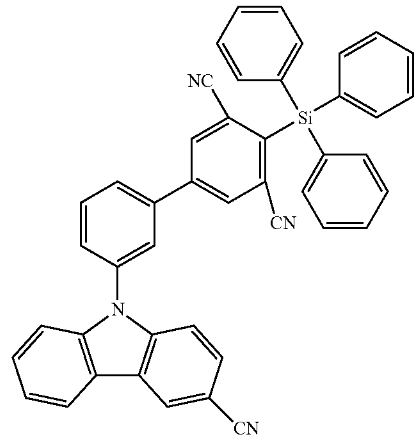
166
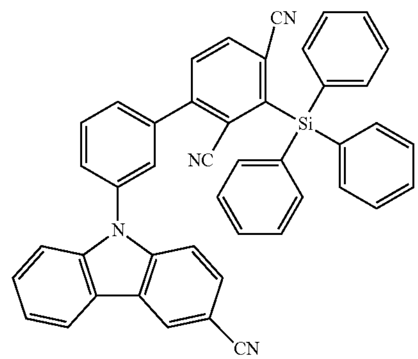
167
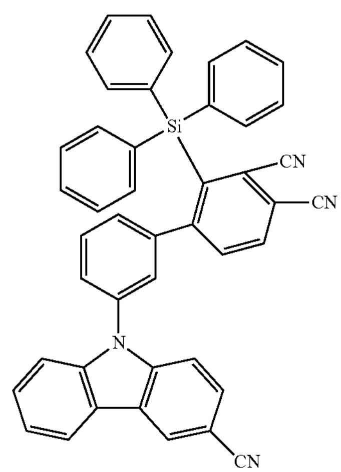
168
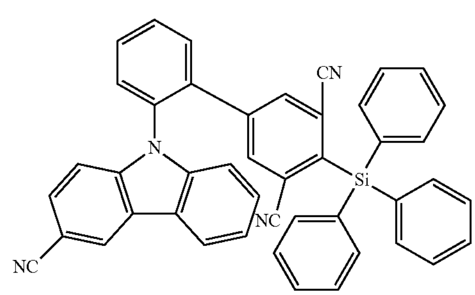

169
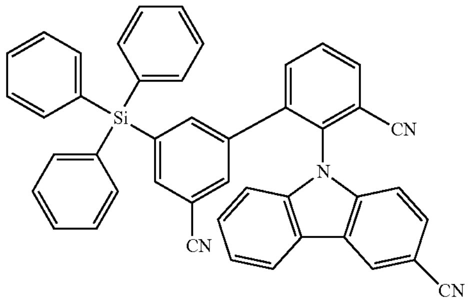
170
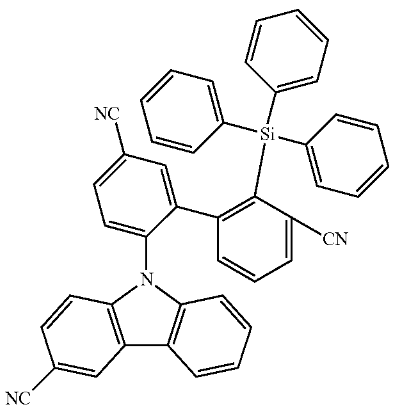
171
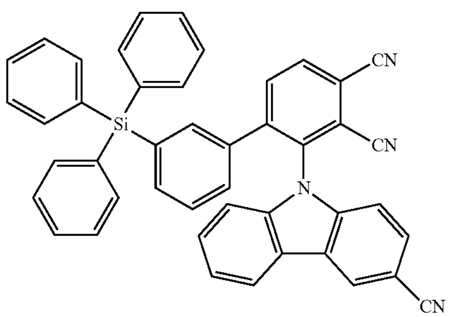
172
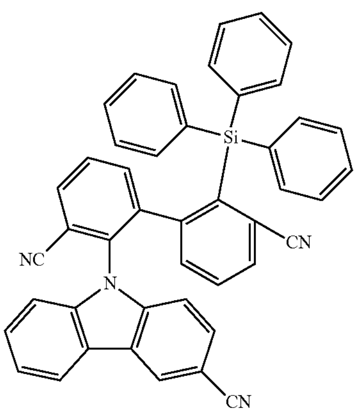
173
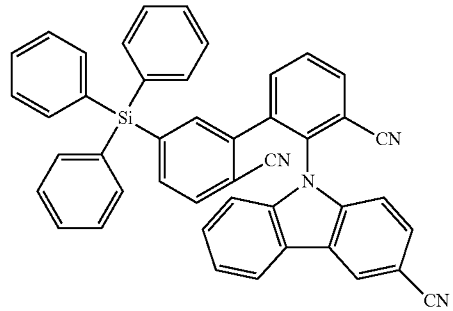
174
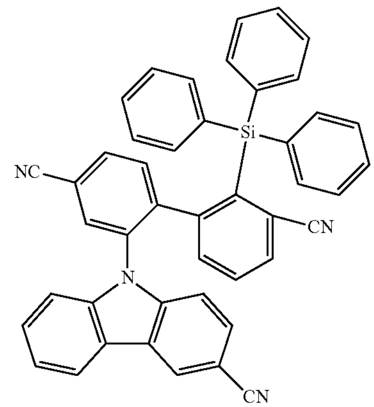
175
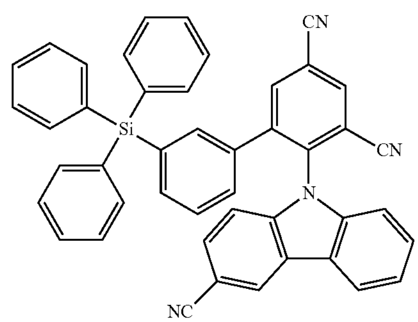
176
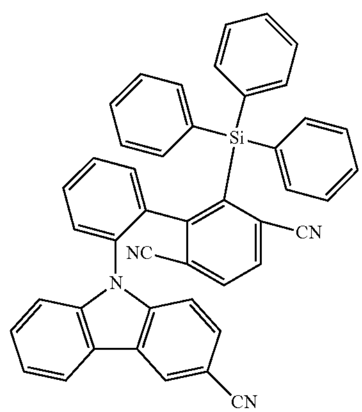

-continued
177
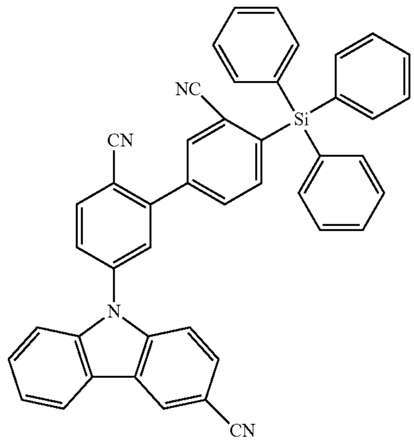
178
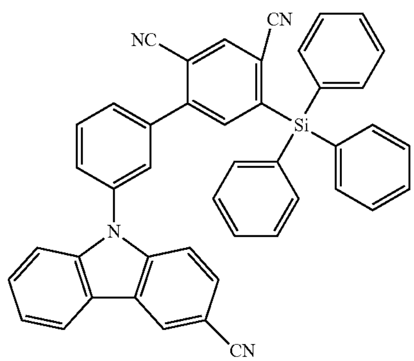
179
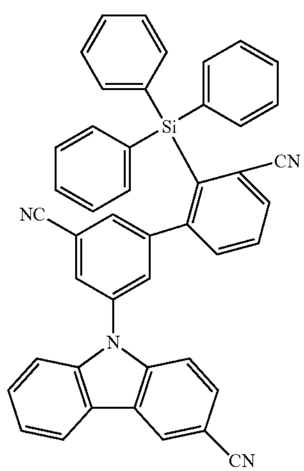
180
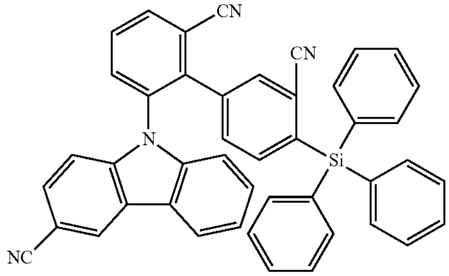
-continued
181
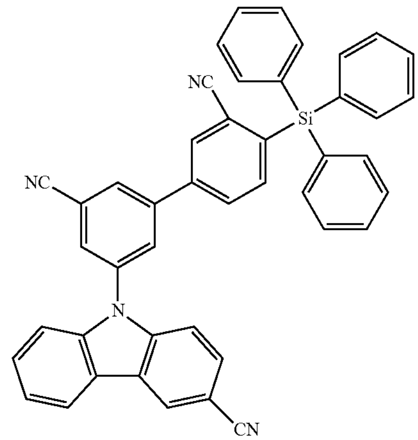
182
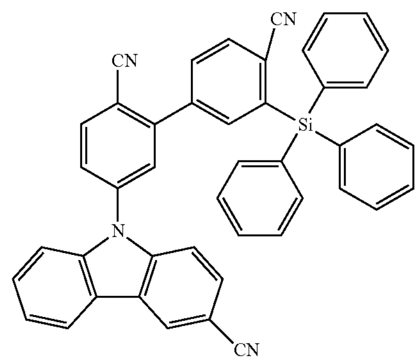
183
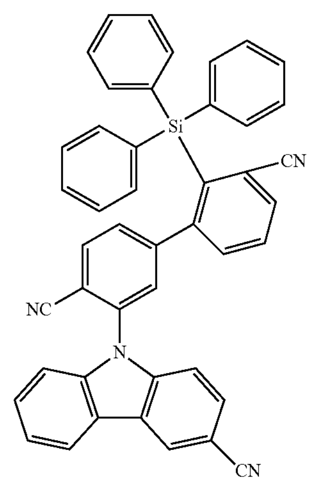
184
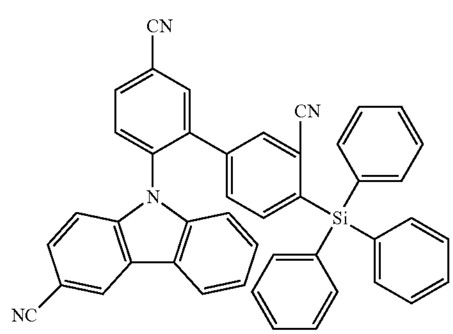

-continued
185
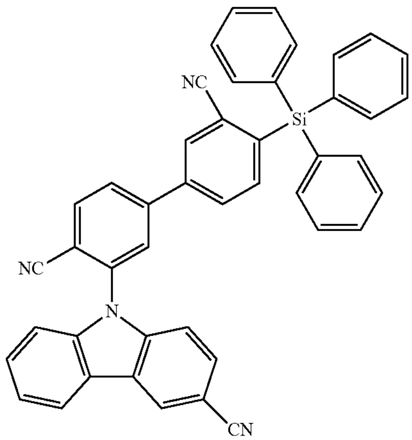
186
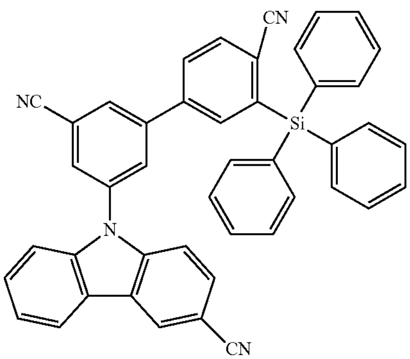
187
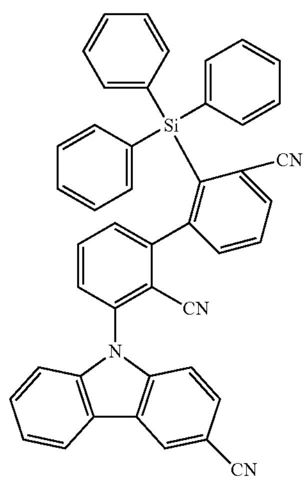
188
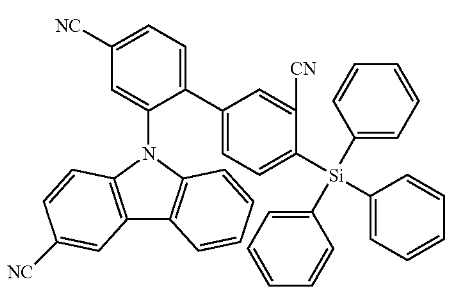
-continued
189
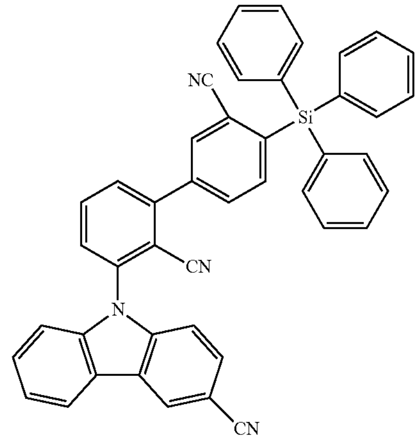
190
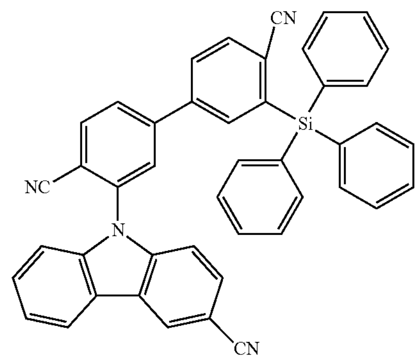
191
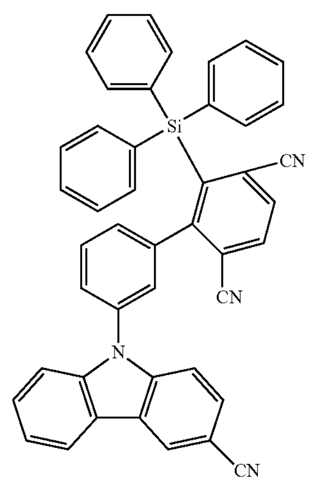
192
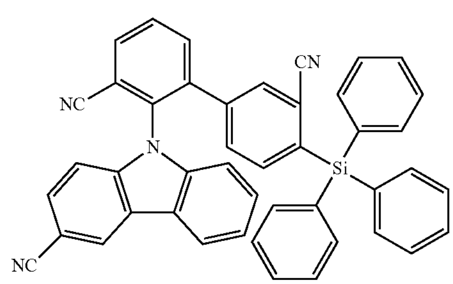

193
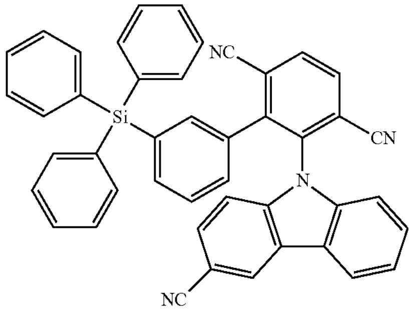
194
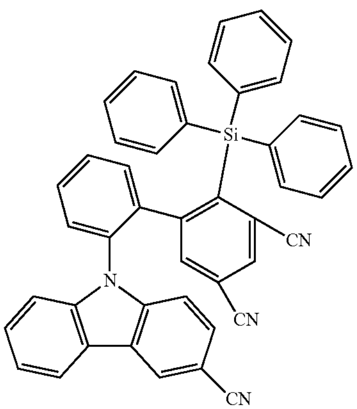
195
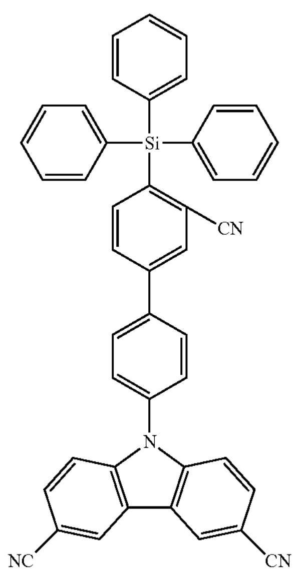
196
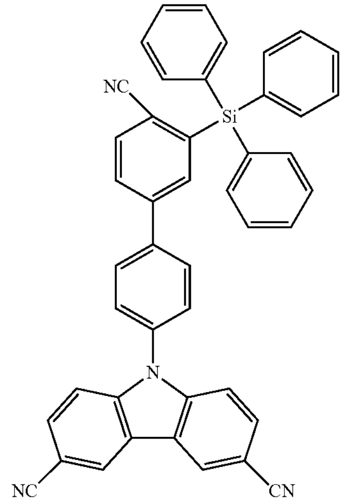
197
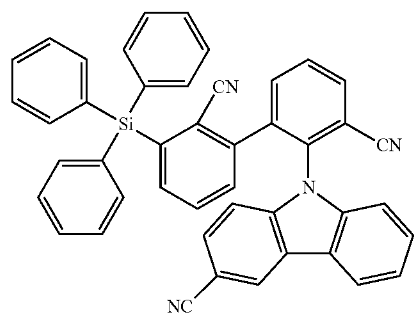
198
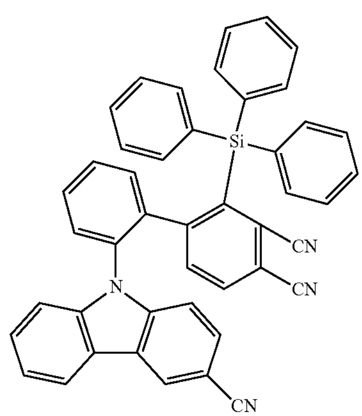

-continued
199
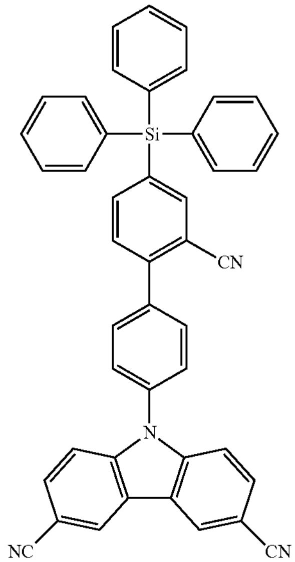
200
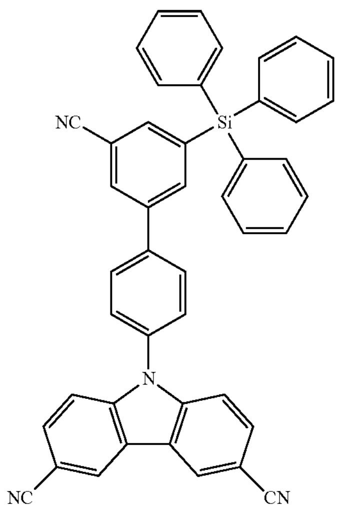
201
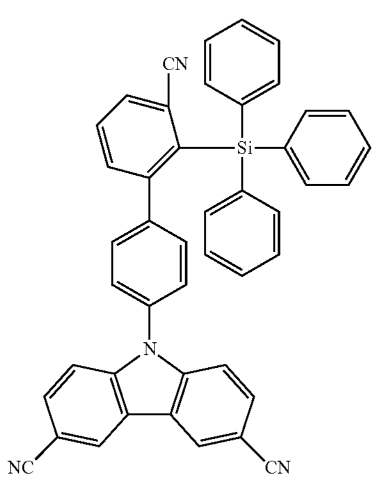
-continued
202
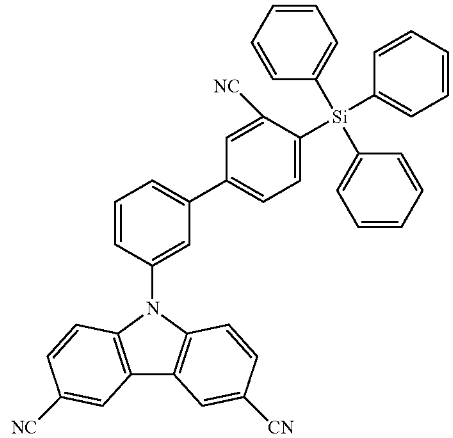
203
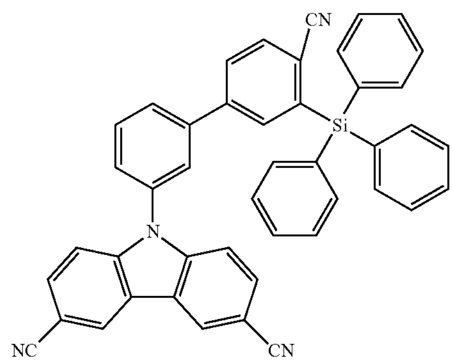
204
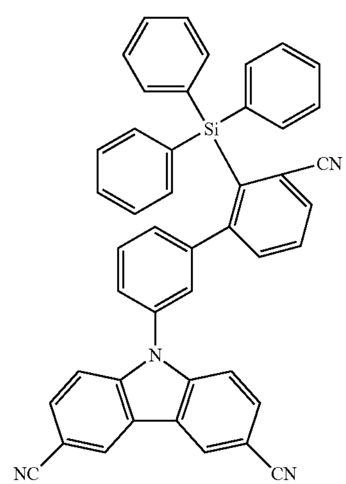

-continued
205
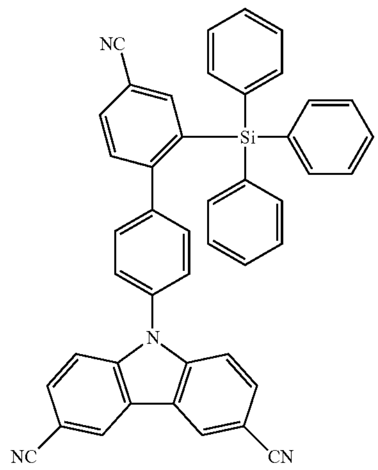
206
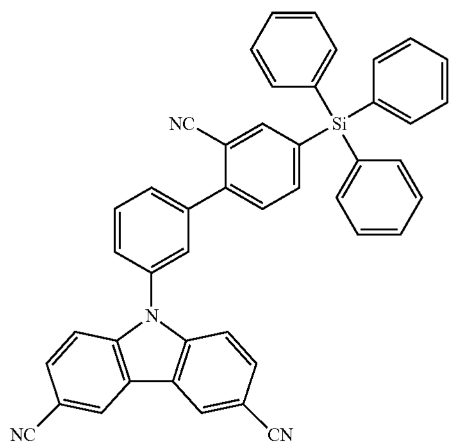
207
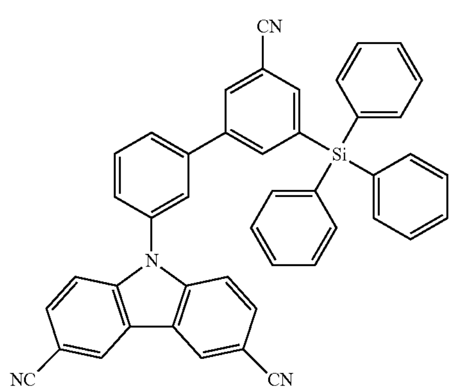
-continued
208
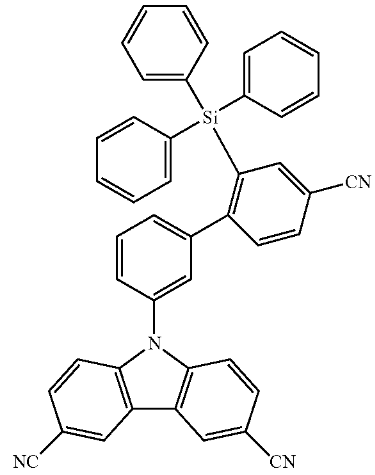
209
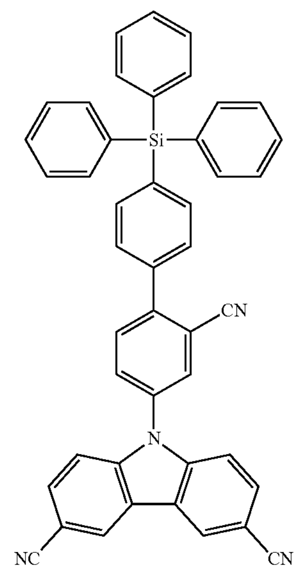
210
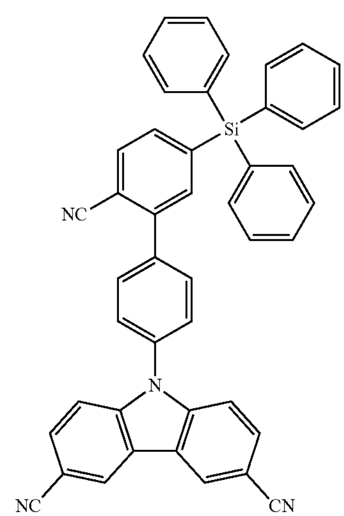

-continued
211
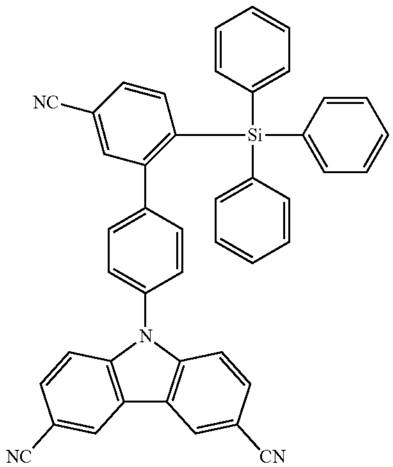
212
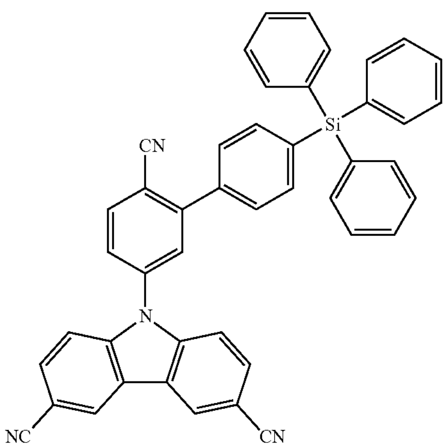
213
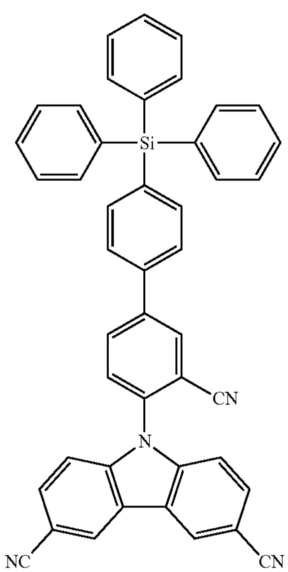
-continued
214
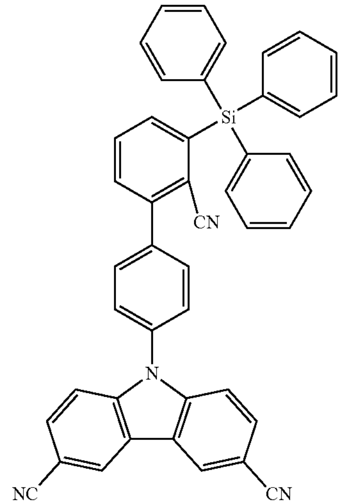
215
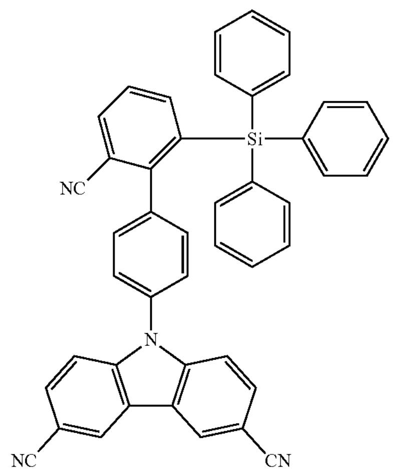
216
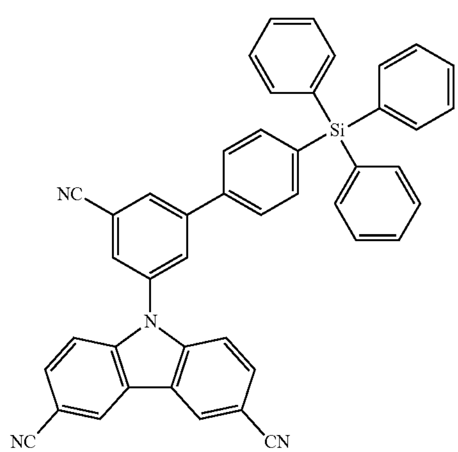

-continued
217
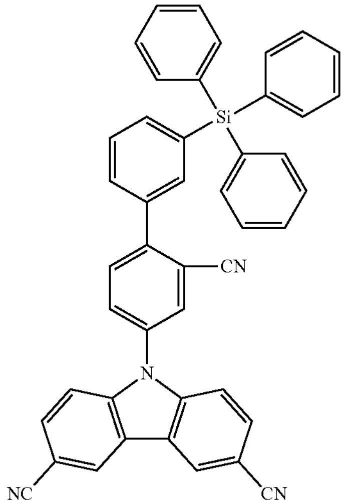
218
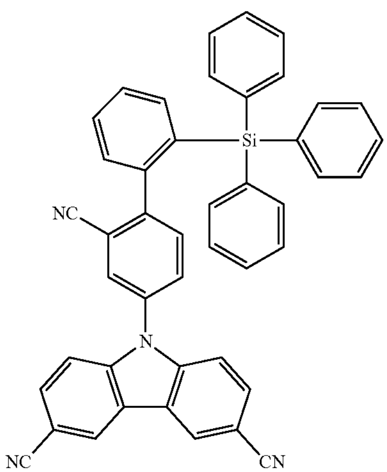
219
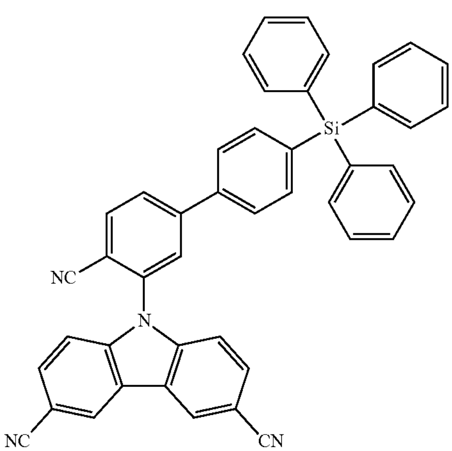
-continued
220
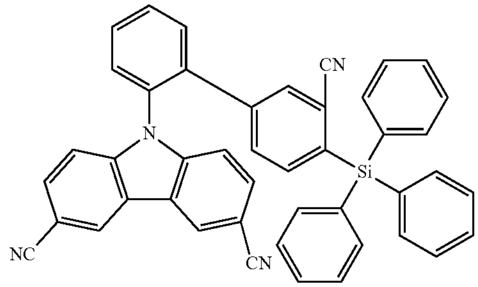
221
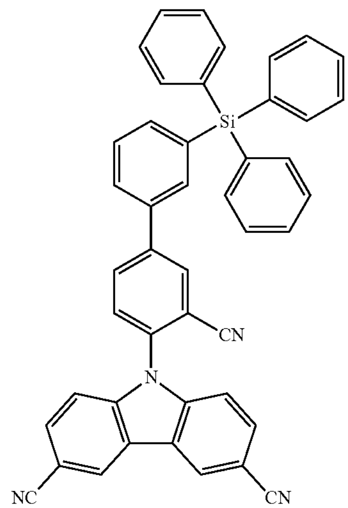
222
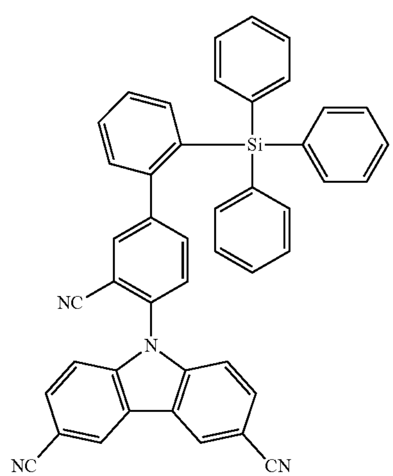

223
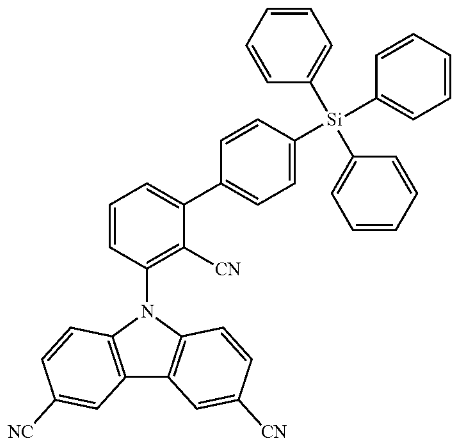
224
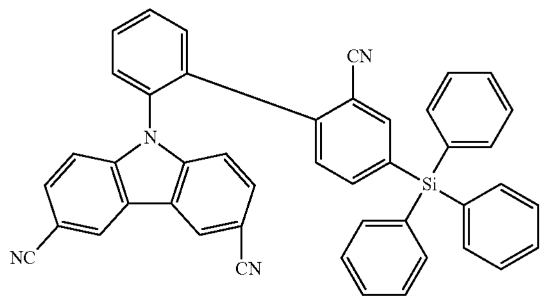
225
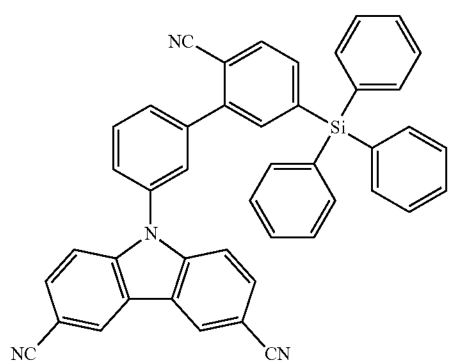
226
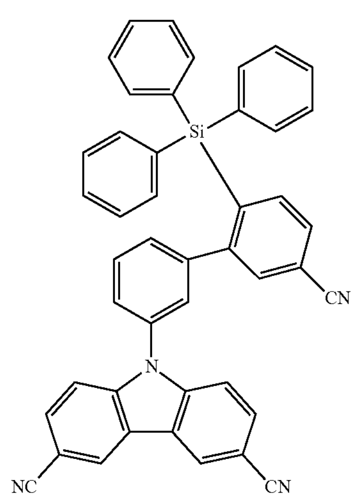
227
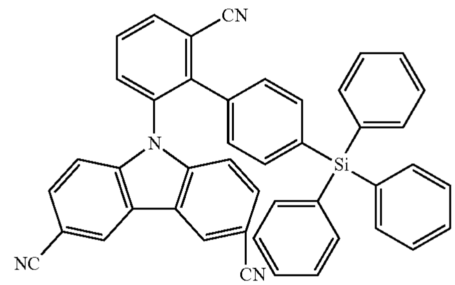
228
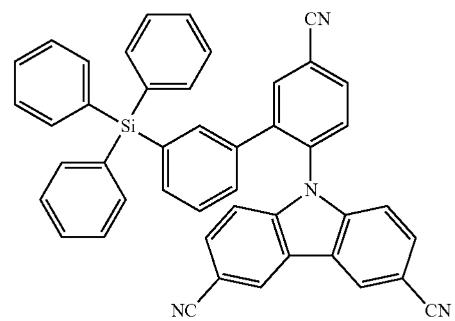
229
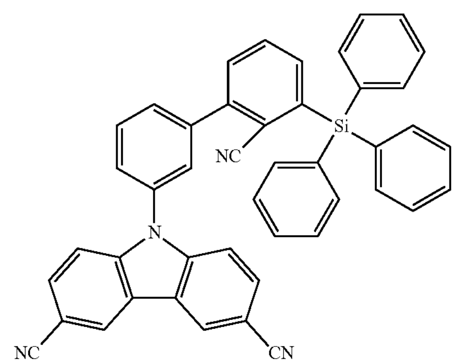
230
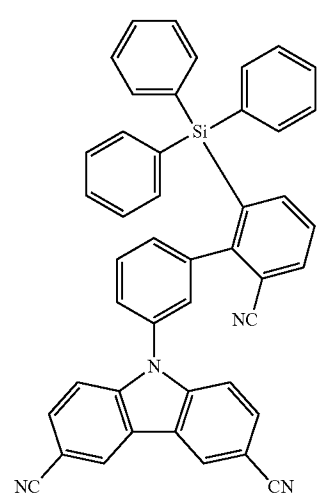

-continued
231
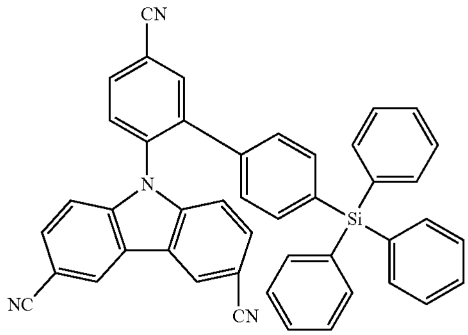
232
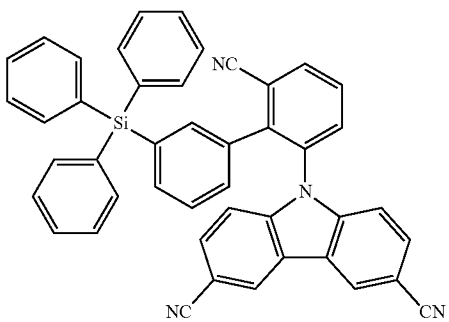
233
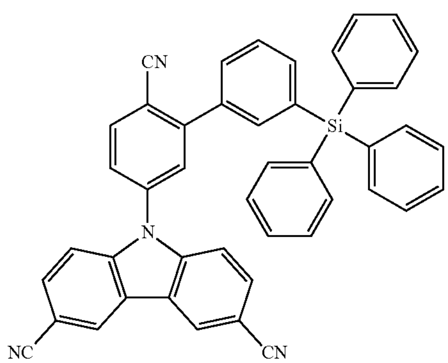
234
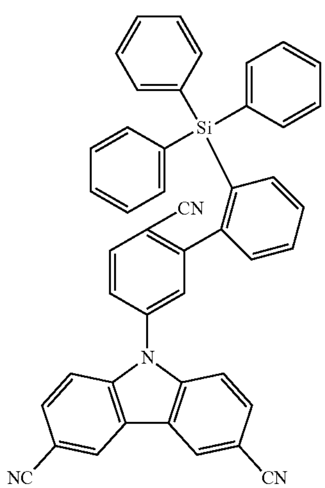
-continued
235
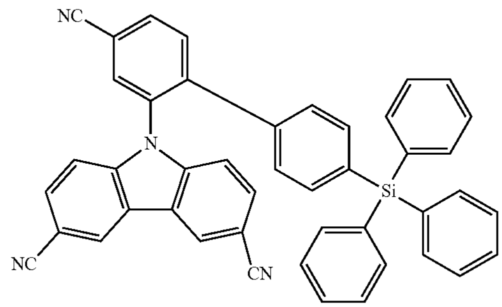
236
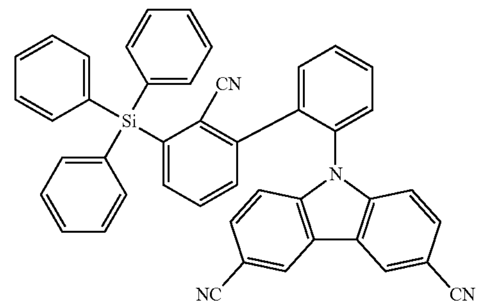
237
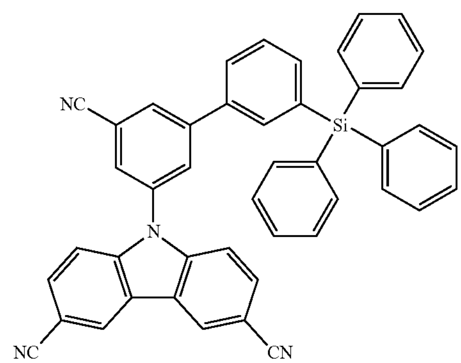
238
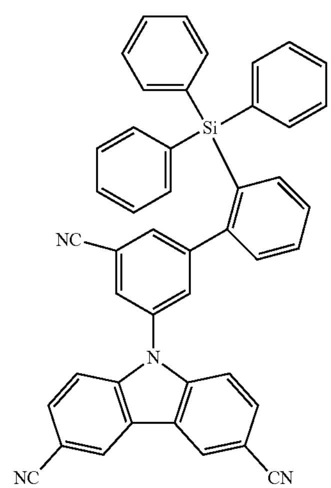

-continued
239
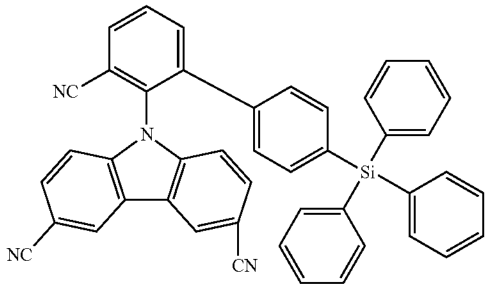
240
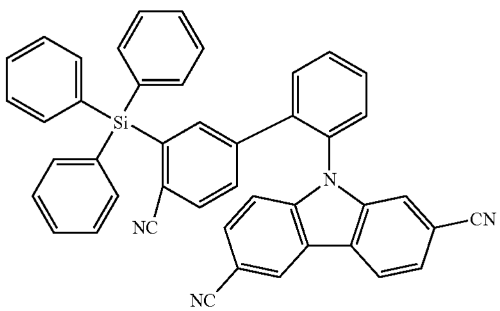
241
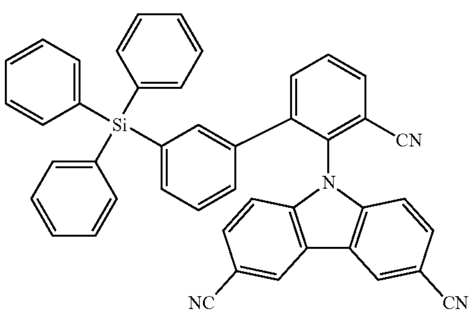
242
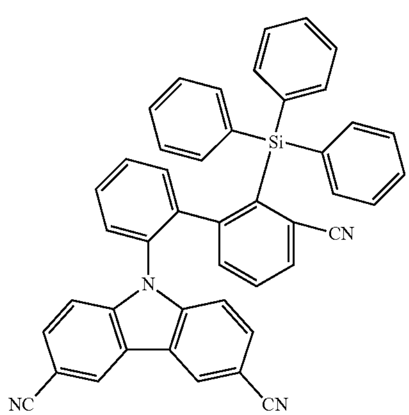
-continued
243
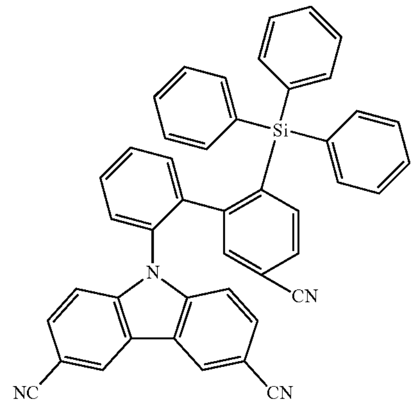
244
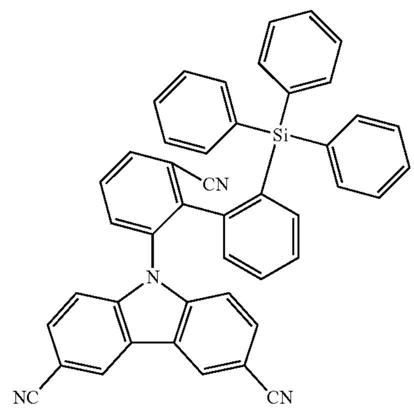
245
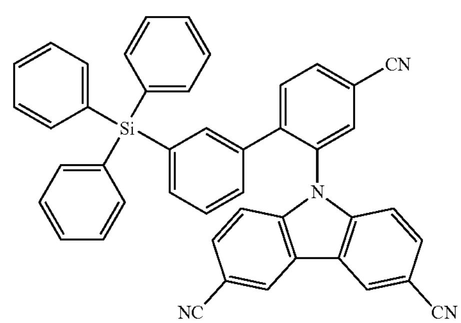
246
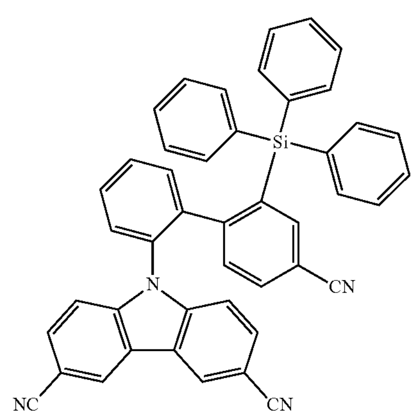

247
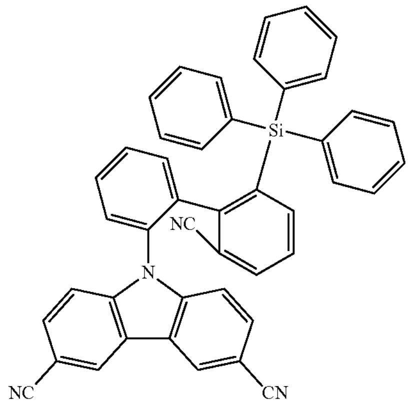
248
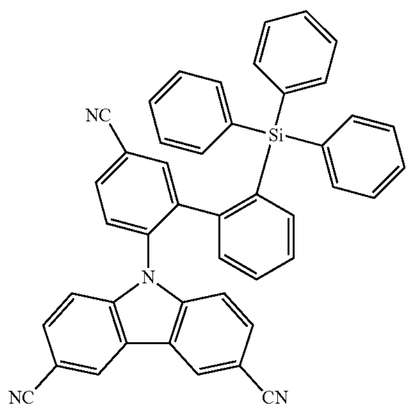
249
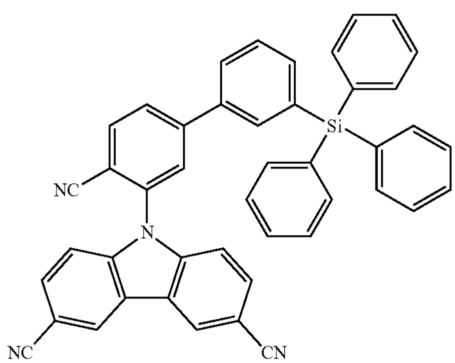
250
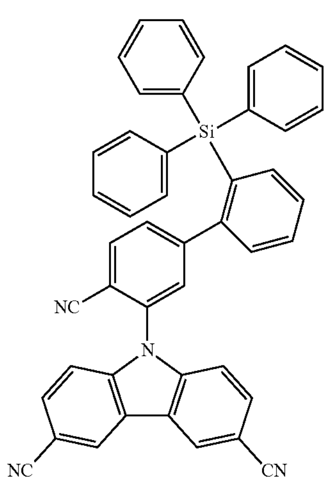
251
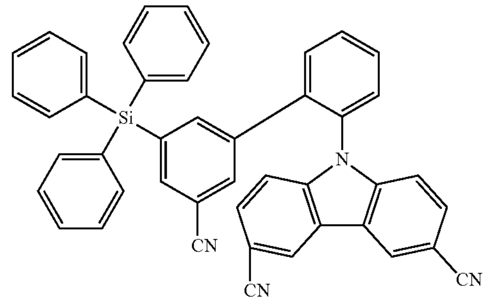
252
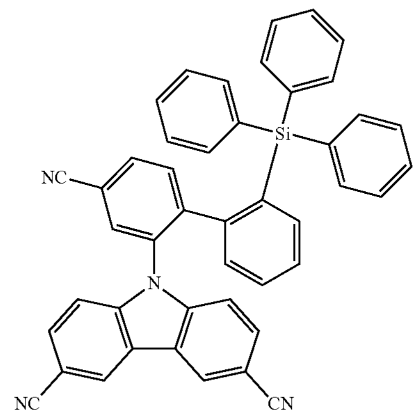
253
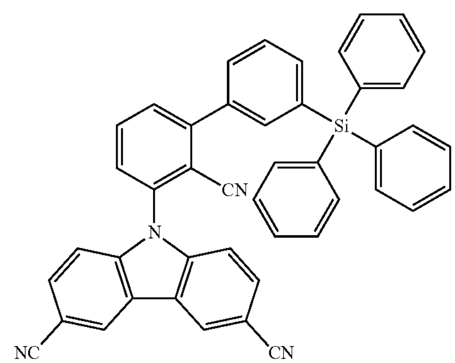
254
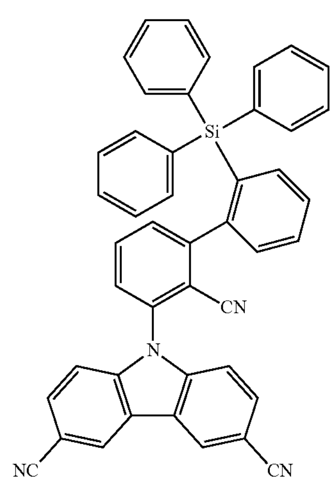

-continued
255
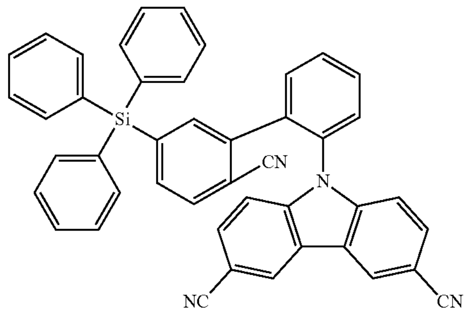
256
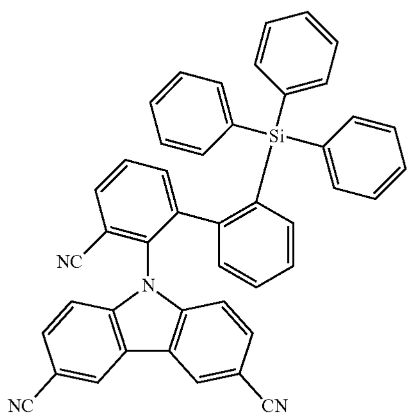
257
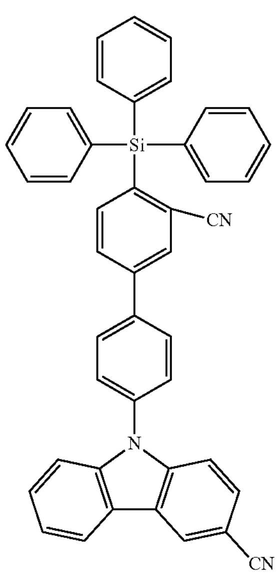
-continued
258
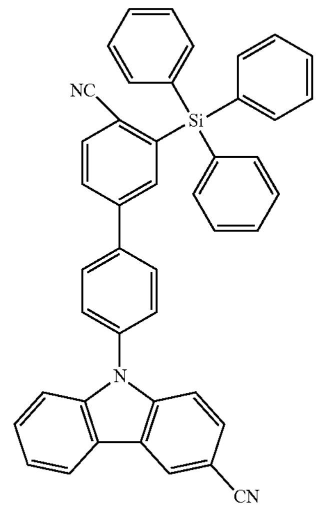
259
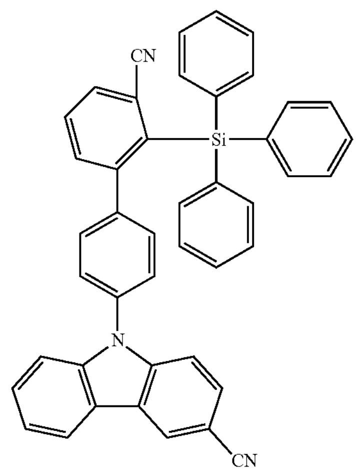
260
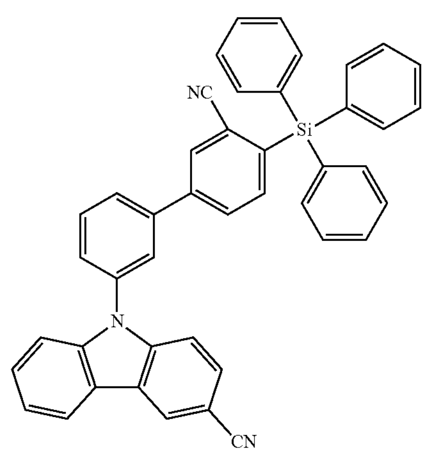

261
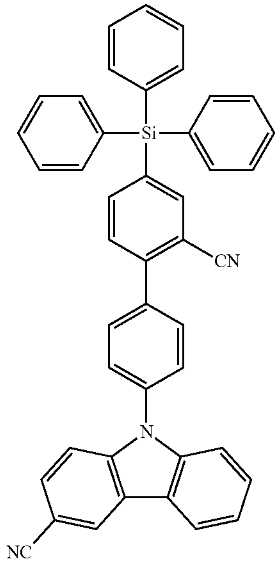
262
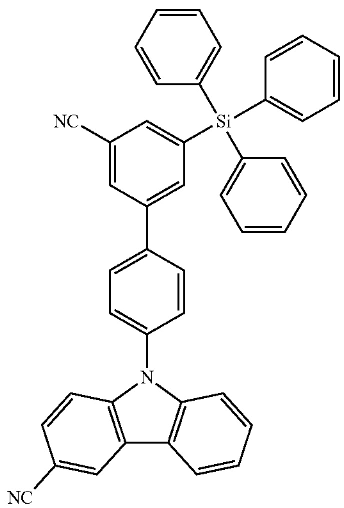
263
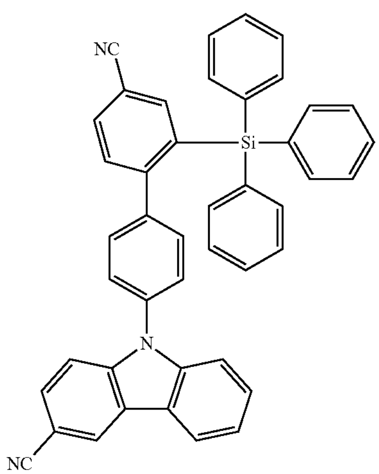
264
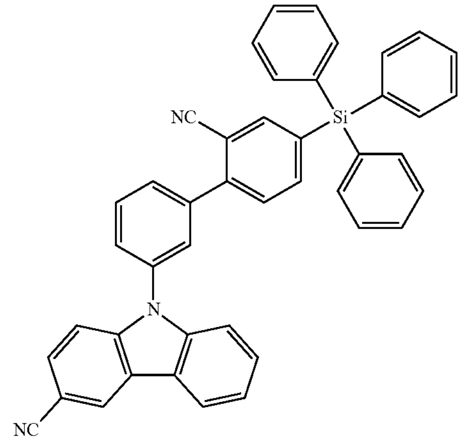
265
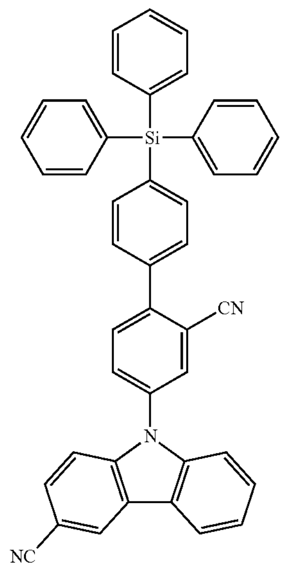
266
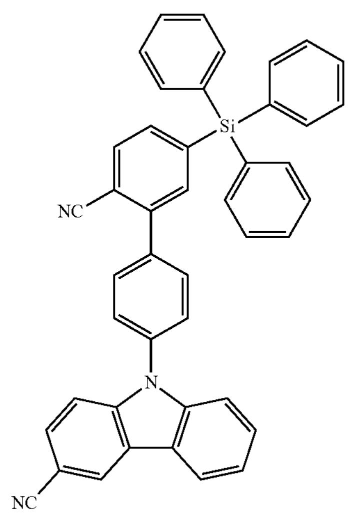

-continued
267
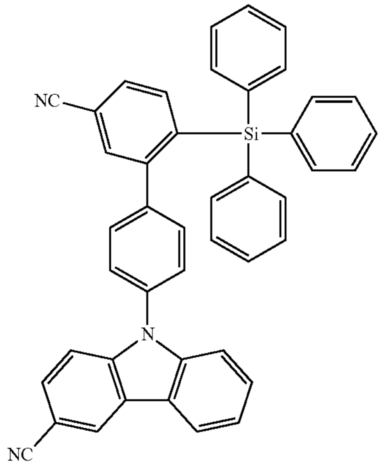
268
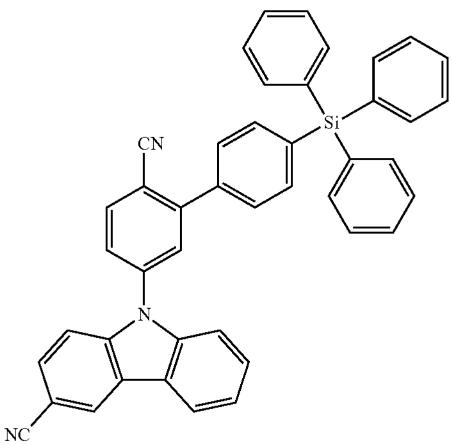
269
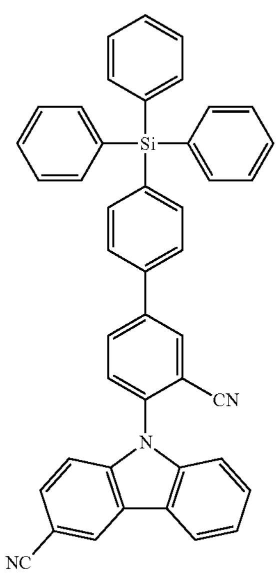
-continued
270
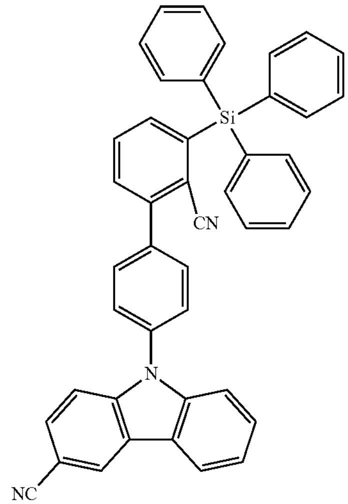
271
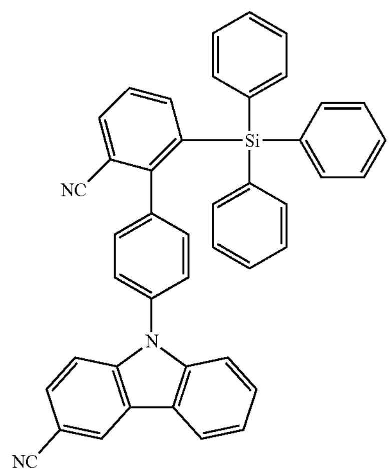
272
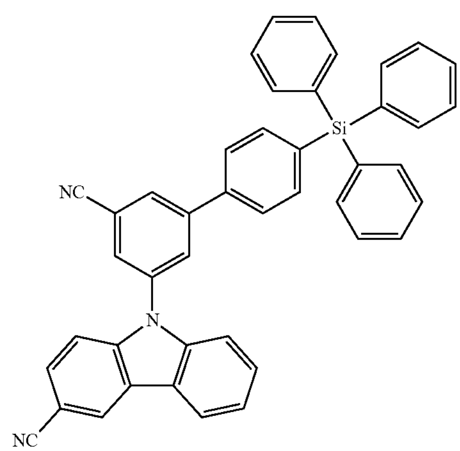

273
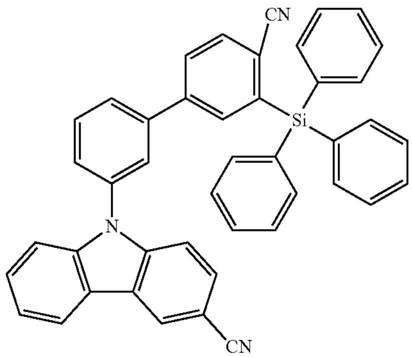
274
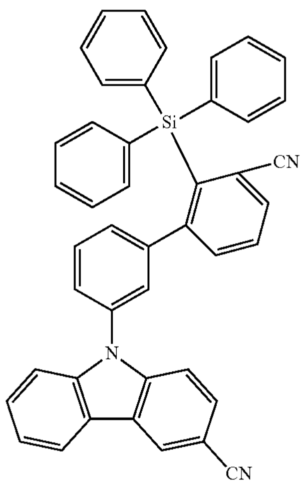
275
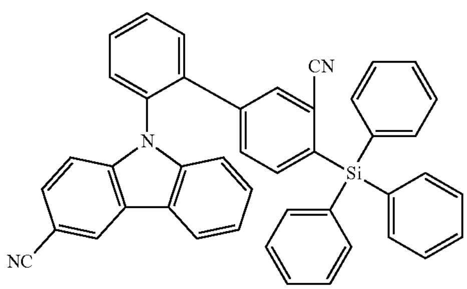
276
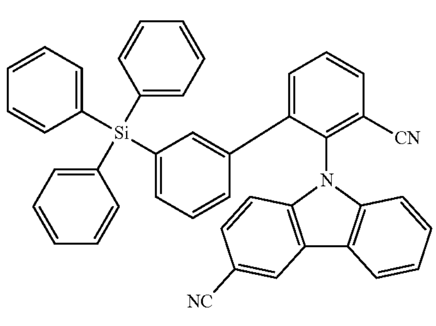
277
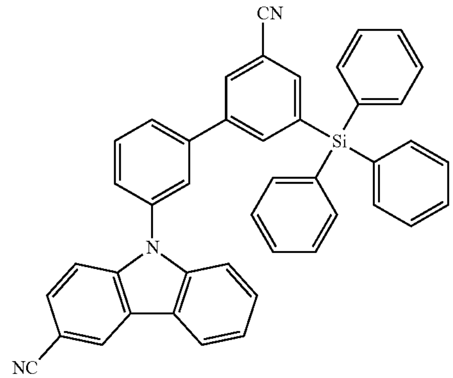
278
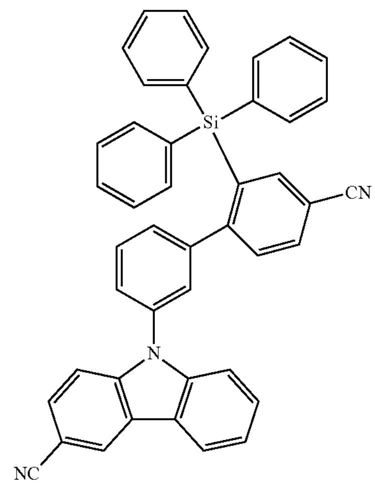
279
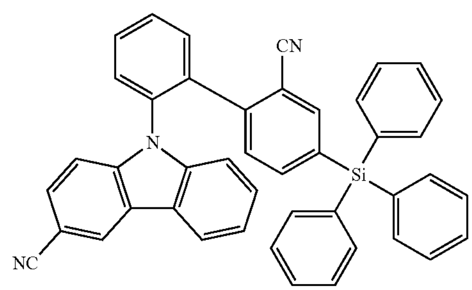
280
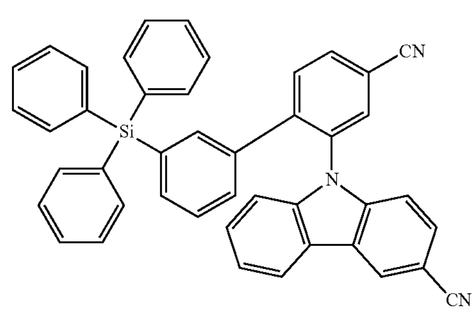

281
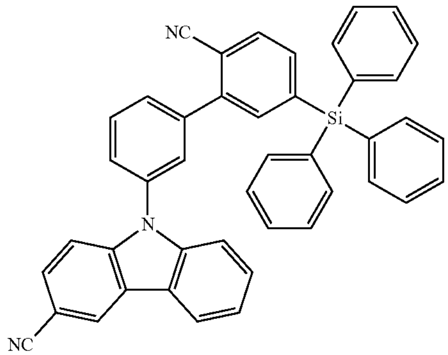
282
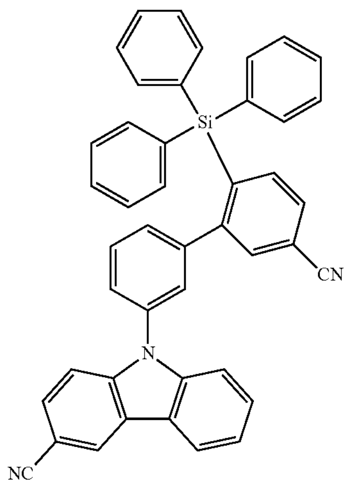
283
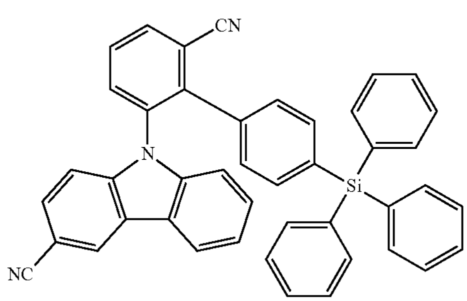
284
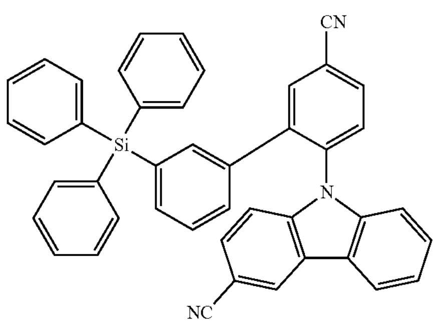
285
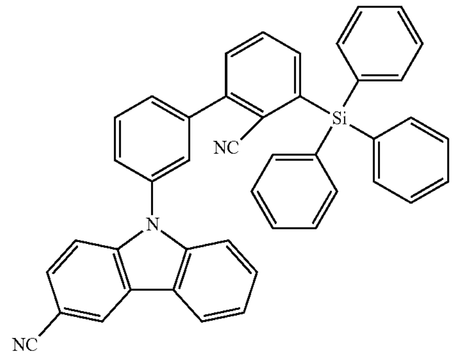
286
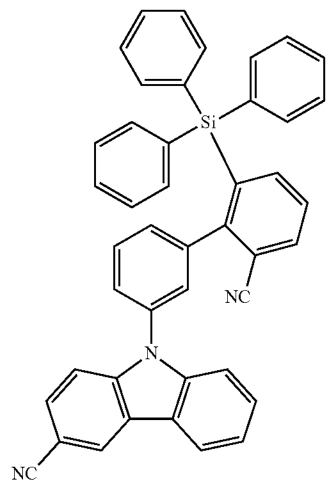
287
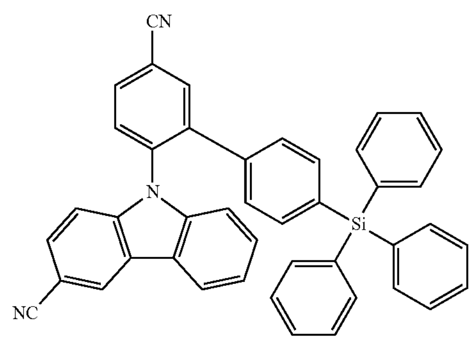
288
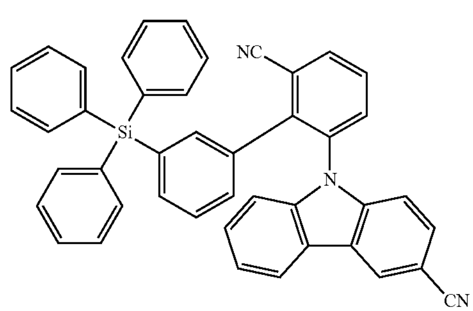

-continued
289
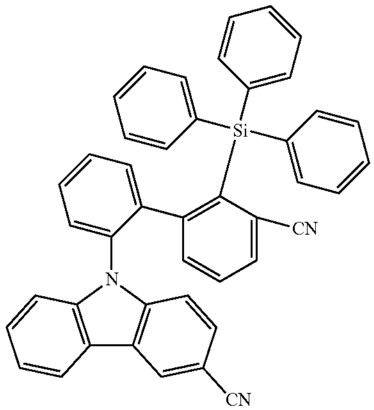
290
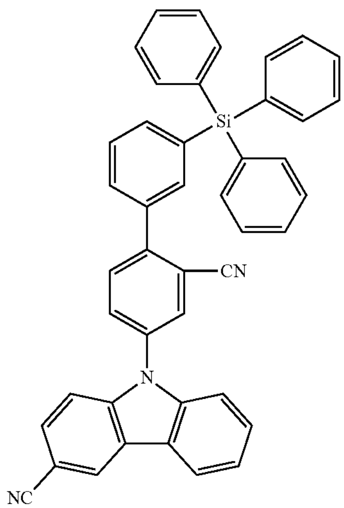
291
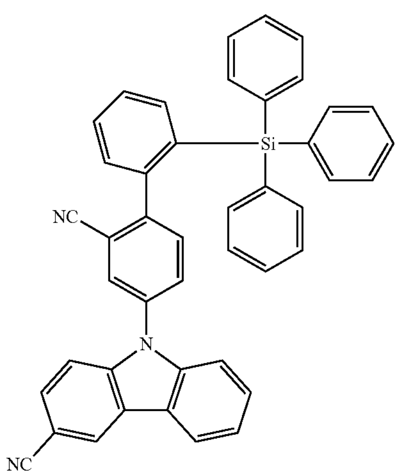
-continued
292
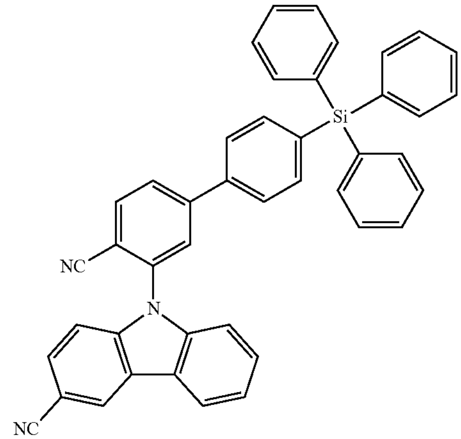
293
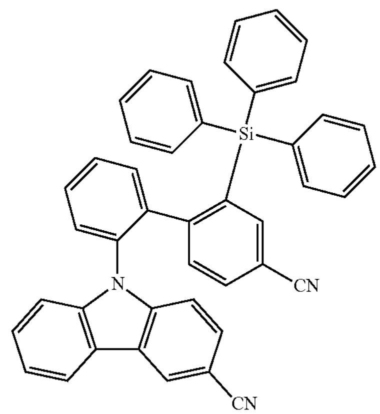
294
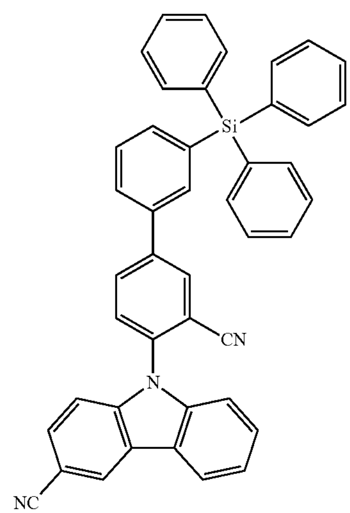

-continued
295
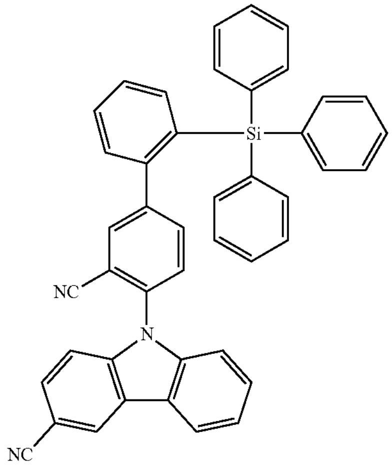
296
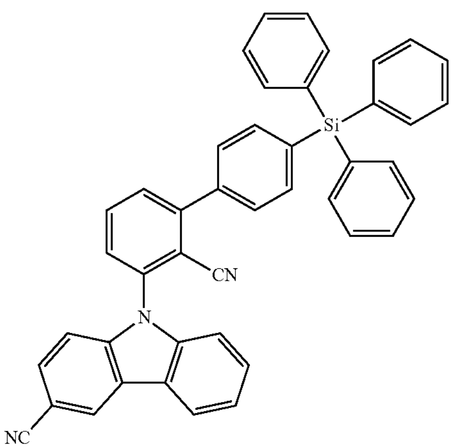
297
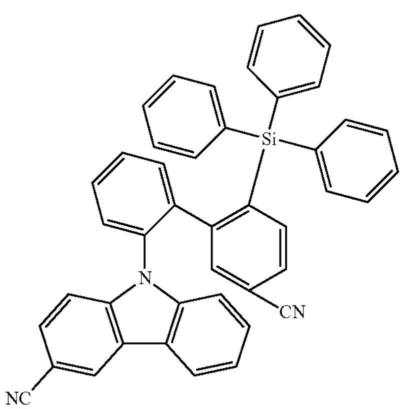
-continued
298
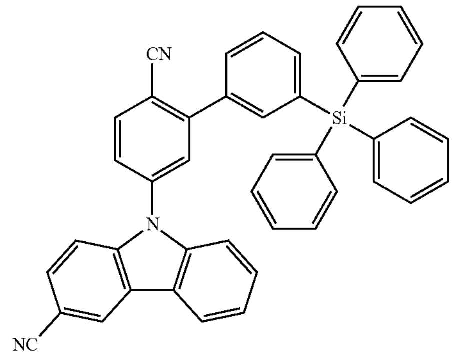
299
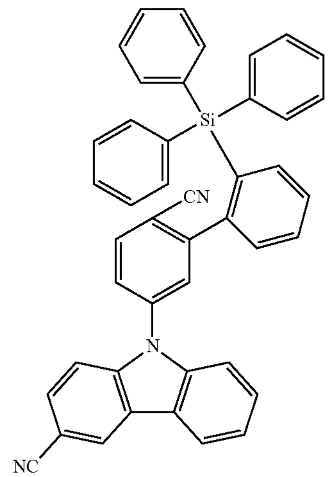
300
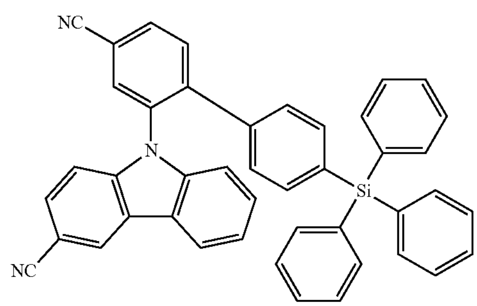
301
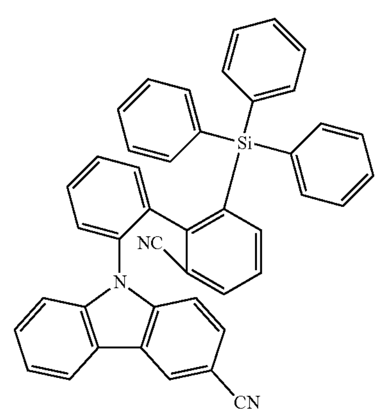

-continued
302
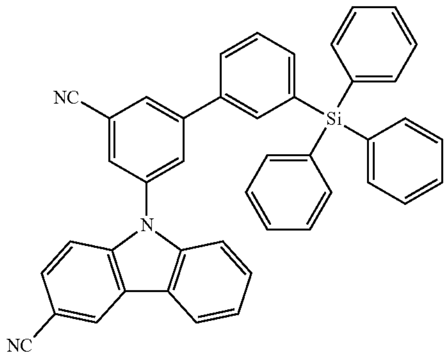
303
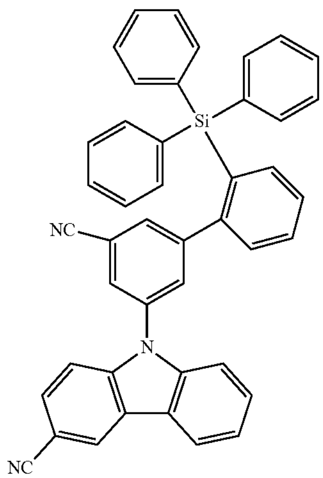
304
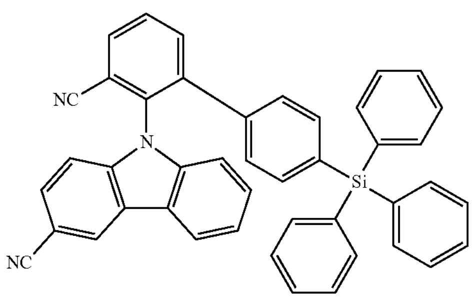
305
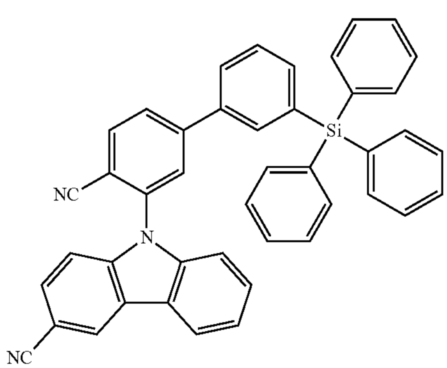
-continued
306
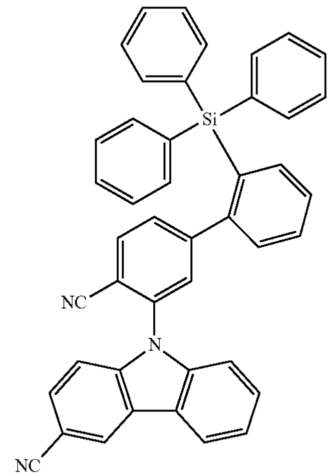
307
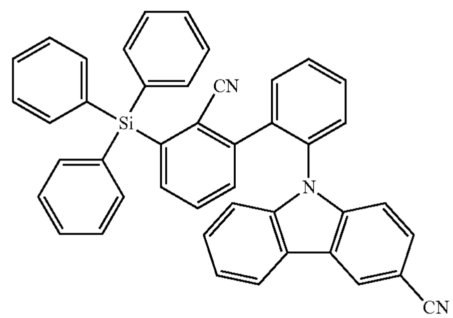
308
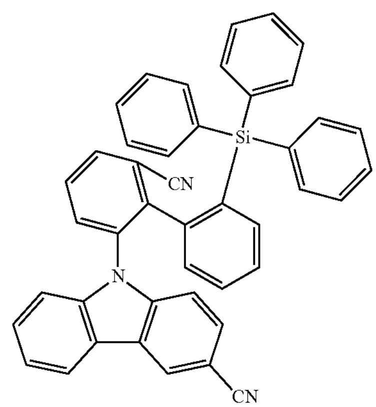
309
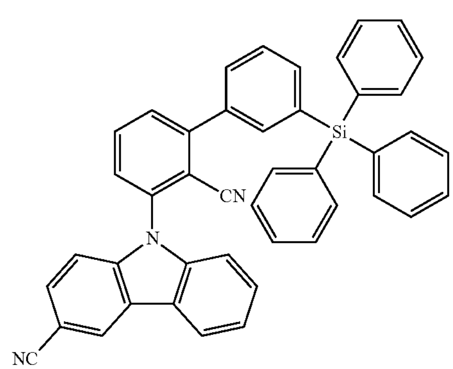

-continued
310
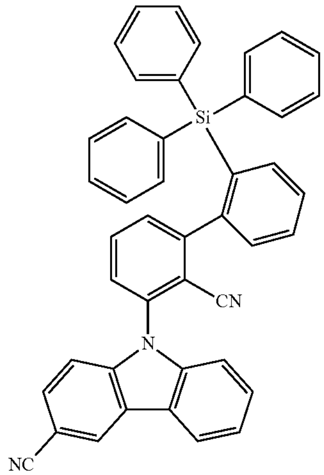
311
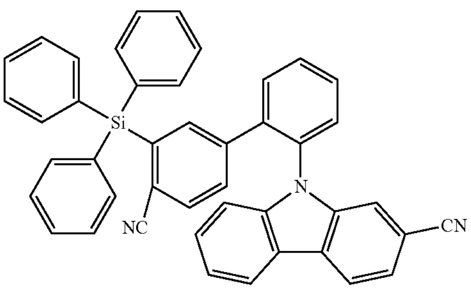
312
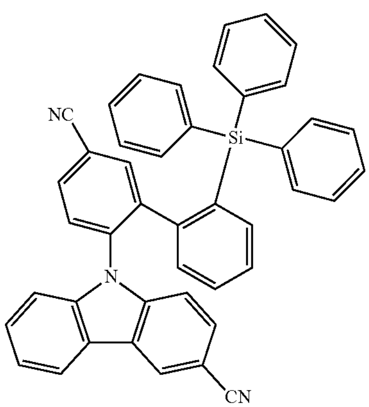
313
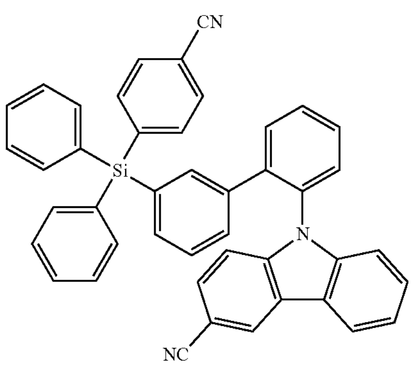
-continued
314
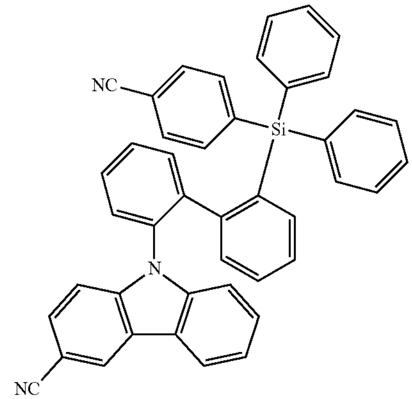
315
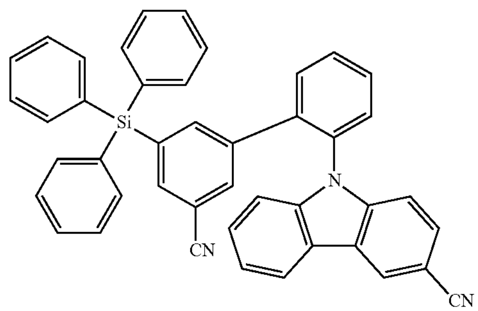
316
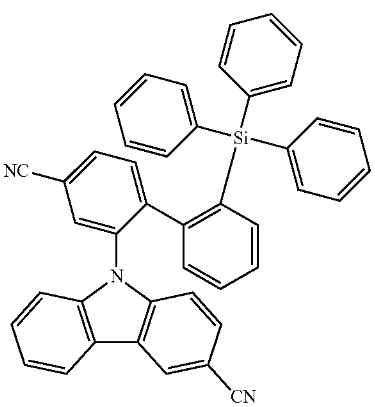
317
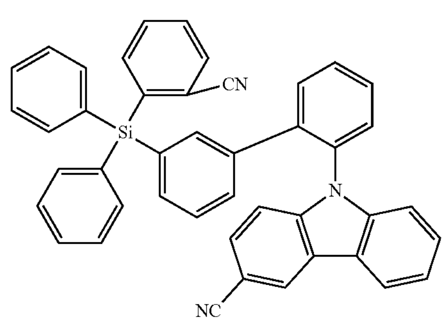

318
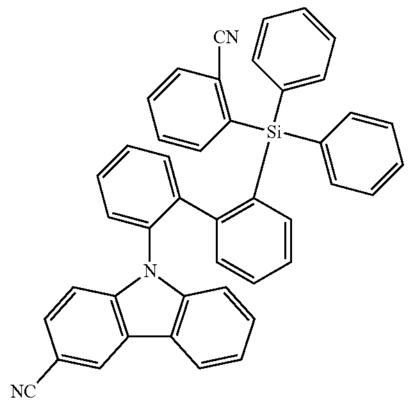
319
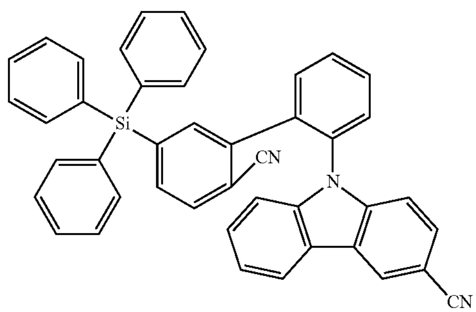
320
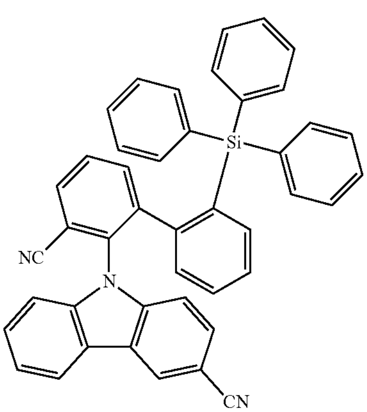
321
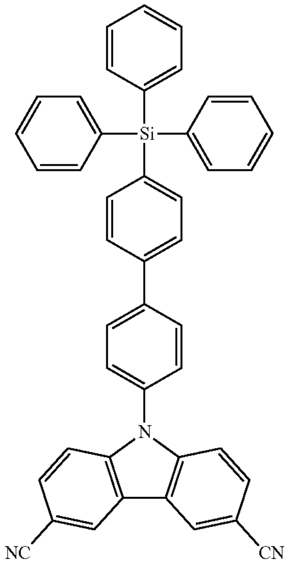
322
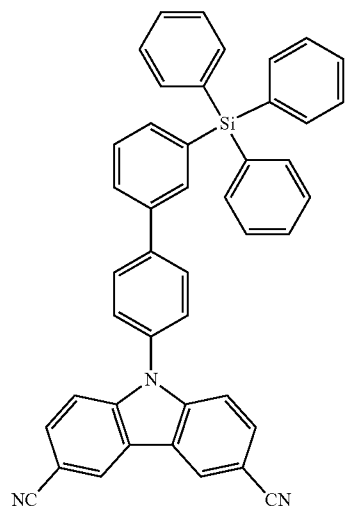
323
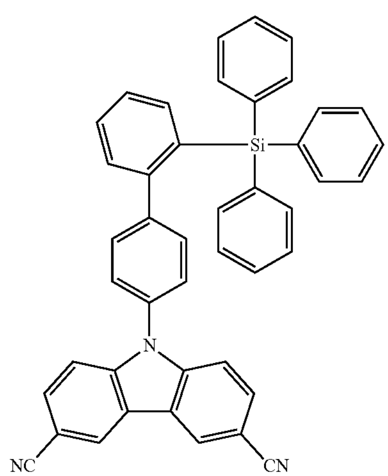

-continued
324
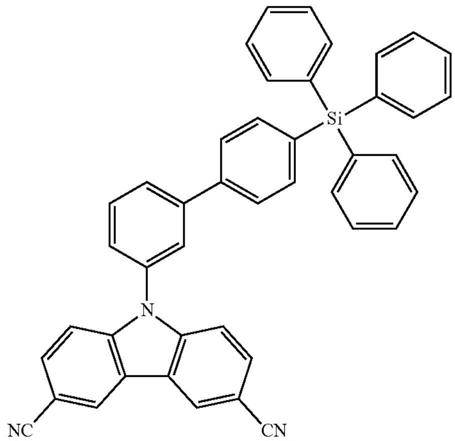
325
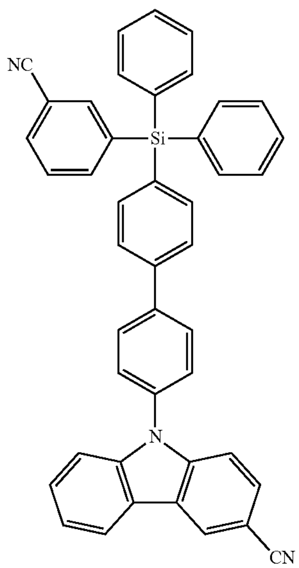
326
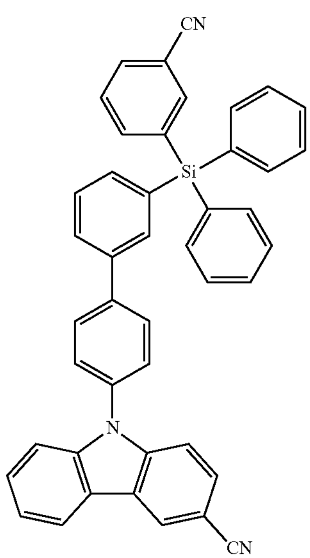
-continued
327
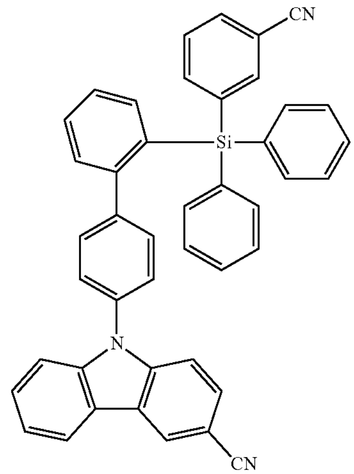
328
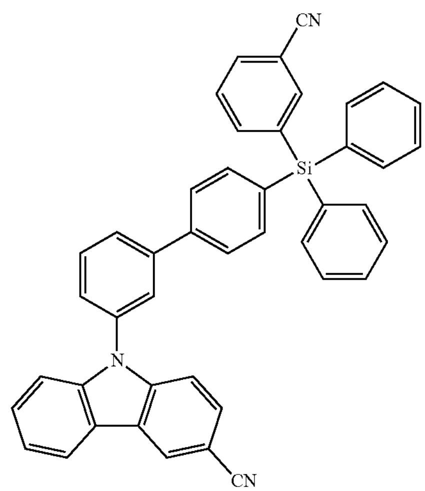
329
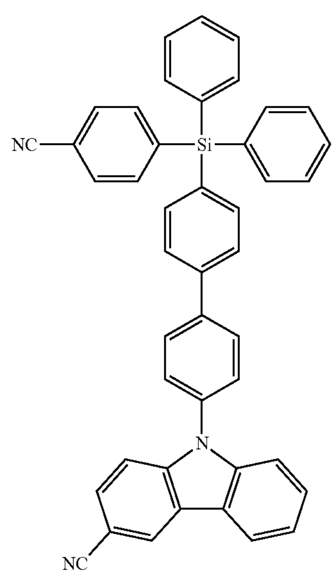

-continued
330
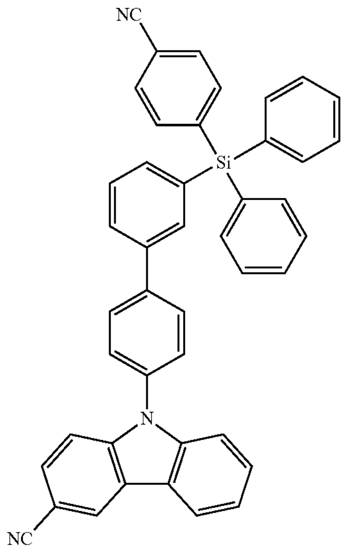
331
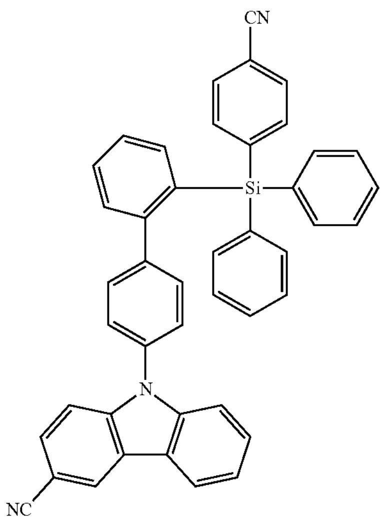
332
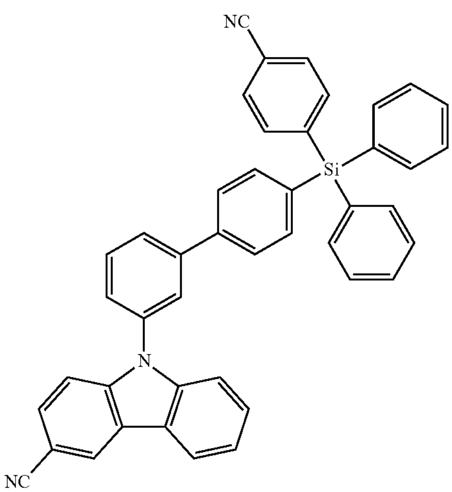
-continued
333
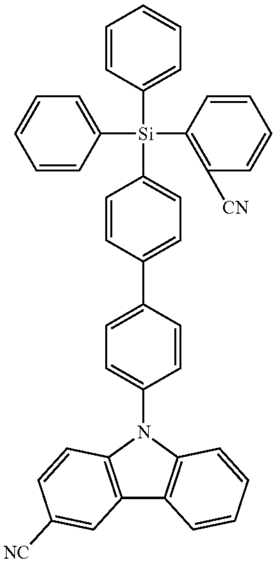
334
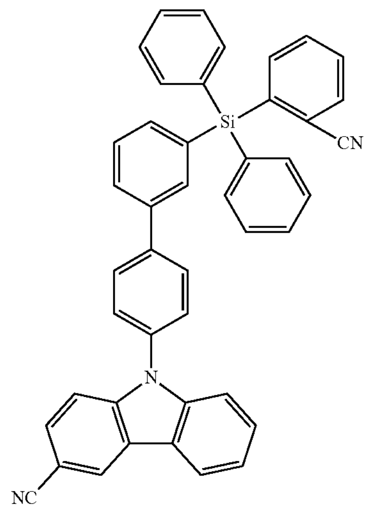
335
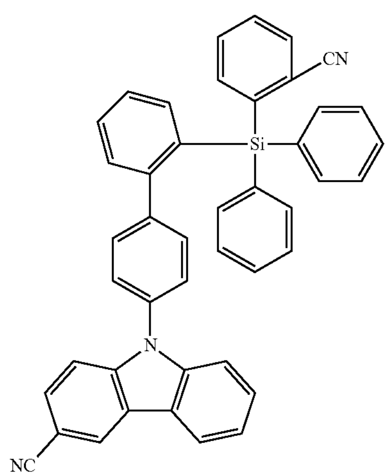

-continued
336
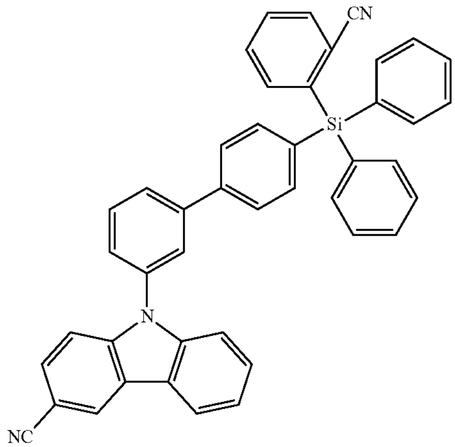
337
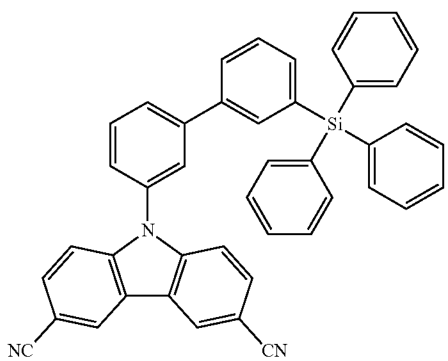
338
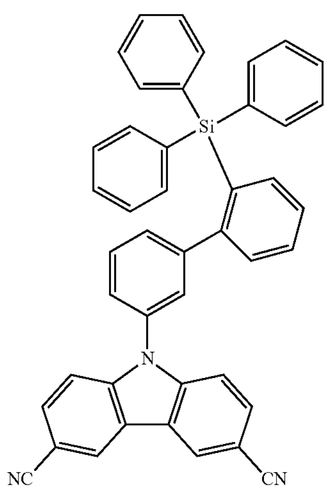
339
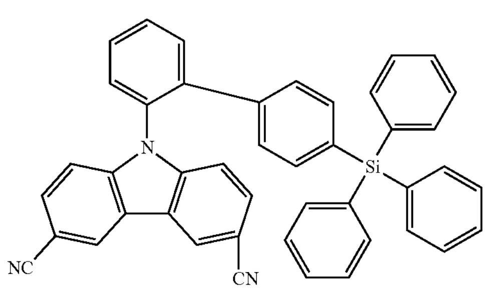
-continued
340
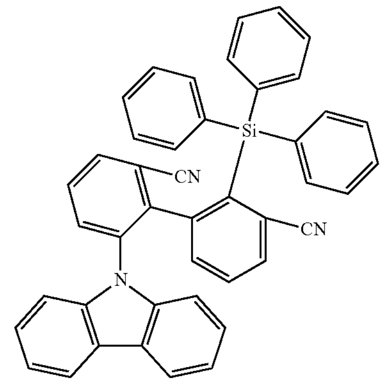
341
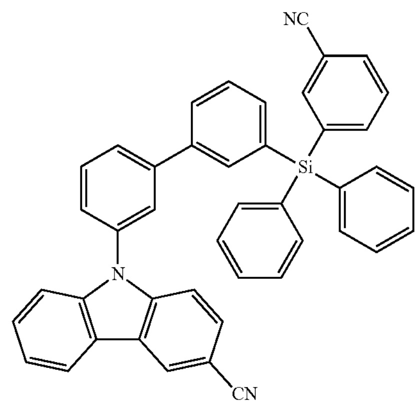
342
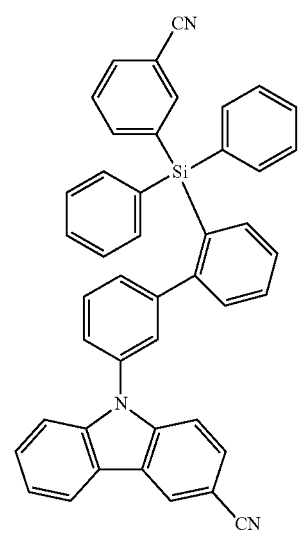
343
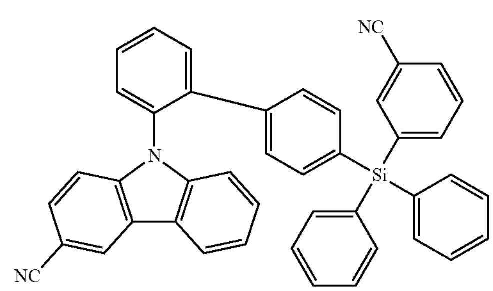

-continued
344
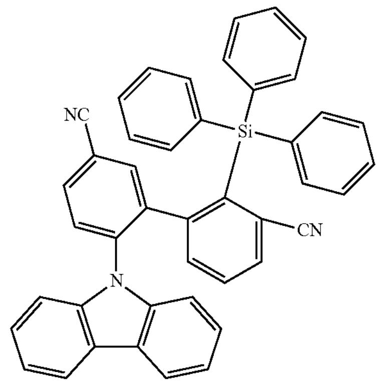
345
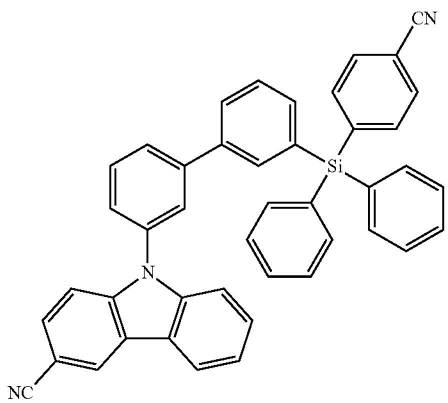
346
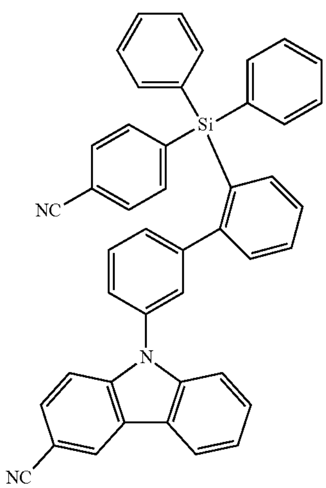
347
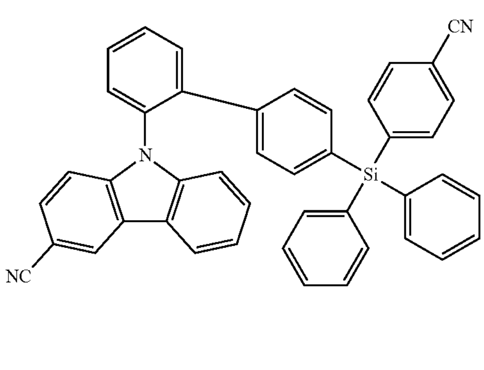
-continued
348
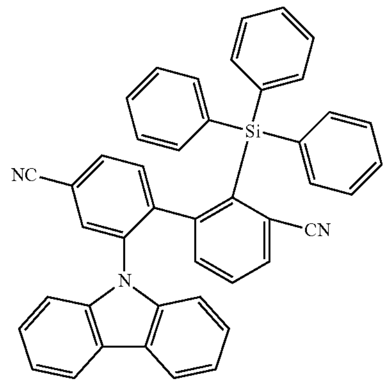
349
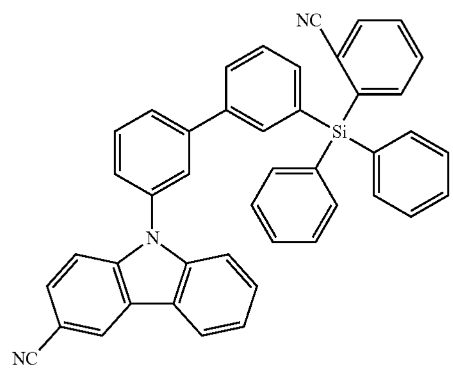
350
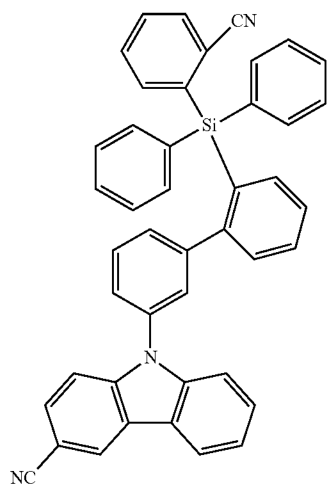
351
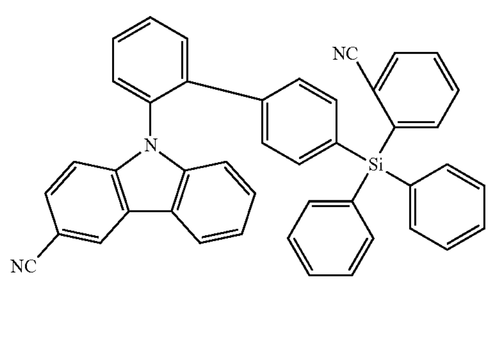

-continued
352
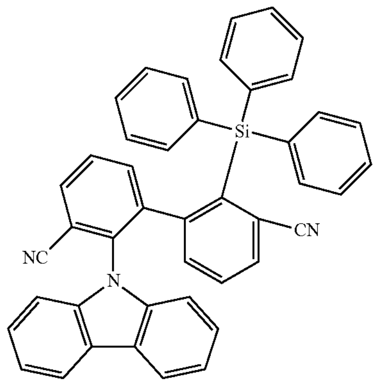
353
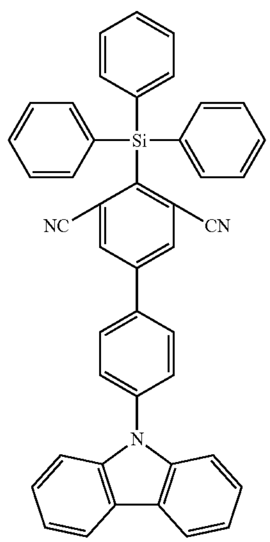
354
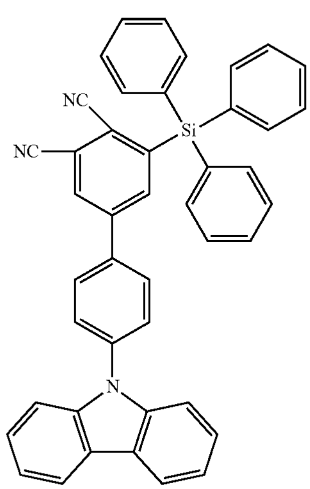
-continued
355
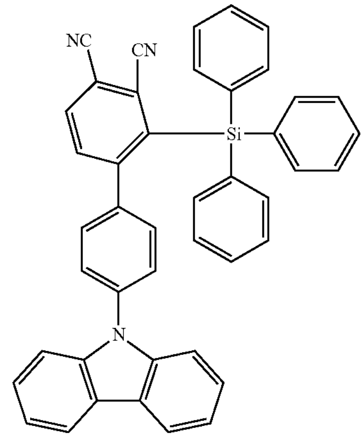
356
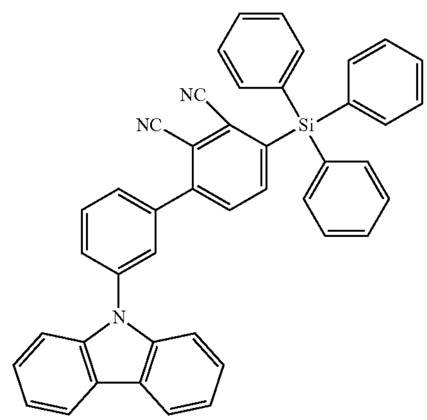
357
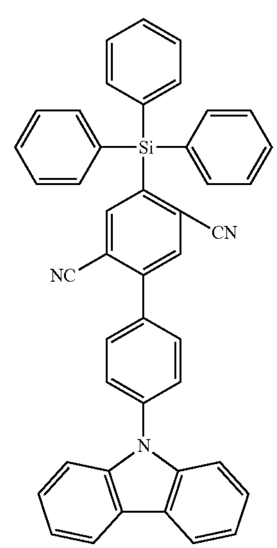

358
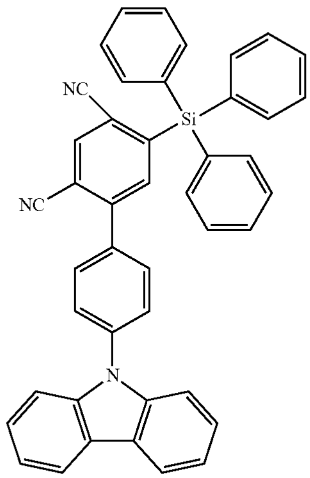
359
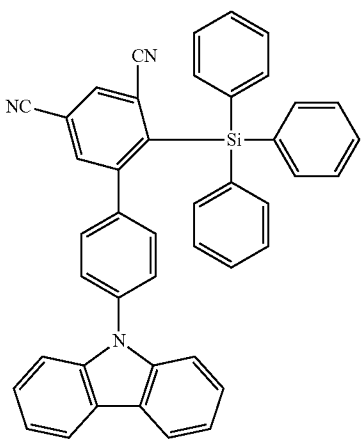
360
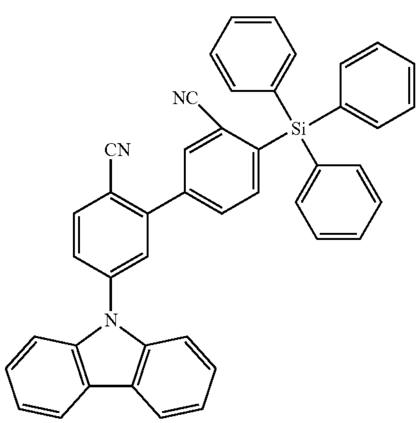
361
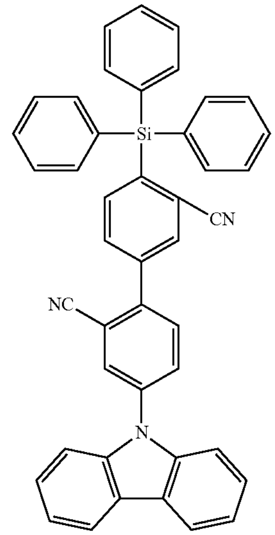
362
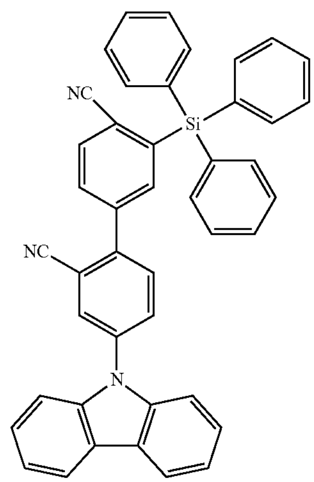
363
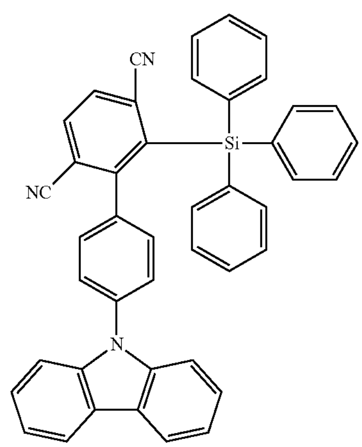

-continued
364
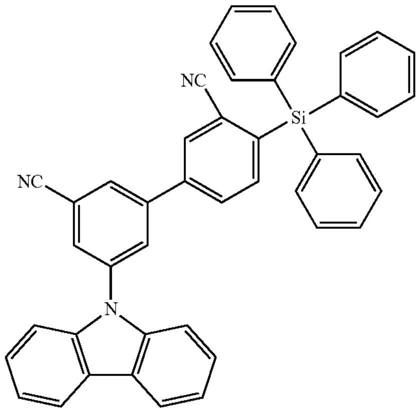
365
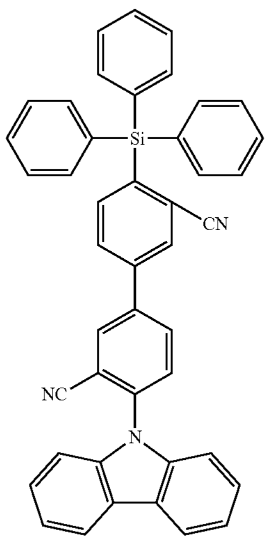
366
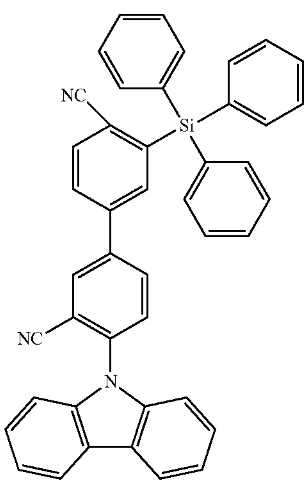
-continued
367
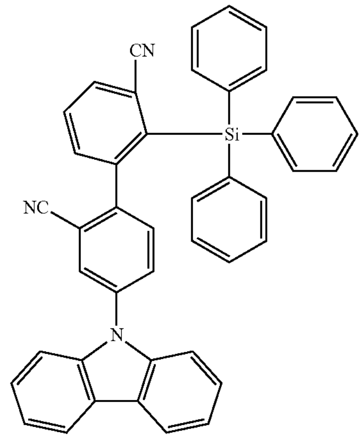
368
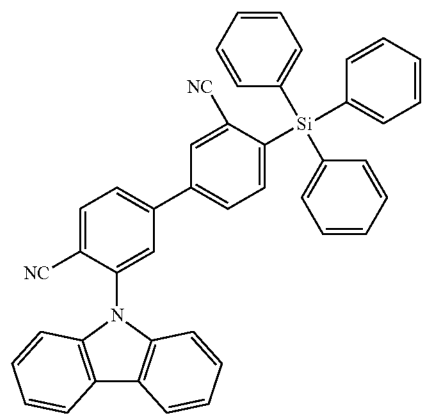
369
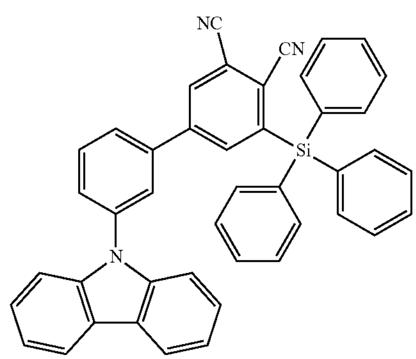

-continued
370
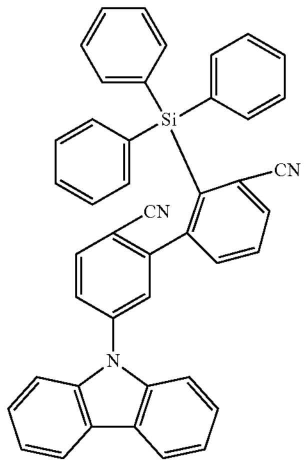
371
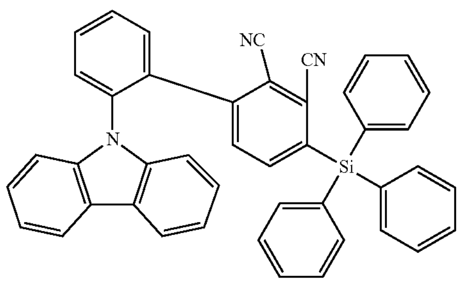
372
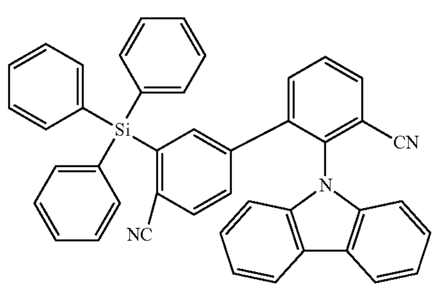
373
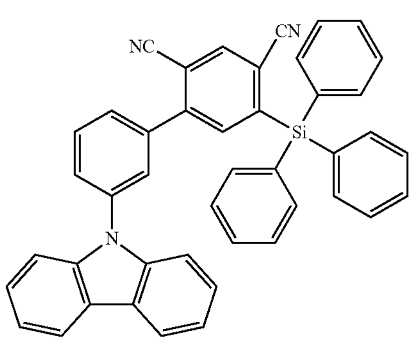
-continued
374
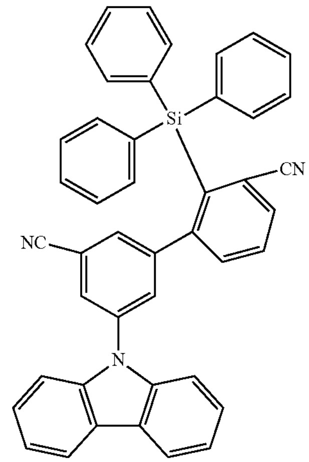
375
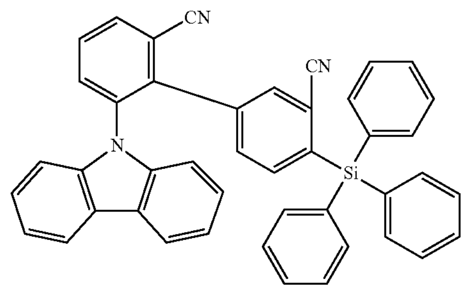
376
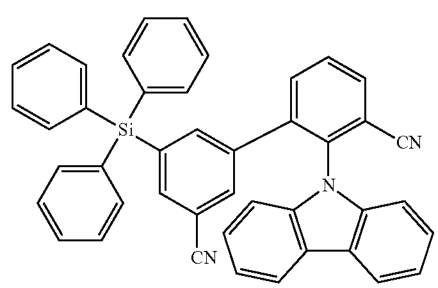
377
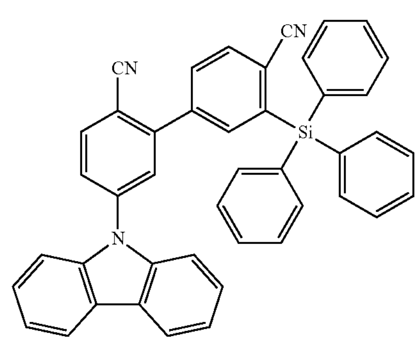

-continued
378
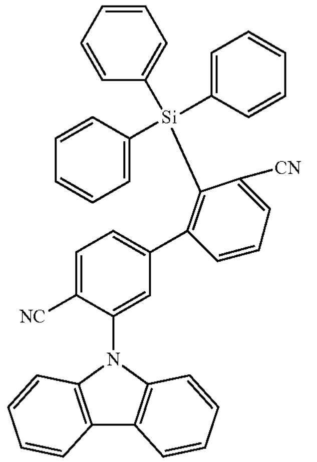
379
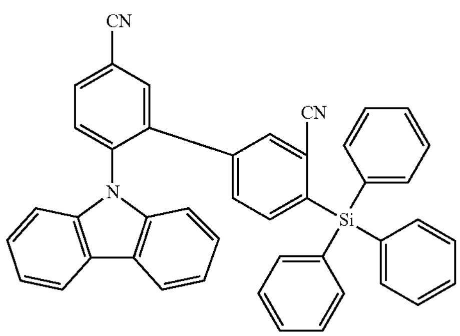
380
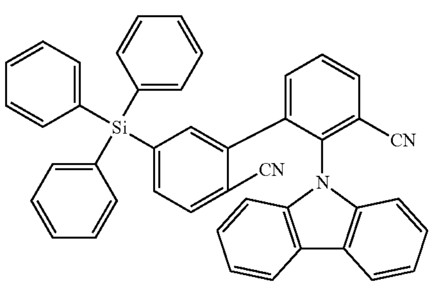
381
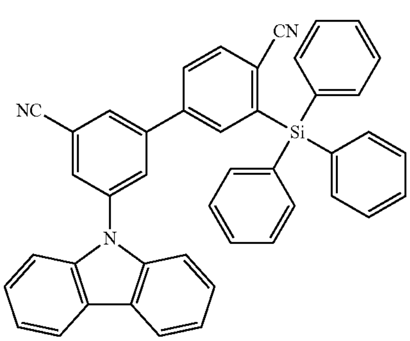
-continued
382
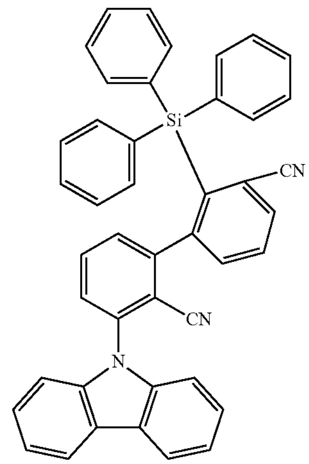
383
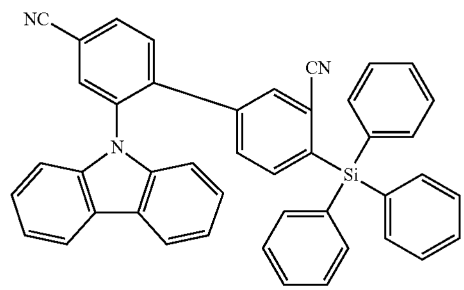
384
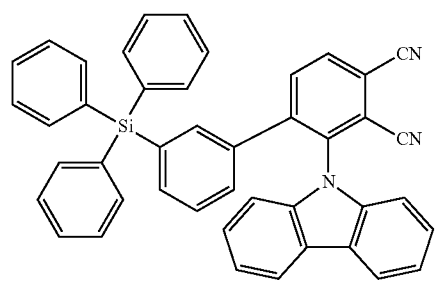
385
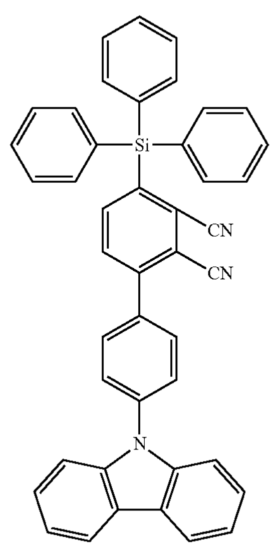

-continued
386
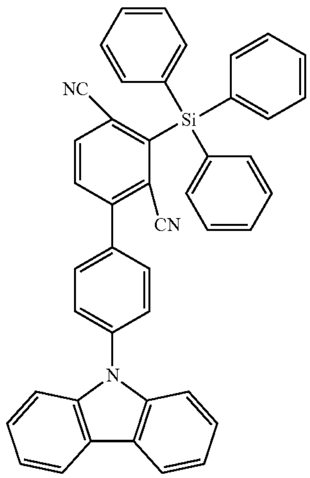
387
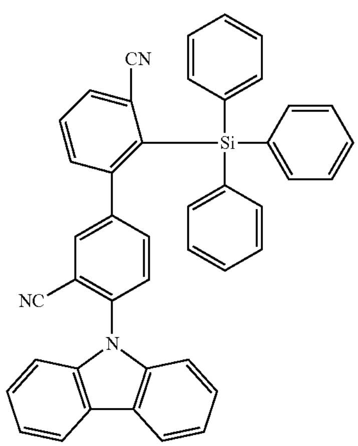
388
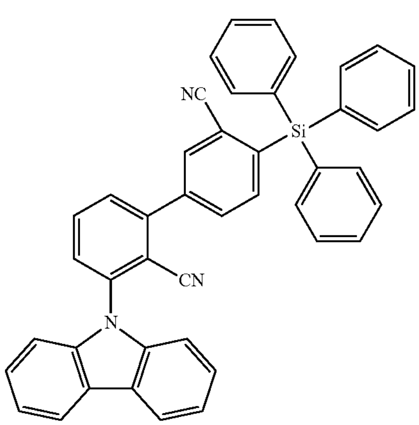
-continued
389
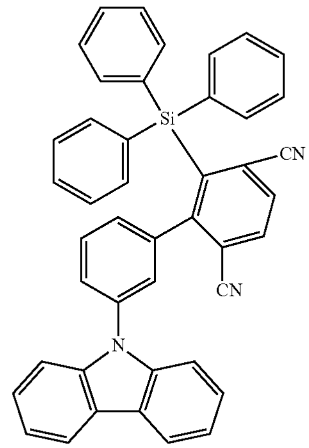
390
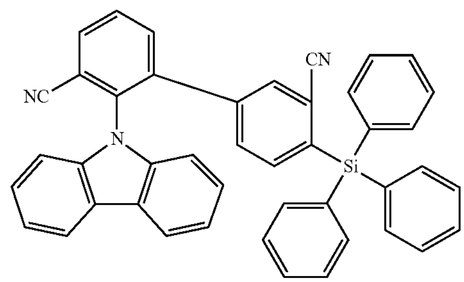
391
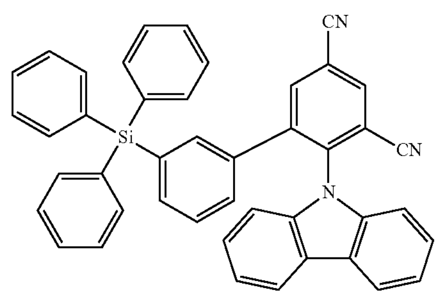
392
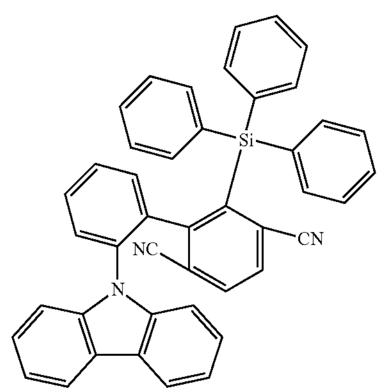

-continued
393
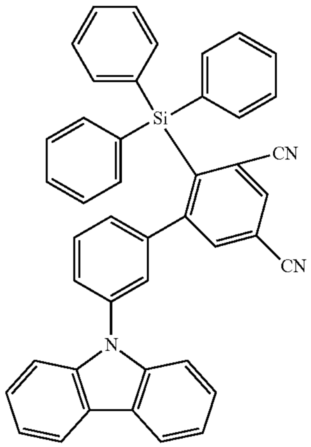
394
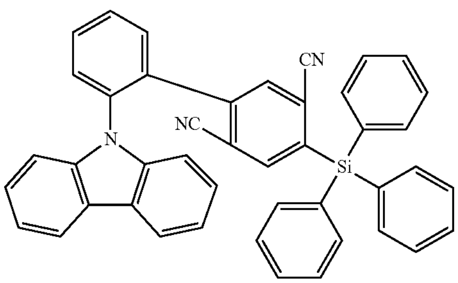
395
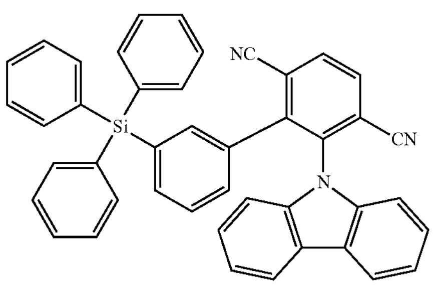
396
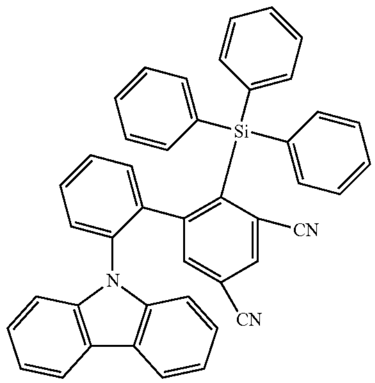
-continued
397
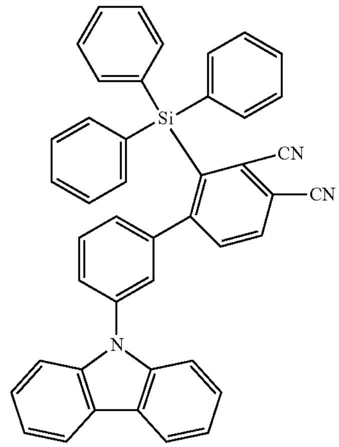
398
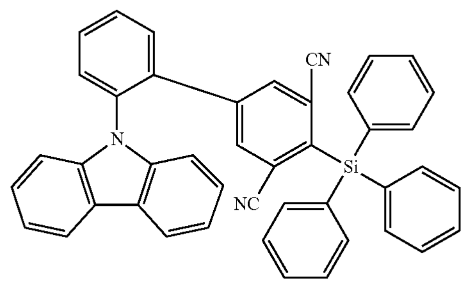
399
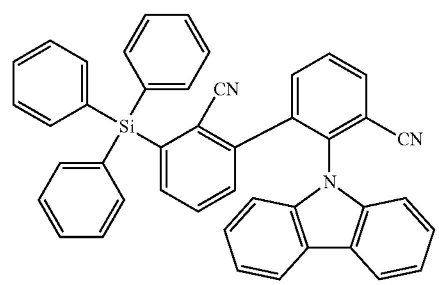
400
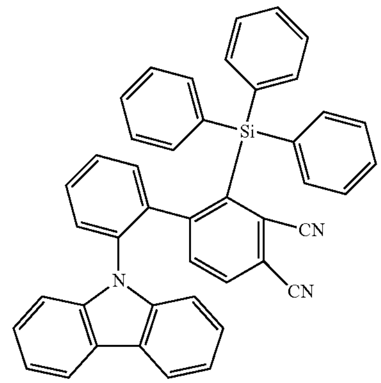

-continued
401
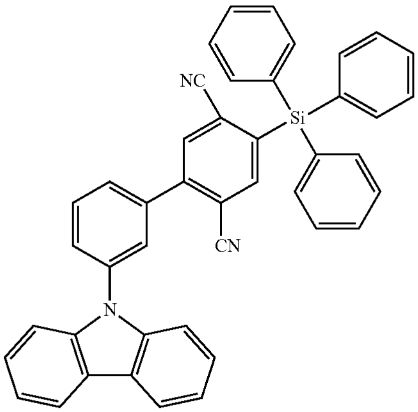
402
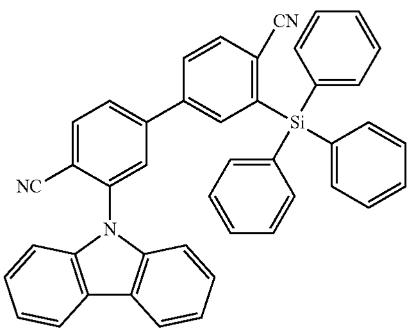
403
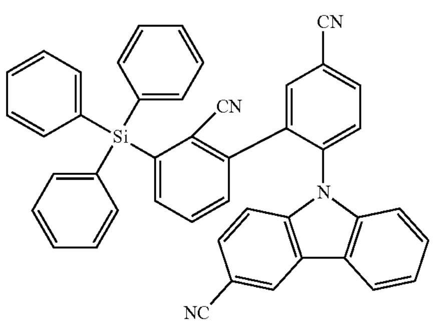
404
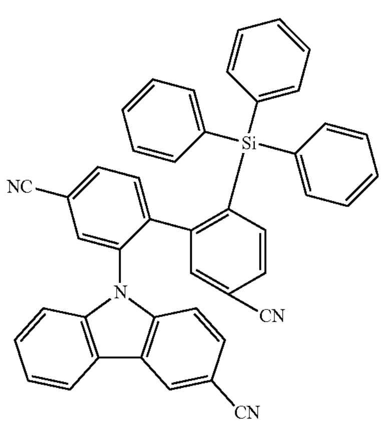
-continued
405
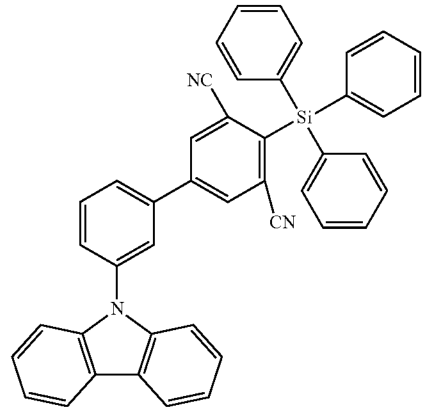
406
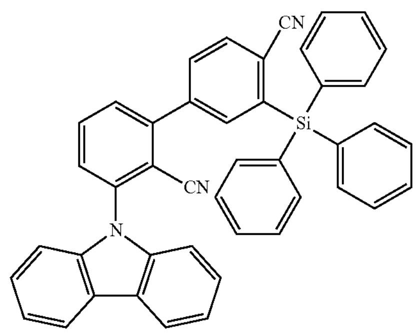
407
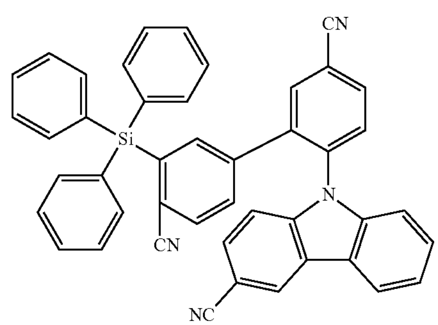
408
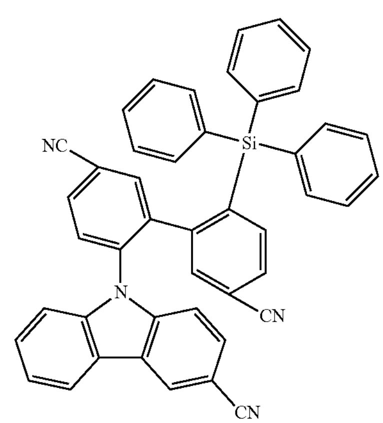

409
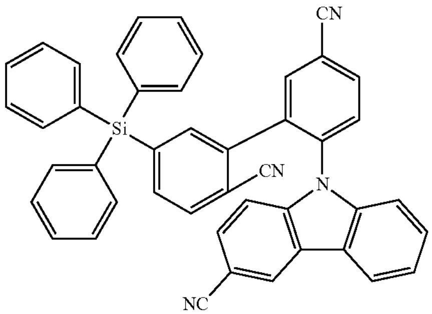
410
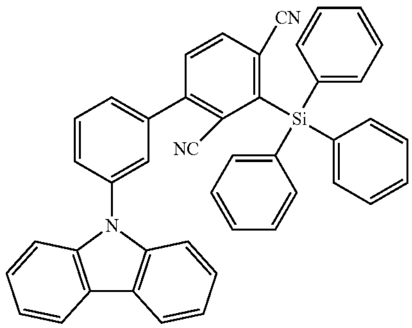
411
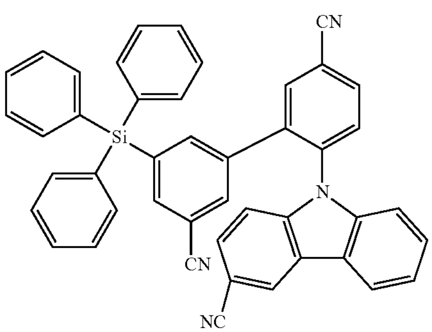
412
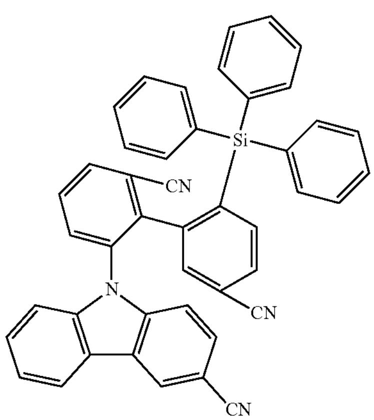
413
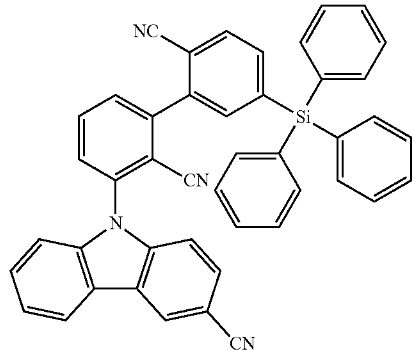
414
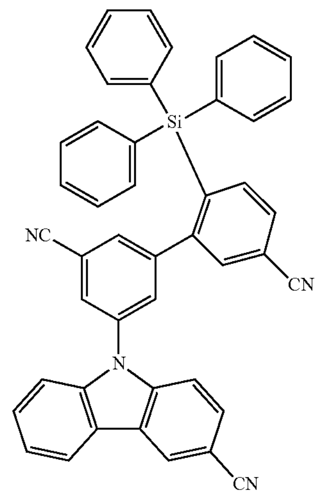
415
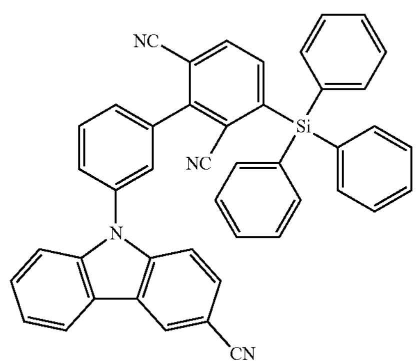

416
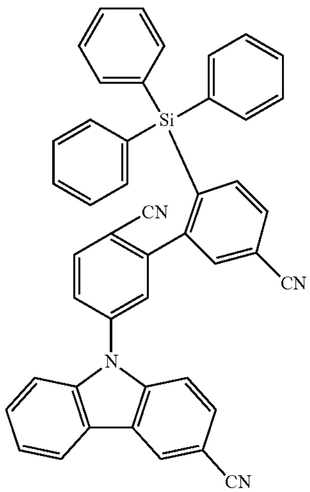
417
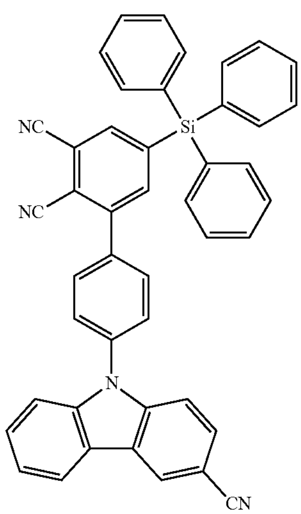
418
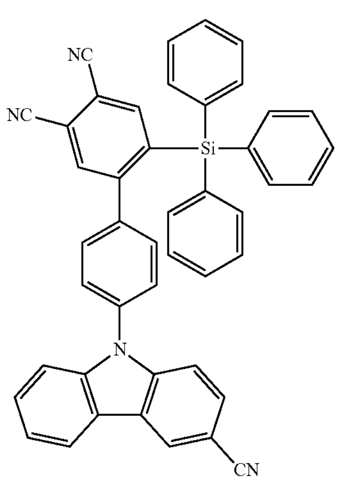
419
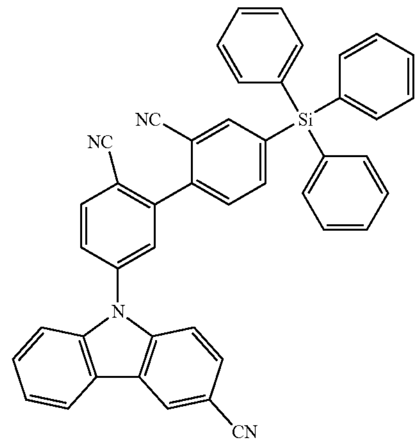
420
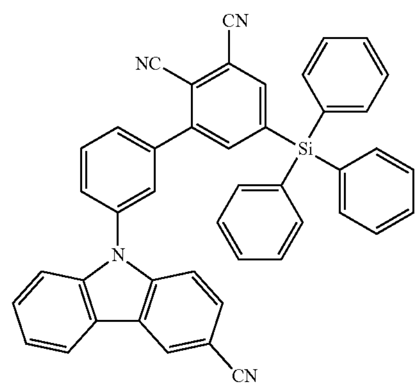
421
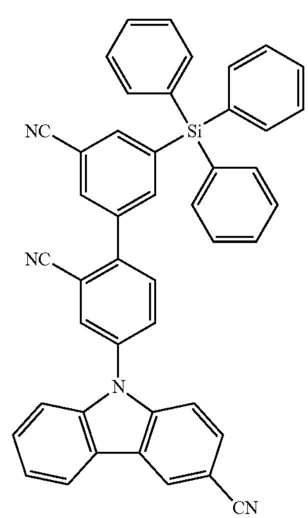

422
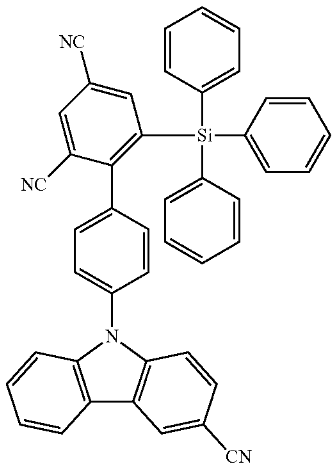
423
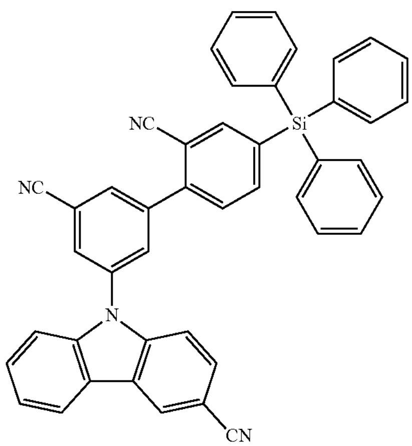
424
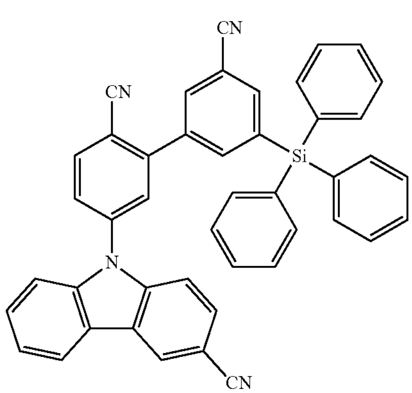
425
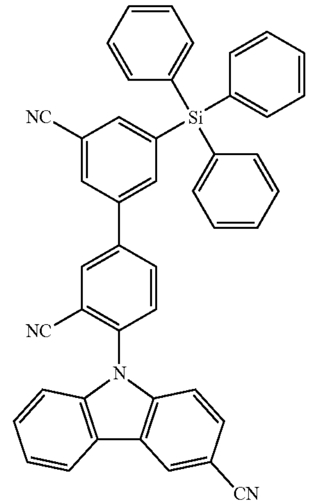
426
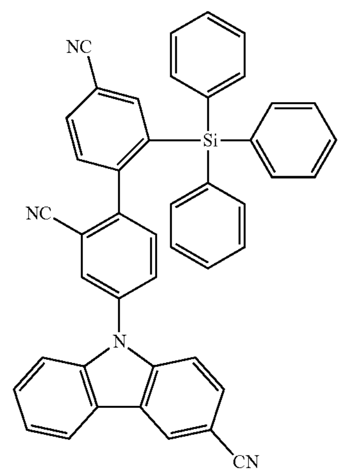
427
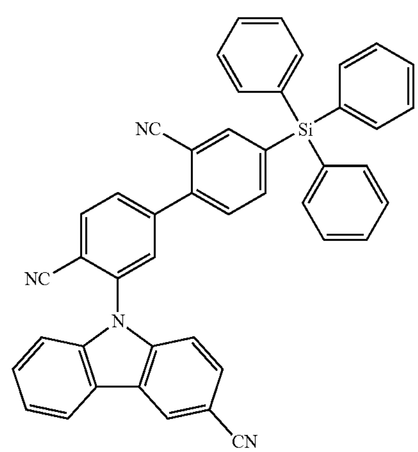

-continued
428
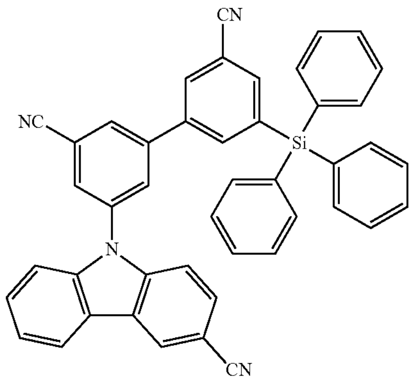
429
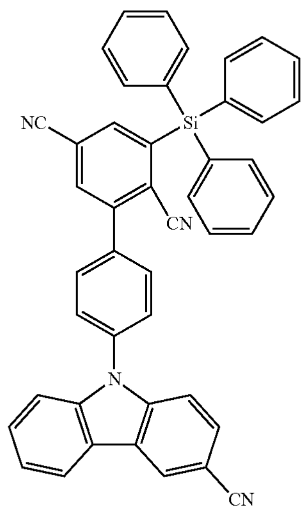
430
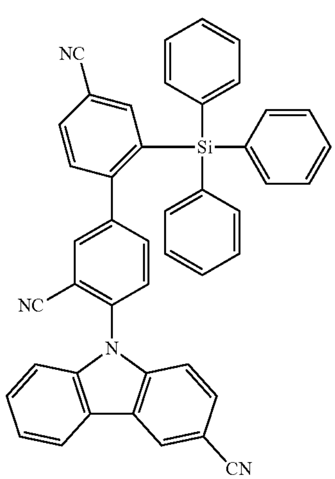
-continued
431
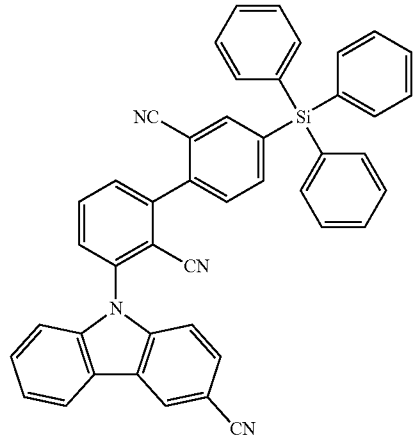
432
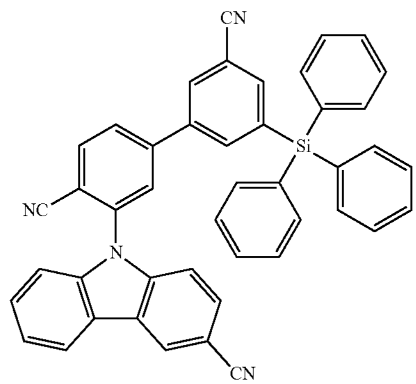
433
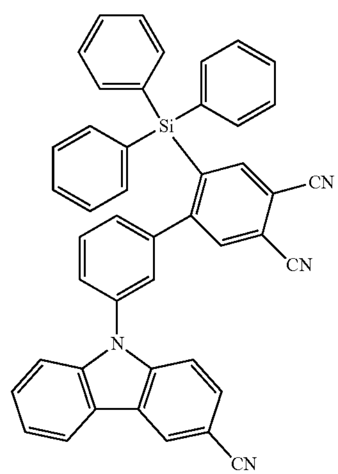
434
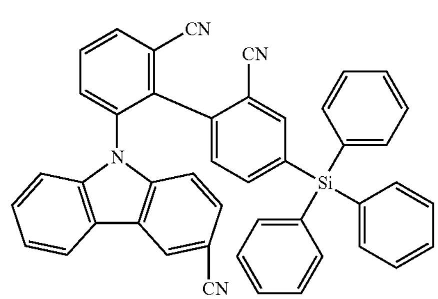

-continued
435
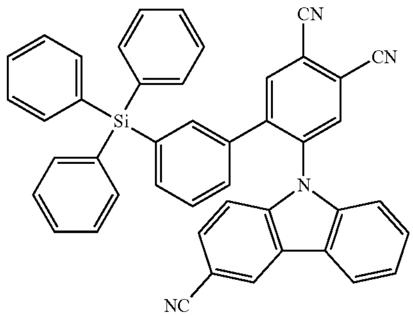
436
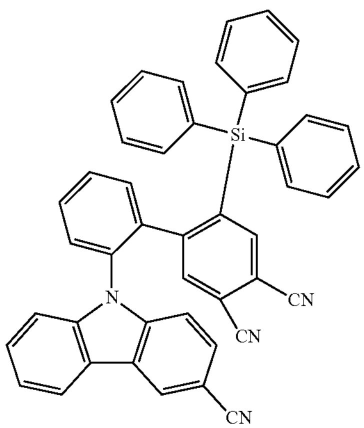
437
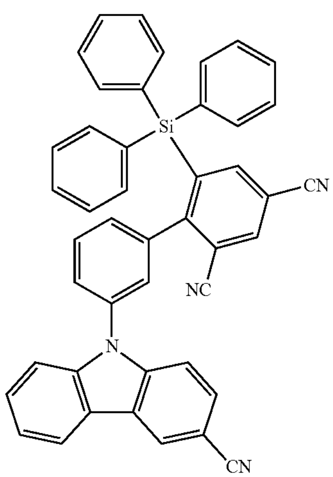
438
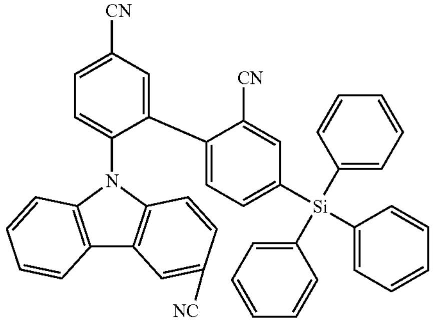
-continued
439
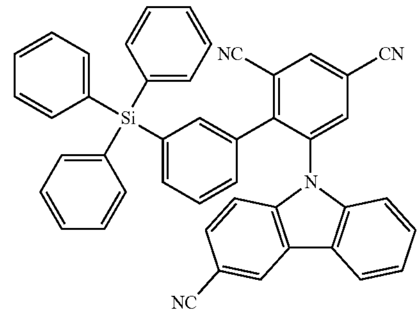
440
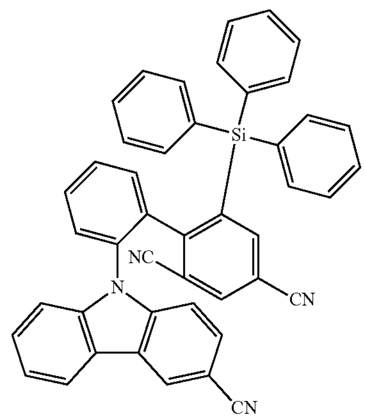
441
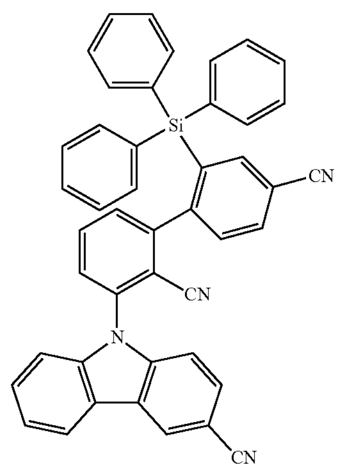
442
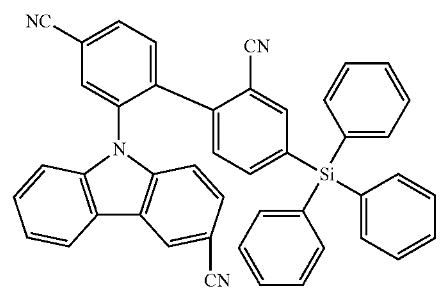

-continued
443
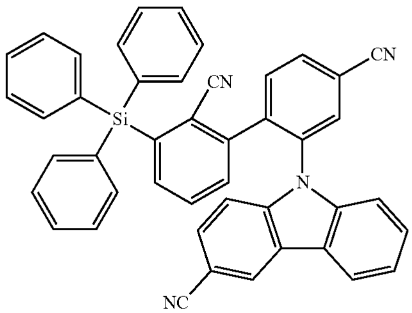
444
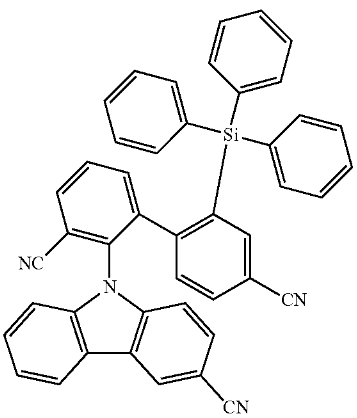
445
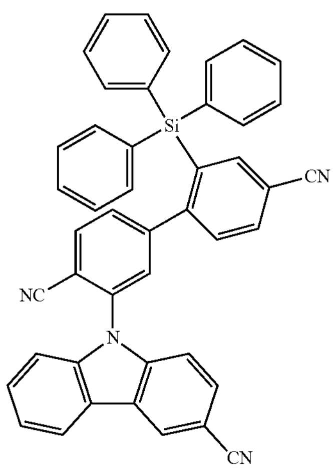
446
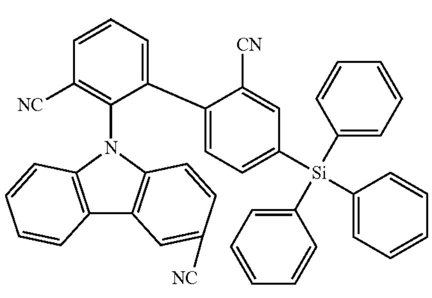
447
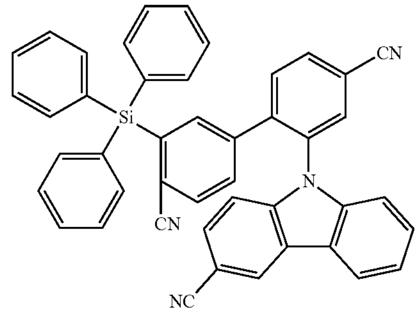
448
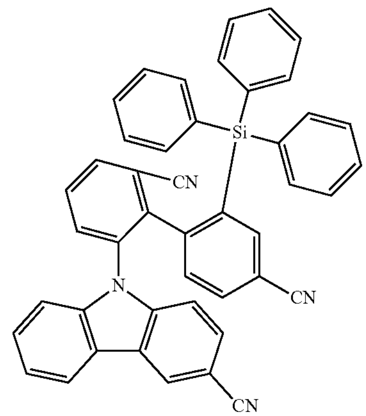
449
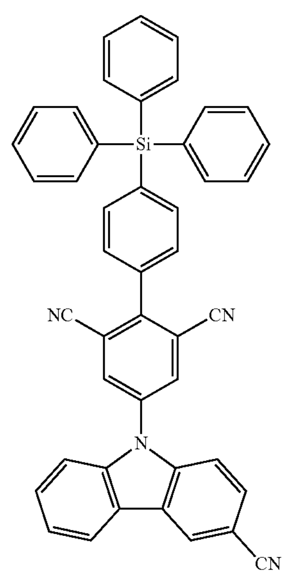

-continued
450
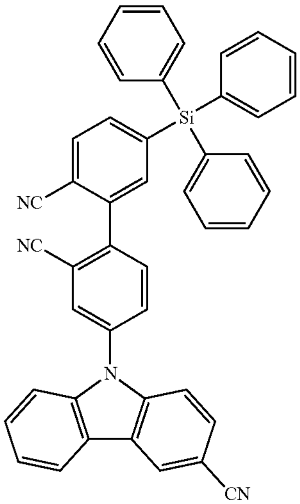
451
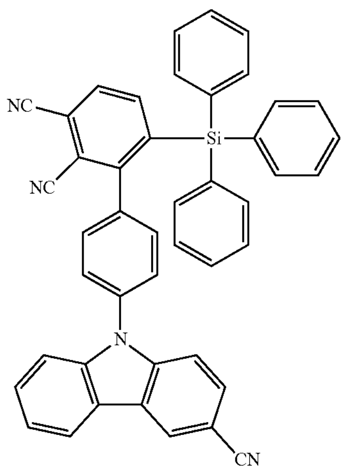
452
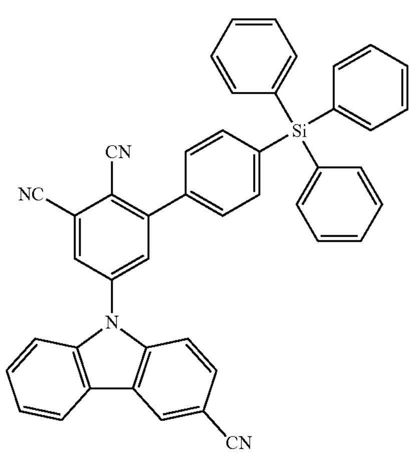
-continued
453
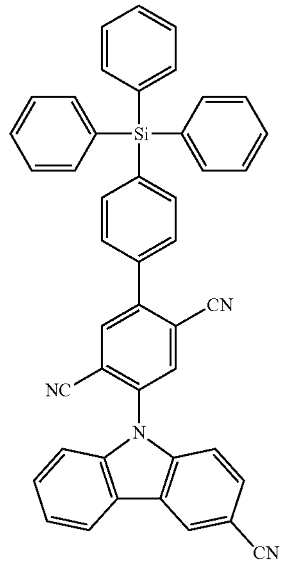
454
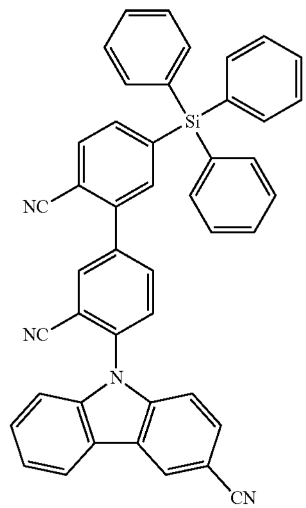
455
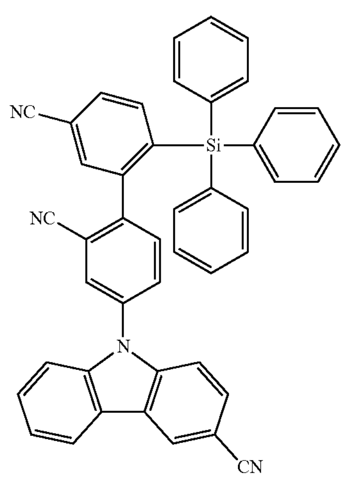

-continued
456
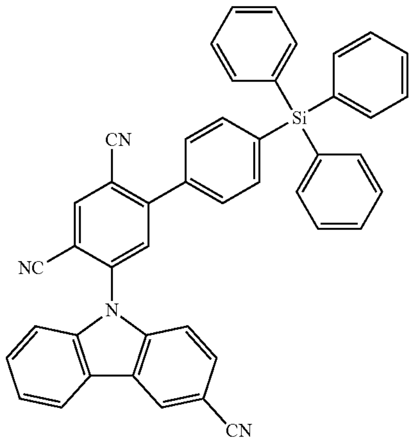
457
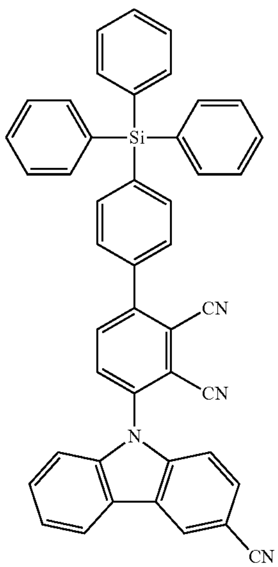
458
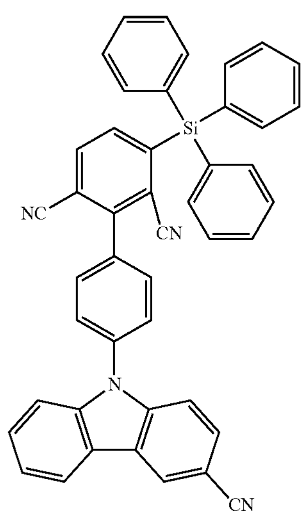
-continued
459
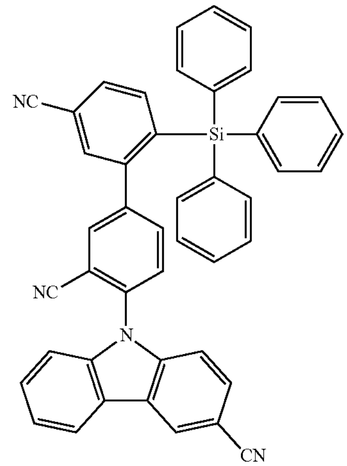
460
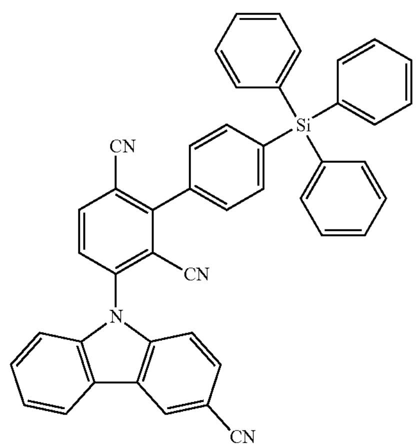
461
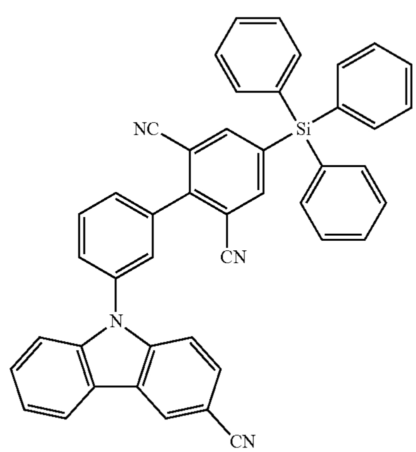

462
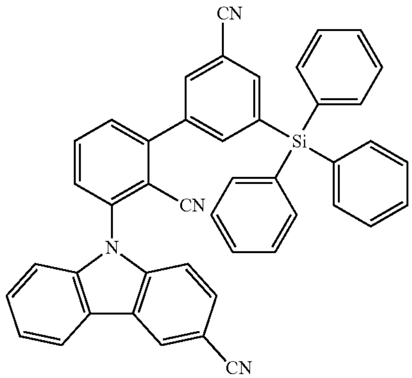
463
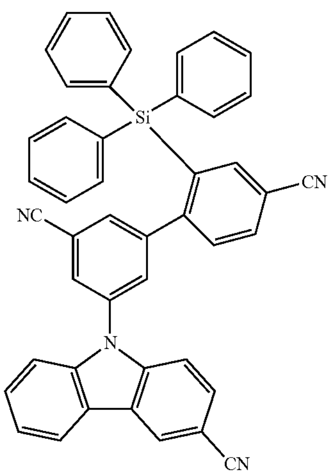
464
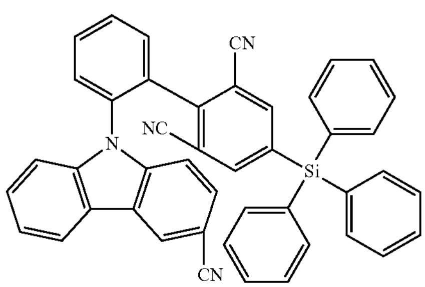
465
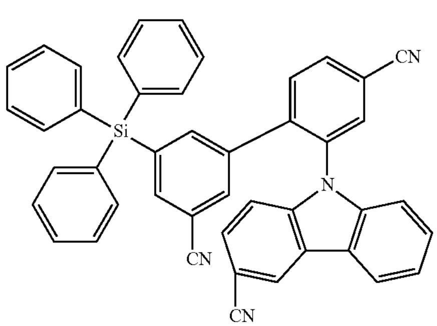
466
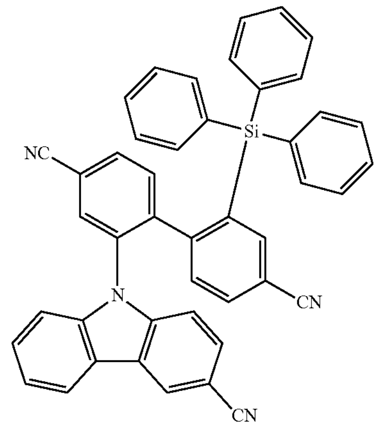
467
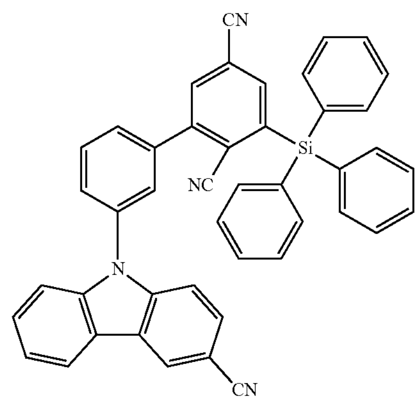
468
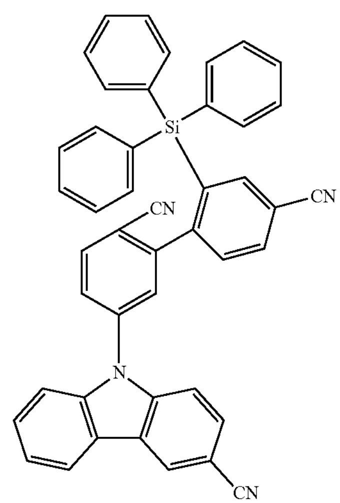
469
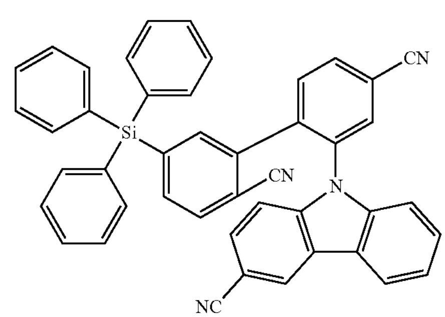

-continued
470
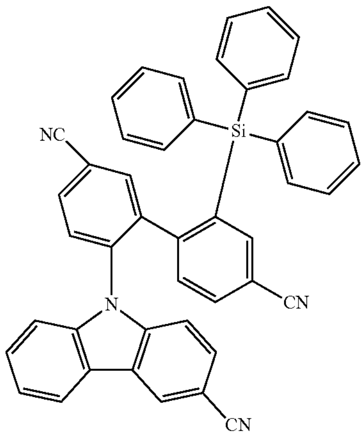
471
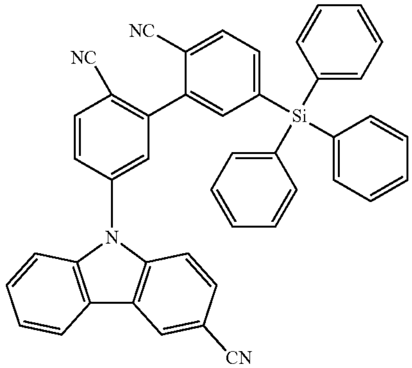
472
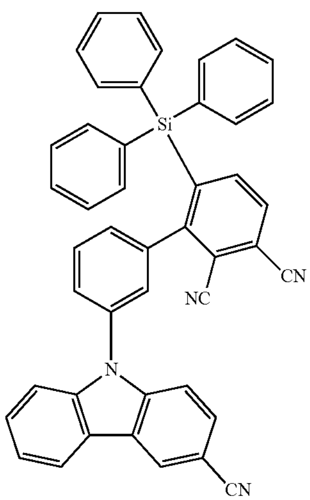
473
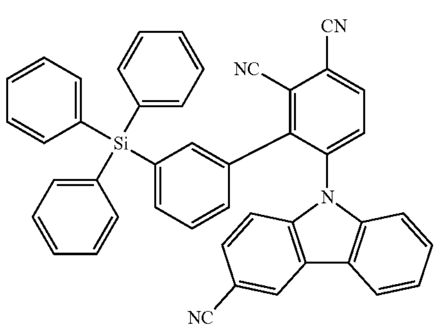
-continued
474
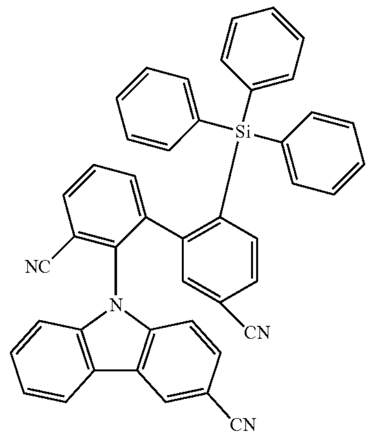
475
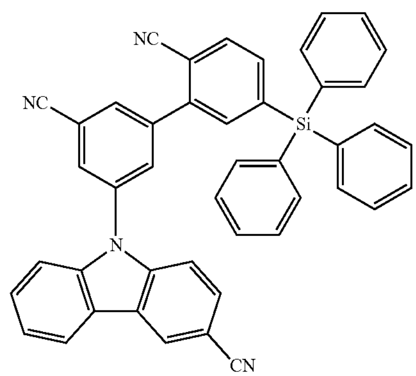
476
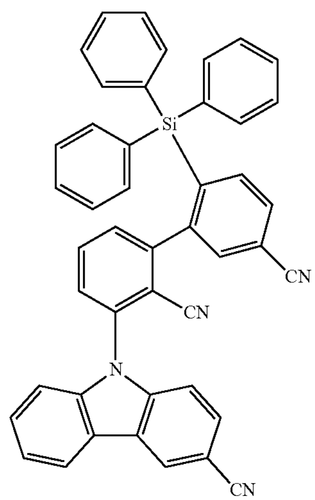
477
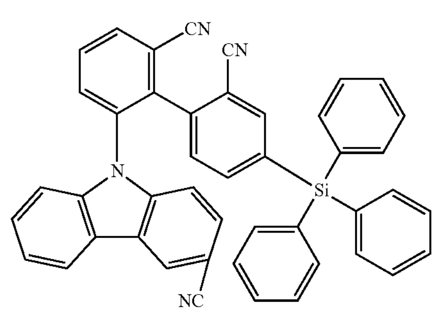

-continued
478
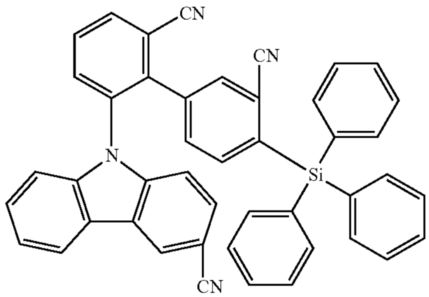
479
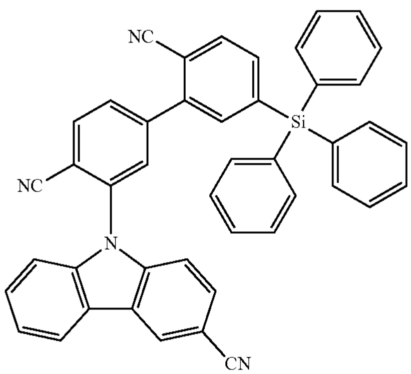
480
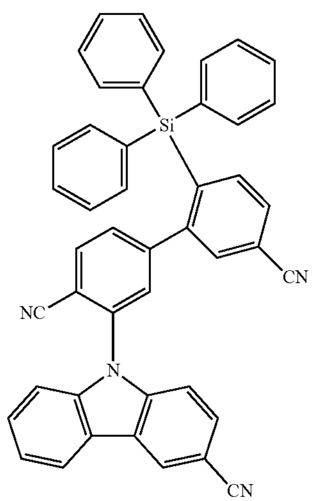
481
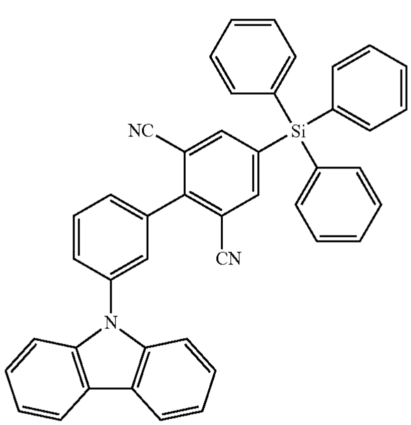
-continued
482
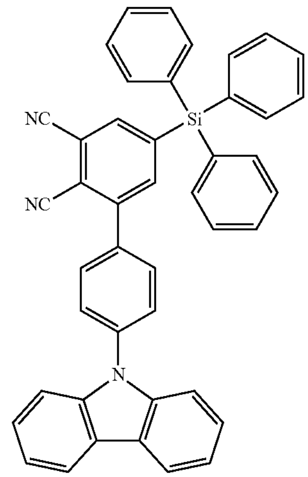
483
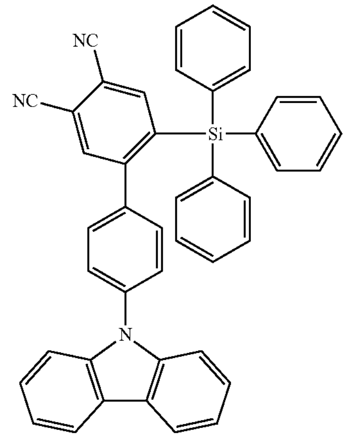
484
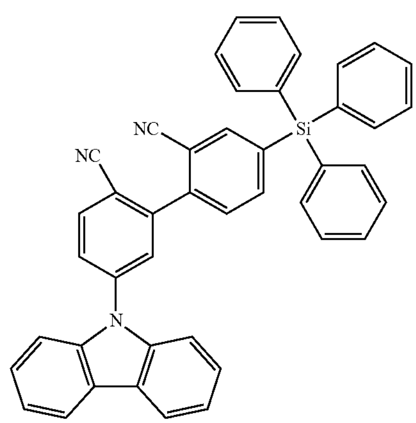

-continued
485
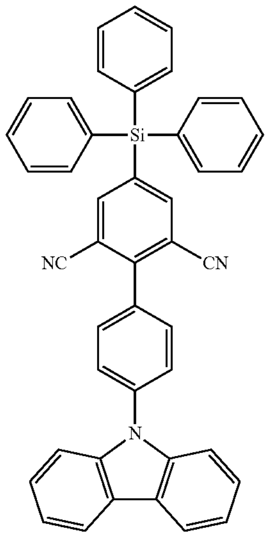
486
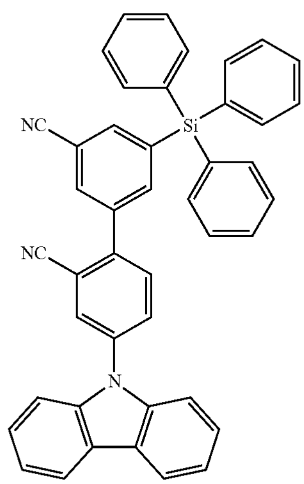
487
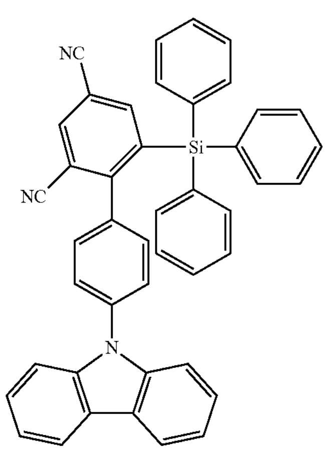
-continued
488
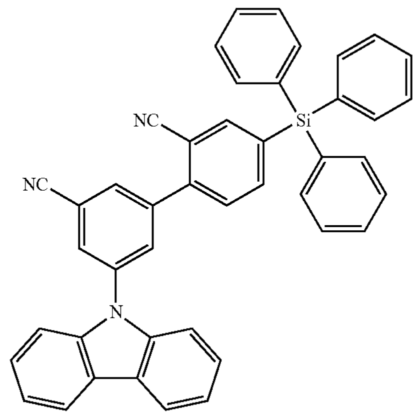
489
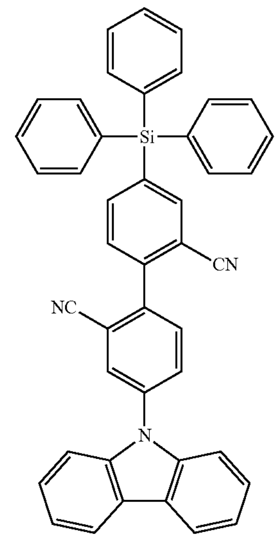
490
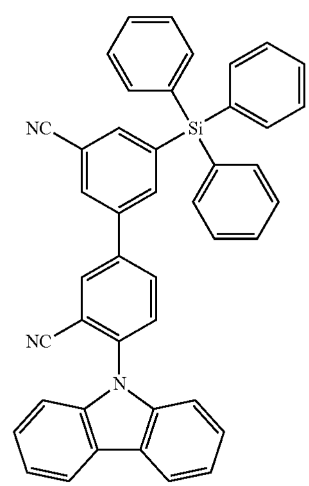

491
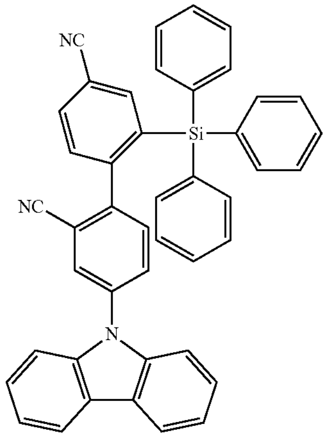
492
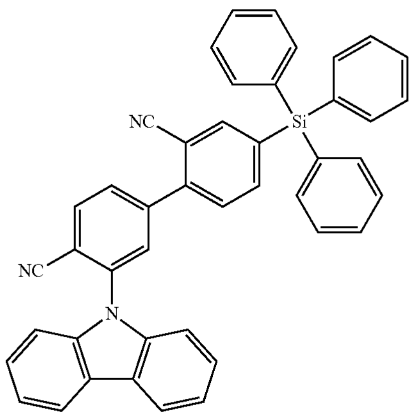
493
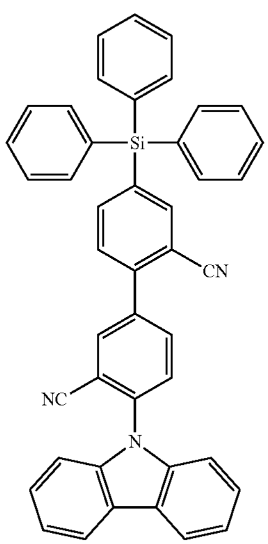
494
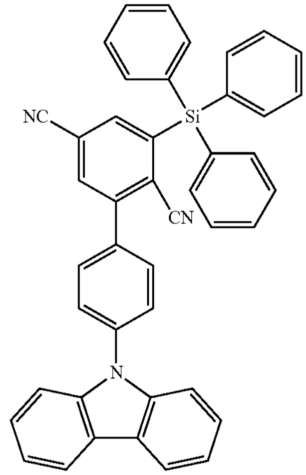
495
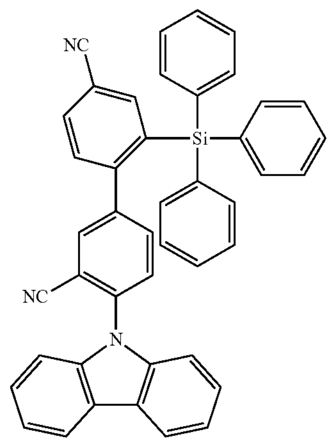
496
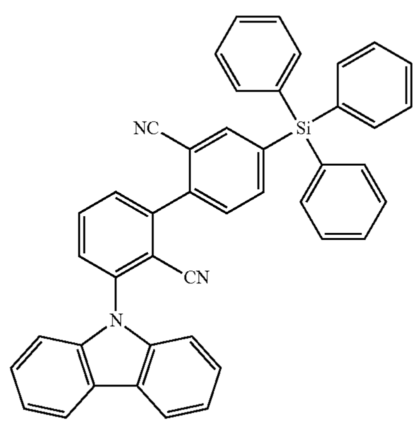

-continued
497
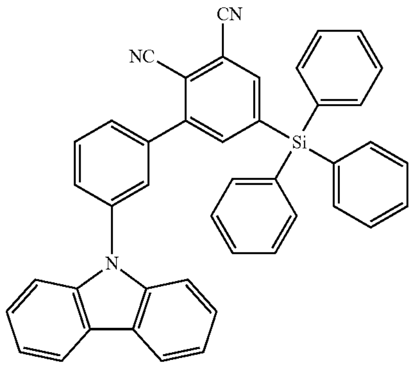
498
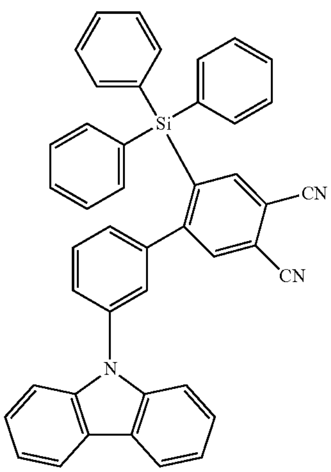
499
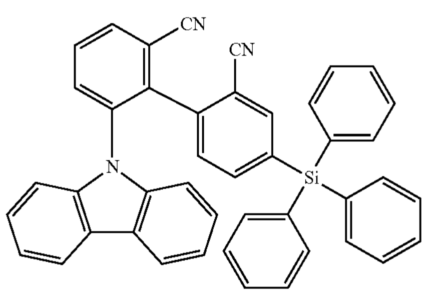
500
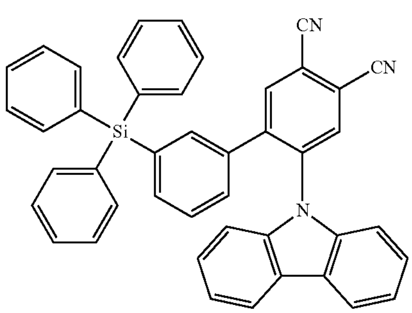
-continued
501
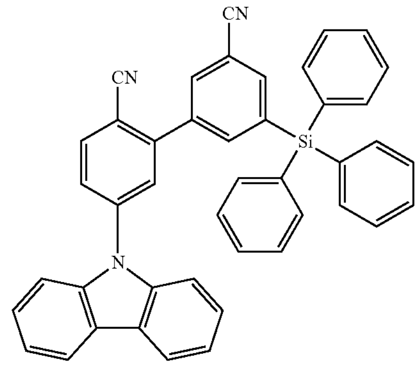
502
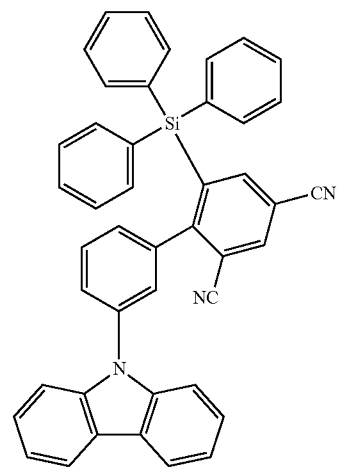
503
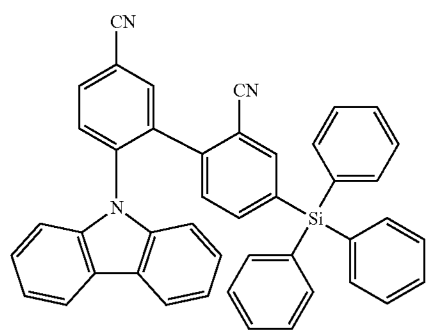
504
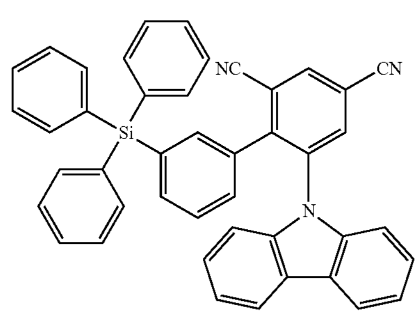

-continued
505
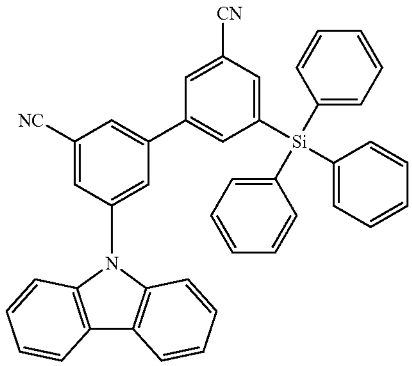
506
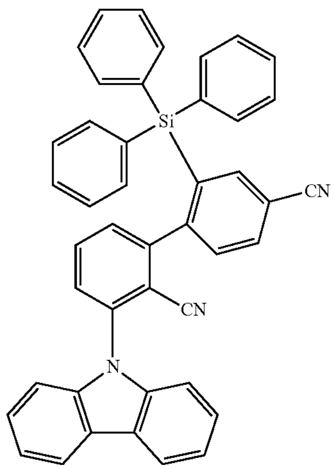
507
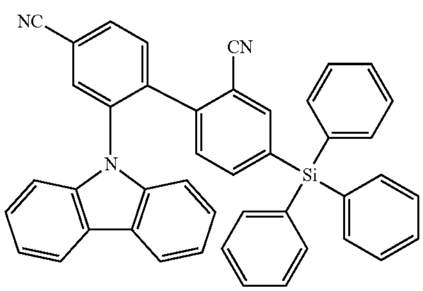
508
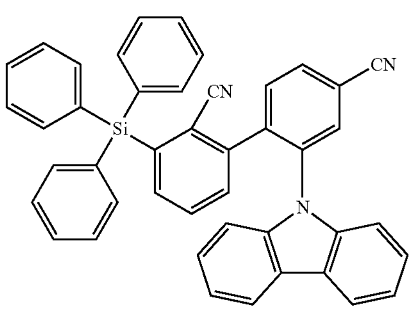
-continued
509
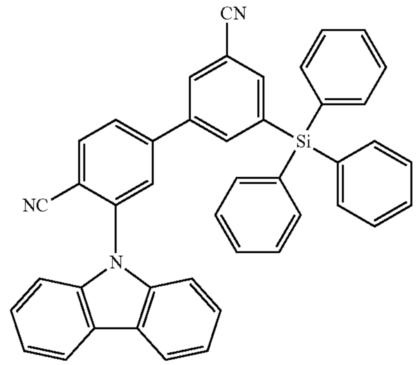
510
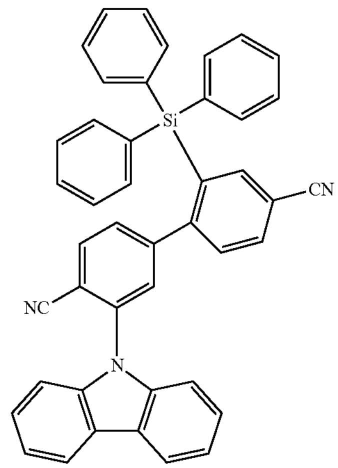
511
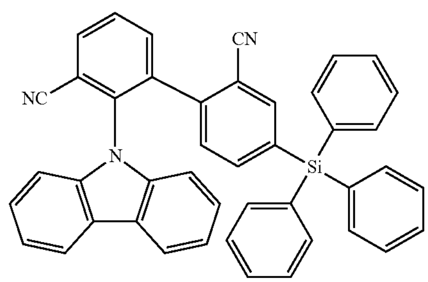
512
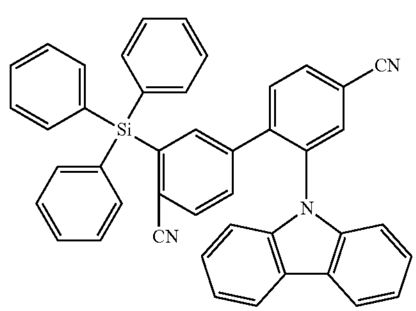

513
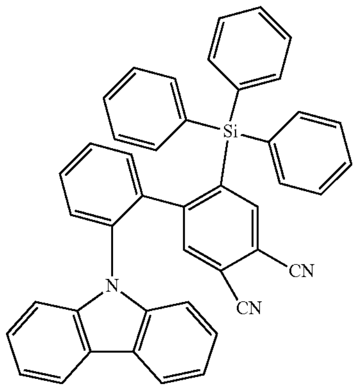
514
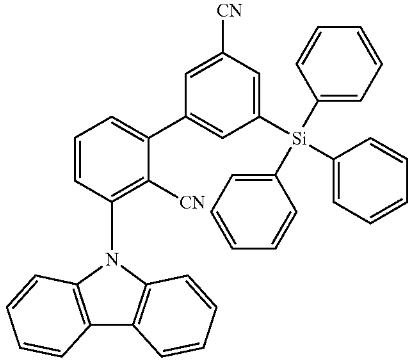
515
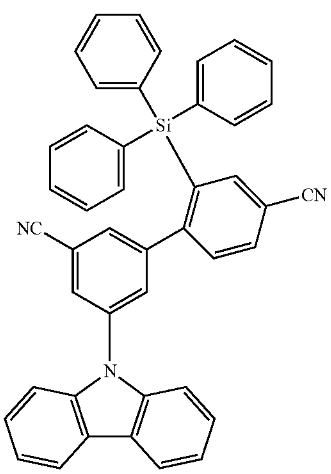
516
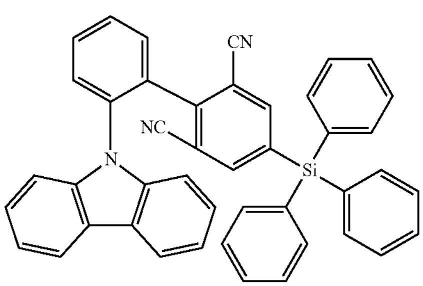
517
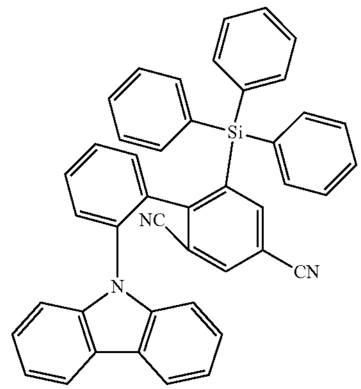
518
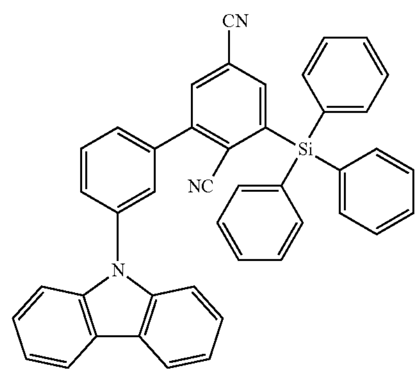
519
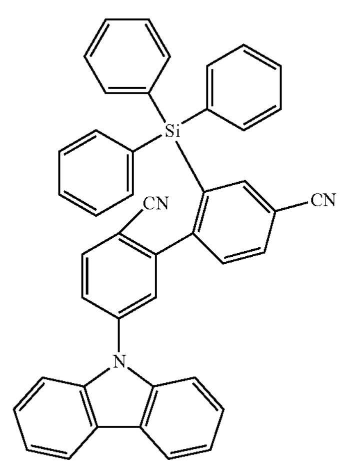

161
-continued
520
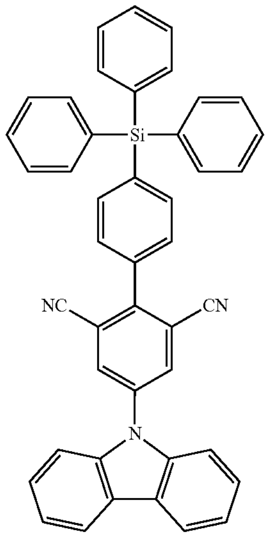
521
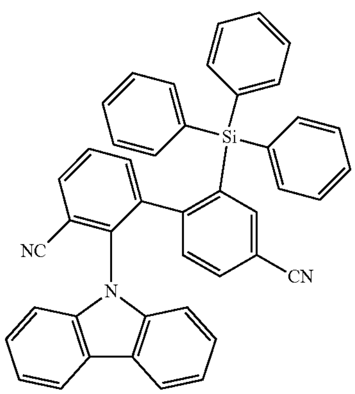
522
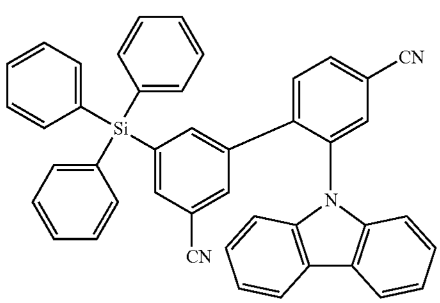
523
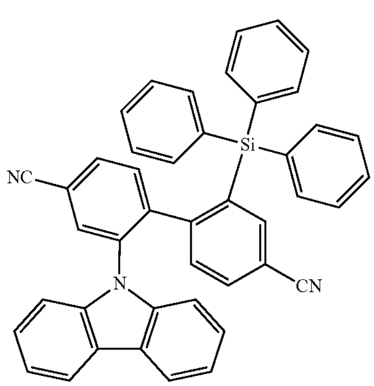
162
-continued
524
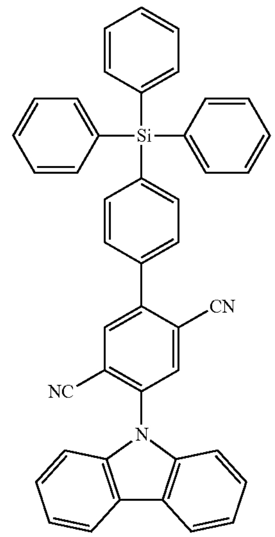
525
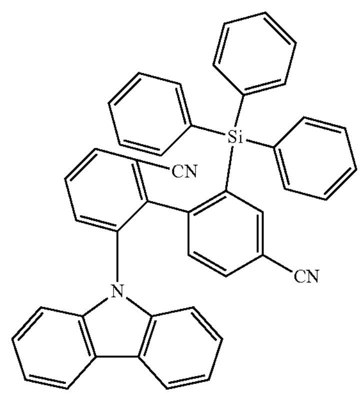
526
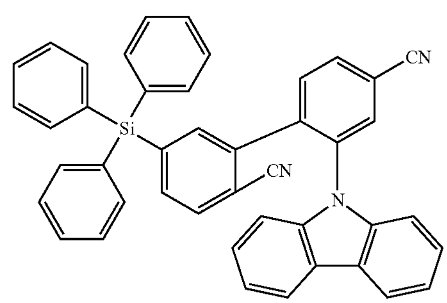
527
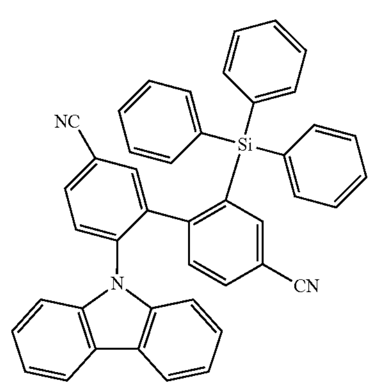

-continued
528
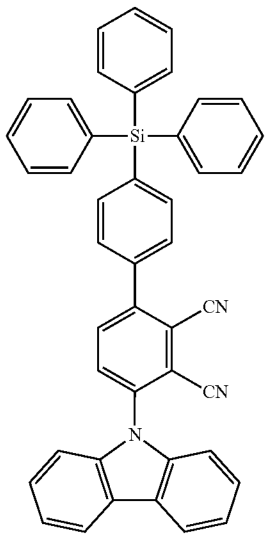
529
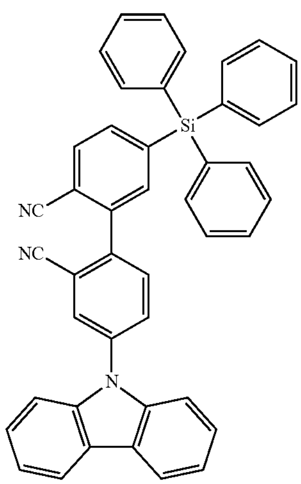
530
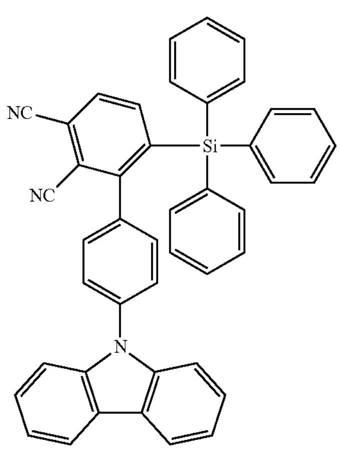
-continued
531
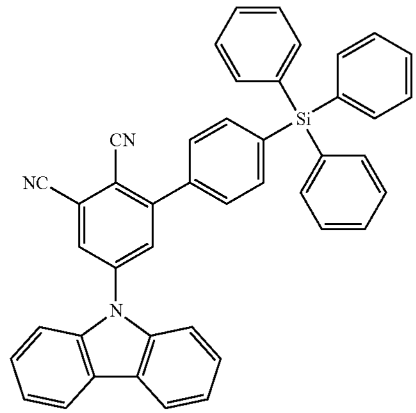
532
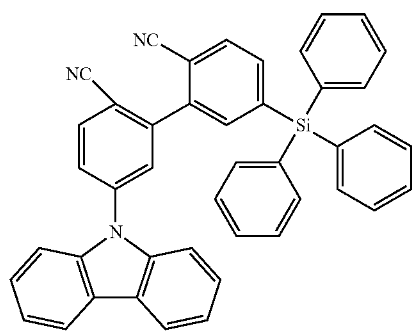
533
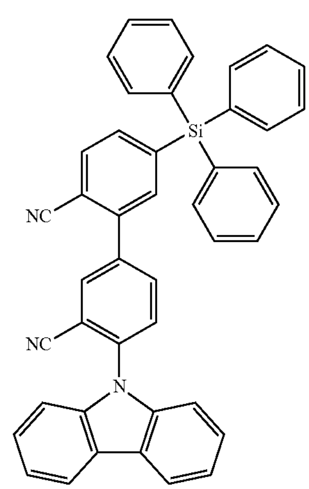

-continued
534
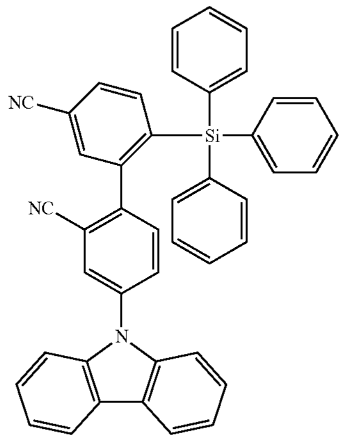
535
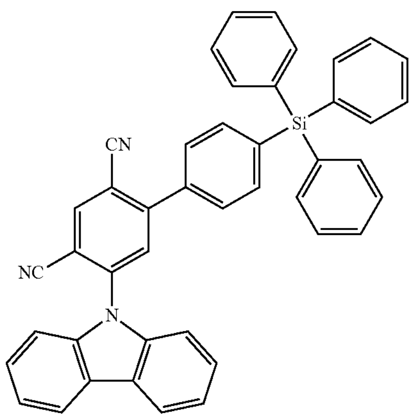
536
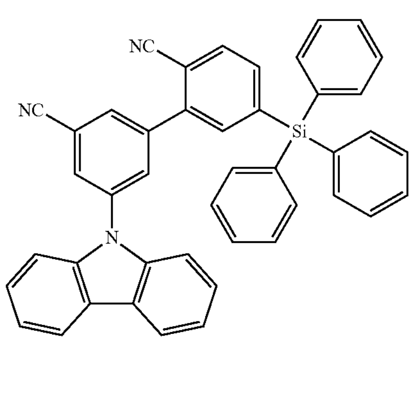
-continued
537
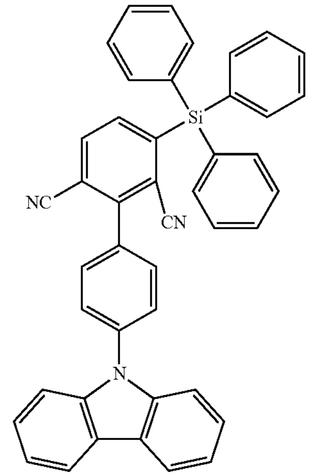
538
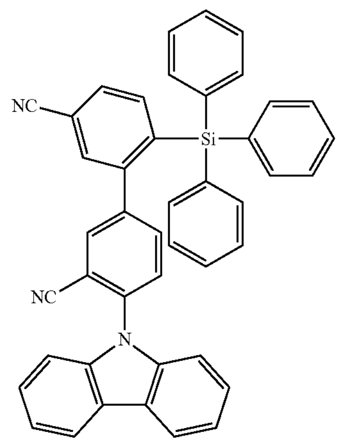
539
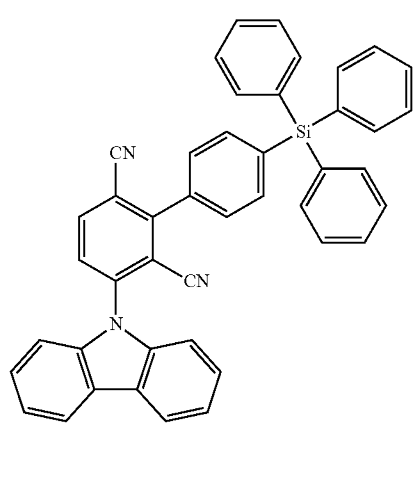

540
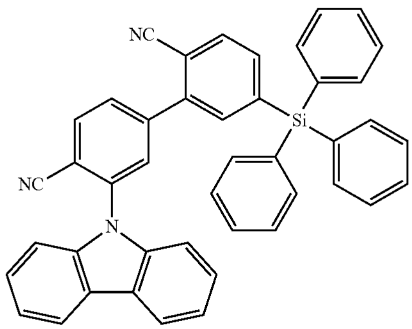
541
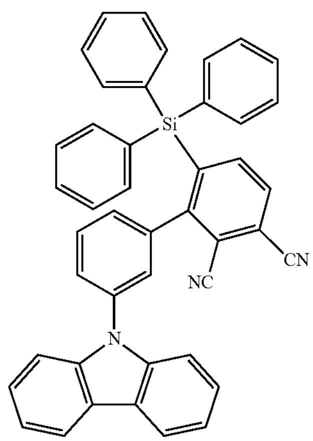
542
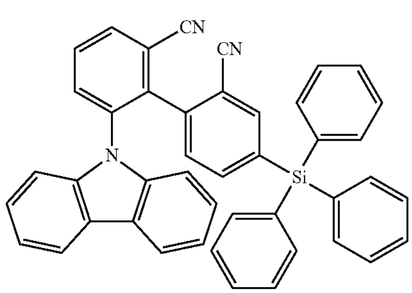
543
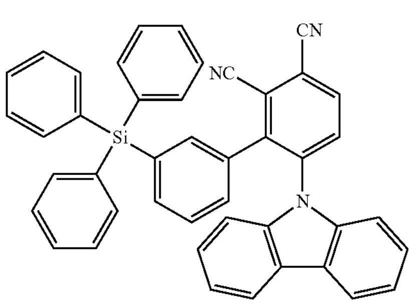
544
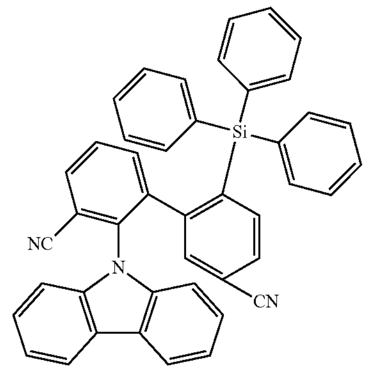
545
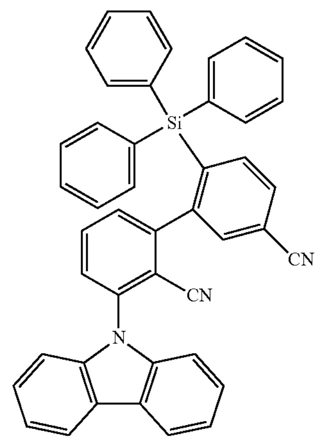
546
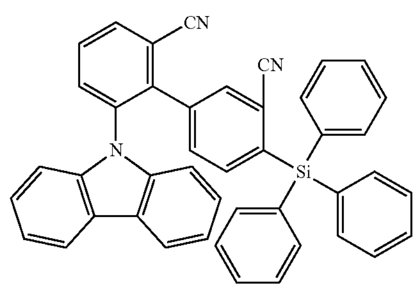
547
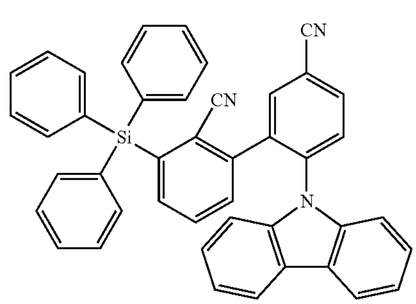

-continued
548
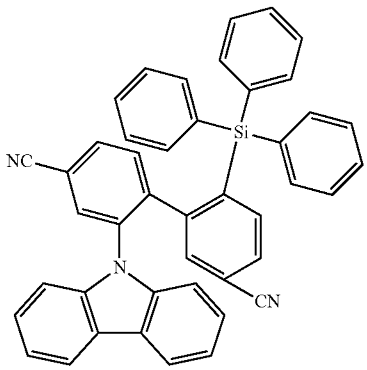
549
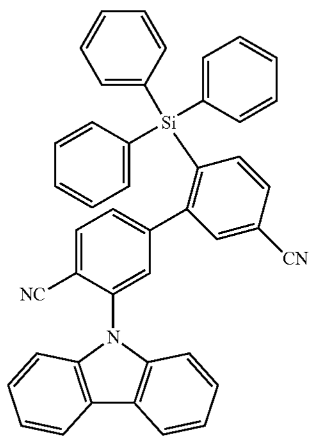
550
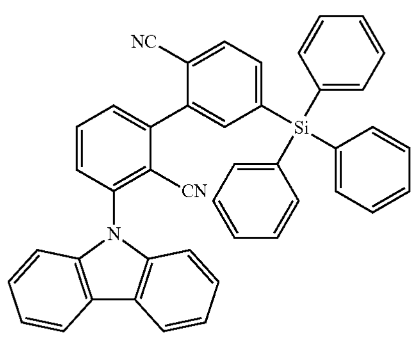
551
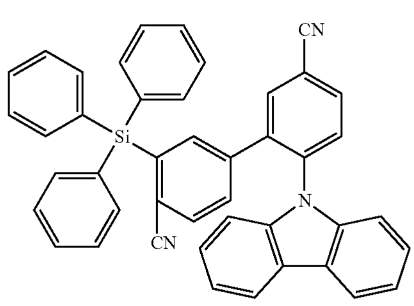
-continued
552
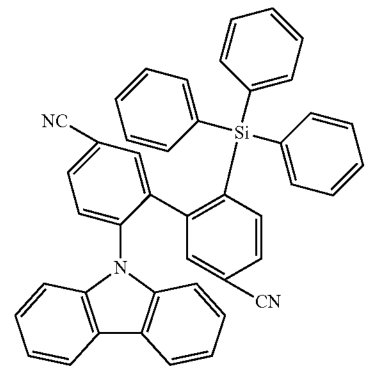
553
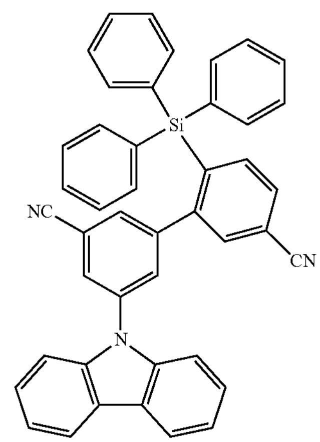
554
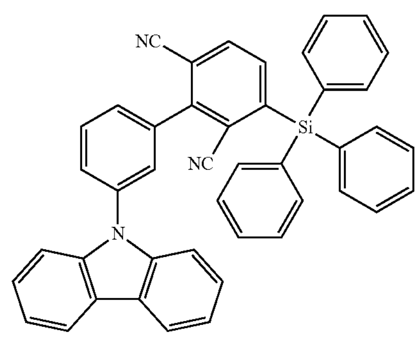
555
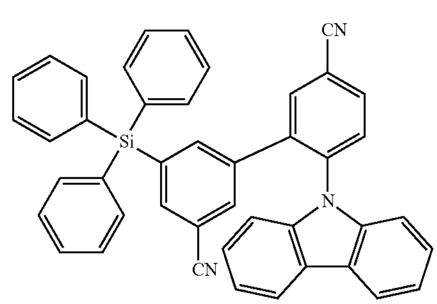

556
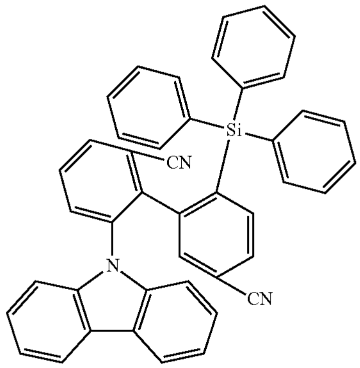
557
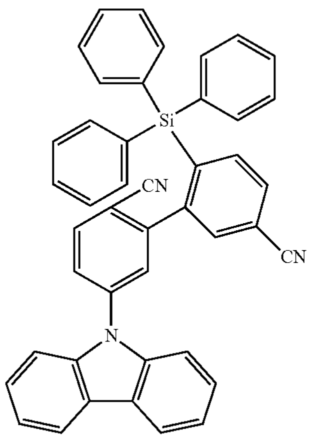
558
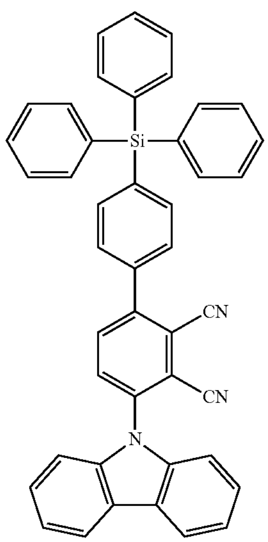
559
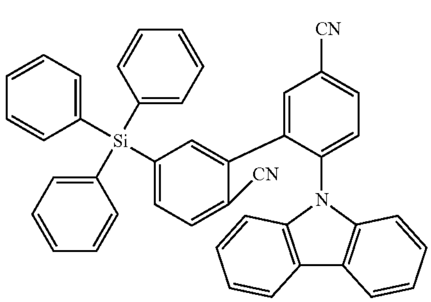
560
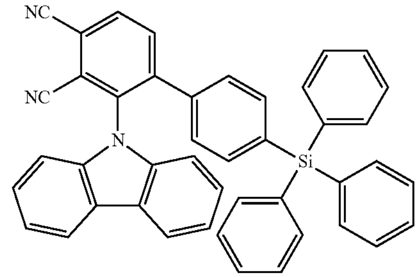
561
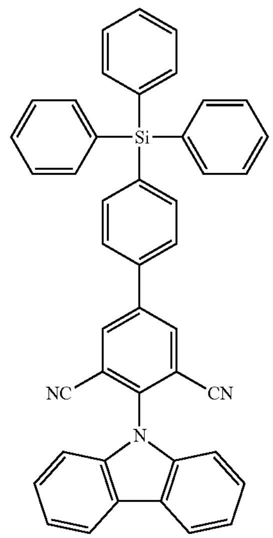
562
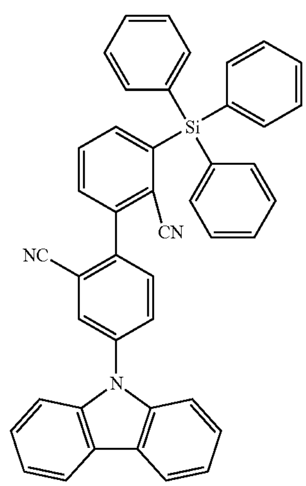

-continued
563
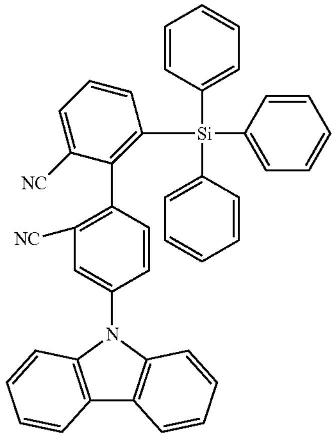
564
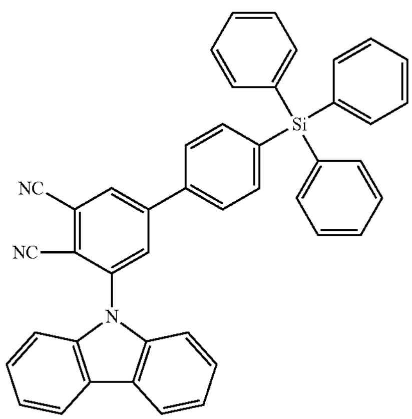
565
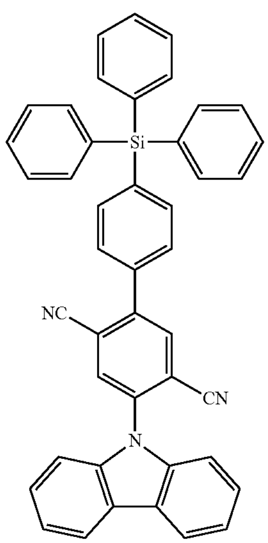
-continued
566
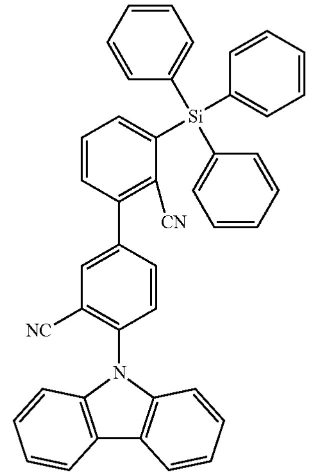
567
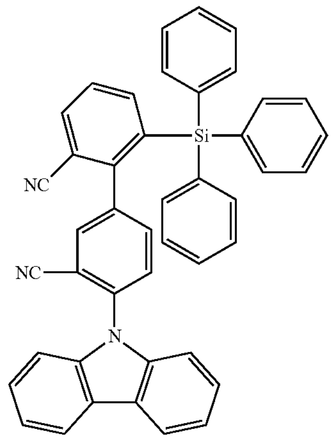
568
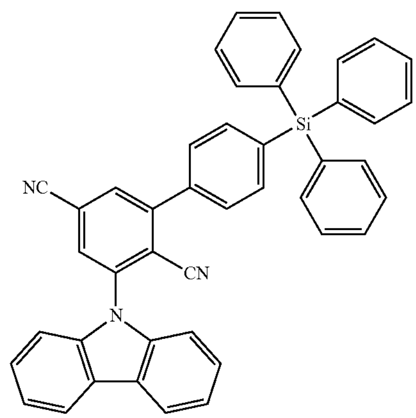
569
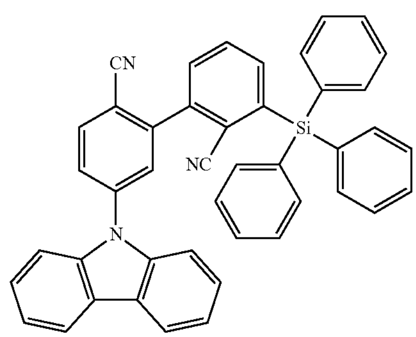

570
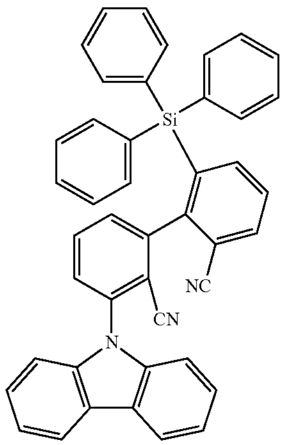
571
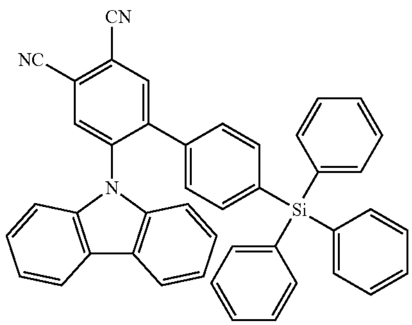
572
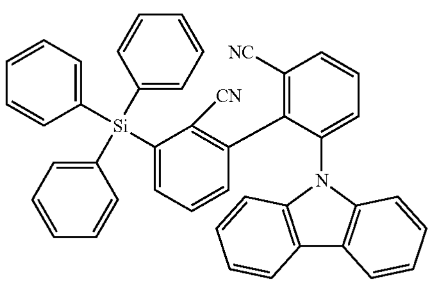
573
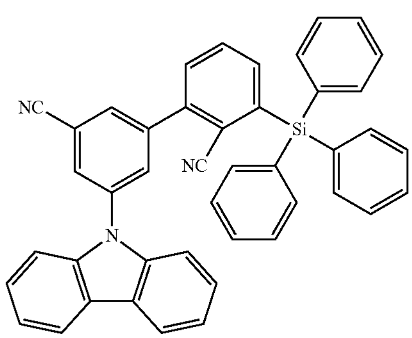
-continued
574
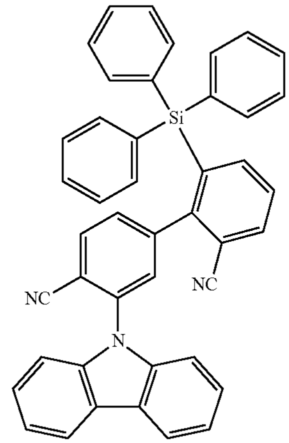
575
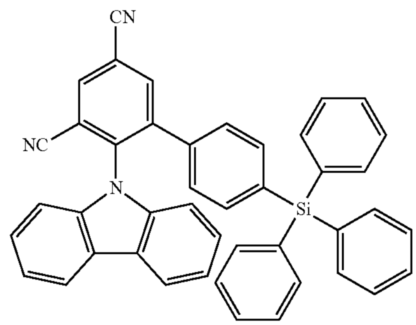
576
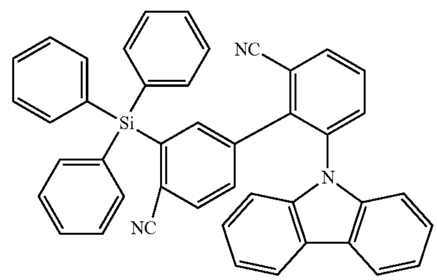
577
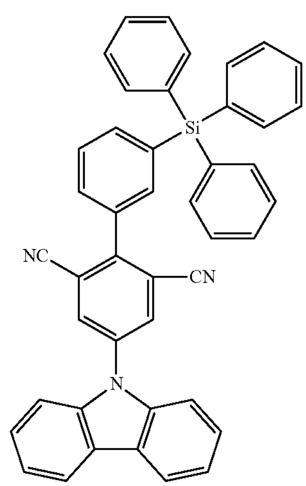

-continued
578
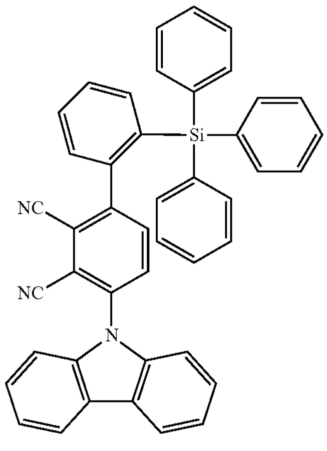
579
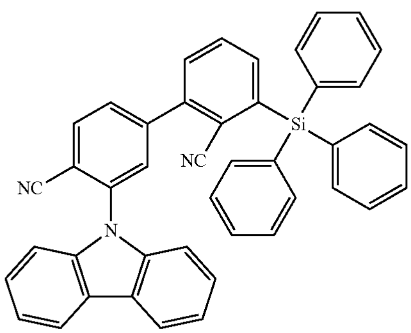
580
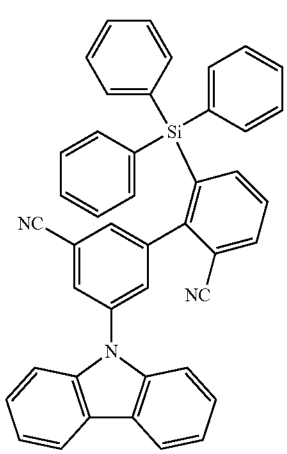
-continued
581
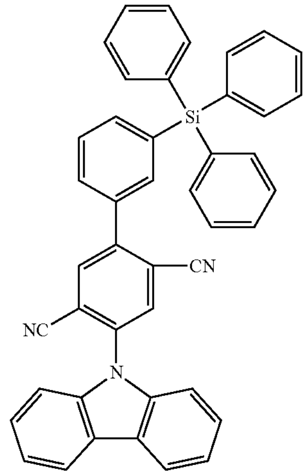
582
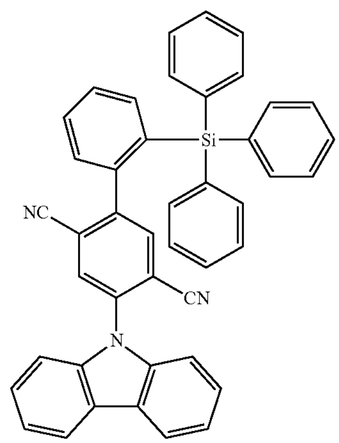
583
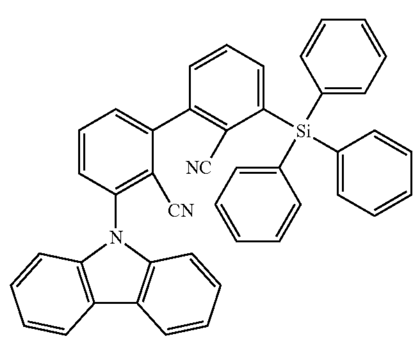

-continued
584
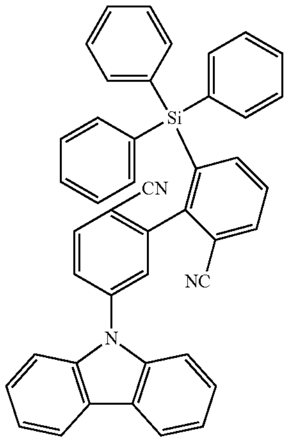
585
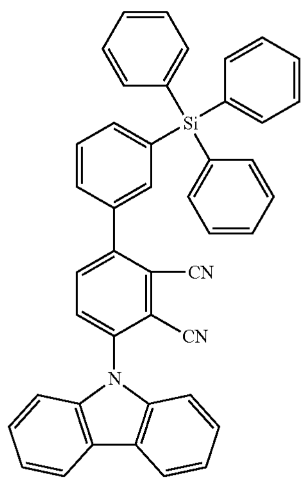
586
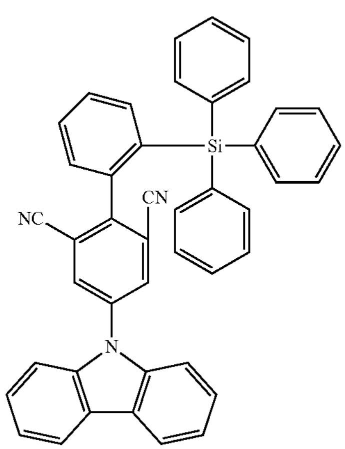
-continued
587
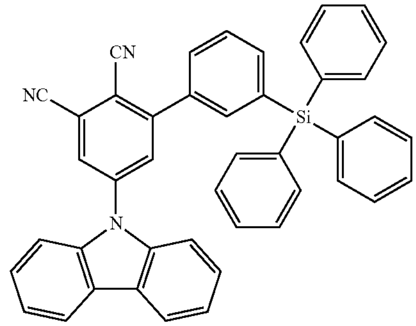
588
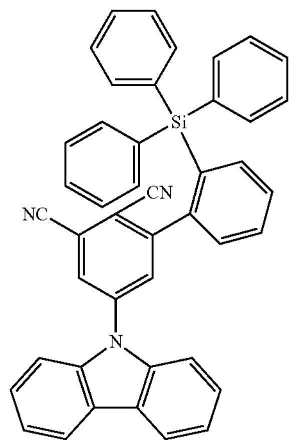
589
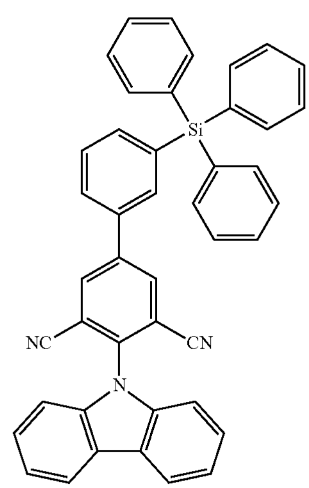

590
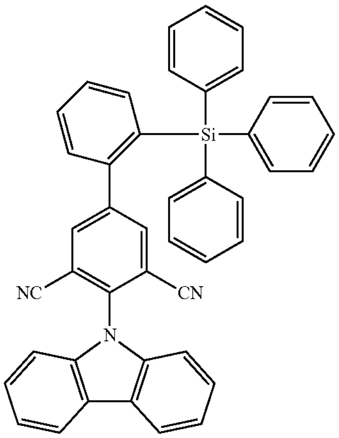
591
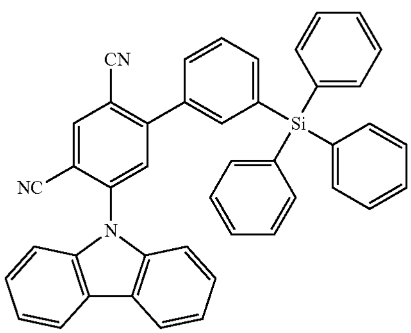
592
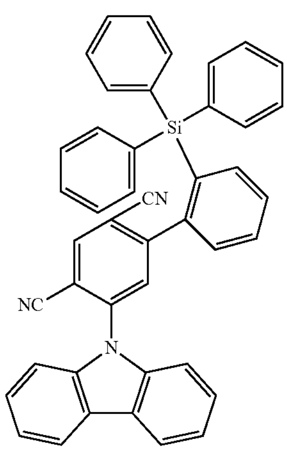
593
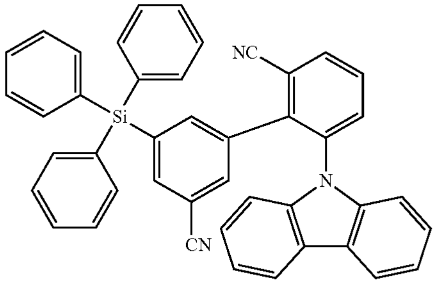
594
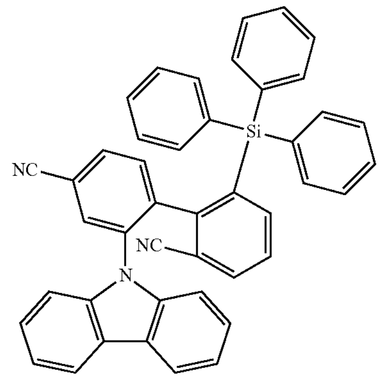
595
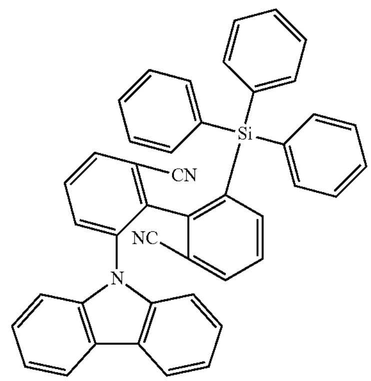
596
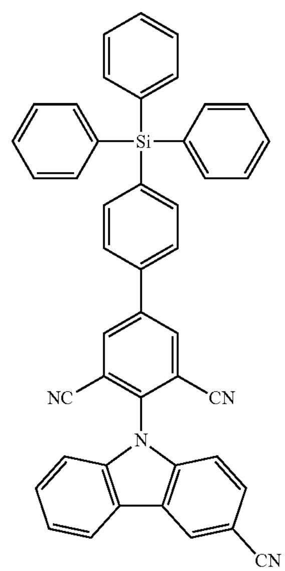
597
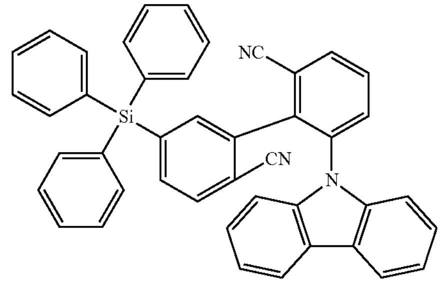

-continued
598
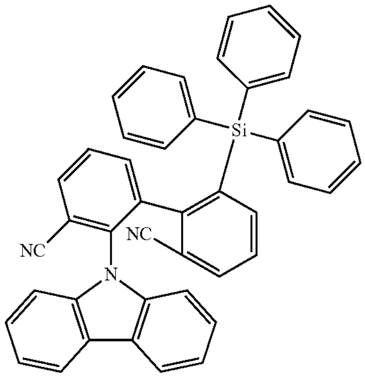
599
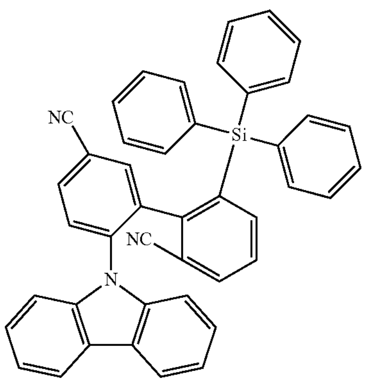
600
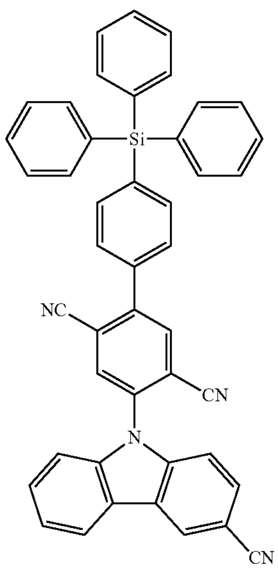
601
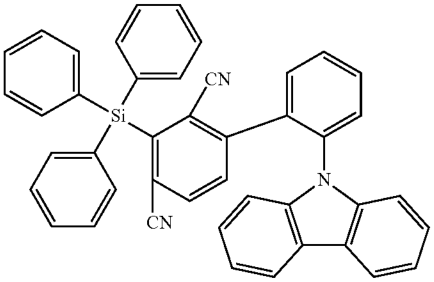
-continued
602
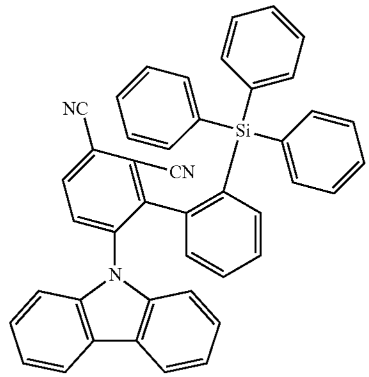
603
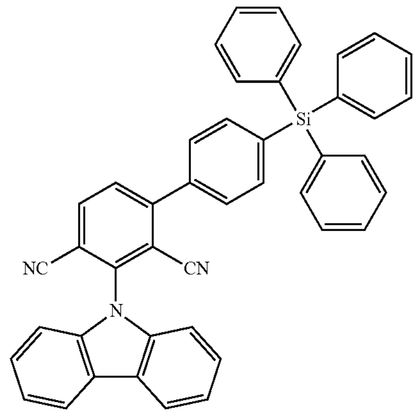
604
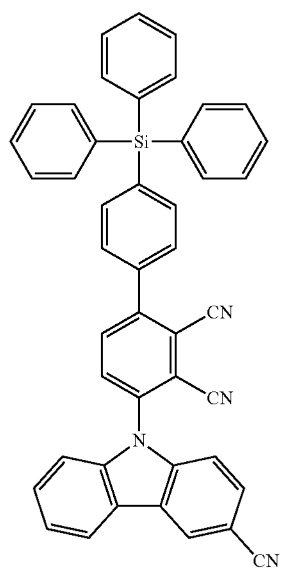
605
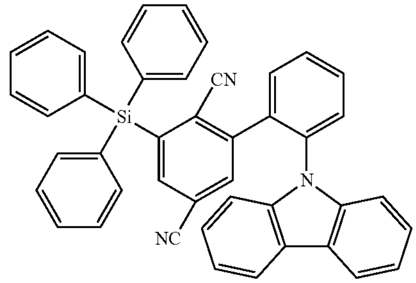

606
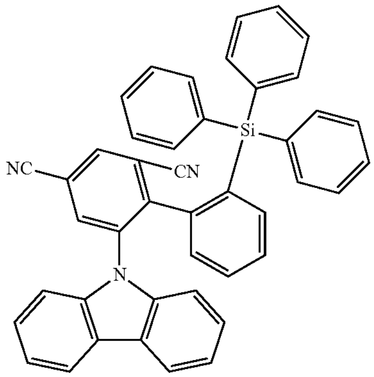
607
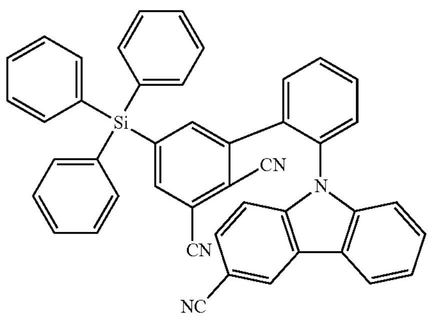
608
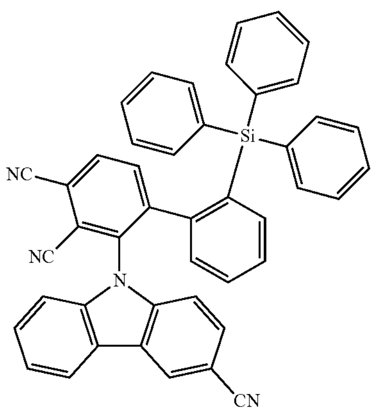
609
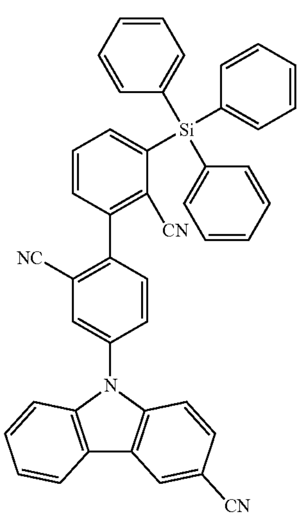
610
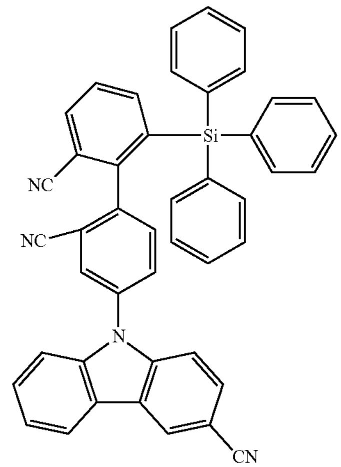
611
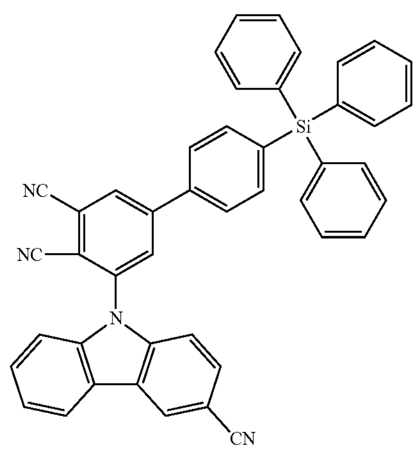
612
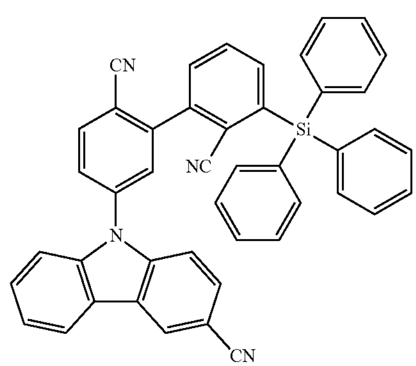

-continued
613
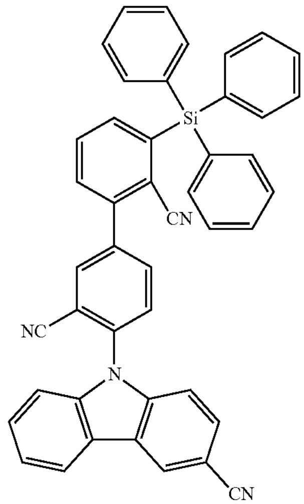
614
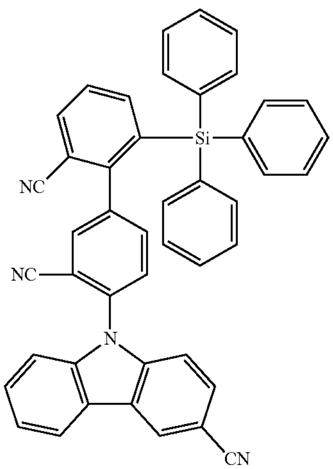
615
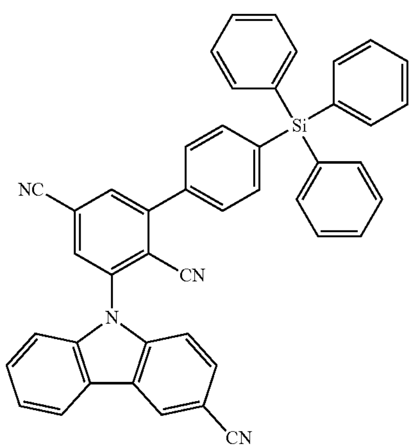
-continued
616
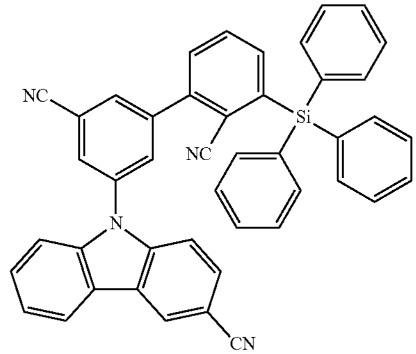
617
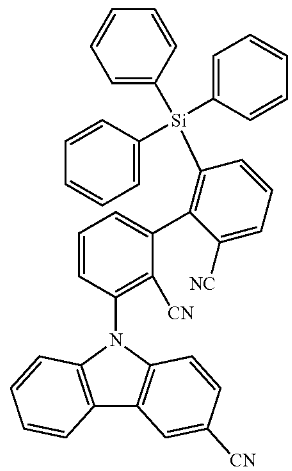
618
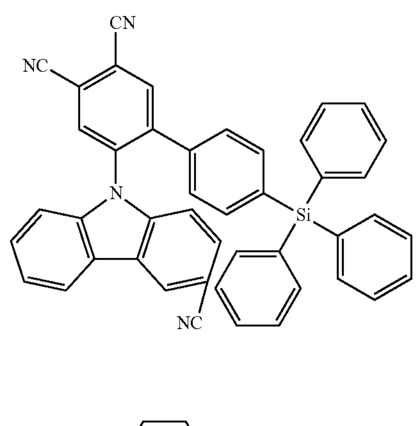
619
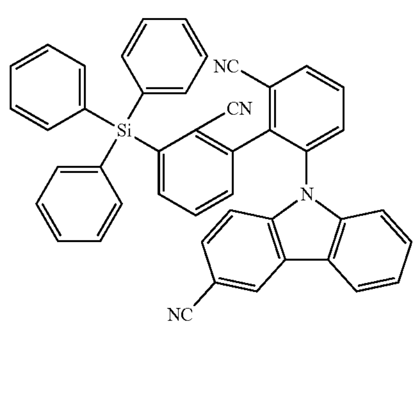

620
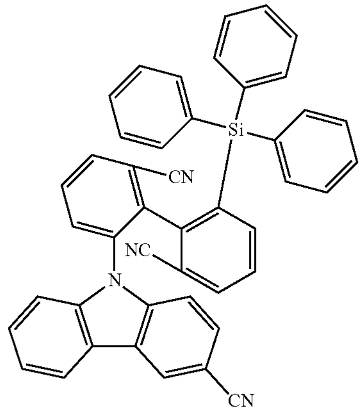
621
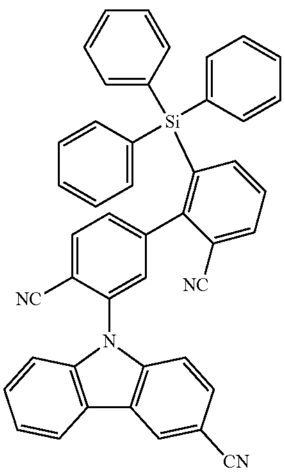
622
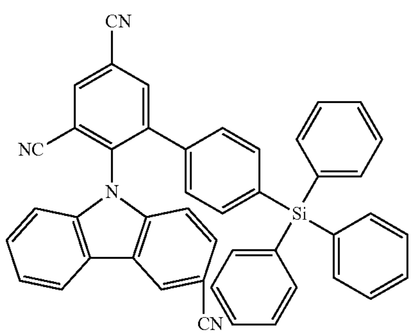
623
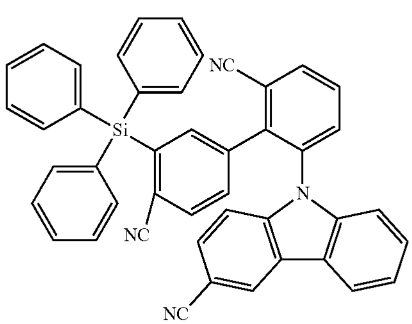
624
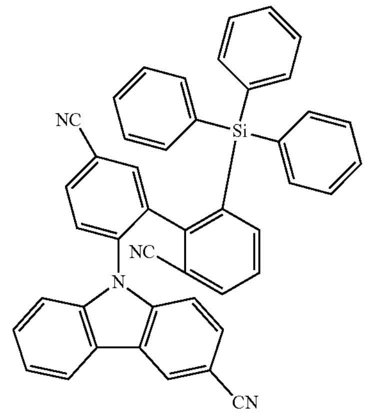
625
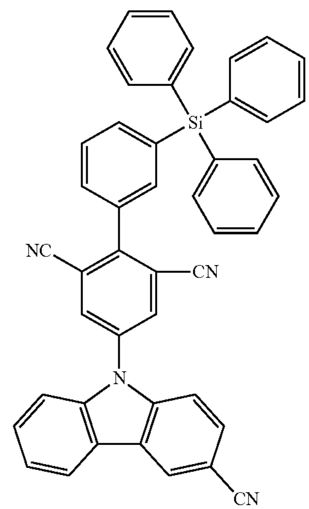
626
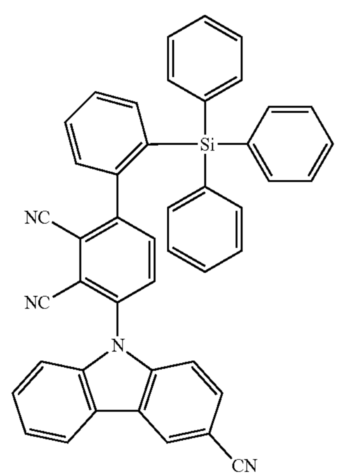

-continued
627
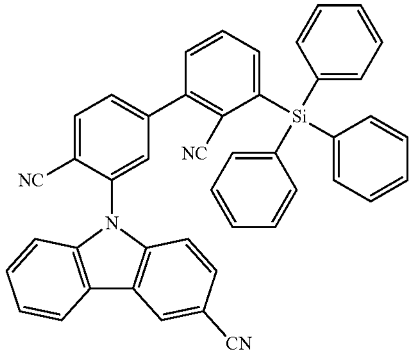
628
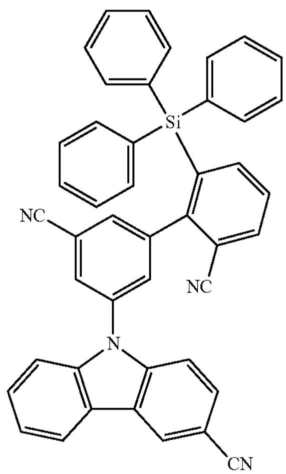
629
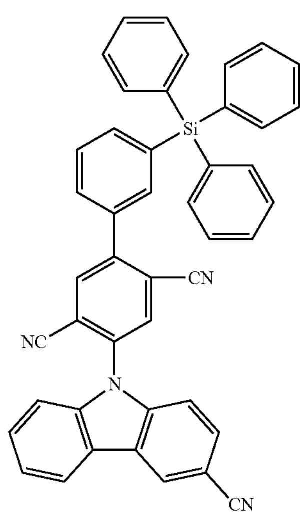
-continued
630
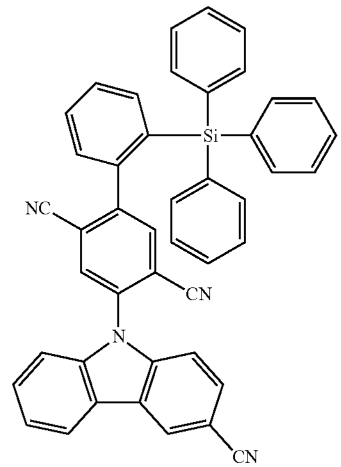
631
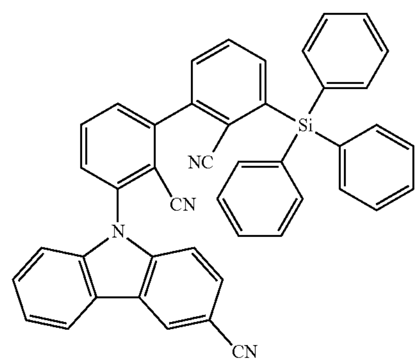
632
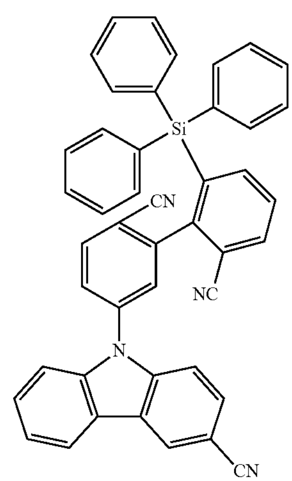

-continued
633
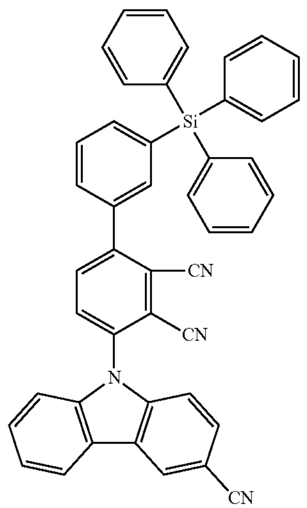
634
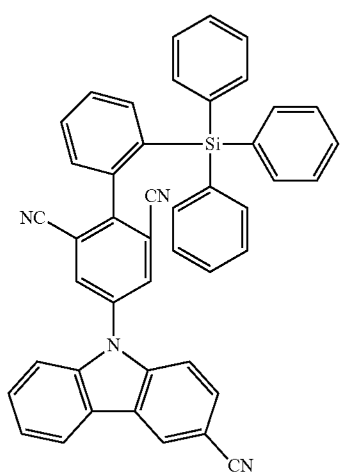
635
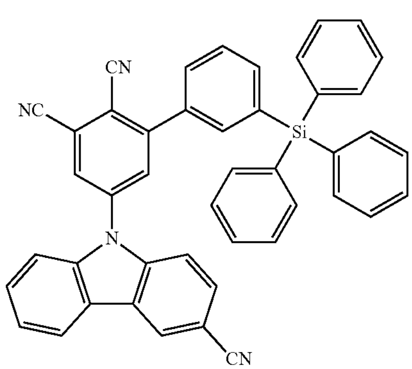
-continued
636
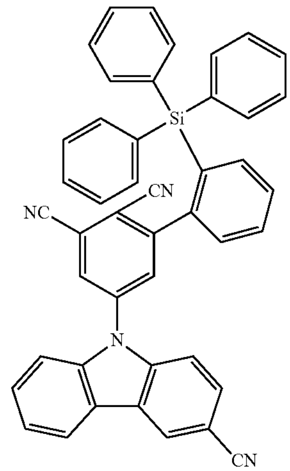
637
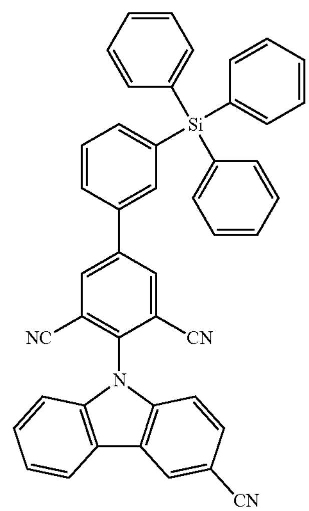
638
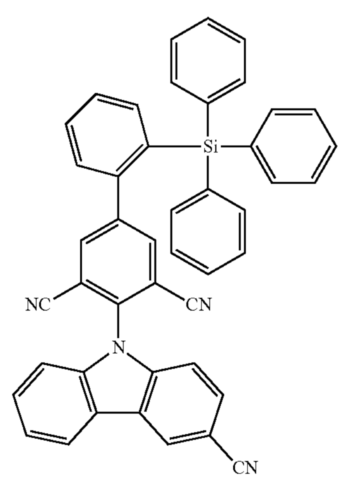

-continued
639
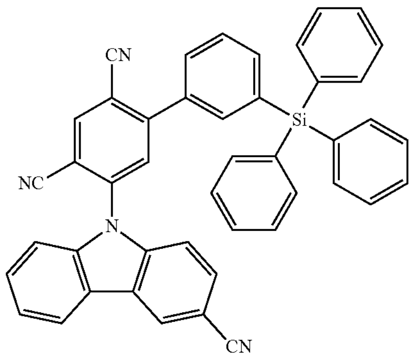
640
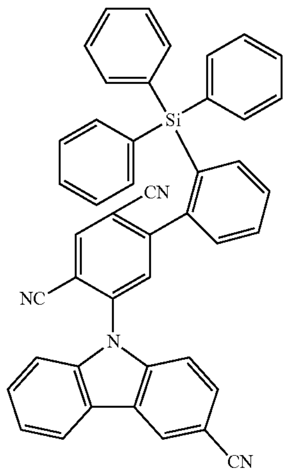
641
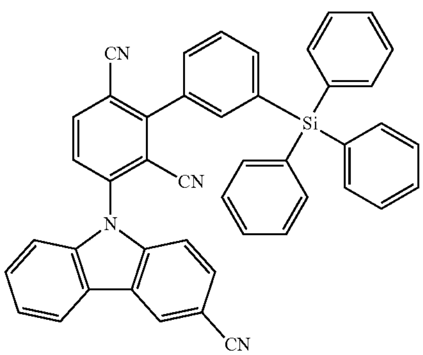
642
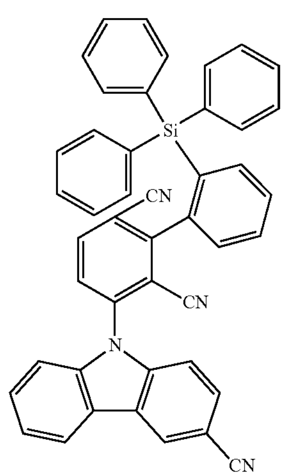
-continued
643
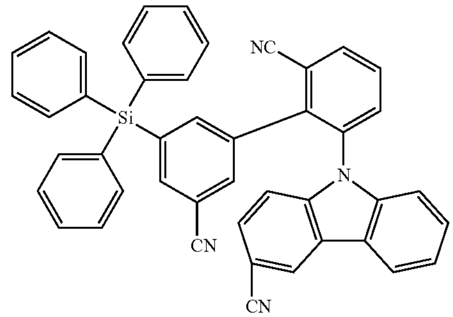
644
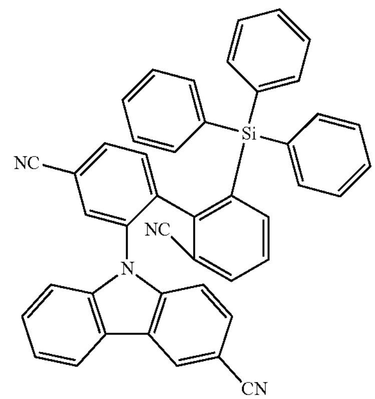
645
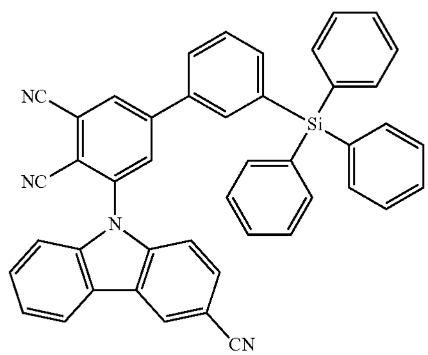
646
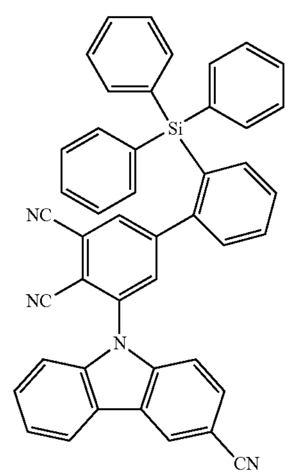

-continued
647
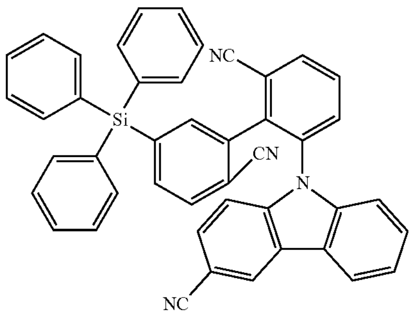
648
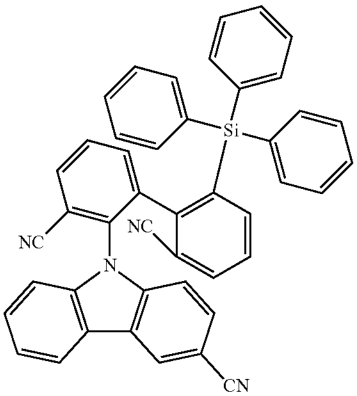
649
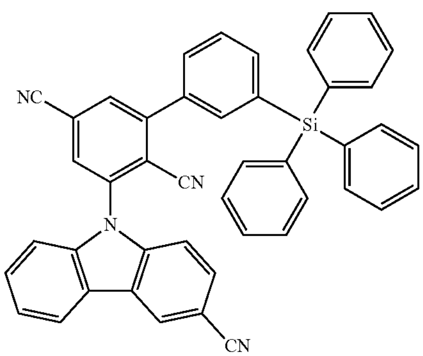
650
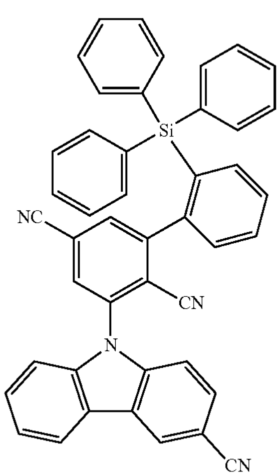
-continued
651
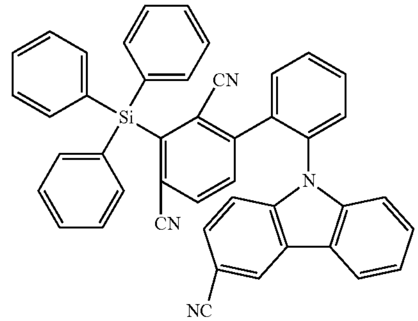
652
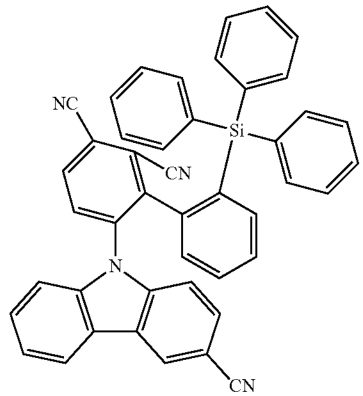
653
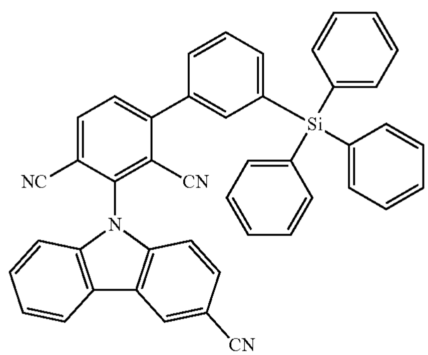
654
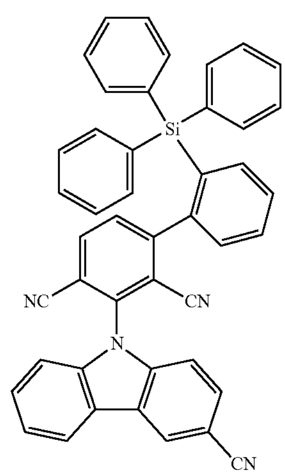

-continued
655
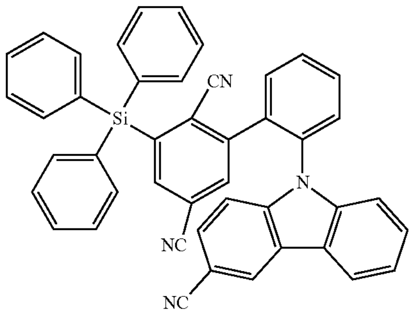
656
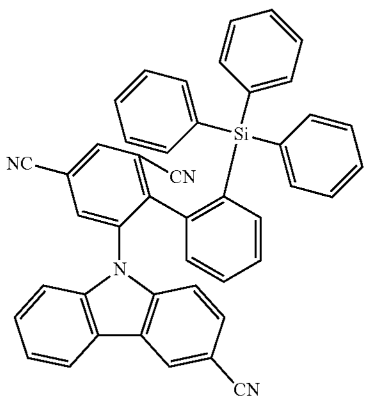
657
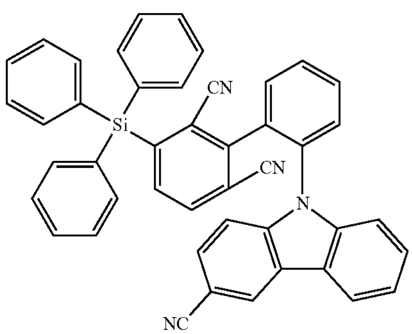
658
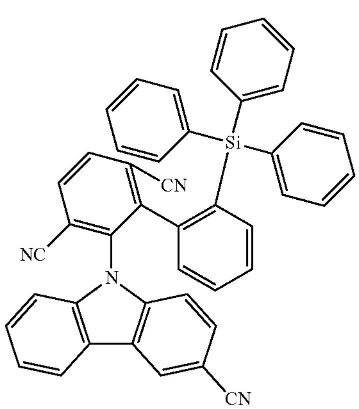
-continued
659
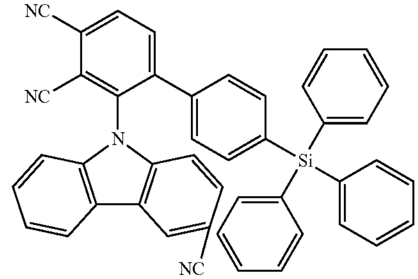
660
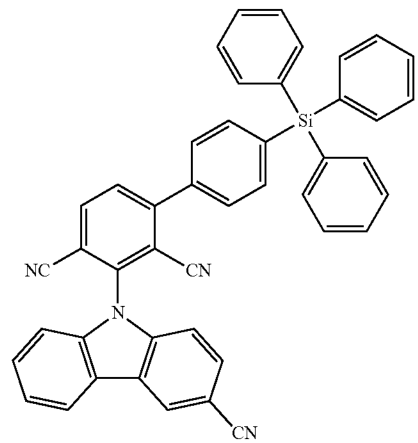
661
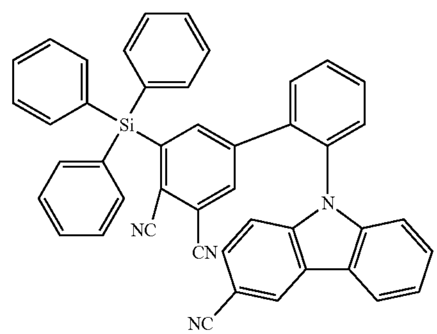
662
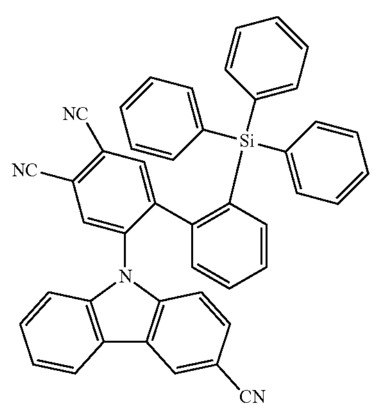

663
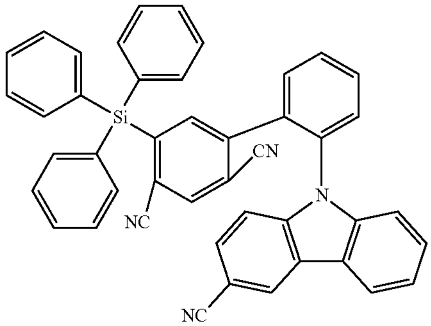
664
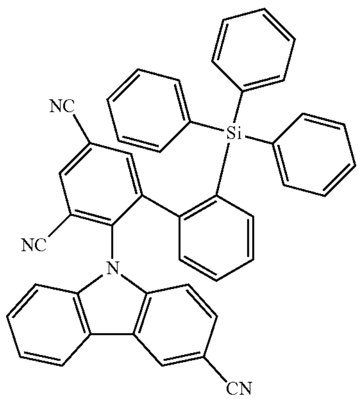
665
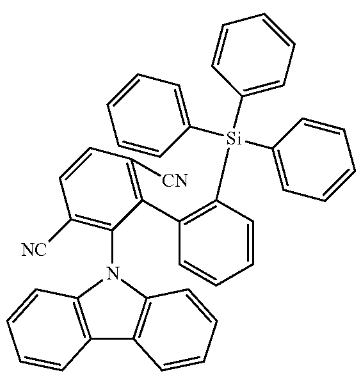
666
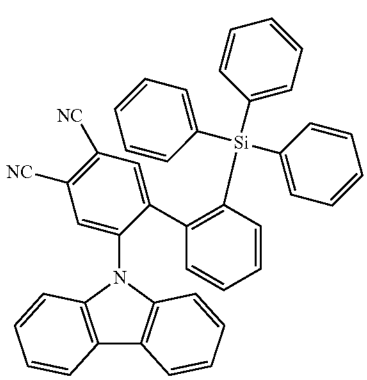
667
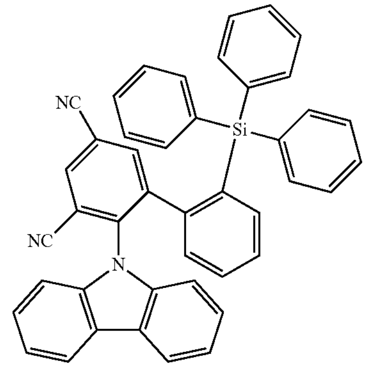
668
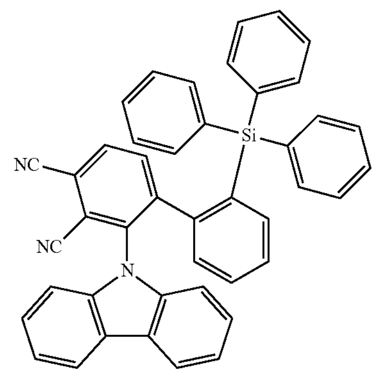
669
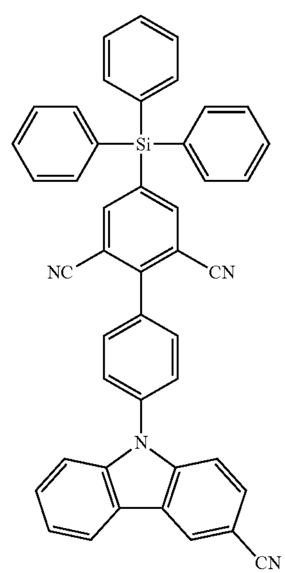

-continued

670

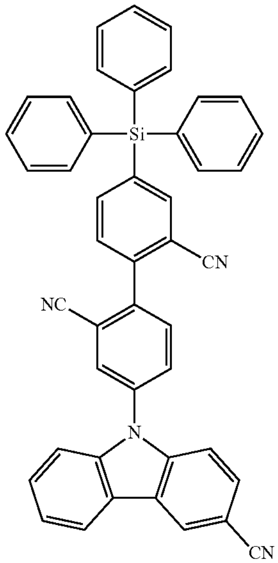

671

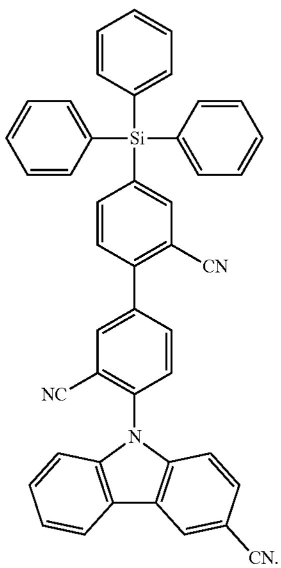

The condensed cyclic compound represented by Formula 1 may have a structure in which

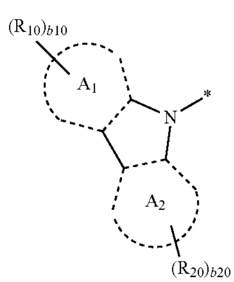

moiety may be connected to a silyl group via -$(L_1)_{a1}$-$(L_2)_{a2}$-$(L_3)_{a3}$-linker. Due to the steric hindrance induced by the silyl group substituted with $Ar_1$ to $Ar_3$, a conjugation length may be shortened. Accordingly, the condensed cyclic compound represented by Formula 1 may have a relatively high triplet (Ti) energy level, thus having relatively excellent electron and hole transportability.

Also, the condensed cyclic compound represented by Formula 1 may essentially include a cyano group. Accordingly, the condensed cyclic compound represented by Formula 1 may have a high $T_1$ energy level and excellent electron transportability.

Also, by controlling the position, at which a cyano group is substituted, in the condensed cyclic compound represented by Formula 1, the highest occupied molecular orbital (HOMO)/the lowest unoccupied molecular orbital (LUMO) energy level and electron and hole transportability may be controlled.

While not wishing to be bound by theory, it is understood that i) Compound A not including a cyano group may have deteriorated electron transportability, and ii) when Compound B including a halogen group as a substituent corresponding to the cyano group is used in an organic light-emitting device, device lifespan may be deteriorated. It is known that device lifespan may be deteriorated when a halogen group is substituted in Appl. Phys. Lett. 109, 243302 (2016); doi: 10.1063/1.497205.

Compound A

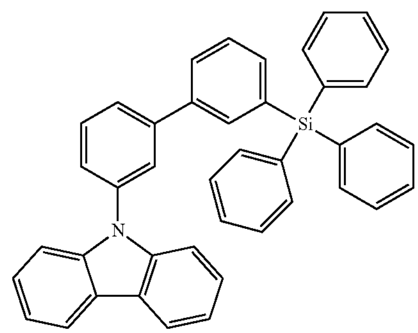

Compound B

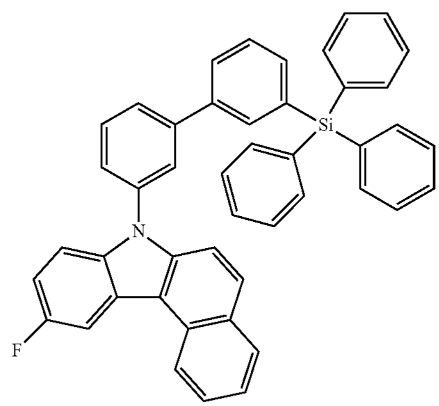

As described above, the condensed cyclic compound represented by Formula 1 may have suitable electric characteristics for a material for organic light-emitting devices, e.g., a host material in an emission layer. Accordingly, an organic light-emitting device including the condensed cyclic compound may have high efficiency and/or a long lifespan.

For example, the HOMO, LUMO, Ti, and singlet (Si) energy levels of some of the compounds described above were evaluated by using Gaussian according to a density functional theory (DFT) method (structure optimization is performed at a degree of B3LYP, and 6-31G(d,p)). The results thereof are shown in Table 1.

TABLE 1

| Compound No. | HOMO (electron volts, eV) | LUMO (eV) | $T_1$ (eV) | $S_1$ (eV) |
|---|---|---|---|---|
| 505 | −5.740 | −1.931 | 3.005 | 3.226 |
| 83 | −5.783 | −1.208 | 3.13 | 3.923 |
| 65 | −5.758 | −1.384 | 3.09 | 3.839 |
| 66 | −5.732 | −1.279 | 3.107 | 3.905 |
| 67 | −5.748 | −1.165 | 3.115 | 3.929 |
| 68 | −5.788 | −1.333 | 3.12 | 3.923 |
| 82 | −5.693 | −1.082 | 3.119 | 3.954 |
| 57 | −5.728 | −1.076 | 3.126 | −5.728 |
| 81 | −5.77 | −1.221 | 3.121 | 3.971 |
| 84 | −5.764 | −1.118 | 3.128 | 3.979 |
| 339 | −6.201 | −1.572 | 3.084 | 3.953 |
| 321 | −6.164 | −1.627 | 3.078 | 3.906 |
| 322 | −6.142 | −1.595 | 3.078 | 3.904 |
| 323 | −6.157 | −1.608 | 3.074 | 3.892 |
| 324 | −6.214 | −1.603 | 3.08 | 3.94 |
| 338 | −6.112 | −1.531 | 3.076 | 3.914 |
| 146 | −6.143 | −1.519 | 3.081 | 3.946 |
| 337 | −6.196 | −1.589 | 3.08 | 3.937 |
| 145 | −6.173 | −1.528 | 3.085 | 3.962 |
| 44 | −5.624 | −1.857 | 2.947 | 3.143 |
| 9 | −5.581 | −1.727 | 2.891 | 3.296 |
| 34 | −5.589 | −1.697 | 2.938 | 3.317 |
| 35 | −5.556 | −1.496 | 3.103 | 3.465 |
| 16 | −5.615 | −1.704 | 3.036 | 3.309 |
| 56 | −5.527 | −1.554 | 3.068 | 3.37 |
| 60 | −5.529 | −1.652 | 3.072 | 3.249 |
| 46 | −5.59 | −1.636 | 3.054 | 3.346 |
| 24 | −5.587 | −1.783 | 2.992 | 3.18 |
| 87 | −5.467 | −1.38 | 3.18 | 3.639 |
| 69 | −5.398 | −1.401 | 3.025 | 3.578 |
| 70 | −5.356 | −1.465 | 3.079 | 3.566 |
| 71 | −5.383 | −1.463 | 3.176 | 3.551 |
| 72 | −5.414 | −1.398 | 3.175 | 3.597 |
| 86 | −5.361 | −1.423 | 3.176 | 3.518 |
| 61 | −5.435 | −1.331 | 3.169 | 3.684 |
| 85 | −5.39 | −1.475 | 3.18 | 3.609 |
| 88 | −5.44 | −1.341 | 3.178 | 3.766 |
| 302 | −6.027 | −1.885 | 3.088 | 3.544 |

Referring to Table 1, the compounds have excellent electric characteristics, e.g., a high $T_1$ energy level. Thus, the condensed cyclic compound represented by Formula 1 may be suitable for use as an emission layer material in an electronic device, e.g., an organic light-emitting device.

A method of synthesizing the condensed cyclic compound represented by Formula 1 may be apparent to one of ordinary skill in the art by referring to Synthesis Examples provided herein.

The condensed cyclic compound represented by Formula 1 may be suitable for use as an organic layer material of an organic light-emitting device, for example, an emission layer material, a hole transport region material, and/or an electron transport region material of the organic layer. In some embodiments, the condensed cyclic compound may be used as an emission layer material. In one or more embodiments, the condensed cyclic compound may be used as a hole transport region material, e.g., an electron blocking layer material. In one or more embodiments, the condensed cyclic compound may be used as an electron transport region material, e.g., a hole blocking layer material.

Accordingly, according to an aspect of another embodiment, an organic light-emitting device may include: a first electrode; a second electrode; and an organic layer disposed between the first electrode and the second electrode, wherein the organic layer includes an emission layer and at least one condensed cyclic compound represented by Formula 1.

As the organic light-emitting device has an organic layer including the condensed cyclic compound represented by Formula 1, the organic light-emitting device may have a low driving voltage, high efficiency, high luminance, high quantum efficiency, and long lifespan.

In an embodiment, in the organic light-emitting device, the first electrode may be an anode, and the second electrode may be a cathode, the organic layer may include a hole transport region between the first electrode and the emission layer and an electron transport region between the emission layer and the second electrode, wherein the hole transport region may include a hole injection layer, a hole transport layer, an electron blocking layer, or any combination thereof, and the electron transport region may include a hole blocking layer, an electron transport layer, an electron injection layer, or a combination thereof, but embodiments are not limited thereto.

In an embodiment, the emission layer in the organic light-emitting device may include at least one condensed cyclic compound represented by Formula 1.

In an embodiment, the emission layer in the organic light-emitting device may include a host and a dopant, wherein the host may include at least one of the condensed cyclic compound represented by Formula 1, and the dopant may include a phosphorescent dopant or a fluorescent dopant. In some embodiments, the dopant may include a phosphorescent dopant (e.g., an organometallic compound represented by Formula 81 provided herein). The host may further include any suitable host, in addition to the condensed cyclic compound represented by Formula 1.

The emission layer may emit red light, green light, or blue light.

In an embodiment, the emission layer may include a phosphorescent dopant, but embodiments are not limited thereto.

In some embodiments, the condensed cyclic compound represented by Formula 1 may be included in a hole transport region of the organic light-emitting device.

In some embodiments, a hole transport region of the organic light-emitting device may include at least one selected from a hole injection layer, a hole transport layer, and an electron blocking layer, wherein at least one selected from the hole injection layer, the hole transport layer, and the electron blocking layer may include the condensed cyclic compound represented by Formula 1.

In some embodiments, the condensed cyclic compound represented by Formula 1 may be included in an electron transport region of the organic light-emitting device.

In some embodiments, a hole transport region of the organic light-emitting device may include at least one selected from a hole blocking layer, an electron transport layer, and an electron injection layer, wherein at least one selected from the hole blocking layer, the electron transport layer, and the electron injection layer, may include the condensed cyclic compound represented by Formula 1.

In an embodiment, a hole transport region of the organic light-emitting device may include an electron blocking layer, wherein the electron blocking layer may include the condensed cyclic compound represented by Formula 1. The electron blocking layer may be in a direct contact with the emission layer.

In an embodiment, an electron transport region of the organic light-emitting device may include a hole blocking layer, wherein the hole blocking layer may include the condensed cyclic compound represented by Formula 1. The hole blocking layer may be in a direct contact with the emission layer.

In one or more embodiments, the organic layer of the organic light-emitting device may further include an organometallic compound represented by Formula 81, in addition to the condensed cyclic compound represented by Formula 1.

Formula 81

$$M(L_{81})_{n81}(L_{82})_{n82}$$

Formula 81A

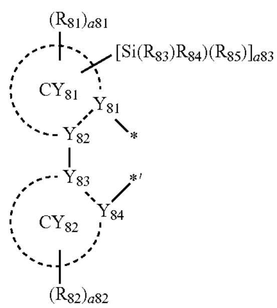

wherein, in Formulae 81 and 81A,

M may be selected from iridium (Ir), platinum (Pt), osmium (Os), titanium (Ti), zirconium (Zr), hafnium (Hf), europium (Eu), terbium (Tb), thulium (Tm), and rhodium (Rh), $L_{81}$ may be a ligand represented by Formula 81A, n81 may be an integer from 1 to 3; and when n81 is 2 or greater, at least two $L_{81}$ groups may be identical to or different from each other, $L_{82}$ may be an organic ligand, n82 may be an integer from 0 to 4; and when n82 is 2 or greater, at least two $L_{82}$ groups may be identical to or different from each other, $Y_{81}$ to $Y_{84}$ may each independently be C or N, $Y_{81}$ and $Y_{82}$ may be bound via a single bond or a double bond, $Y_{83}$ and $Y_{84}$ may be bound via a single bond or a double bond, $CY_{81}$ and $CY_{82}$ may each independently be selected from a $C_5$-$C_{30}$ carbocyclic group and a $C_2$-$C_{30}$ heterocarbocyclic group, $CY_{81}$ and $CY_{82}$ may optionally or additionally be bound via an organic linking group, $R_{81}$ to $R_{85}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{81})(Q_{82})(Q_{83})$, —$N(Q_{84})(Q_{85})$, —$B(Q_{86})(Q_{87})$, and —$P(=O)(Q_{88})(Q_{89})$, a81 to a83 may each independently be an integer from 0 to 5, when a81 is 2 or greater, at least two groups $R_{81}$ may be identical to or different from each other, when a82 is 2 or greater, at least two groups $R_{82}$ may be identical to or different from each other, when a81 is 2 or greater, two adjacent groups $R_{81}$ may be optionally bound to form a saturated or unsaturated $C_2$-$C_{30}$ ring (e.g., a benzene ring, a cyclopentane ring, a cyclohexane ring, a cyclopentene ring, a cyclohexene ring, a norbornane ring, a (bicyclo[2.2.1]heptanes) ring, a naphthalene ring, a benzoindene ring, a benzoindole ring, a benzofuran ring, a benzothiophene ring, a pyridine ring, a pyrimidine ring, or a pyrazine ring), or a saturated or unsaturated $C_2$-$C_{30}$ ring substituted with at least one $R_{88}$ (e.g., a benzene ring, a cyclopentane ring, a cyclohexane ring, a cyclopentene ring, a cyclohexene ring, a norbornane ring, a (bicyclo[2.2.1]heptanes) ring, a naphthalene ring, a benzoindene ring, a benzoindole ring, a benzofuran ring, a benzothiophene ring, a pyridine ring, a pyrimidine ring, or a pyrazine ring, each substituted with at least one $R_{88}$), when a82 is 2 or greater, two adjacent groups $R_{82}$ may be optionally bound to form a saturated or unsaturated $C_2$-$C_{30}$ ring (e.g., a benzene ring, a cyclopentane ring, a cyclohexane ring, a cyclopentene ring, a cyclohexene ring, a norbornane ring, a (bicyclo[2.2.1]heptanes) ring, a naphthalene ring, a benzoindene ring, a benzoindole ring, a benzofuran ring, a benzothiophene ring, a pyridine ring, a pyrimidine ring, or a pyrazine ring), or a saturated or unsaturated $C_2$-$C_{30}$ ring substituted with at least one $R_{89}$ (e.g., a benzene ring, a cyclopentane ring, a cyclohexane ring, a cyclopentene ring, a cyclohexene ring, a norbornane ring, a (bicyclo[2.2.1]heptanes) ring, a naphthalene ring, a benzoindene ring, a benzoindole ring, a benzofuran ring, a benzothiophene ring, a pyridine ring, a pyrimidine ring, or a pyrazine ring, each substituted with at least one $R_{89}$), $R_{88}$ may be understood by referring to the descriptions for $R_{81}$ provided herein, $R_{89}$ may be understood by referring to the descriptions for $R_{82}$ provided herein, in Formula 81A, * and *' each indicate a binding site to M in Formula 81, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —$Si(Q_{91})(Q_{92})(Q_{93})$, wherein $Q_{81}$ to $Q_{89}$ and $Q_{91}$ to $Q_{93}$ may each independently be selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an embodiment, in Formula 81A, a83 may be 1 or 2, and $R_{83}$ to $R_{85}$ may each independently be selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In one or more embodiments, in Formula 81A, $Y_{81}$ may be N, $Y_{82}$ and $Y_{83}$ may each be C, $Y_{84}$ may be N or C, and $CY_{81}$ and $CY_{82}$ may each independently be selected from a cyclopentadiene group, a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, an indazole group, a pyrazole group, an imidazole group, a triazole group, an oxazole group, an isoxazole group, an oxadiazole group, a thiazole group, an isothiazole group, a thiadiazole group, a purine group, a furan group, a thiophene group, a pyridine group, a pyrimidine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, a benzofuran group, a benzothiophene group, an iso-benzothiazole group, a benzoxazole group, an isobenzoxazole group, a benzocarbazole group, a dibenzocarbazole group, an imidazopyridine group, an imidazopyrimidine group, a dibenzofuran group, a dibenzothiophene group, a dibenzothiophene sulfone group, a carbazole group, a dibenzosilole group, and a 2,3-dihydro-1H-imidazole group.

In one or more embodiments, in Formula 81A, $Y_{81}$ may be N, $Y_{82}$ to $Y_{84}$ may each be C, $CY_{81}$ may be selected from 5-membered rings including two N atoms as ring-forming atoms, and $CY_{82}$ may be selected from a benzene group, a naphthalene group a fluorene group, a dibenzofuran group, and a dibenzothiophene group, but embodiments are not limited thereto.

In one or more embodiments, in Formula 81A, $Y_{81}$ may be N, $Y_{82}$ to $Y_{84}$ may each be C, $CY_{81}$ may be an imidazole group or a 2,3-dihydro-1H-imidazole group, and $CY_{82}$ may be selected from a benzene group, a naphthalene group a fluorene group, a dibenzofuran group, and a dibenzothiophene group, but embodiments are not limited thereto.

In one or more embodiments, in Formula 81A, $Y_{81}$ may be N, $Y_{82}$ to $Y_{84}$ may each be C, $CY_{81}$ may be selected from a pyrrole group, a pyrazole group, an imidazole group, a triazole group, an oxazole group, an isoxazole group, an oxadiazole group, a thiazole group, an isothiazole group, a thiadiazole group, a pyridine group, a pyrimidine group, a quinoline group, an isoquinoline group, a benzoquinoline group, a phthalazine group, a naphthyridine group, a quinoxaline group, a quinazoline group, a cinnoline group, a benzimidazole group, an isobenzothiazole group, a benzoxazole group, and an isobenzoxazole group, and $CY_{82}$ may be selected from a cyclopentadiene group, a benzene group, a naphthalene group, a fluorene group, a benzofluorene group, a dibenzofluorene group, a phenanthrene group, an anthracene group, a triphenylene group, a pyrene group, a chrysene group, a perylene group, a benzofuran group, a benzothiophene group, a benzocarbazole group, a dibenzocarbazole group, a dibenzofuran group, a dibenzothiophene group, a dibenzothiophene sulfone group, a carbazole group, and a dibenzosilole group.

In one or more embodiments, in Formula 81A, $R_{81}$ and $R_{82}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $—B(Q_{86})(Q_{87})$ and $—P(═O)(Q_{88})(Q_{89})$, wherein $Q_{86}$ to $Q_{89}$ may each independently be selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $-CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In one or more embodiments, in Formula 81A, at least one selected from groups $R_{81}$ in the number of a81 and groups $R_{82}$ in the number of a82 may be a cyano group.

In one or more embodiments, in Formula 81A, at least one of groups $R_{82}$ in the number of a82 may be a cyano group.

In one or more embodiments, in Formula 81A, at least one of groups $R_{81}$ in the number of a81 and groups $R_{82}$ in the number of a82 may be deuterium.

In one or more embodiments, in Formula 81, $L_{82}$ may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114):

3-1(1)

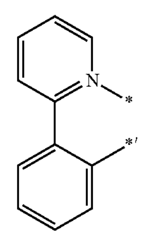

3-1(2)

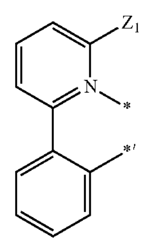

3-1(3)

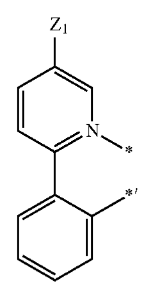

3-1(4)

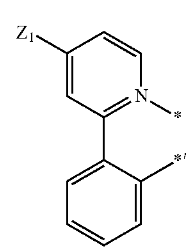

-continued
3-1(5)
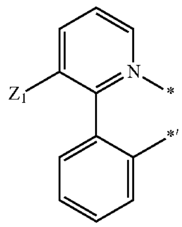
3-1(6)
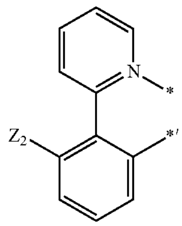
3-1(7)
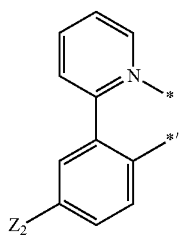
3-1(8)
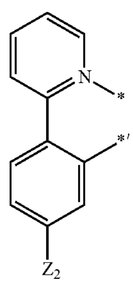
3-1(9)
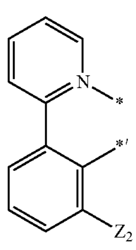
3-1(10)
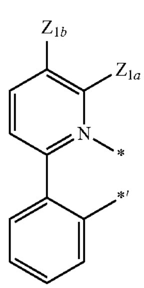
-continued
3-1(11)
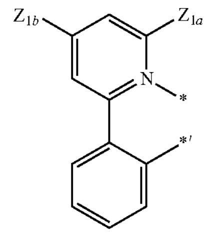
3-1(12)
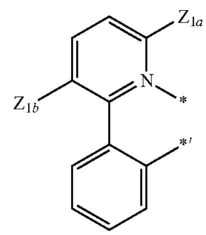
3-1(13)
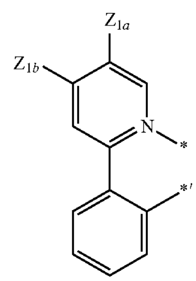
3-1(14)
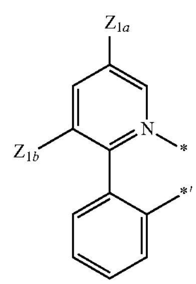
3-1(15)
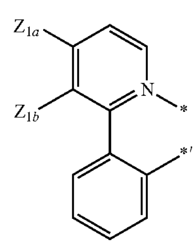
3-1(16)
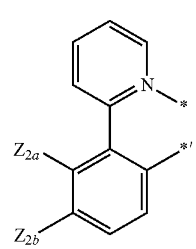

-continued
3-1(17)
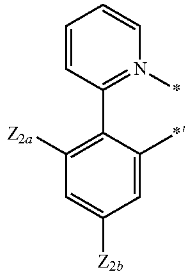
3-1(18)
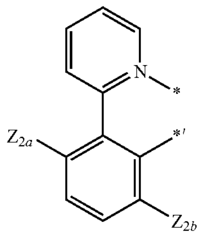
3-1(19)
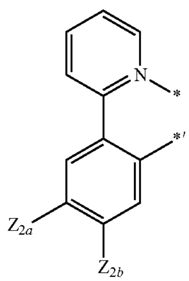
3-1(20)
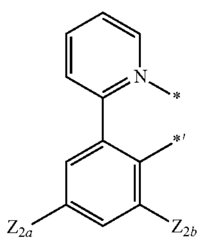
3-1(21)
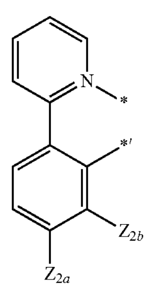
3-1(22)
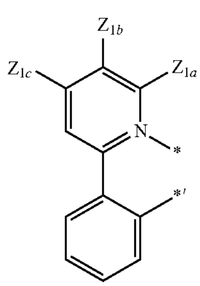
-continued
3-1(23)
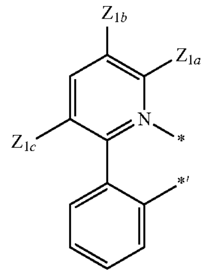
3-1(24)
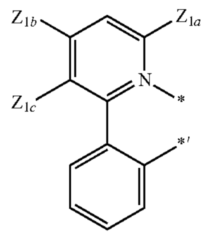
3-1(25)
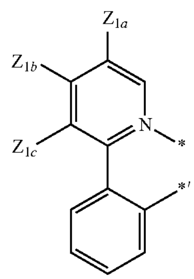
3-1(26)
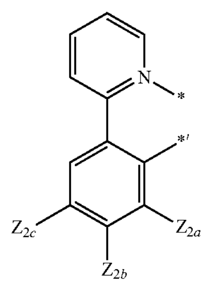
3-1(27)
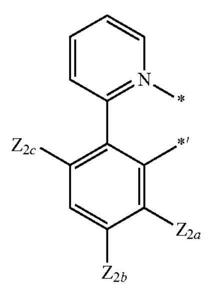
3-1(28)
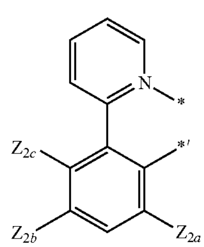

-continued
3-1(29)
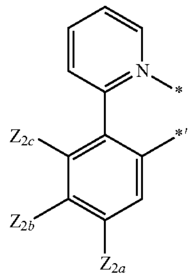
3-1(30)
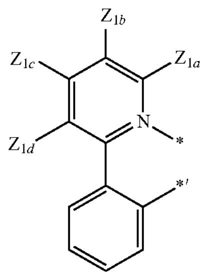
3-1(31)
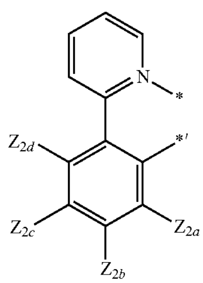
3-1(32)
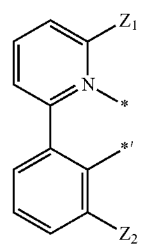
3-1(33)
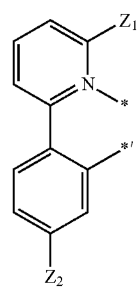
3-1(34)
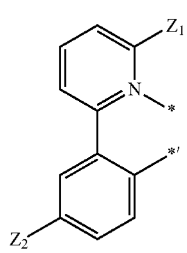
-continued
3-1(35)
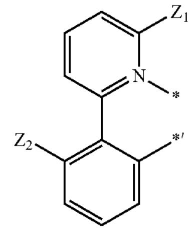
3-1(36)
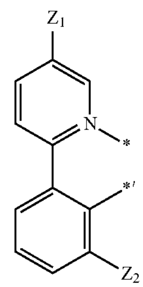
3-1(37)
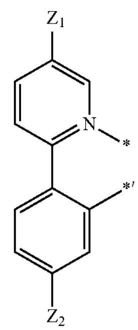
3-1(38)
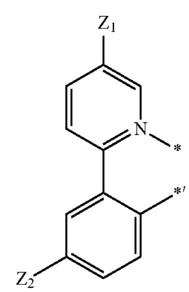
3-1(39)
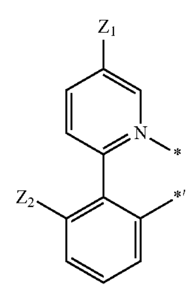

-continued
3-1(40)
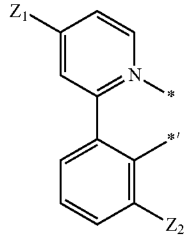
3-1(41)
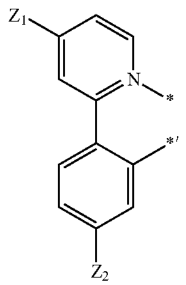
3-1(42)
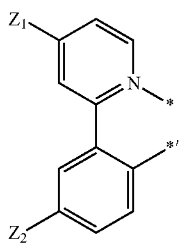
3-1(43)
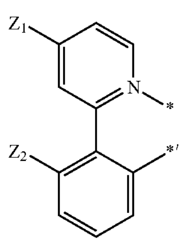
3-1(44)
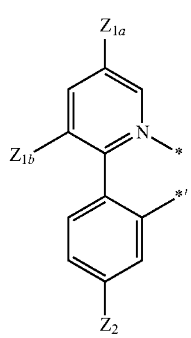
3-1(45)
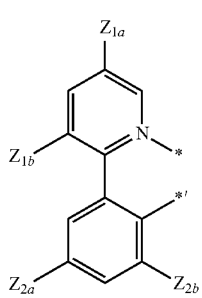
-continued
3-1(46)
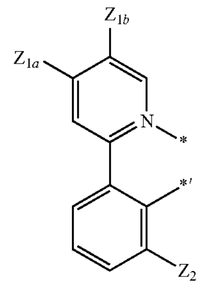
3-1(47)
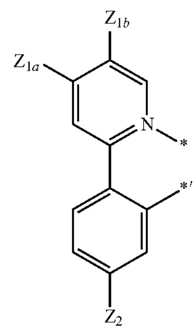
3-1(48)
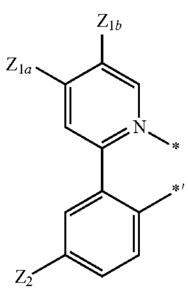
3-1(49)
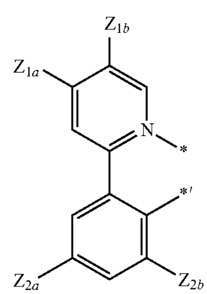
3-1(50)
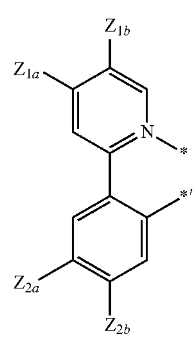

3-1(51)
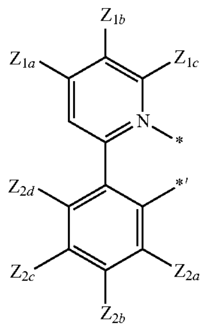
3-1(52)
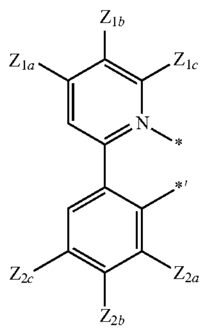
3-1(53)
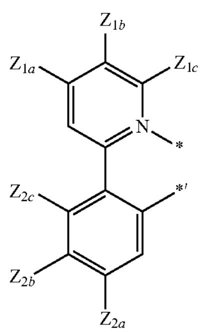
3-1(54)
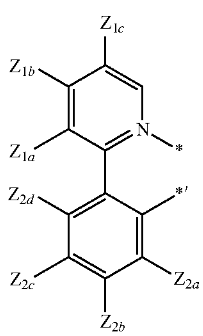
3-1(55)
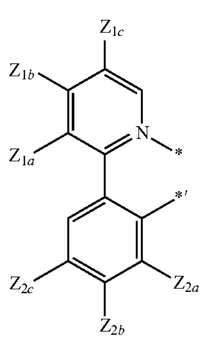
3-1(56)
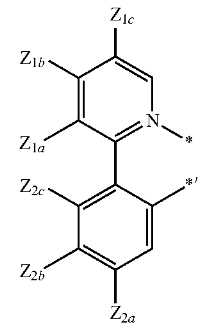
3-1(57)
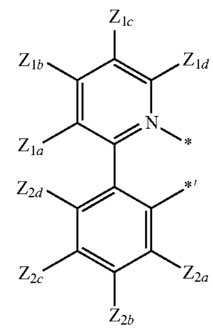
3-1(58)
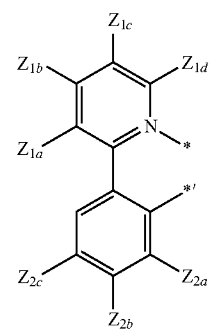
3-1(59)
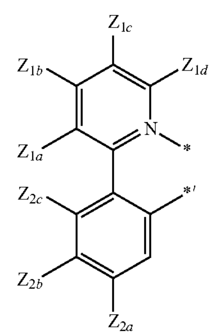
3-1(60)
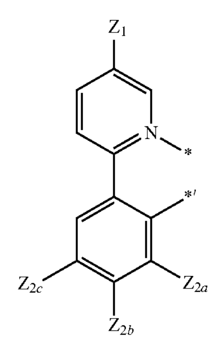

-continued
3-1(61)
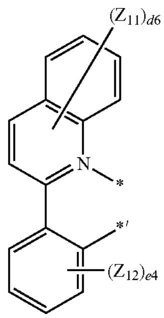
3-1(62)
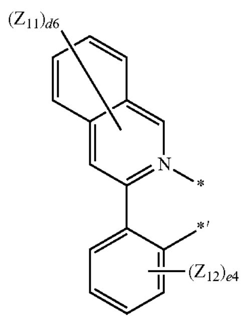
3-1(63)
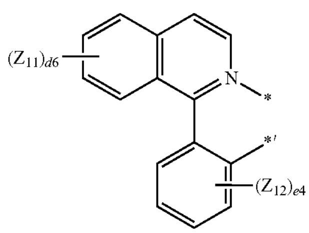
3-1(64)
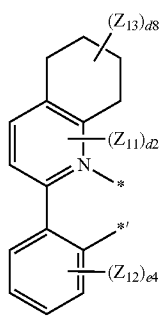
3-1(65)
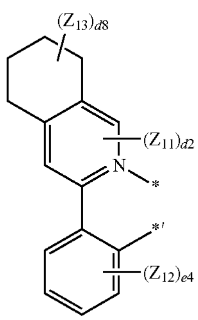
-continued
3-1(66)
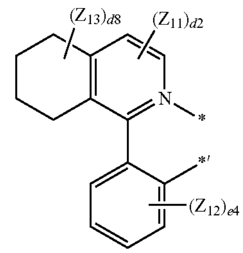
3-1(67)
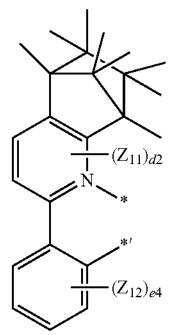
3-1(68)
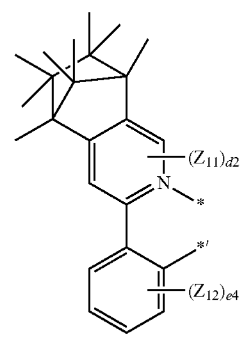
3-1(69)
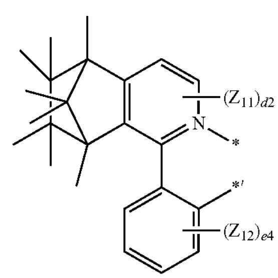
3-1(71)
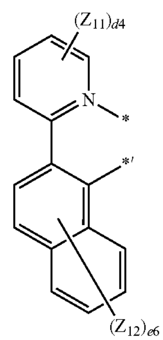

-continued
3-1(72)
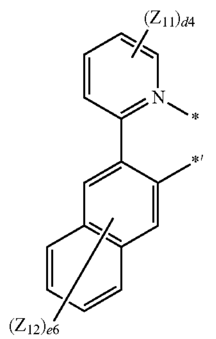
3-1(73)
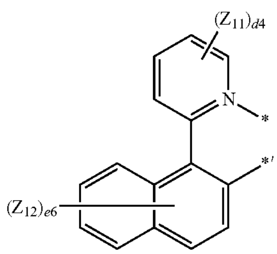
3-1(74)
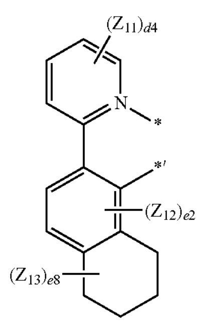
3-1(75)
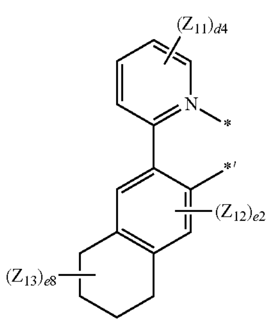
3-1(76)
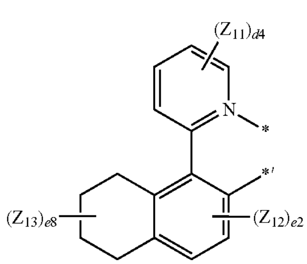
-continued
3-1(77)
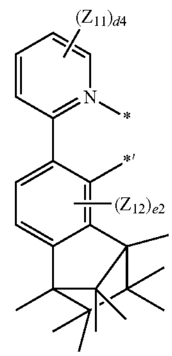
3-1(78)
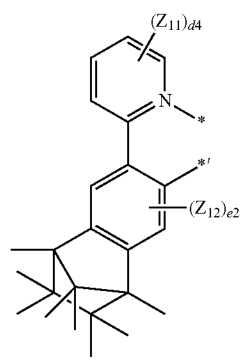
3-1(79)
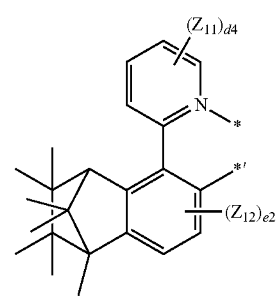
3-1(81)
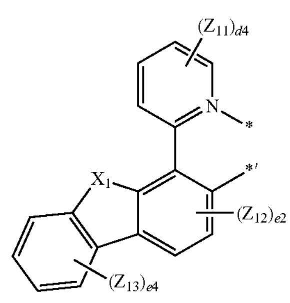
3-1(82)
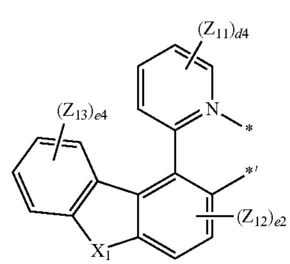

-continued
3-1(83)
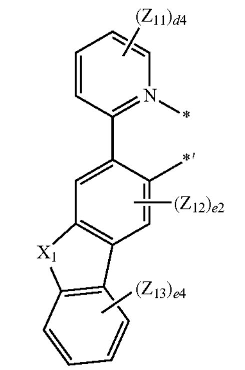
3-1(84)
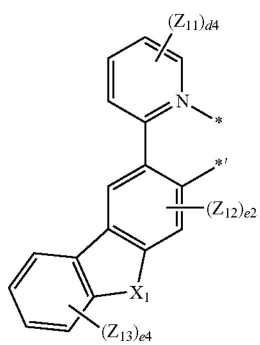
3-1(85)
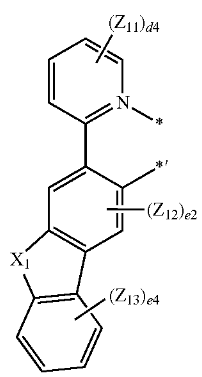
3-1(86)
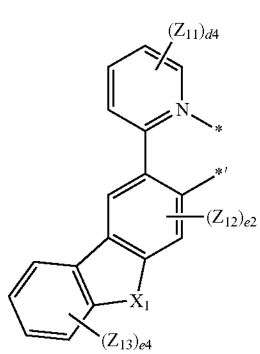
-continued
3-1(87)
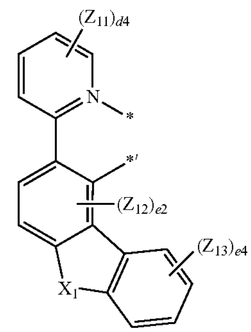
3-1(88)
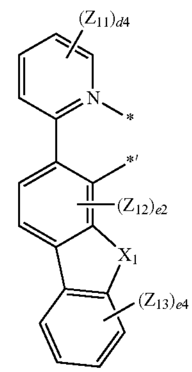
3-1(91)
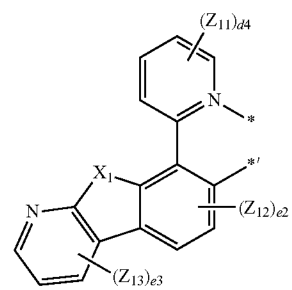
3-1(92)
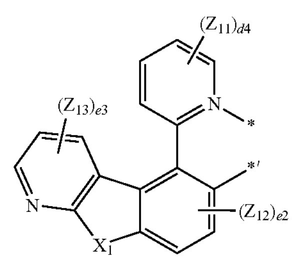
3-1(93)
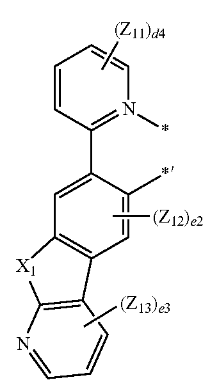

-continued
3-1(94)
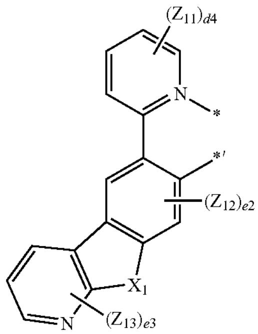
3-1(95)
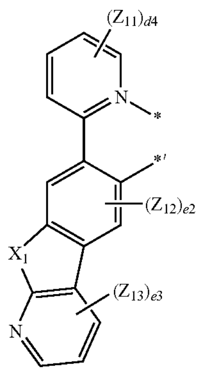
3-1(96)
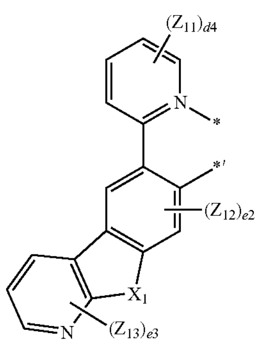
3-1(97)
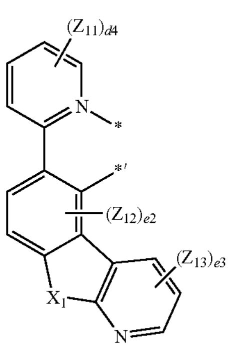
-continued
3-1(98)
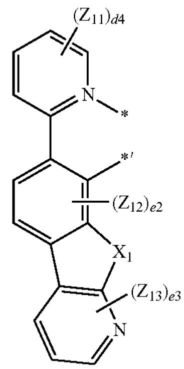
3-1(101)
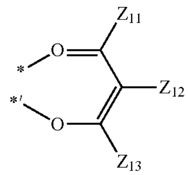
3-1(102)
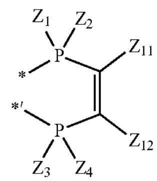
3-1(103)
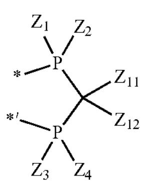
3-1(104)
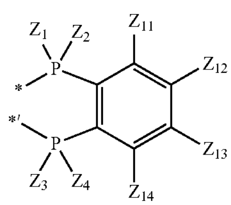
3-1(105)
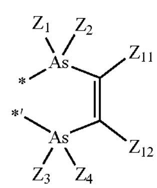
3-1(106)
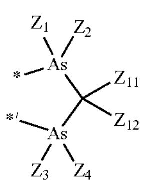

-continued 3-1(107)

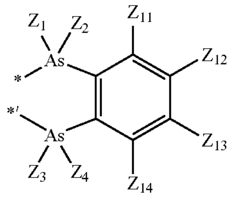

3-1(108)

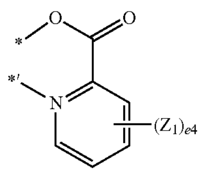

3-1(109)

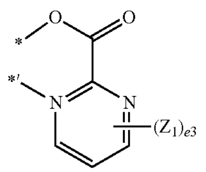

3-1(110)

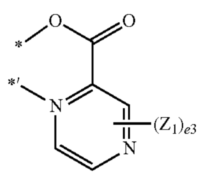

3-1(111)

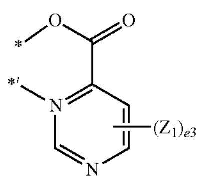

3-1(112)

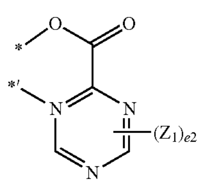

3-1(113)

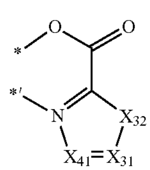

3-1(114)

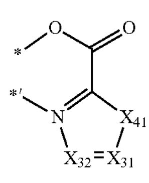

wherein, in Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114), $X_1$ may be O, S, $C(Z_{21})(Z_{22})$, or $N(Z_{23})$, $X_{31}$ may be N or $C(Z_{1a})$, $X_{32}$ may be N or $C(Z_{1b})$, $X_{41}$ may be O, S, $N(Z_{1a})$, or $C(Z_{1a})(Z_{1b})$, and $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B($Q_{86}$)($Q_{87}$) and —P(═O)($Q_{88}$)($Q_{89}$), wherein $Q_{86}$ to $Q_{89}$ may each independently be selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and -$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, d2 and e2 may each independently be 0 or 2, e3 may be an integer from 0 to 3, d4 and e4 may each independently be an integer from 0 to 4, d6 and e6 may each independently be an integer from 0 to 6, d8 and e8 may each independently be an integer from 0 to 8, and

* and *' each indicate a binding site to M in Formula 1.

In one or more embodiments, in Formula 81, M may be Ir, and a sum of n81 and n82 may be 3. In one or more embodiments, in Formula 81, M may be Pt, and a sum of n81 and n82 may be 2.

In one or more embodiments, the organometallic compound represented by Formula 81 may be neutral, and may not include ion pairs of cations and anions.

In one or more embodiments, the organometallic compound represented by Formula 81 may include at least one selected from Compounds PD1 to PD78 and $FIr_6$, but embodiments are not limited thereto:

PD1

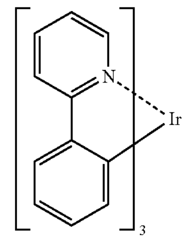

PD2

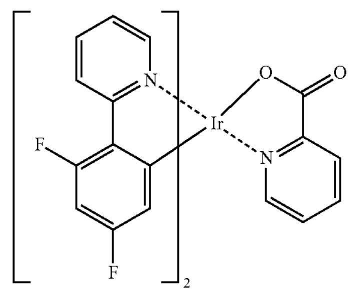

PD3

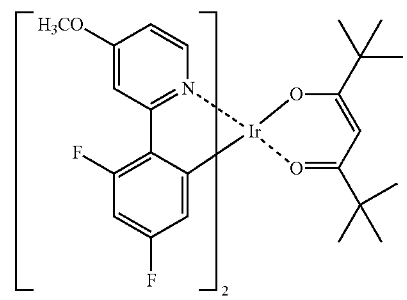

PD4

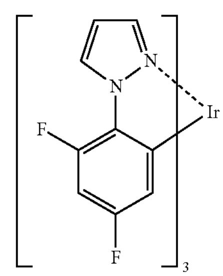

PD5

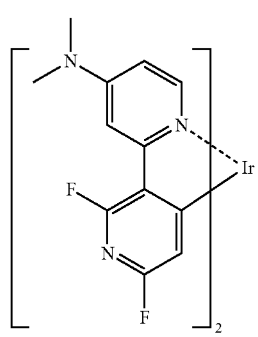

-continued
PD6
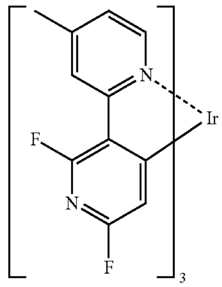
PD7
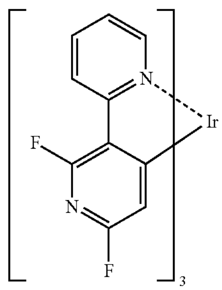
PD8
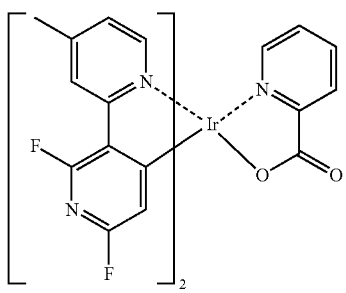
PD9
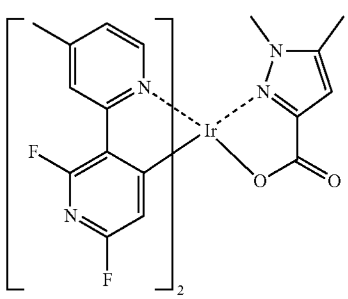
PD10
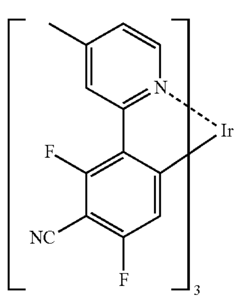
-continued
PD11
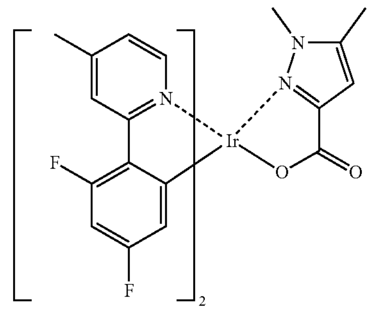
PD12
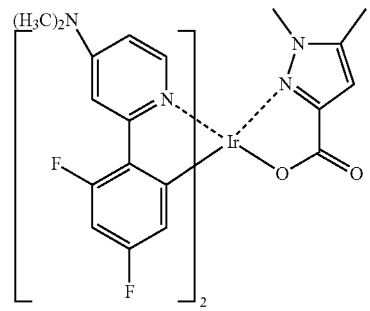
PD13
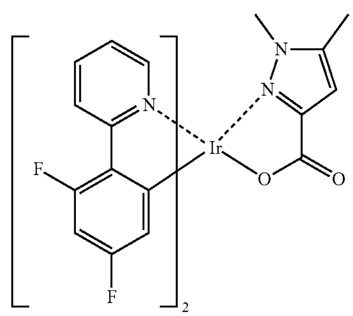
PD14
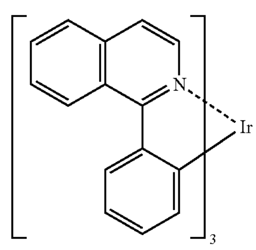
PD15
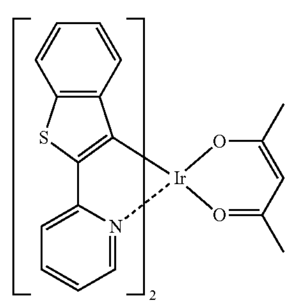

-continued
PD16
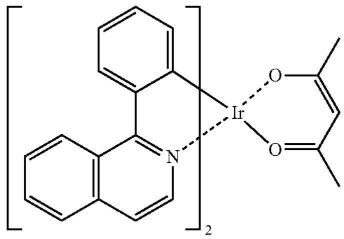
PD17
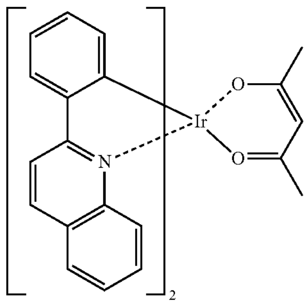
PD18
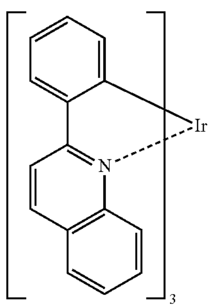
PD19
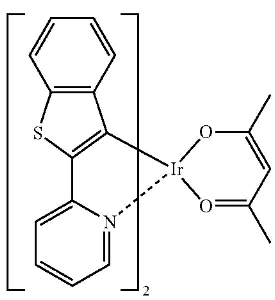
PD20
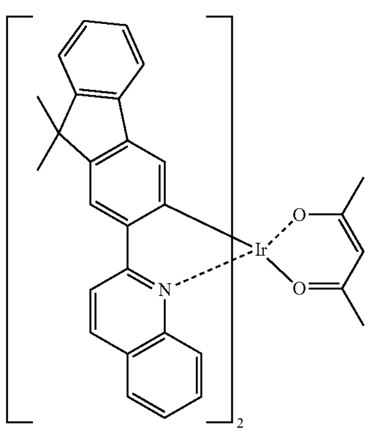
-continued
PD21
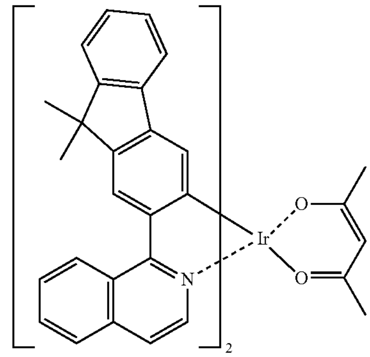
PD22
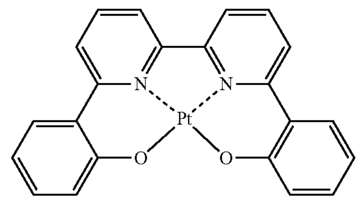
PD23
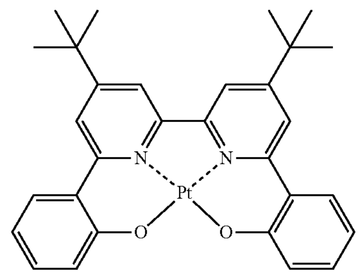
PD24
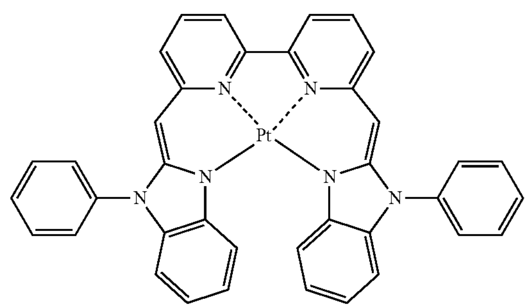
PD25
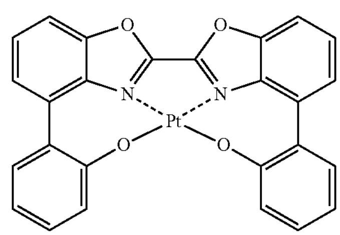
PD26
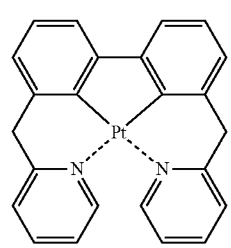

PD27
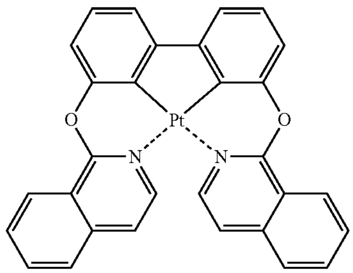
PD28
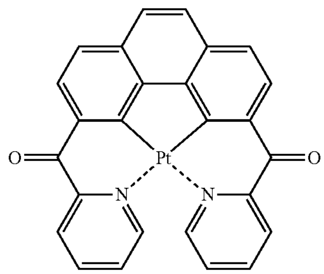
PD29
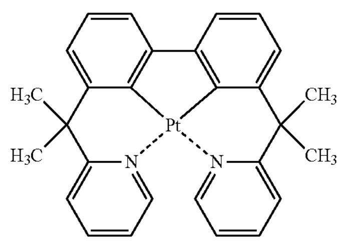
PD30
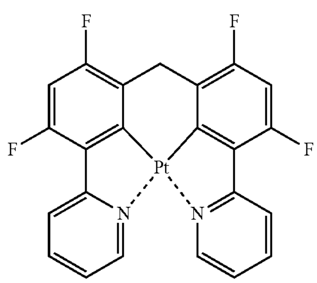
PD31
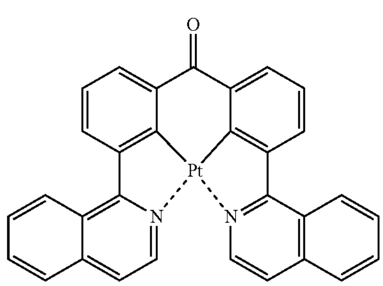
PD32
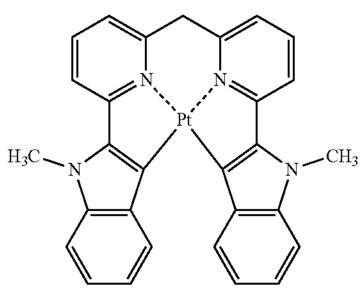
PD33
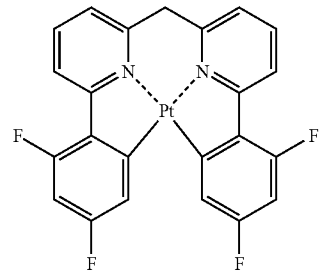
PD34
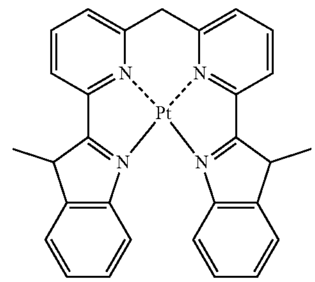
PD35
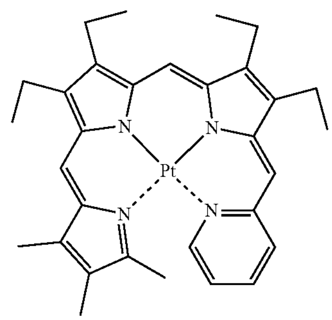
PD36
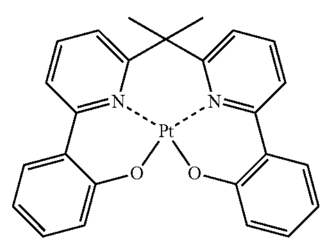
PD37
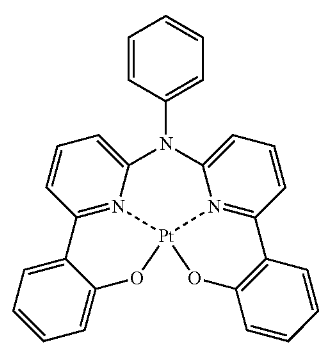

-continued
PD38
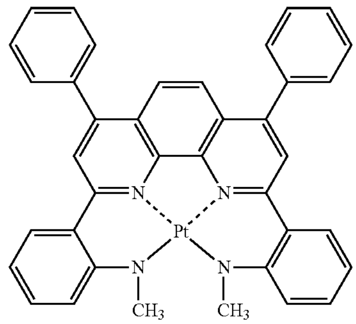
PD39
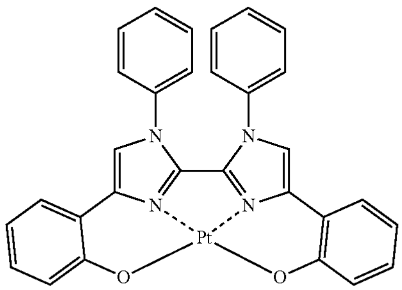
PD40
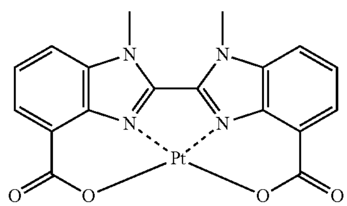
PD41
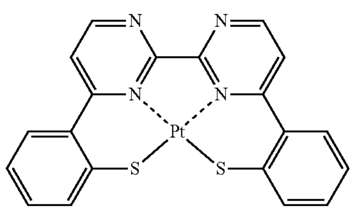
PD42
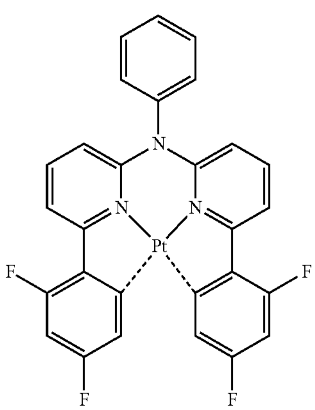
-continued
PD43
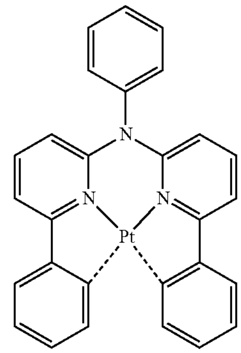
PD44
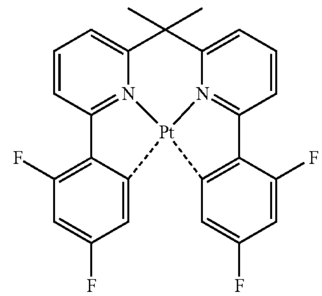
PD45
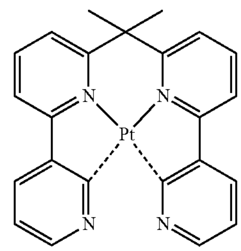
PD46
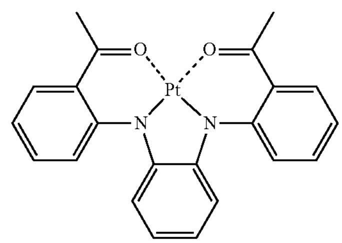
PD47
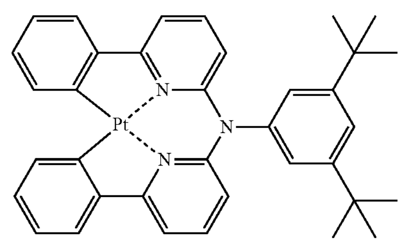
PD48
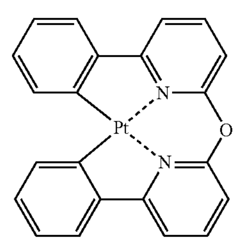

PD49
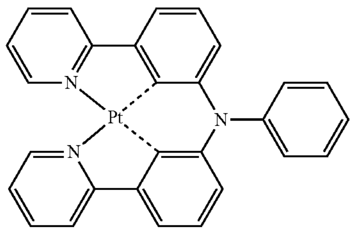
PD50
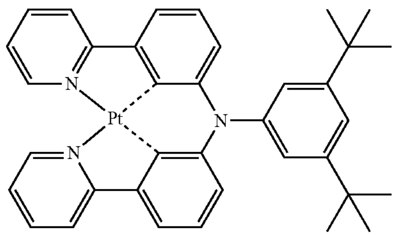
PD51
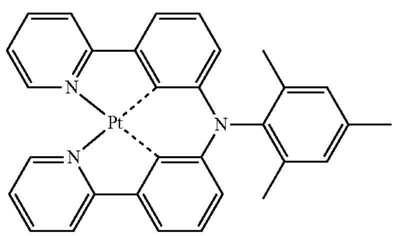
PD52
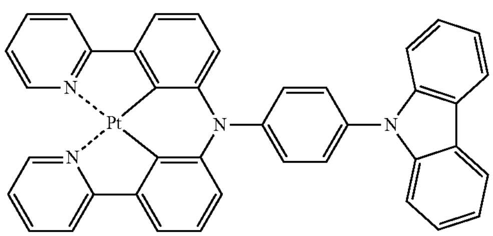
PD53
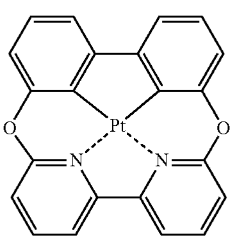
PD54
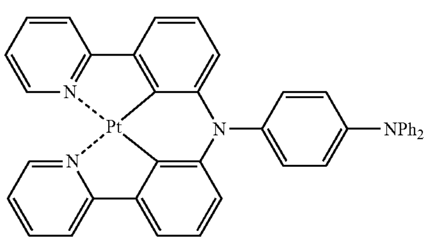
PD55
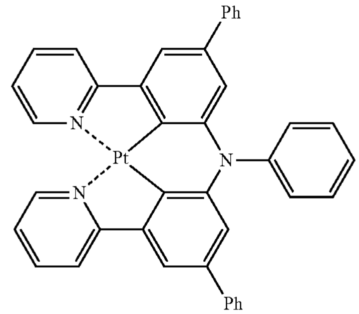
PD56
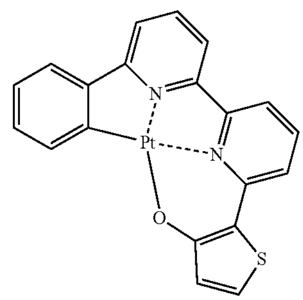
PD57
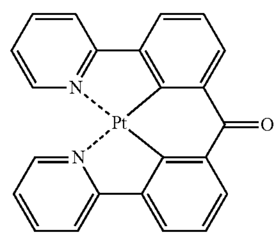
PD58
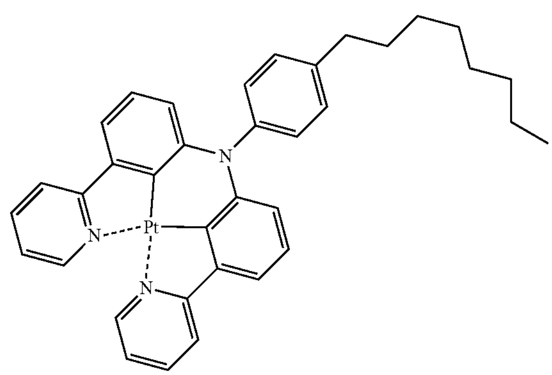
PD59
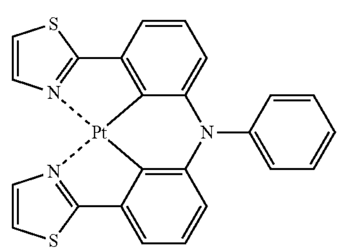

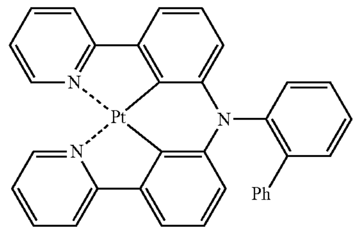
PD60
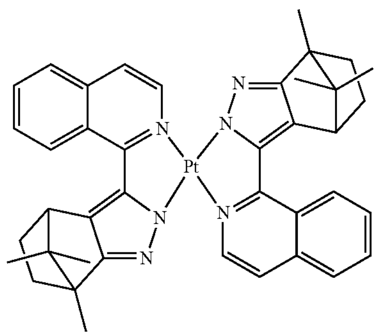
PD61
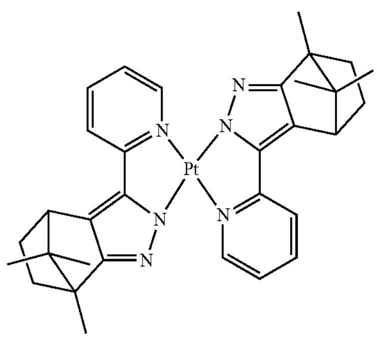
PD62
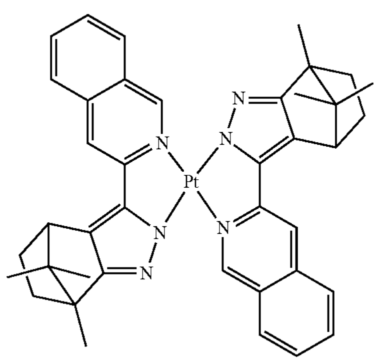
PD63
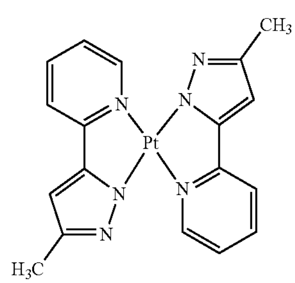
PD64
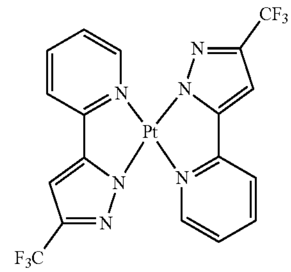
PD65
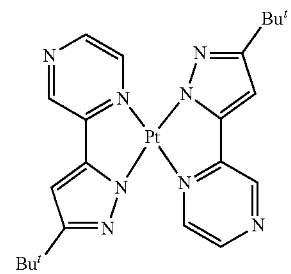
PD66
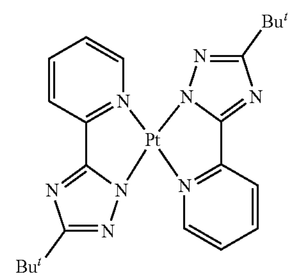
PD67
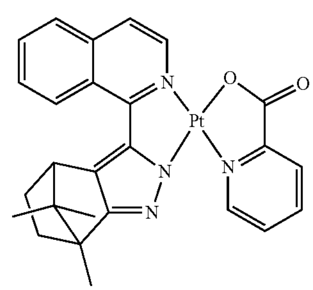
PD68
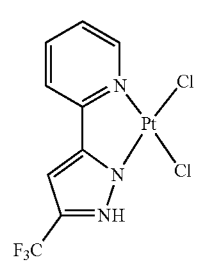
PD69

-continued

PD70

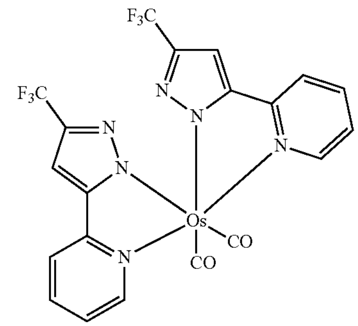

PD71

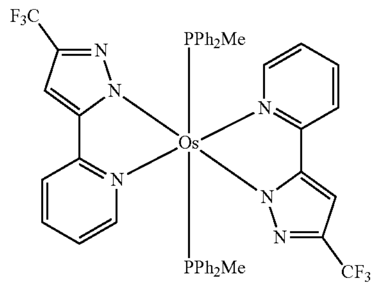

PD72

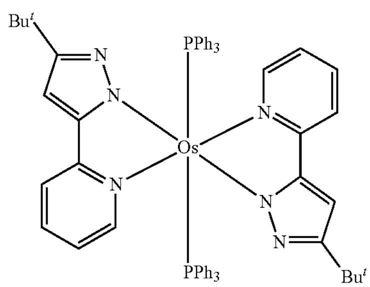

PD73

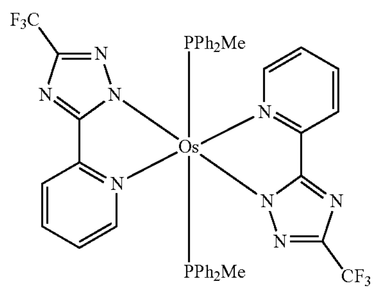

PD74

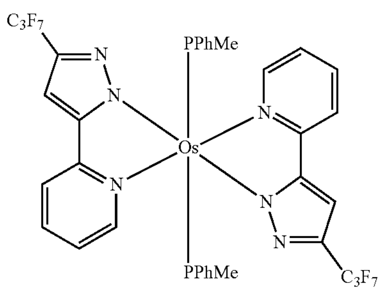

-continued

PD75

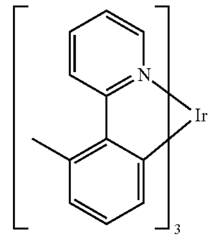

PD76

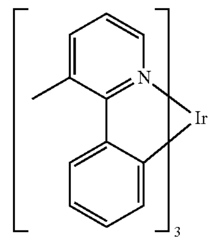

PD77

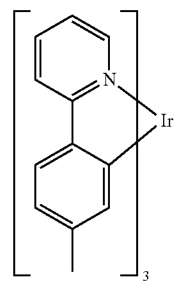

PD78

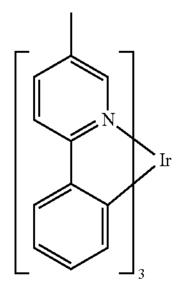

FIr6

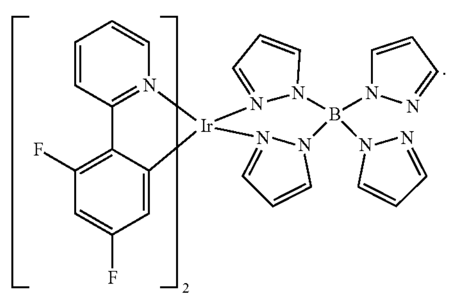

As used herein, the expression "(for example, the organic layer) including at least one condensed cyclic compound" means that "(the organic layer) including a condensed cyclic compound represented by Formula 1, or at least two different condensed cyclic compounds represented by Formula 1".

For example, the organic layer may include Compound 1 only as the condensed cyclic compound. In this embodiment, Compound 1 may be included in the emission layer of the organic light-emitting device. In some embodiments, Compounds 1 and 2 may be included in the organic layer as the condensed cyclic compounds. In this embodiment, Compounds 1 and 2 may be present in the same layer (for example, Compounds 1 and 2 may be both present in an emission layer), or in different layers (for example, Compound 1 may be present in an emission layer, and Compound 2 may be present in a hole blocking layer).

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

The term "organic layer" as used herein refers to a single and/or a plurality of layers between the first electrode and the second electrode in an organic light-emitting device. The "organic layer" may include not only organic compounds but also organometallic complexes including metals.

The FIG. illustrates a schematic cross-sectional view of an organic light-emitting device 10 according to an embodiment. Hereinafter, a structure of an organic light-emitting device according to one or more embodiments and a method of manufacturing the organic light-emitting device will be described with reference to the FIGURE. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by vacuum-depositing or sputtering, onto the substrate, a material for forming the first electrode 11. The first electrode 11 may be an anode. The material for forming the first electrode 11 may be selected from materials with a high work function for easy hole injection. The first electrode 11 may be a reflective electrode, a semi-transmissive electrode, or a transmissive electrode. The material for forming the first electrode 11 may be selected from indium tin oxide (ITO), indium zinc oxide (IZO), tin oxide ($SnO_2$), and zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO, but embodiments are not limited thereto.

The organic layer 15 may be on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum deposition, for example, the vacuum deposition may be performed at a deposition temperature in a range of about 100° C. to about 500° C., at a vacuum degree in a range of about $10^{-8}$ torr to about $10^{-3}$ torr, and at a deposition rate in a range of about 0 Angstroms per second (Å/sec) to about 100 Å/sec, though the conditions may vary depending on a compound that is used as a hole injection material and a structure and thermal properties of a desired hole injection layer, but conditions for the vacuum deposition are not limited thereto.

When a hole injection layer is formed by spin coating, the spin coating may be performed at a coating rate in a range of about 2,000 revolutions per minute (rpm) to about 5,000 rpm, and at a temperature in a range of about 80° C. to 200° C., to facilitate removal of a solvent after the spin coating, though the conditions may vary depending on a compound that is used as a hole injection material and a structure and thermal properties of a desired hole injection layer, but conditions for the spin coating are not limited thereto.

The conditions for forming a hole transport layer and an electron blocking layer may be inferred from the conditions for forming the hole injection layer.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), (polyaniline)/poly(4-styrene sulfonate) (PANI/PSS), a compound represented by Formula 201, and a compound represented by Formula 202:

m-MTDATA

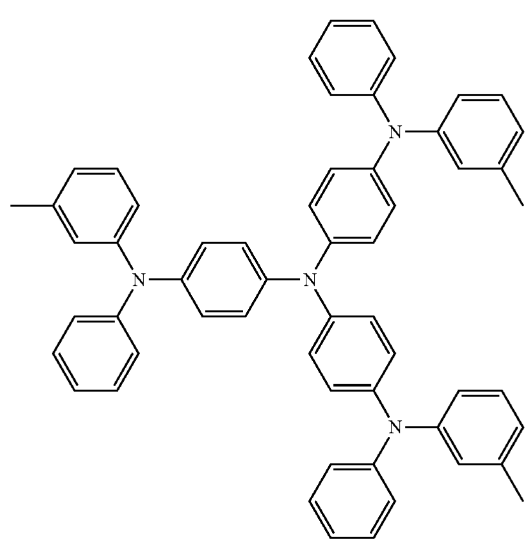

-continued
TDATA
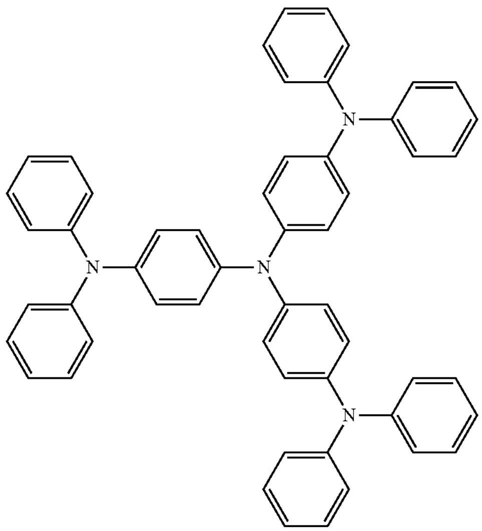
2-TNATA
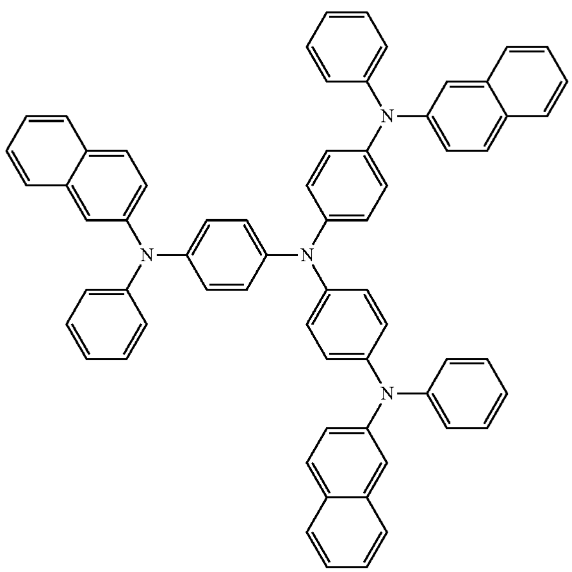
NPB
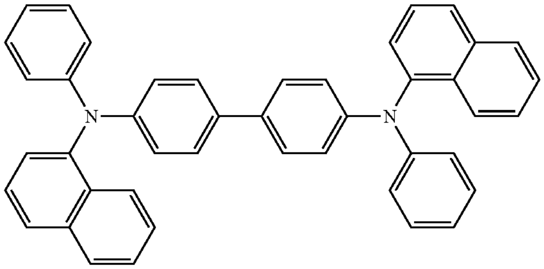
-continued
β-NPB
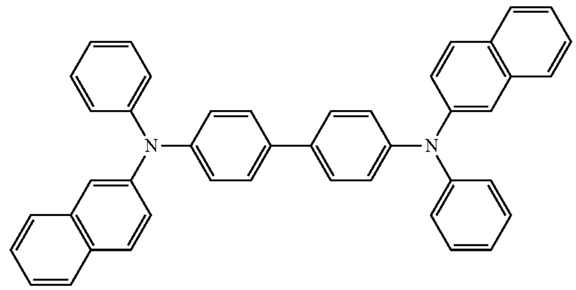
TPD
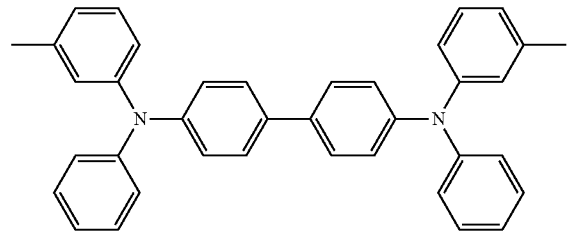
Spiro-TPD
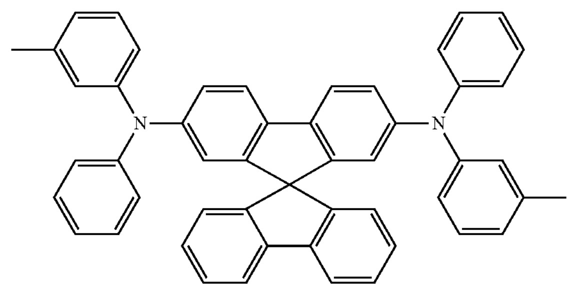
Spiro-NPB
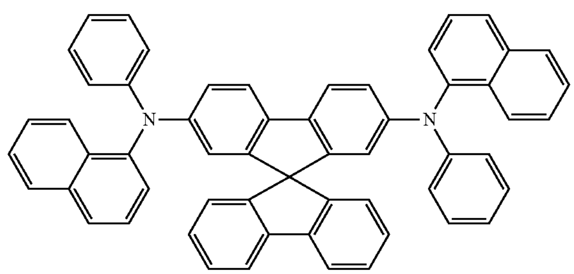
methylated NPB
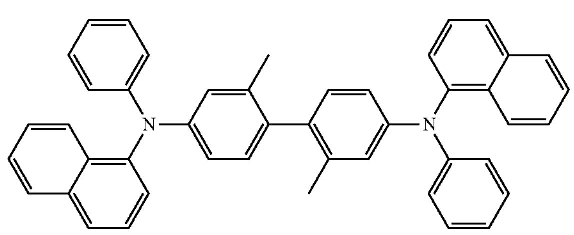

-continued

TAPC

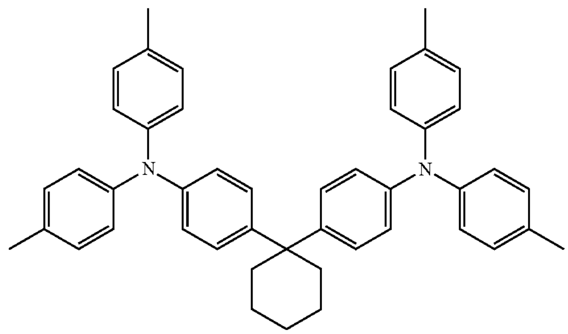

HMTPD

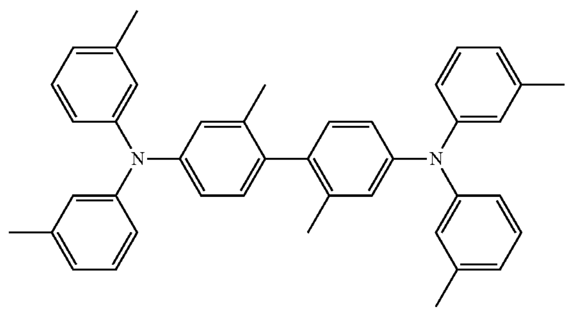

Formula 201

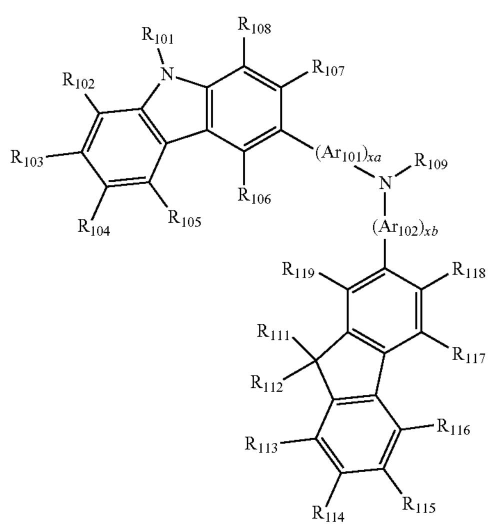

Formula 202

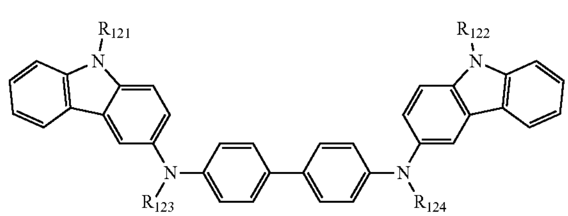

wherein, in Formula 201, $Ar_{101}$ and $Ar_{102}$ may each independently be selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5. In some embodiments, xa and xb may each independently be an integer from 0, 1, and 2. In some embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), and a $C_1$-$C_{10}$ alkoxy group (e.g., a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

In Formula 201, $R_{109}$ may be selected from a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In some embodiments, the compound represented by Formula 201 may be represented by Formula 201A, but embodiments are not limited thereto:

Formula 201A

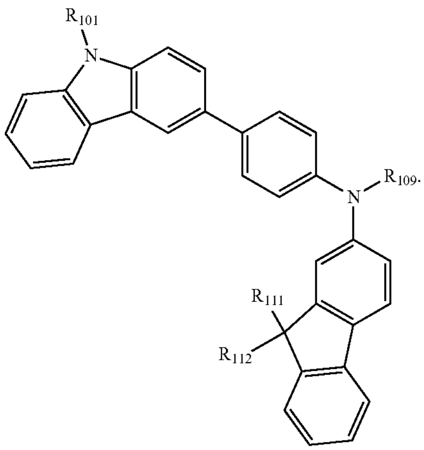

$R_{101}$, $R_{111}$, $R_{112}$, and $R_{109}$ in Formula 201A may be understood by referring to the descriptions for those provided herein.

In some embodiments, the compounds represented by Formulae 201 and 202 may include Compounds HT1 to HT20, but embodiments are not limited thereto:

HT1

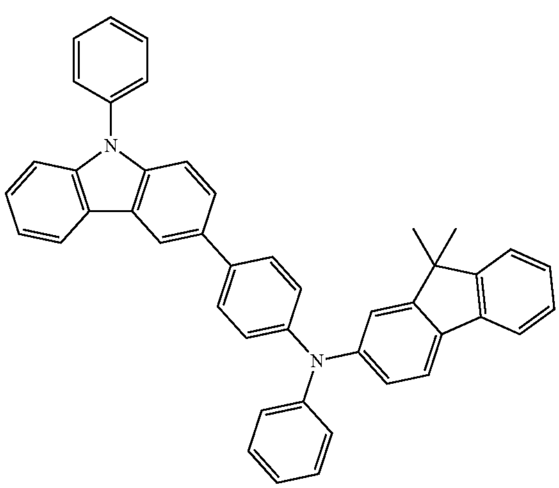

-continued

HT2

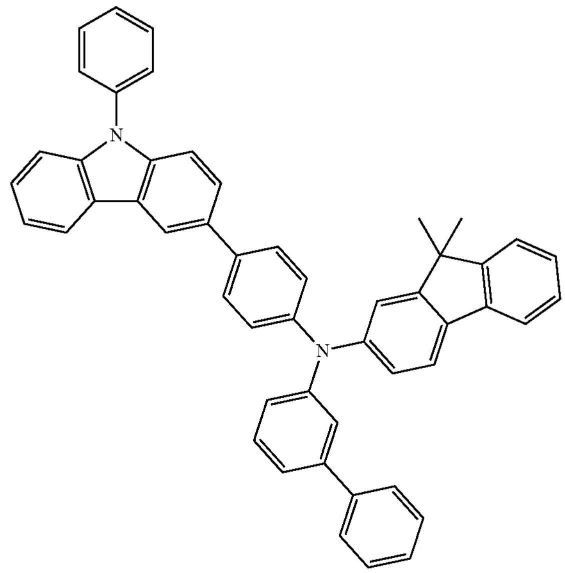

HT3

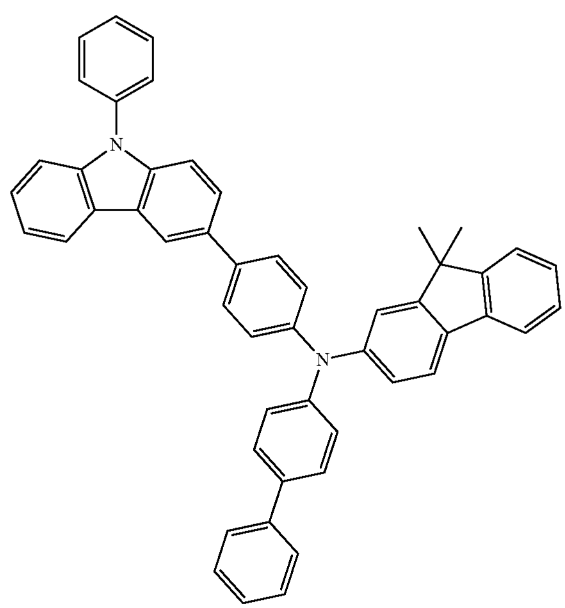

-continued
HT4
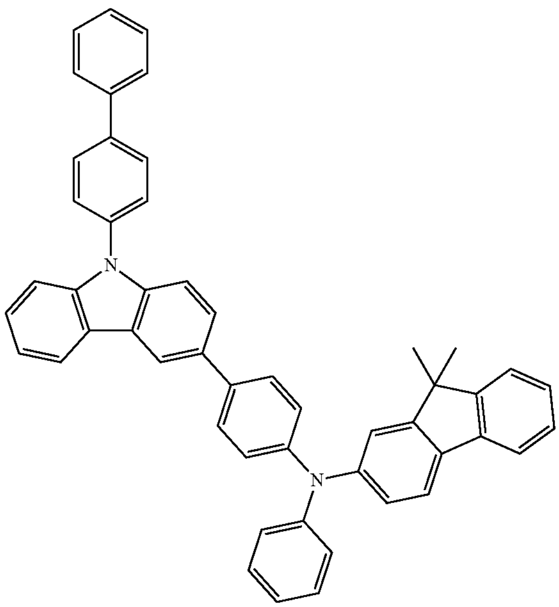
HT5
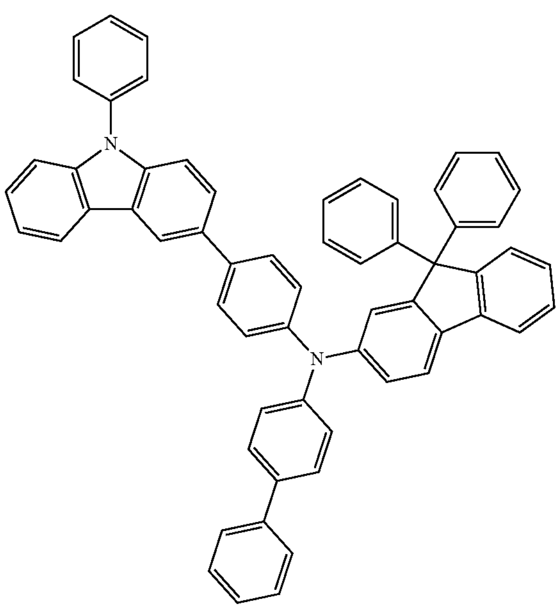
-continued
HT6
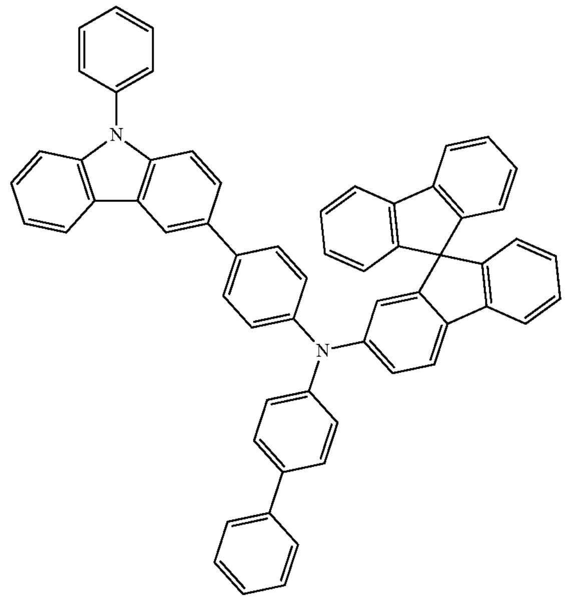
HT7
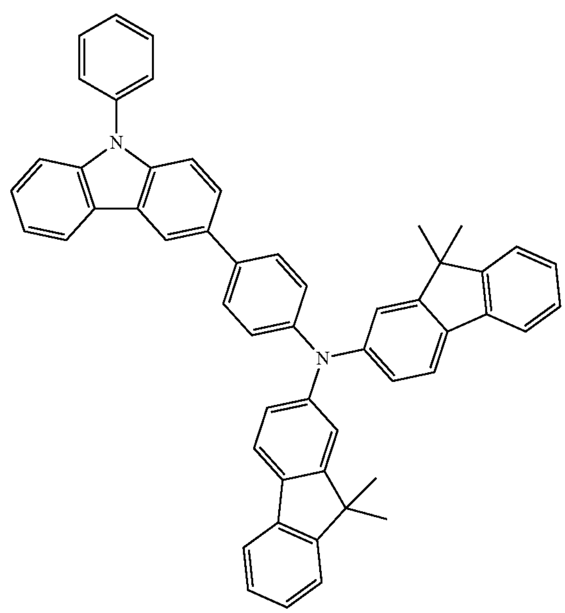

-continued
HT8
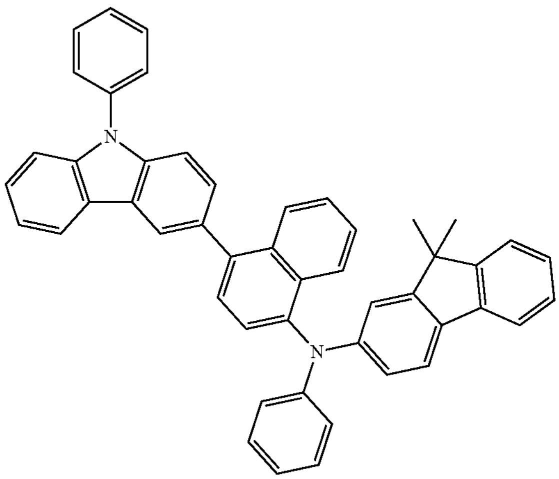
HT9
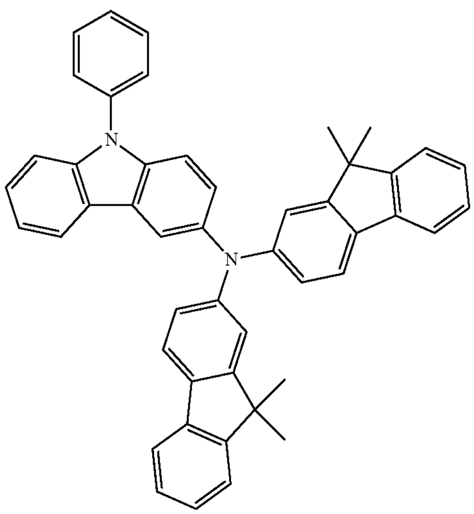
HT10
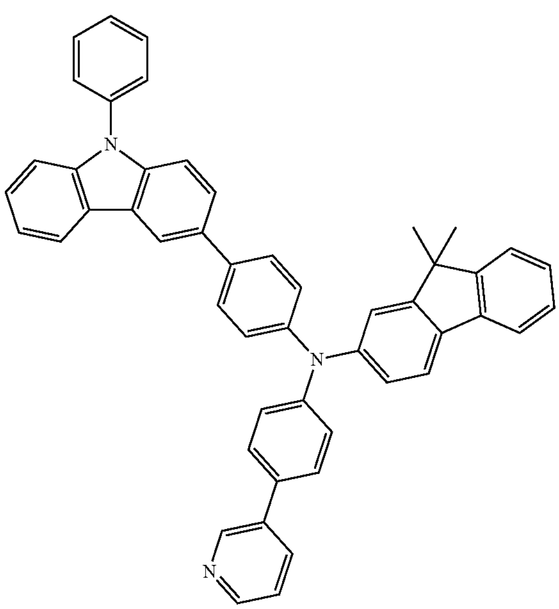
-continued
HT11
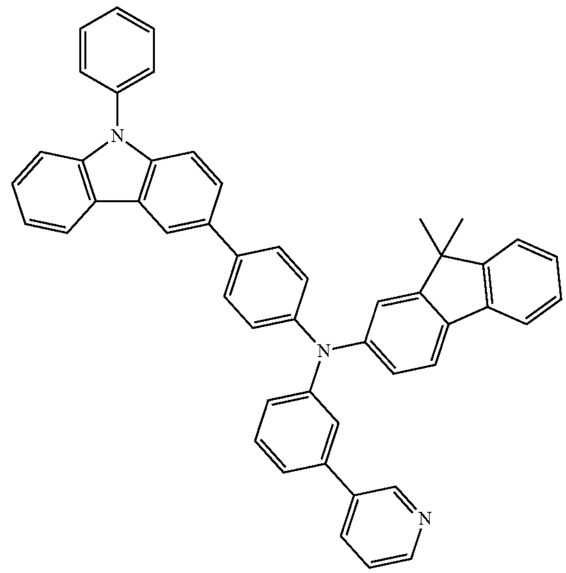
HT12
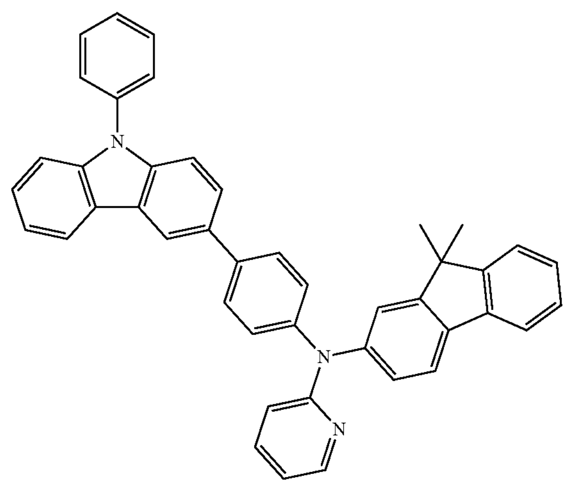
HT13
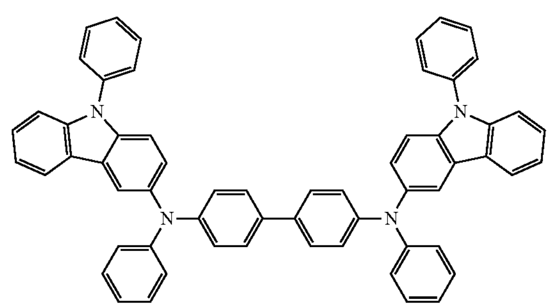

-continued

HT14

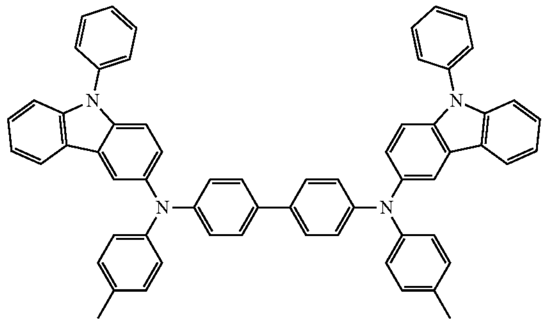

HT15

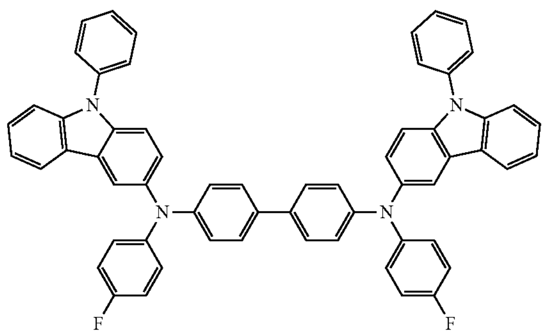

HT16

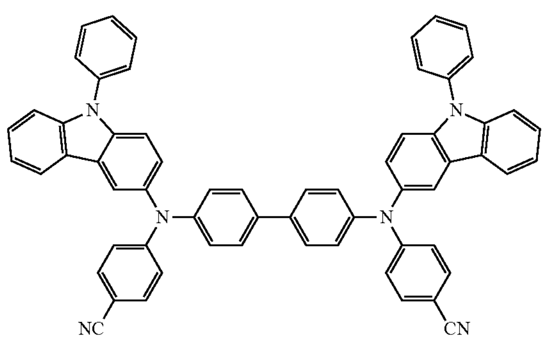

HT17

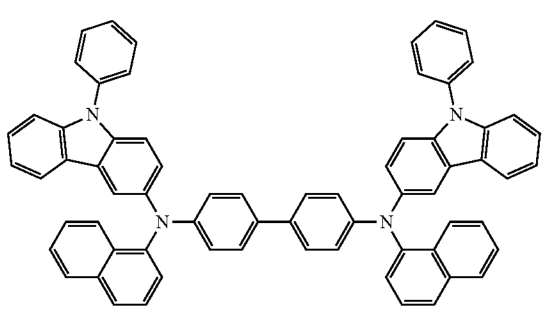

-continued

HT18

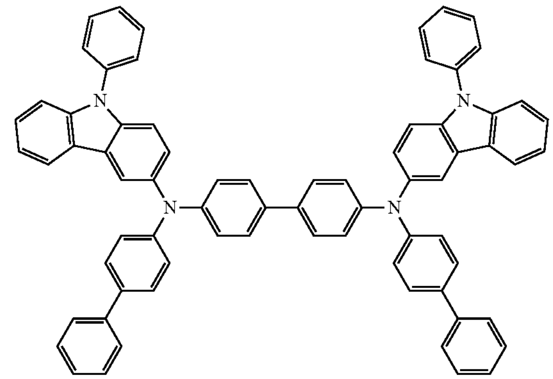

HT19

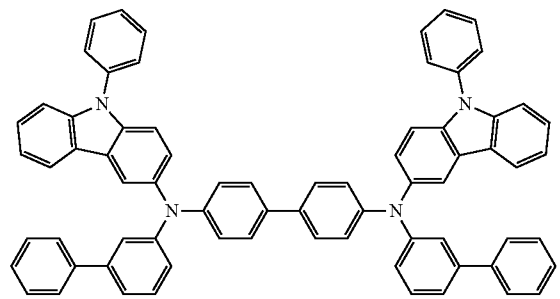

HT20

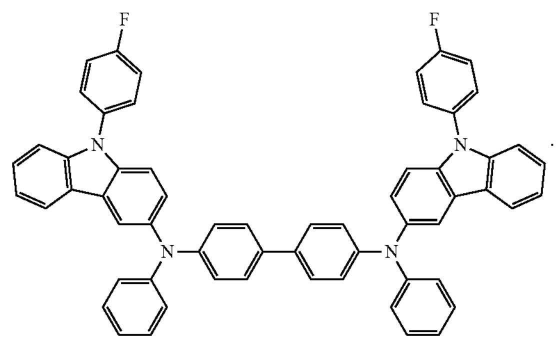

The thickness of the hole transport region may be in a range of about 100 (Angstroms) Å to about 10,000 Å, and in some embodiments, about 100 Å to about 1,000 Å. When the hole transport region includes at least one selected from a hole injection layer and a hole transport layer, the thickness of the hole injection layer may be in a range of about 100 Å to about 10,000 Å, and in some embodiments, about 100 Å to about 1,000 Å, and the thickness of the hole transport layer may be in a range of about 50 Å to about 2,000 Å, and in some embodiments, about 100 Å to about 1,500 Å. While not wishing to be bound by theory, it is understood that when the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may include one of a quinone derivative, a metal oxide, and a compound containing a cyano group, but embodiments are not limited thereto. For example, non-limiting examples of the p-dopant include a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HT-D1 or Compound HT-D2, but embodiments are not limited thereto:

HT-D1

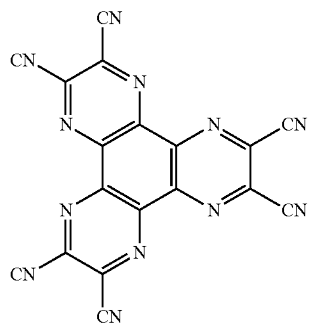

F4-TCNQ

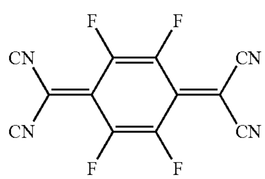

HT-D2

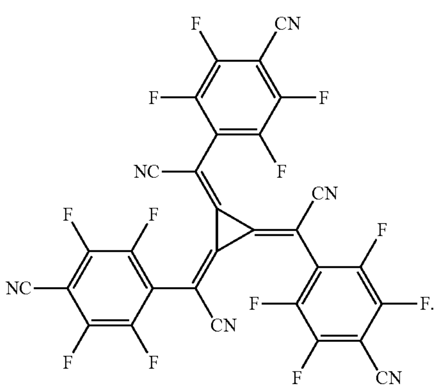

The hole transport region may further include a buffer layer.

The buffer layer may compensate for an optical resonance distance depending on a wavelength of light emitted from the emission layer to improve the efficiency of an organic light-emitting device.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to the those conditions for forming a hole injection layer, though the conditions may vary depending on a compound that is used.

The hole transport region may further include an electron blocking layer. The electron blocking layer may include any suitable known material, e.g., mCP, but embodiments are not limited thereto:

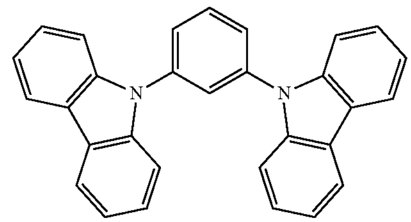

mCP

The thickness of the electron blocking layer may be in a range of about 50 Å to about 1,000 Å, and in some embodiments, about 70 Å to about 500 Å. While not wishing to be bound by theory, it is understood that when the thickness of the electron blocking layer is within any of these ranges, excellent electron blocking characteristics may be obtained without a substantial increase in driving voltage.

When the organic light-emitting device 10 is a full-color organic light-emitting device, the emission layer may be patterned into a red emission layer, a green emission layer, and a blue emission layer. In some embodiments, the emission layer may have a structure in which the red emission layer, the green emission layer, and/or the blue emission layer are layered to emit white light. In some embodiments, the structure of the emission layer may vary.

The emission layer may include the condensed cyclic compound represented by Formula 1.

In some embodiments, the emission layer may include the condensed cyclic compound represented by Formula 1 only.

In some embodiments, the emission layer may include:

the condensed cyclic compound represented by Formula 1, i) the second compound (e.g., a compound represented by Formula H-1);

ii) the organometallic compound represented by Formula 81; or iii) any combination of i) and ii).

The condensed cyclic compound represented by Formula 1, the second compound, and the organometallic compound represented by Formula 81 may be understood by referring to the descriptions for those provided herein.

When the emission layer includes the host and the dopant, an amount of the dopant may be selected from a range of about 0.01 parts to about 20 parts by weight based on about 100 parts by weight of the emission layer, but embodiments are not limited thereto. While not wishing to be bound by theory, it is understood that when the amount of the dopant is within this range, light emission without quenching may be realized.

When the emission layer includes the condensed cyclic compound represented by Formula 1 and the second compound, a weight ratio of the condensed cyclic compound represented by Formula 1 to the second compound may be in a range of about 1:99 to about 99:1, for example, about 70:30 to about 30:70. In some embodiments, a weight ratio of the condensed cyclic compound represented by Formula 1 to the second compound may be in a range of about 60:40 to about 40:60. While not wishing to be bound by theory, it is understood that when the weight ratio of the condensed cyclic compound represented by Formula 1 to the second compound in the emission layer is within any of these ranges, the charge transport balance may be efficiently achieved in the emission layer.

The thickness of the emission layer may be in a range of about 100 Å to about 1,000 Å, and in some embodiments, about 200 Å to about 600 Å. While not wishing to be bound by theory, it is understood that when the thickness of the emission layer is within any of these ranges, improved luminescence characteristics may be obtained without a substantial increase in driving voltage.

Next, an electron transport region may be formed on the emission layer.

The electron transport region may include at least one selected from a hole blocking layer, an electron transport layer, and an electron injection layer.

In some embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer, for example, may include at least one of BCP and Bphen, but embodiments are not limited thereto:

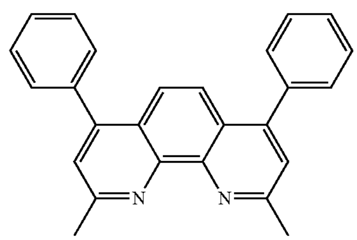

BCP

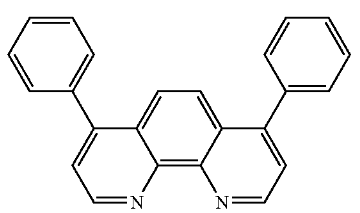

Bphen

The hole blocking layer may include the condensed cyclic compound represented by Formula 1.

The thickness of the hole blocking layer may be in a range of about 20 Å to about 1,000 Å, and in some embodiments, about 30 Å to about 300 Å. While not wishing to be bound by theory, it is understood that when the thickness of the hole blocking layer is within any of these ranges, excellent hole blocking characteristics may be obtained without a substantial increase in driving voltage.

The electron transport layer may further include at least one selected from BCP, BPhen, $Alq_3$, BAlq, TAZ, and NTAZ:

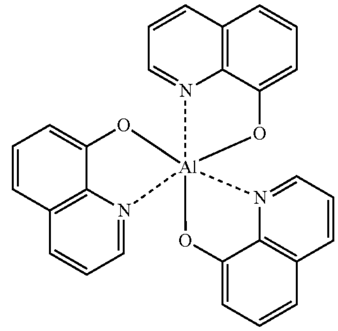

$Alq_3$

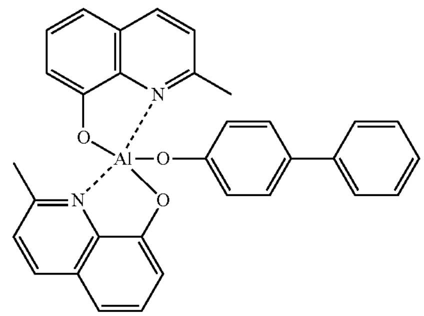

BAlq

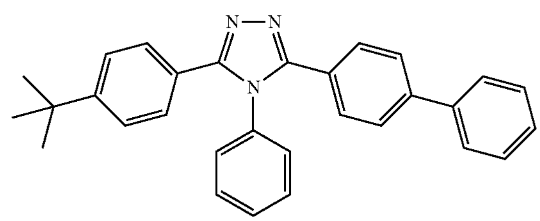

TAZ

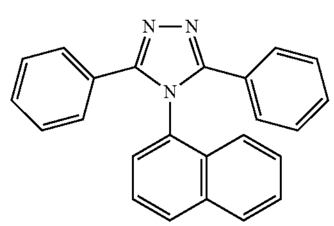

NTAZ

In some embodiments, the electron transport layer may include at least one selected from Compounds ET1, ET2, and ET3, but embodiments are not limited thereto:

ET1

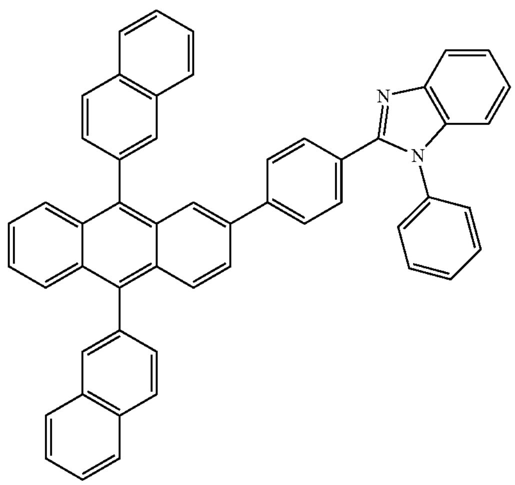

ET2

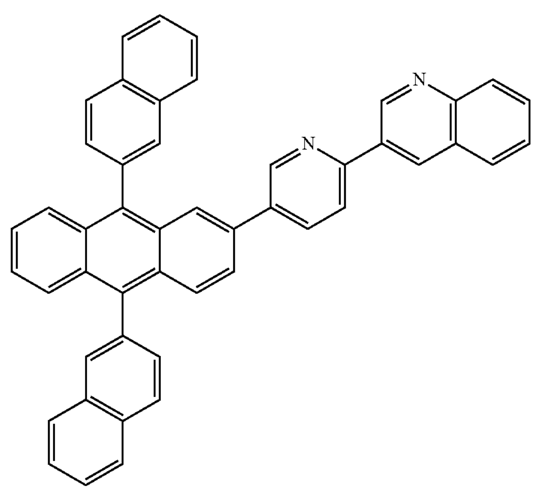

ET3

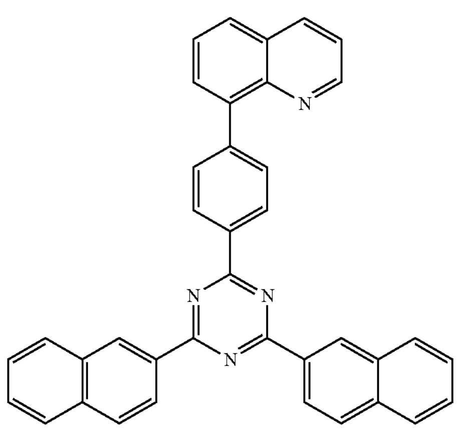

The thickness of the electron transport layer may be in a range of about 100 Å to about 1,000 Å, and in some embodiments, about 150 Å to about 500 Å. While not wishing to be bound by theory, it is understood that when the thickness of the electron transport layer is within any of these ranges, excellent electron transport characteristics may be obtained without a substantial increase in driving voltage.

The electron transport layer may further include a material containing metal, in addition to the materials described above.

The material containing metal may include a $L_1$ complex. The $L_1$ complex may include, e.g., Compound ET-D1 (lithium 8-hydroxyquinolate, LiQ) or Compound ET-D2:

ET-D1

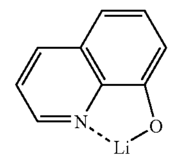

ET-D2

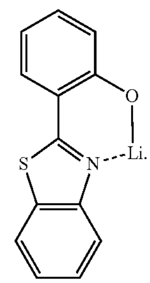

The electron transport region may include an electron injection layer that facilitates electron injection from the second electrode 19.

The electron injection layer may include at least one selected from LiQ, LiF, NaCl, CsF, $Li_2O$, and BaO.

The thickness of the electron injection layer may be in a range of about 1 Å to about 100 Å, for example, about 3 Å to about 90 Å. While not wishing to be bound by theory, it is understood that when the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, and a mixture thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to the FIGURE, but embodiments are not limited thereto.

The term "$C_1$-$C_{60}$ alkyl group" as used herein refers to a linear or branched aliphatic saturated hydrocarbon monovalent group having 1 to 60 carbon atoms.

Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an iso-propyloxy group.

The term "$C_2$-$C_{60}$ alkenyl group" as used herein refers to a group formed by including at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a group formed by including at least one carbon-carbon triple bond in the middle or at the terminus of the $C_2$-$C_{60}$ alkyl group. Examples thereof include an ethenyl group and a propenyl group. The term "$C_2$-$C_{60}$ alkynylene group" as used herein refers to a divalent group having substantially the same structure as the $C_2$-$C_{60}$ alkynyl group.

The term "$C_3$-$C_{10}$ cycloalkyl group" as used herein refers to a monovalent monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, P, Si, and S as a ring-forming atom and 1 to 10 carbon atoms. Examples thereof include a tetrahydrofuranyl group and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group including 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, and S as a ring-forming atom, 1 to 10 carbon atoms, and at least one double bond in its ring. Examples of the $C_2$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and a $C_6$-$C_{60}$ arylene group each include at least two rings, the at least two rings may be fused.

The term "$C_1$-$C_{60}$ heteroaryl group" as used herein refers to a monovalent group having a carbocyclic aromatic system having at least one heteroatom selected from N, O, P, Si, and S as a ring-forming atom and 1 to 60 carbon atoms. The term "$C_1$-$C_{60}$ heteroarylene group" as used herein refers to a divalent group having a carbocyclic aromatic system having at least one heteroatom selected from N, O, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include at least two rings, the at least two rings may be fused.

The term "$C_6$-$C_{60}$ aryloxy group" as used herein refers to a group represented by —$OA_{102}$ (where $A_{102}$ is a $C_6$-$C_{60}$ aryl group). The term "$C_6$-$C_{60}$ arylthio group" as used herein refers to a group represented by —$SA_{103}$ (where $A_{103}$ is a $C_6$-$C_{60}$ aryl group).

The term "monovalent non-aromatic condensed polycyclic group" as used herein refers to a monovalent group having two or more rings condensed and only carbon atoms (for example, the number of carbon atoms may be in a range of 8 to 60) as ring-forming atoms, wherein the molecular structure as a whole is non-aromatic. Examples of the non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group having at least two rings condensed and a heteroatom selected from N, O, P, Si, and S as well as carbon atoms (for example, the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

In the present specification, at least one substituent of the substituted $C_1$-$C_{60}$ alkyl group, the substituted $C_2$-$C_{60}$ alkenyl group, the substituted $C_2$-$C_{60}$ alkynyl group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group and a monovalent non-aromatic condensed heteropolycyclic group, each substituted with at least one selected from deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$), wherein, $Q_{11}$ to $Q_{17}$, $Q_{21}$ to $Q_{27}$, and $Q_{31}$ to $Q_{37}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

The symbols * and *' as used herein, unless defined otherwise, refer to a binding site to an adjacent atom in the formula.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an identical molar equivalent of B was used in place of A.

EXAMPLES

Synthesis Example 1: Synthesis of Compound 505

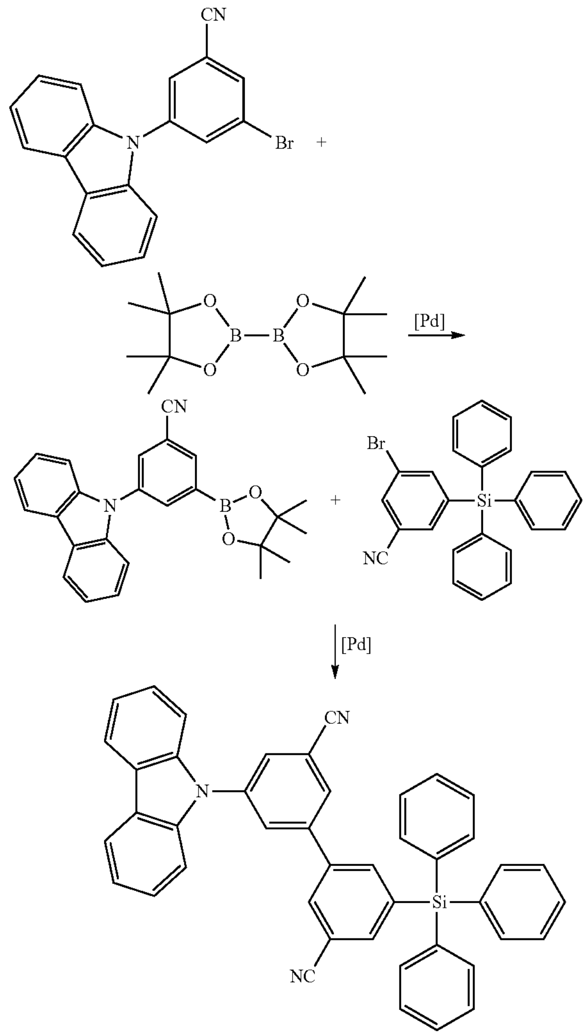

13.21 grams (g), 38.04 millimoles (mmol) of 3-bromo-5-(9H-carbazol-9-yl)benzonitrile, 14.49 g (57.07 mmol) of bis(pinacolato)diboron, 1.55 g (1.90 mmol) of $PdCl_2$(dppf), and 11.20 g (114.13 mmol) of KOAc were mixed with 127 milliliters (mL) of dimethyl formamide (DMF). The mixture was then heated and stirred in a sealed tube at a temperature of 100° C. for 18 hours. The resulting product was cooled to room temperature and diluted by adding 700 mL of ethyl acetate. The solid content was removed therefrom using a Celite filter. Subsequently, the resultant was washed three times using 600 mL of $H_2O$. The water was removed from the solution using $MgSO_4$, and the organic solvent was removed therefrom using a rotary evaporator. Silica hot-filtration was performed thereon using 400 mL of toluene, and then extraction was performed using additional 400 mL of toluene. Subsequently, the solution was concentrated to 100 mL, followed by addition of 600 mL of MeOH and stirring at room temperature for 4 hours. The formed solid content was subjected to filtration, followed by vacuum-drying, thereby obtaining 9.0 g of 3-(9H-carbazol-9-yl)-5-(4,4,5,5-tetramethyl-1,3,2-dioxaborolan-2-yl)benzonitrile. This compound was used in the following reaction without any additional purification.

3.14 g (7.96 mmol) of 3-(9H-carbazol-9-yl)-5-(4,4,5,5-tetramethyl-1,3,2-dioxaborolan-2-yl)benzonitrile, 4.56 g (10.35 mmol) of 3-bromo-5-(triphenylsilyl)benzonitrile, 0.46 g (0.40 mmol) of $Pd(PPh_3)_4$, and 7.78 g (23.89 mmol) of $Cs_2CO_3$ were mixed with 35 mL of 1,4-dioxane, followed by heating and stirring at a temperature of 160° C. for 18 hours. The resulting product was cooled to room temperature and diluted by adding 200 mL of ethyl acetate. The solid content was removed therefrom using a Celite filter. Subsequently, the resultant was washed three times using 200 mL of $H_2O$. Then, water was removed from the solution using $MgSO_4$, followed by filtration using 300 g of silica gel and removing the solvent therefrom using a rotary evaporator. The solid content was dissolved using 100 mL of methylene chloride, and the solvent was substituted using 20 mL of ethyl acetate, thereby obtaining a solid content. Then, 3.65 g of Compound 505 was obtained by vacuum-drying. The obtained Compound 505 was identified using liquid chromatography-mass spectrometry (LC-MS).

$C_{44}H_{29}N_3Si$: M+ 627.27

Synthesis Example 2: Synthesis of Compound 21

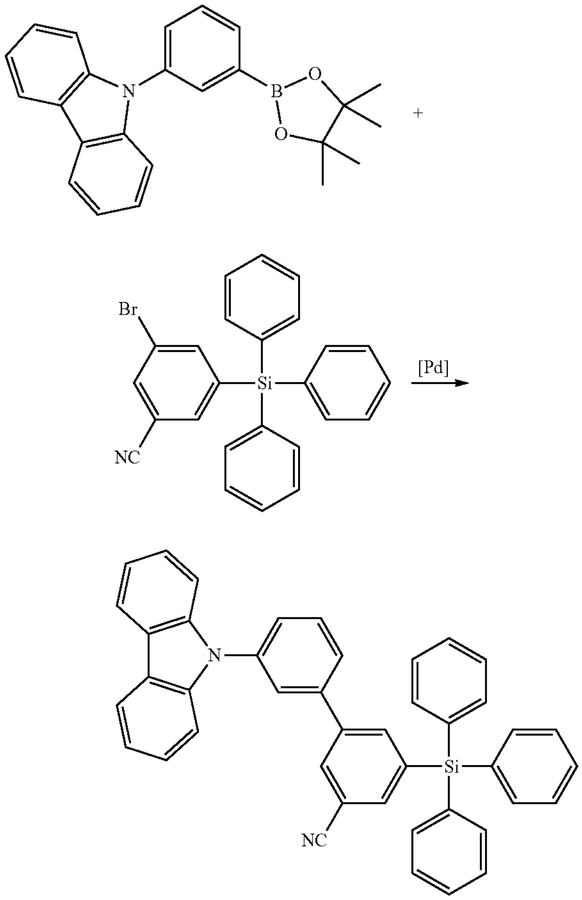

Compound 21 was prepared in substantially the same manner as in Synthesis Example 1, except that 9-(3-(4,4,5,5-tetramethyl-1,3,2-dioxaborolan-2-yl)phenyl)-9H-carbazole) was used instead of 3-(9H-carbazol-9-yl)-5-(4,4,5,5-tetramethyl-1,3,2-dioxaborolan-2-yl)benzonitrile. The obtained Compound 21 was identified using LC-MS.

$C_{43}H_{30}N_2Si$: M+ 602.26

Synthesis Example 3: Synthesis of Compound 277

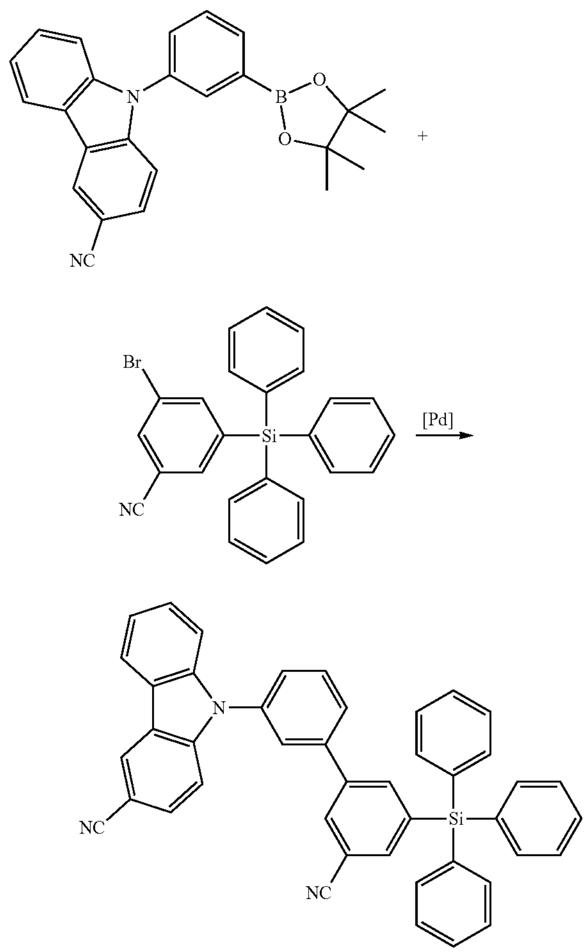

Compound 277 was prepared in substantially the same manner as in Synthesis Example 1, except that 9-(3-(4,4,5,5-tetramethyl-1,3,2-dioxaborolan-2-yl)phenyl)-9H-carbazole-3-carbonitrile was used instead of 3-(9H-carbazol-9-yl)-5-(4,4,5,5-tetramethyl-1,3,2-dioxaborolan-2-yl) benzonitrile. The obtained Compound 277 was identified using LC-MS.

$C_{44}H_{29}N_3Si$: M+ 627.18

Example 1

As a first electrode (an anode), a glass substrate having an ITO electrode deposited thereon at a thickness of 1,500 Å was washed with distilled water in the presence of ultrasound waves. Once the washing with distilled water was complete, ultrasound wave washing was performed on the substrate using a solvent, such as iso-propyl alcohol, acetone, or methanol. Subsequently, the substrate was dried, transferred to a plasma washer, washed for 5 minutes using oxygen plasma, and mounted in a vacuum depositor.

Compound HT3 was vacuum-deposited on the ITO electrode of the glass substrate to form a hole injection layer having a thickness of 100 Å, and Compound HT13 was deposited on the hole injection layer to form a hole transport layer having a thickness of 1,300 Å, thereby forming a hole transport region.

Subsequently, Compound 505 (host) and Compound PD97 (dopant, 10 percent by weight (weight %)) were deposited on the hole transport region to form an emission layer having a thickness of about 300 Å.

BCP was vacuum deposited on the emission layer to form a hole blocking layer having a thickness of about 50 Å. Compound ET3 and LiQ were then co-deposited on the hole blocking layer to form an electron transport layer having a thickness of about 250 Å. Next, LiQ was deposited on the electron transport layer to form an electron injection layer having a thickness of about 5 Å, and then, aluminum (Al) second electrode (a cathode) having a thickness of 1,000 Å was formed on the electron injection layer, thereby completing the manufacture of an organic light-emitting device.

H3

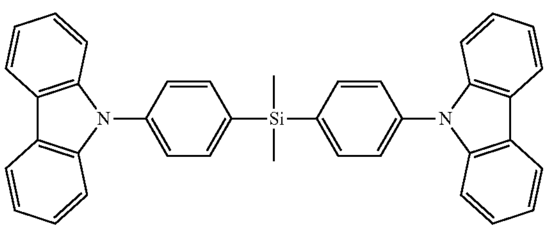

H13

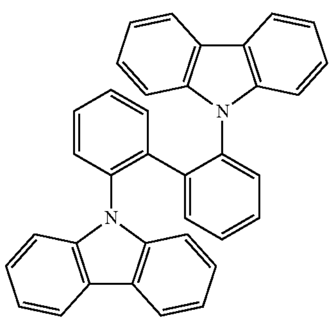

ET3

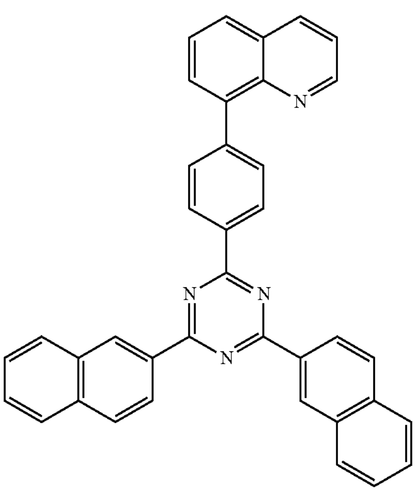

-continued

LiQ

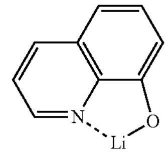

PD79

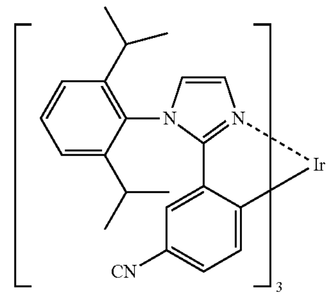

Examples 2 and 3 and Comparative Examples 1 and 2

Organic light-emitting devices were manufactured in substantially the same manner as in Example 1, except that the compounds shown in Table 2 were used instead of Compound 505 as a host in the formation of an emission layer.

Compound A

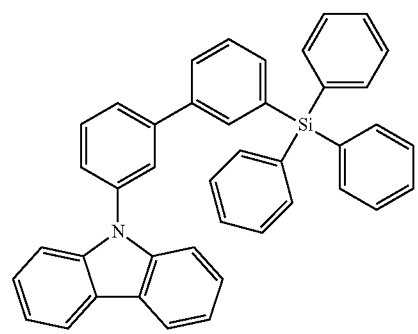

Compound C

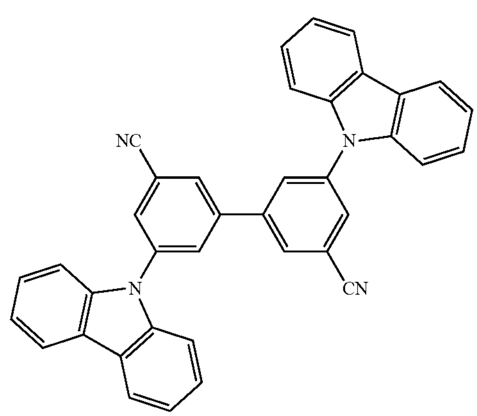

Evaluation Example 1: Evaluation of Characteristics of Organic Light-Emitting Device Current density changes, luminance changes, and emission efficiencies of the organic light-emitting device prepared in Examples 1 to 3 and Comparative Examples 1 and 2 were measured by applying various voltages thereto. The measurement method is as described in the following. The results thereof are shown in Table 2.

(1) Measurement of Current Density Changes Depending on Changes of Applied Voltages Current values of the prepared organic light-emitting devices were measured by measuring values of current in a unit device thereof using a current voltmeter (Keithley 2400) while increasing the applied voltage from 0 volts (V) to 10 V. The result was obtained by dividing a current value by an area.

(2) Measurement of Luminance Changes Depending on Changes of Applied Voltages

Luminance values of the prepared organic light-emitting devices were measured by using a luminance meter (Minolta Cs-1000A) while increasing the applied voltage from 0 V to 10 V.

(3) Measurement of Emission Efficiency

The luminance values measured from (2) and current density values measured from (1), and applied voltages were used in calculating the current efficiency (candelas per ampere, cd/A) under a condition of an identical current density (10 milliamperes per square centimeter, mA/cm$^2$).

(4) Measurement of Durability

The time (hour) for the luminance of the organic light-emitting device to decline to 95% of its initial luminance was evaluated.

TABLE 2

| No. | Host Compound | Driving voltage (relative value | Current density (relative value) | Current efficiency (relative value) | Luminescence efficiency (relative value) | Quantum yield (relative value) | $T_{95}$ lifespan (relative value) |
|---|---|---|---|---|---|---|---|
| Example 1 | 505 | 99% | 79% | 127% | 128% | 117% | 176% |
| Example 2 | 21 | 110% | 76% | 137% | 123% | 141% | 86% |
| Example 3 | 277 | 102% | 85% | 121% | 120% | 126% | 126% |
| Comparative Example 1 | A | 181% | 95% | 105% | 58% | 122% | 1% |
| Comparative Example 2 | C | 100% | 100% | 100% | 100% | 100% | 100% |

Referring to Table 2, it was found that the organic light-emitting devices of Examples 1 to 3 had similar or better driving voltage, current efficiency, luminescence efficiency, and lifespan characteristics, as compared with the organic light-emitting devices of Comparative Examples 1 and 2.

As apparent from the foregoing description, the condensed cyclic compound according to embodiments has excellent electric characteristics and thermal stability. Accordingly, an organic light-emitting device including the condensed cyclic compound may have a low driving voltage, high efficiency, high power, high quantum yield, and long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. A condensed cyclic compound represented by

Formula 1

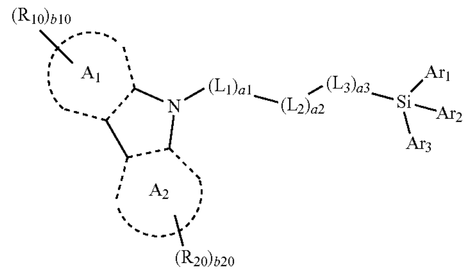

Formula 2

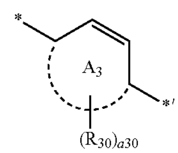

Formula 3

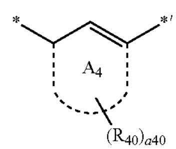

-continued

Formula 4

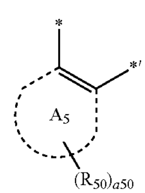

wherein in Formulae 1 to 4, $Ar_1$ to $Ar_3$ are each independently $-(L_4)_{a4}-(R_{60})_{a60}$, $L_1$ to $L_4$ are each independently a group represented by one selected from Formulae 2 to 4, a1 and a3 are each independently an integer from 1 to 3, a2 and a4 are each independently an integer from 0 to 3, rings $A_1$ to $A_5$ are each independently a $C_5$-$C_{60}$ carbocyclic group or a $C_2$-$C_{60}$ heterocyclic group, $R_{10}$, $R_{20}$, $R_{30}$, $R_{40}$, $R_{50}$, and $R_{60}$ are each independently selected from hydrogen, deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), and —B($Q_6$)($Q_7$), provided that when a4 is 0 and a60 is 1, then $R_{60}$ is selected from hydrogen, deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic add group or a salt thereof, a phosphoric acid group or a salt thereof, a phenyl group, a naphthyl group, a pyridinyl group, a pyrimidinyl group, a pyrazinyl group, a pyridazinyl group, and a triazinyl group;

a cyclopentyl group, a cyclohexyl group, a cyclopentenyl group, a cyclohexenyl group, a cycloheptenyl group, a phenyl group, a pentalenyl group, an indenyl group, a naphthyl group, an azolenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, imidazopyridimidinyl group, and an imidazopyridinyl group; and a cyclopentyl group, a cyclohexyl group, a cyclopentenyl group, a cyclohexenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, imidazopyridimidinyl group, and an imidazopyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group, wherein at least one selected from $R_{10}$, $R_{20}$, $R_{30}$, $R_{40}$, $R_{50}$, and $R_{60}$ is a cyano group, b10, b20, a30, a40, a50, and a60 are each independently an integer from 1 to 10, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{24})(Q_{25})$, and —$B(Q_{26})(Q_{27})$; and —$Si(Q_{31})(Q_{32})(Q_{33})$, —$N(Q_{34})(Q_{35})$, and —$B(Q_{36})(Q_{37})$, wherein $Q_1$ to $Q_7$, $Q_{11}$ to $Q_{17}$, $Q_{21}$ to $Q_{27}$, and $Q_{31}$ to $Q_{37}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

2. The condensed cyclic compound of claim 1, wherein a4 is 1, 2, or 3.

3. The condensed cyclic compound of claim 1, wherein rings $A_1$ and $A_5$ are each independently selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

4. The condensed cyclic compound of claim 1, wherein rings $A_1$ and ring $A_2$ are each independently selected from a benzene group, a naphthalene group, a fluorene group, a pyridine group, a pyrazine group, a pyrimidine group, a pyridazine group, a carbazole group, a triazine group, a dibenzofuran group, and a dibenzothiophene group.

5. The condensed cyclic compound of claim 1, wherein rings $A_3$ to $A_5$ are each a benzene group.

6. The condensed cyclic compound of claim 1, wherein Li to $L_3$ are each independently a group represented by one selected from Formulae 3-1 to 3-9:

3-1

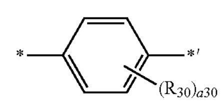

3-2

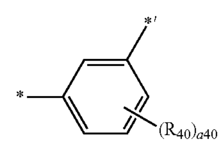

3-3

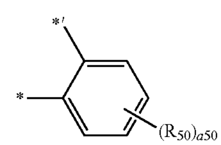

3-4

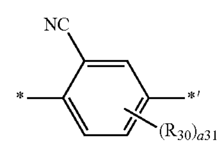

3-5

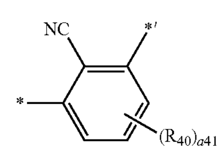

-continued 3-6

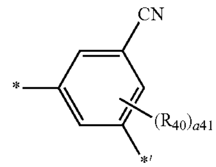

3-7

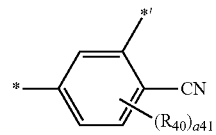

3-8

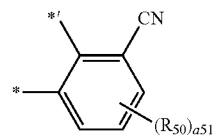

3-9

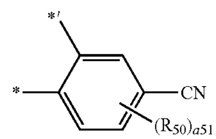

wherein, in Formulae 3-1 to 3-9, $R_{30}$, $R_{40}$, $R_{50}$, a30, a40, and a50 are each as defined in claim 1, a30, a40, and a50 are each independently an integer from 1 to 4, and a31, a41, and a51 are each independently an integer from 1 to 3.

7. The condensed cyclic compound of claim 1, wherein $R_{10}$, $R_{20}$, $R_{30}$, $R_{40}$, $R_{50}$, and $R_{60}$ are each independently selected from hydrogen, deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, a pyrimidinyl group, a pyrazinyl group, a pyridazinyl group, and a triazinyl group;

a cyclopentyl group, a cyclohexyl group, a cyclopentenyl group, a cyclohexenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, imidazopyridimidinyl group, and an imidazopyridinyl group; and a cyclopentyl group, a cyclohexyl group, a cyclopentenyl group, a cyclohexenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, imidazopyridimidinyl group, and an imidazopyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group, and at least one selected from $R_{10}$, $R_{20}$, $R_{30}$, $R_{40}$, $R_{50}$, and $R_{60}$ is a cyano group.

8. The condensed cyclic compound of claim 1, wherein $R_{10}$, $R_{20}$, $R_{30}$, $R_{40}$, $R_{50}$, and $R_{60}$ are each independently selected from hydrogen, deuterium, a cyano group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, a cyano group, a phenyl group, a biphenyl group, a terphenyl group, and a naphthyl group;

a cyclopentyl group, a cyclohexyl group, a cyclopentenyl group, a cyclohexenyl group, a cycloheptenyl group, a phenyl group, a biphenyl group, a terphenyl group, a naphthyl group, a fluorenyl group, a carbazolyl group, a dibenzofuranyl group, and a dibenzothiophenyl group; and a cyclopentyl group, a cyclohexyl group, a cyclopentenyl group, a cyclohexenyl group, a cycloheptenyl group, a phenyl group, a biphenyl group, a terphenyl group, a naphthyl group, a fluorenyl group, a carbazolyl group, a dibenzofuranyl group, and a dibenzothiophenyl group, each substituted with at least one selected from deuterium, a cyano group, a $C_1$-$C_{20}$ alkyl group, a $C_1$-$C_{20}$ alkoxy group, a phenyl group, a biphenyl group, a terphenyl group, and a naphthyl group, and at least one selected from $R_{10}$, $R_{20}$, $R_{30}$, $R_{40}$, $R_{50}$, and $R_{60}$ is a cyano group.

9. The condensed cyclic compound of claim 1, wherein the number of cyano groups comprised in the condensed cyclic compound represented by Formula 1 is 1 to 5.

10. The condensed cyclic compound of claim 1, wherein (i) at least one selected from $R_{10}$ and $R_{20}$ is a cyano group, and $R_{30}$, $R_{40}$, and $R_{50}$ are each independently a cyano group, (ii) at least one selected from $R_{30}$, $R_{40}$, and $R_{50}$ is a cyano group, and $R_{10}$ and $R_{20}$ are each independently a cyano group, or (iii) $R_{60}$ is a cyano group.

11. The condensed cyclic compound of claim 1, wherein at least one selected from $R_{10}$ and $R_{20}$ and at least one selected from $R_{30}$, $R_{40}$, and $R_{50}$ are each a cyano group.

12. The condensed cyclic compound of claim 1, wherein the condensed cyclic compound represented by Formula 1 is represented by Formula 10:

Formula 10

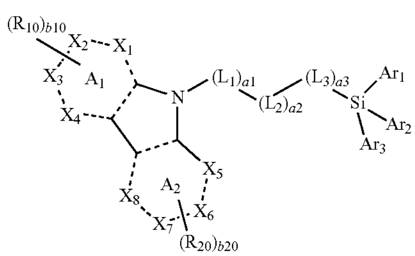

wherein, in Formula 10, $A_1$, $A_2$, $R_{10}$, $R_{20}$, b10, b20, $L_1$, $L_2$, $L_3$, a1, a2, a3, and $Ar_1$ to $Ar_3$ are each as defined in claim 1, $X_1$ to $X_4$ are each independently selected from carbon (C) and nitrogen (N), and $X_5$ to $X_8$ are each independently selected from C and N.

13. The condensed cyclic compound of claim 1, wherein the condensed cyclic compound represented by Formula 1 is represented by one of Formulae 10-1 to 1-9:

Formula 10-1

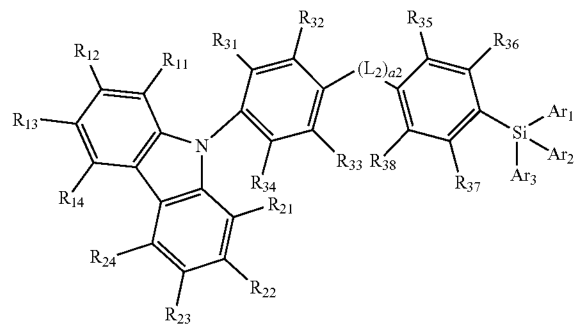

Formula 10-2

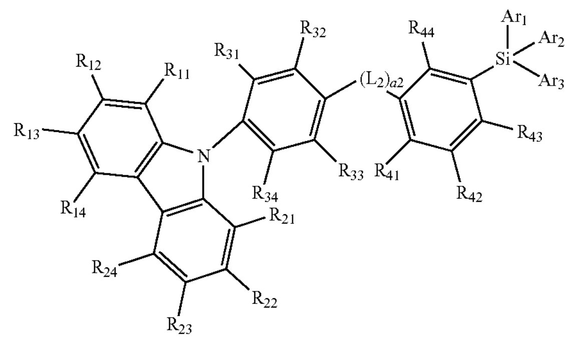

Formula 10-3

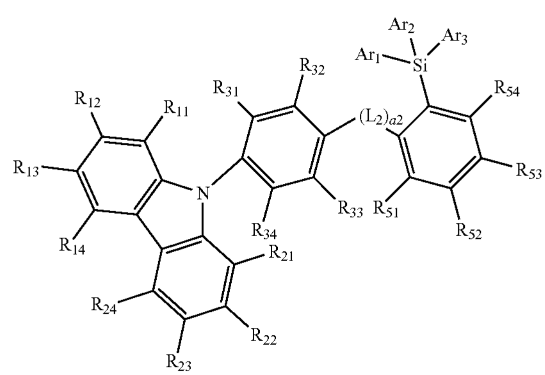

Formula 10-4

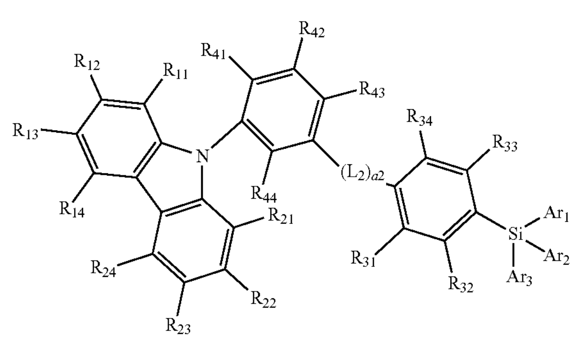

-continued

Formula 10-5

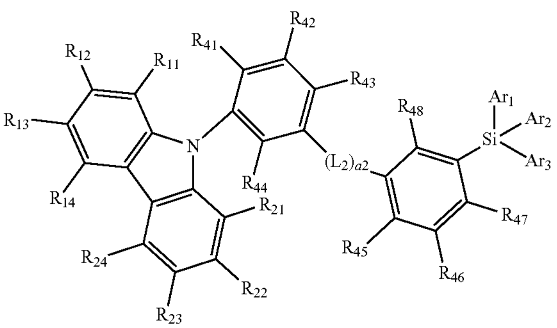

Formula 10-6

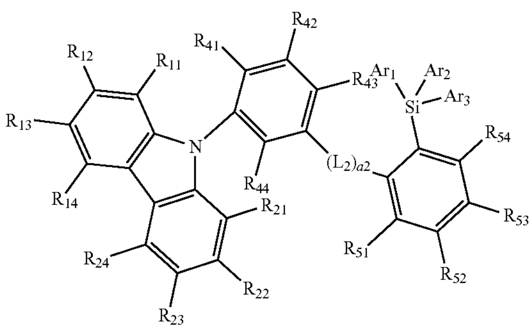

Formula 10-7

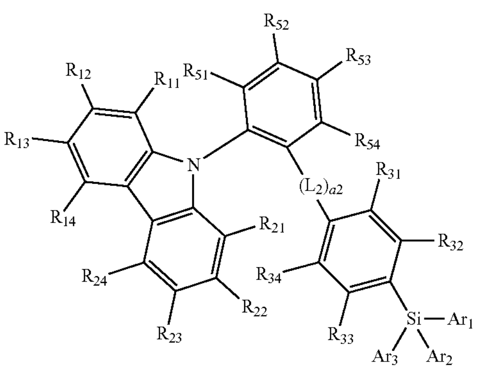

Formula 10-8

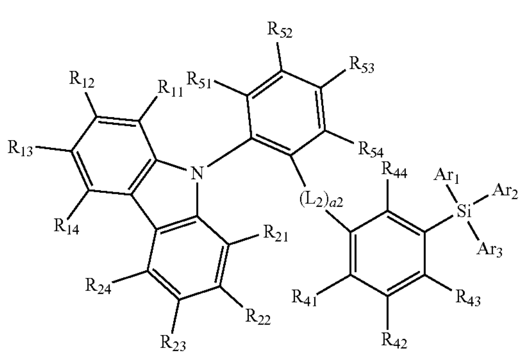

-continued

Formula 10-9

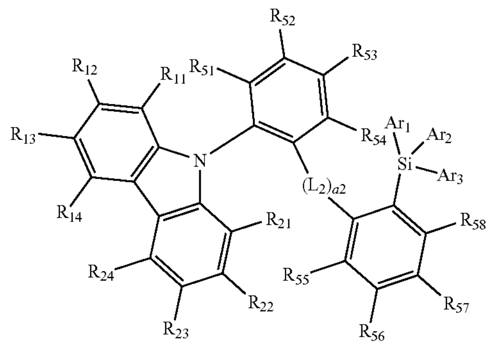

wherein, in Formulae 10-1 to 10-9, $L_2$, a2, and $Ar_1$ to $Ar_3$ are each as defined in claim 1, $R_{11}$ to $R_{14}$ are each independently defined the same as $R_{10}$ in claim 1, $R_{21}$ to $R_{24}$ are each independently defined the same as $R_{20}$ in claim 1, $R_{31}$ to $R_{38}$ are each independently defined the same as $R_{30}$ in claim 1, $R_{41}$ to $R_{48}$ are each independently defined the same as $R_{40}$ in claim 1, $R_{51}$ to $R_{58}$ are each independently defined the same as $R_{50}$ in claim 1, and at least one selected from $R_{11}$ to $R_{14}$, $R_{21}$ to $R_{24}$, $R_{31}$ to $R_{38}$, $R_{41}$ to $R_{48}$, $R_{51}$ to $R_{58}$, and $R_{60}$ is a cyano group.

14. The condensed cyclic compound of claim 1, wherein the condensed cyclic compound represented by Formula 1 is selected from Compounds 1 to 671:

1

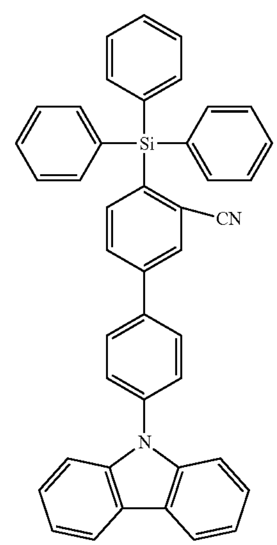

2
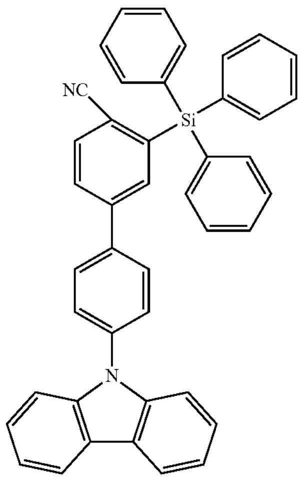
3
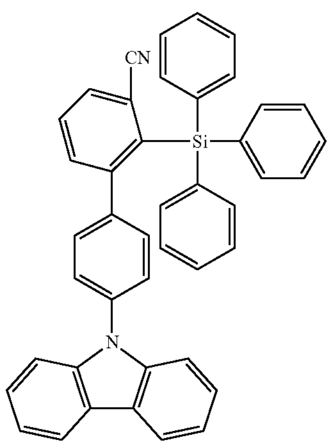
4
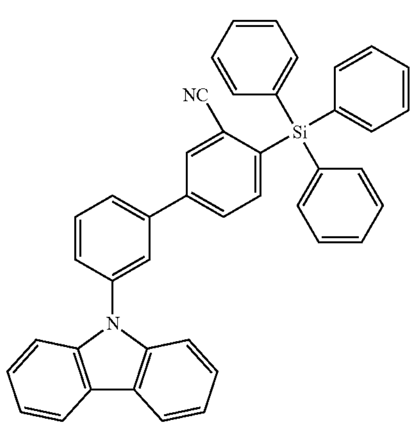
5
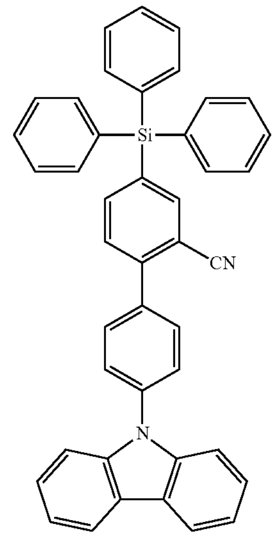
6
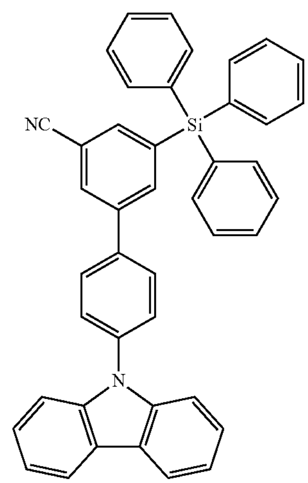
7
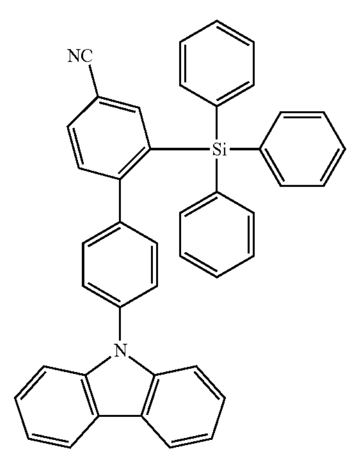

-continued
8
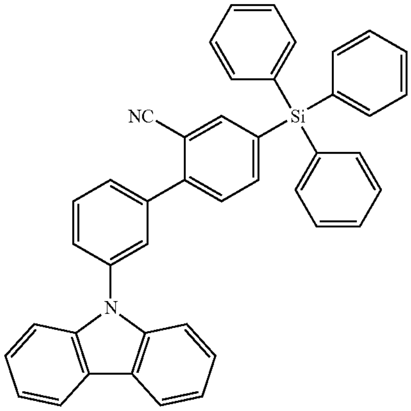
9
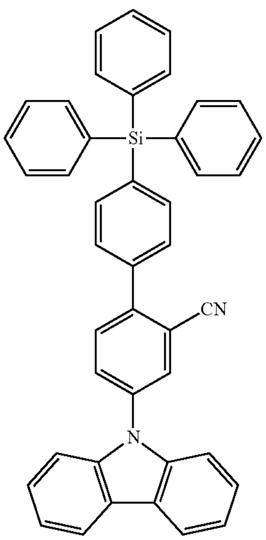
10
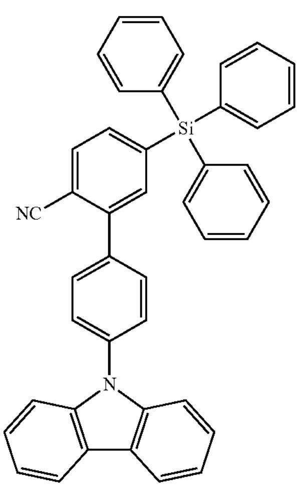
-continued
11
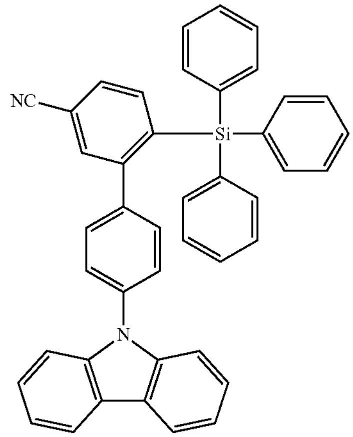
12
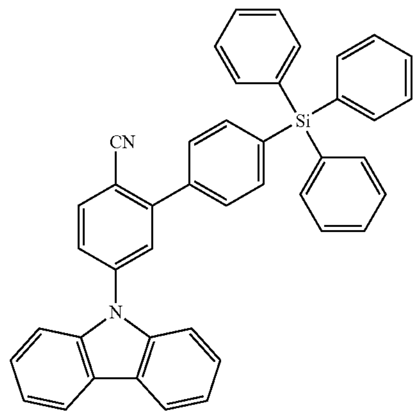
13
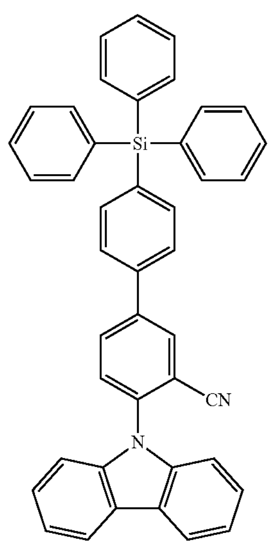

-continued
14
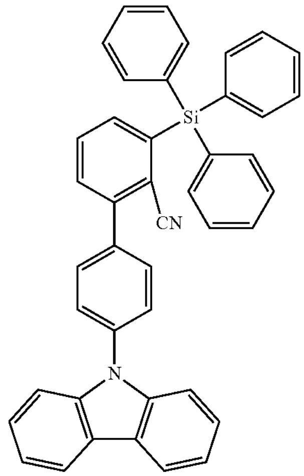
15
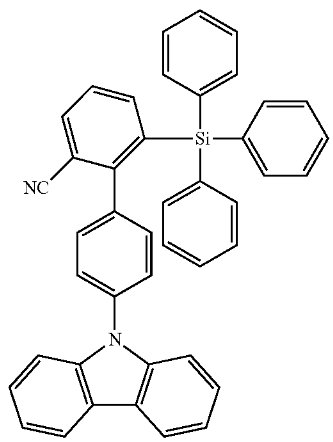
16
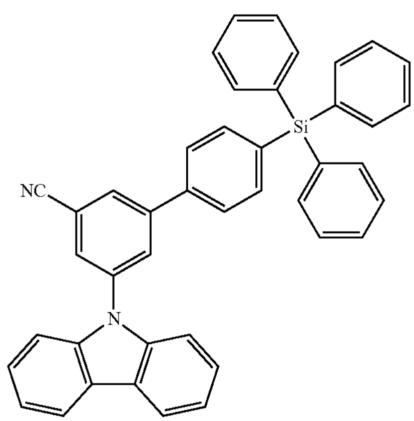
17
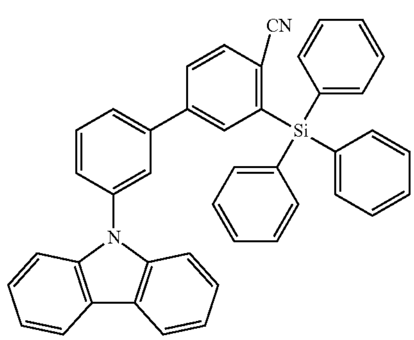
-continued
18
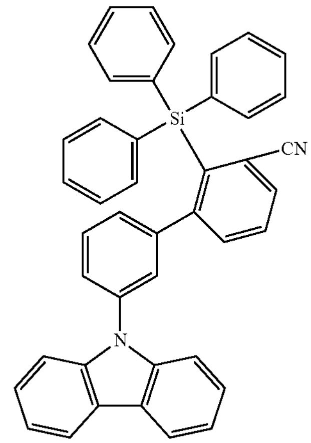
19
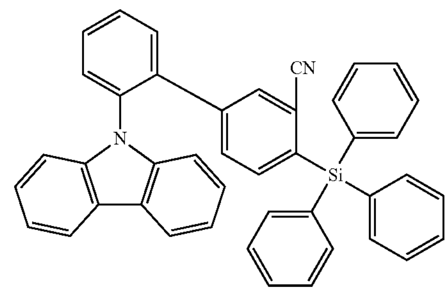
20
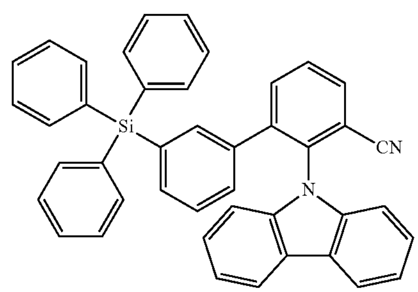
21
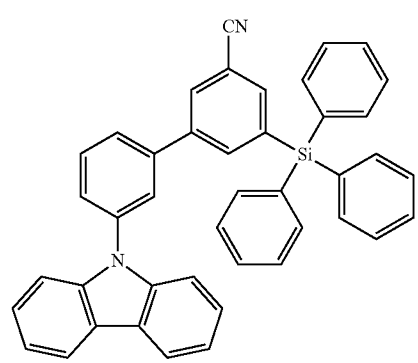

-continued
22
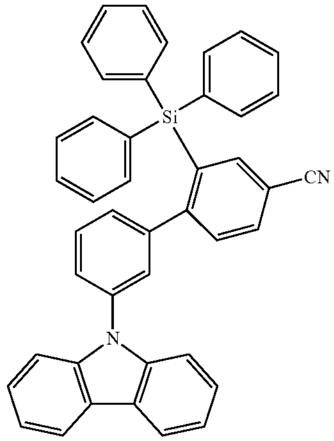
23
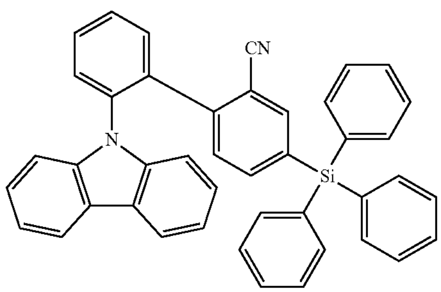
24
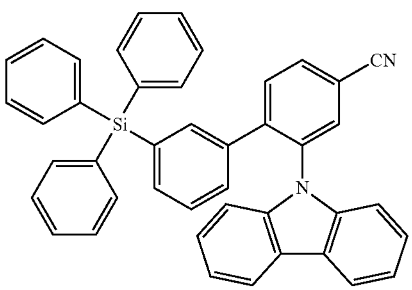
25
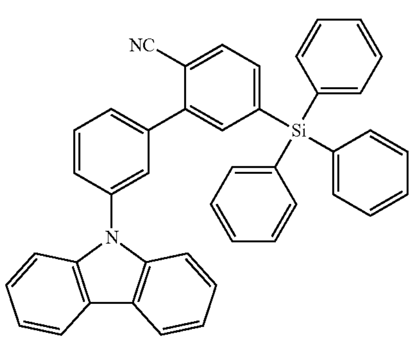
-continued
26
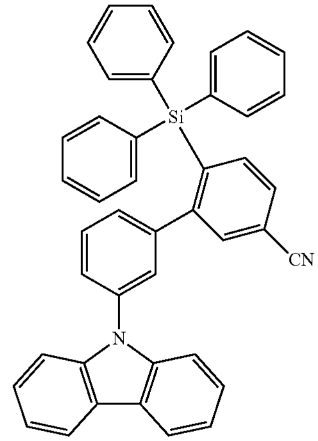
27
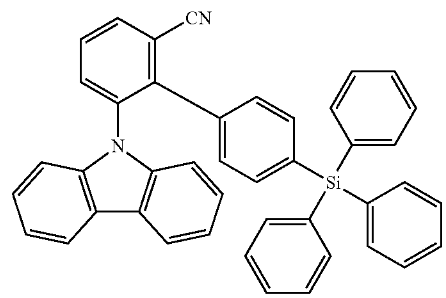
28
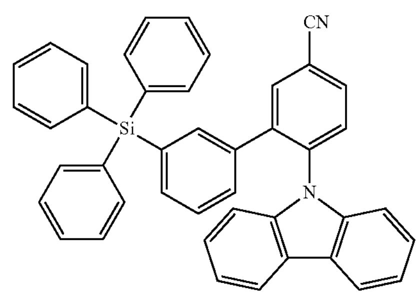
29
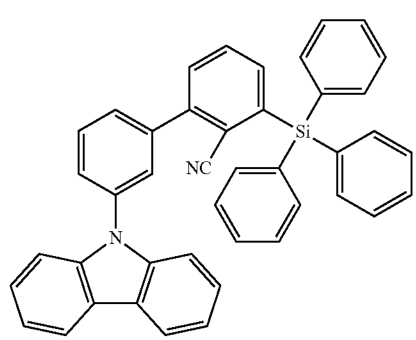

30
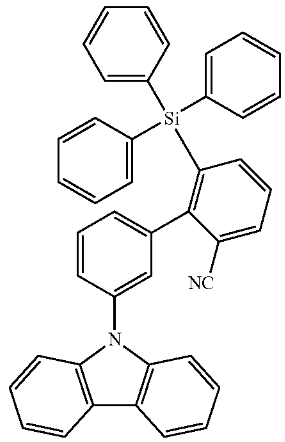
31
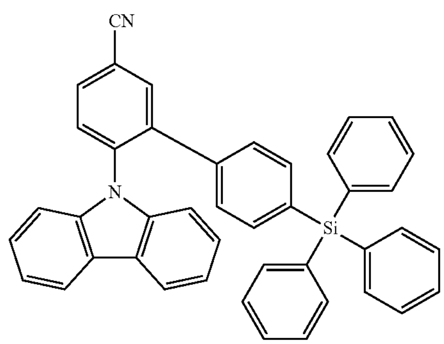
32
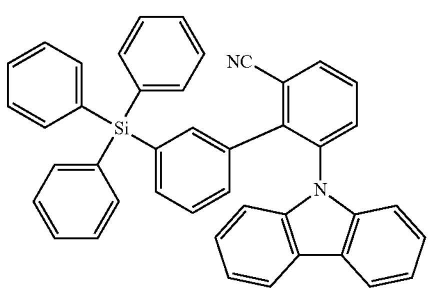
33
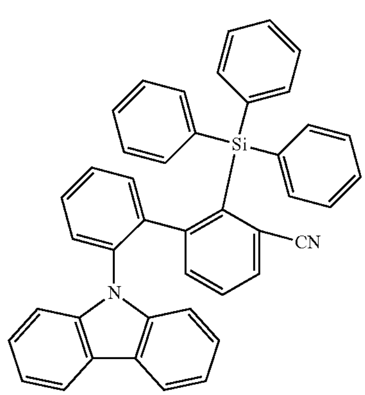
34
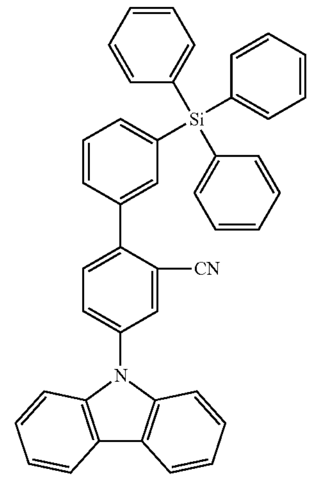
35
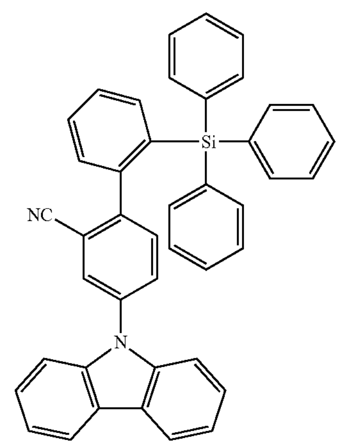
36
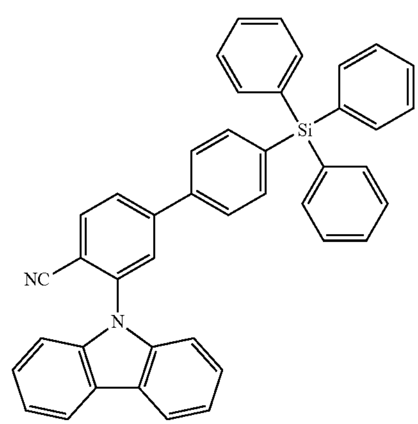

-continued
37
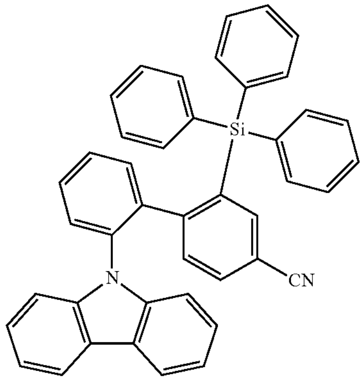
38
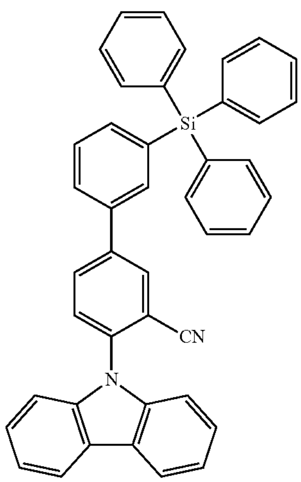
39
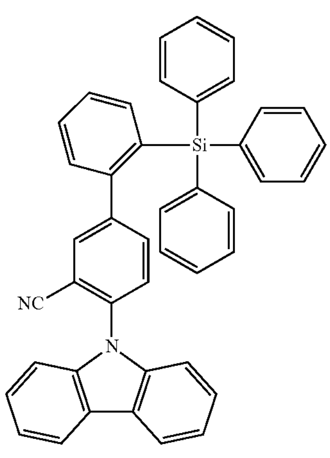
-continued
40
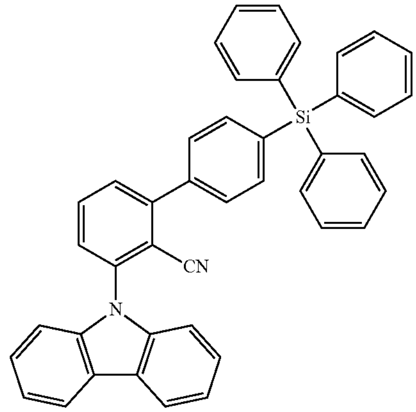
41
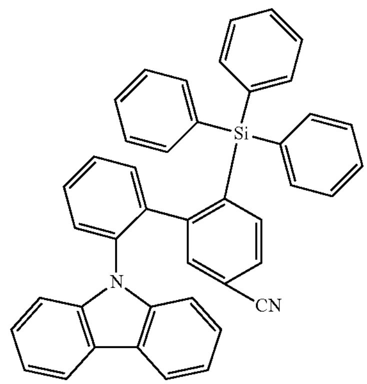
42
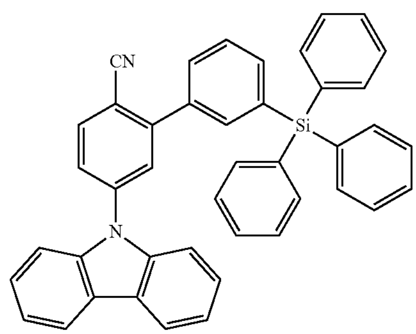
43
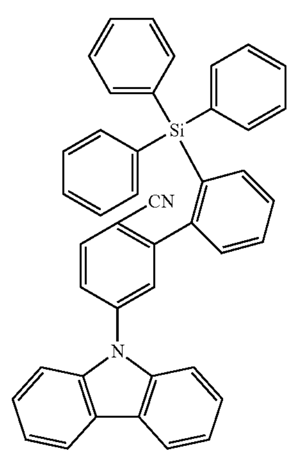

-continued
44
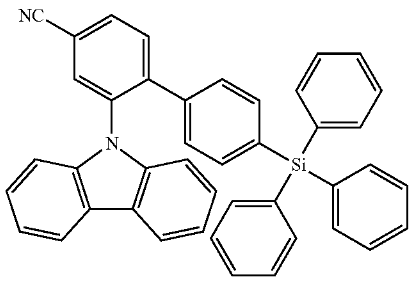
45
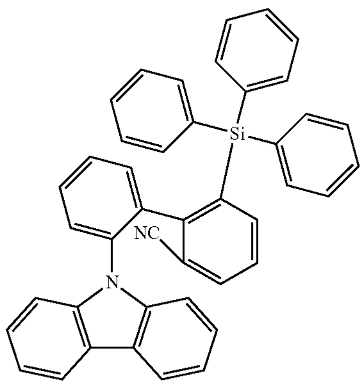
46
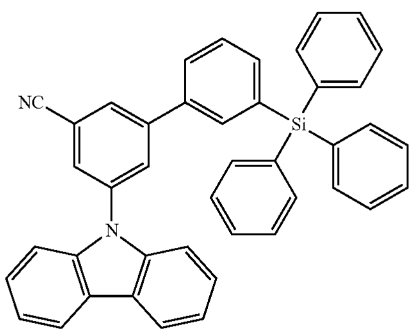
47
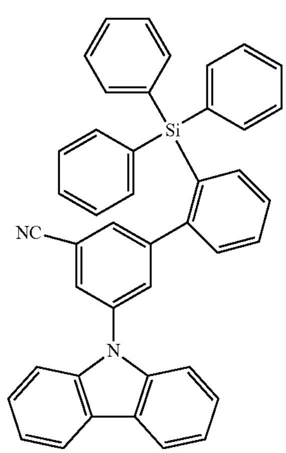
-continued
48
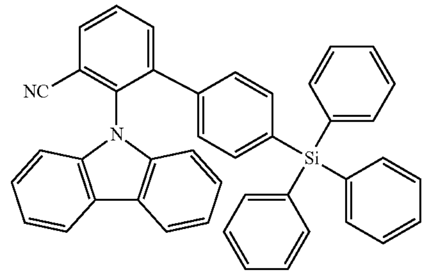
49
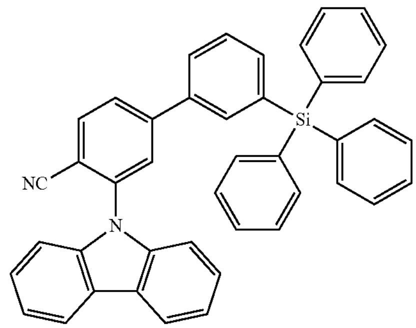
50
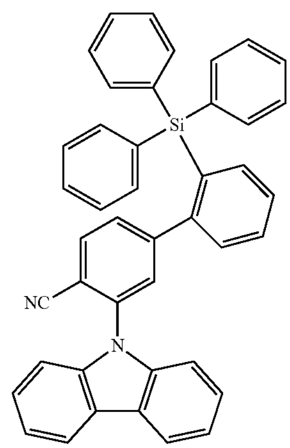
51
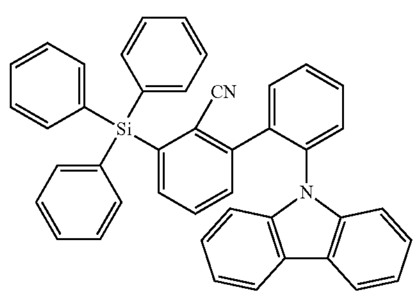

-continued
52
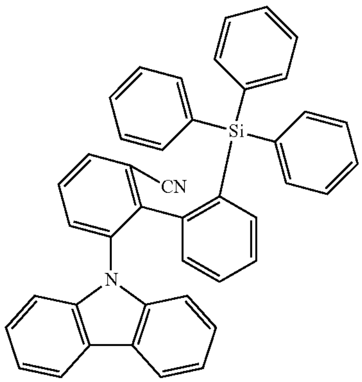
53
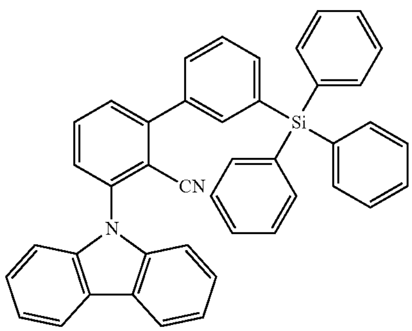
54
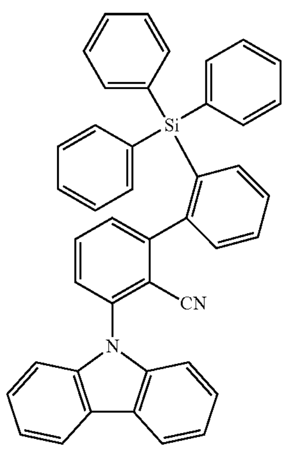
55
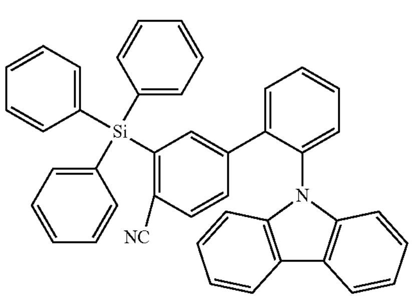
-continued
56
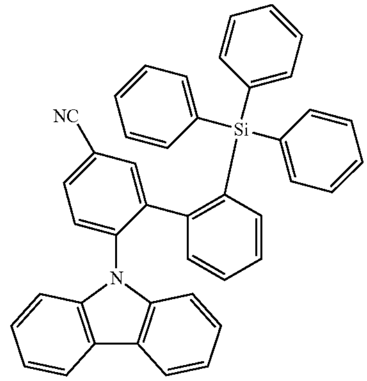
57
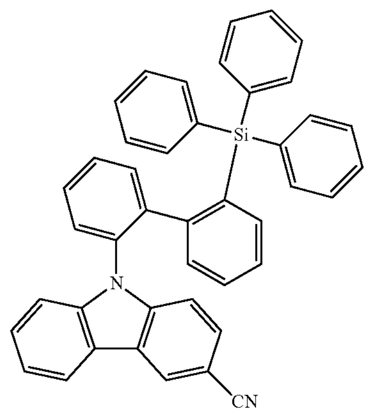
58
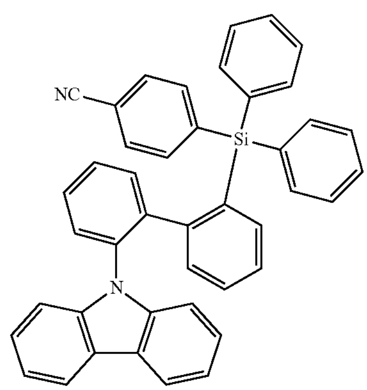
59
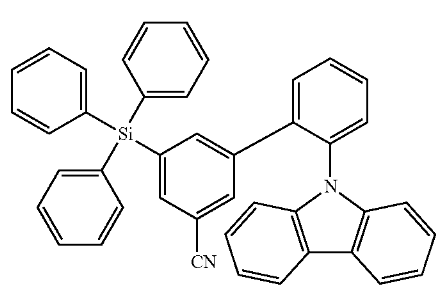

-continued
60
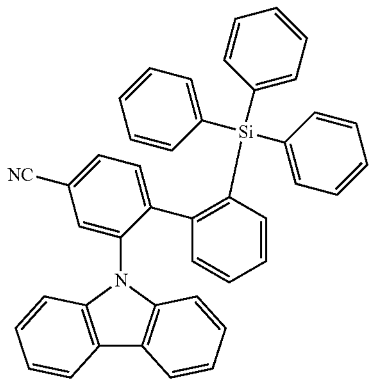
61
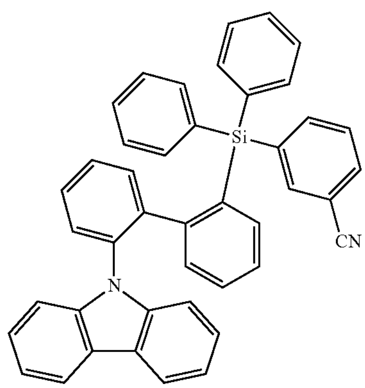
62
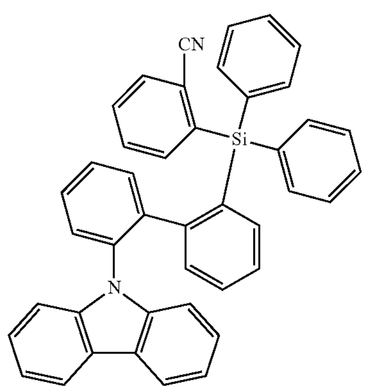
63
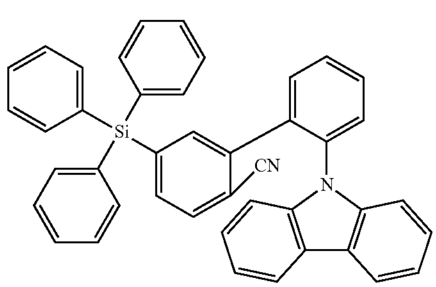
-continued
64
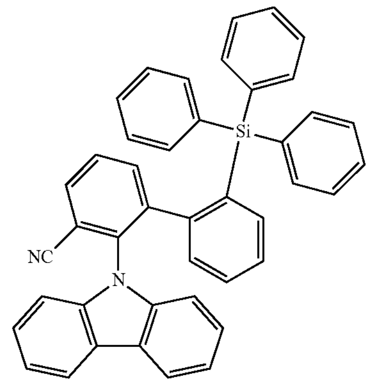
65
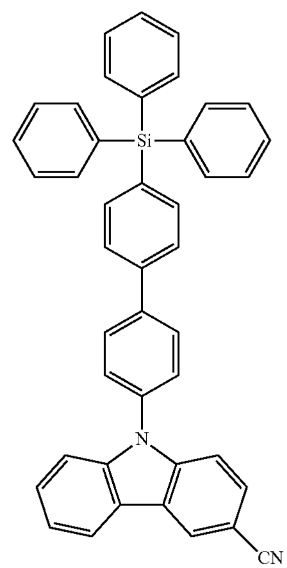
66
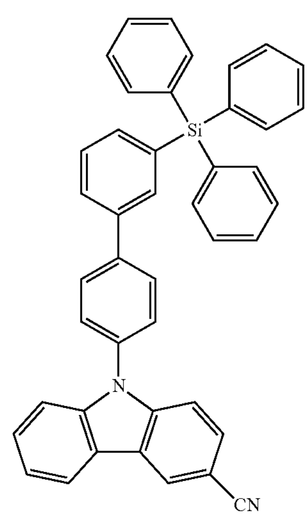

67
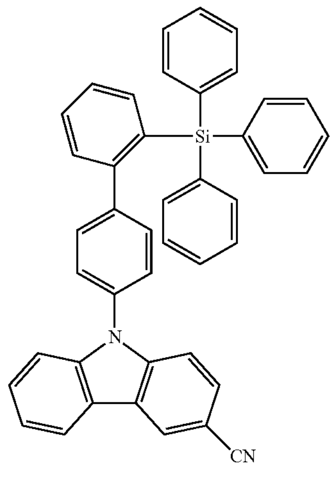
68
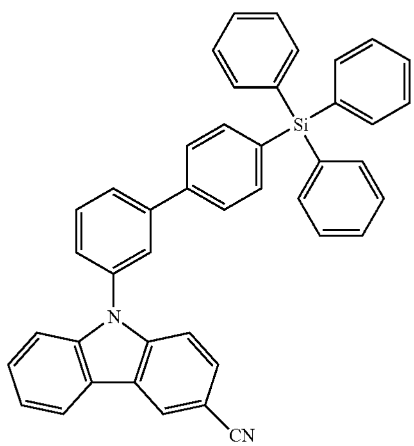
69
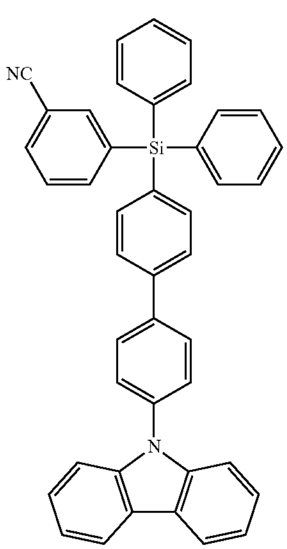
70
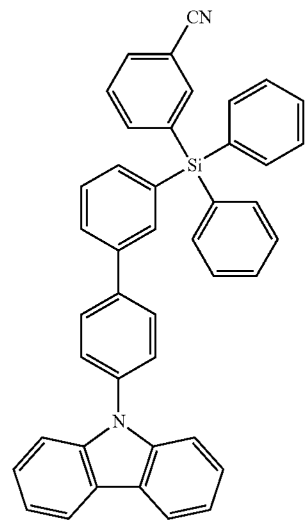
71
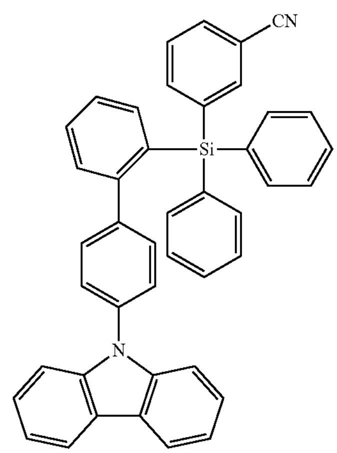
72
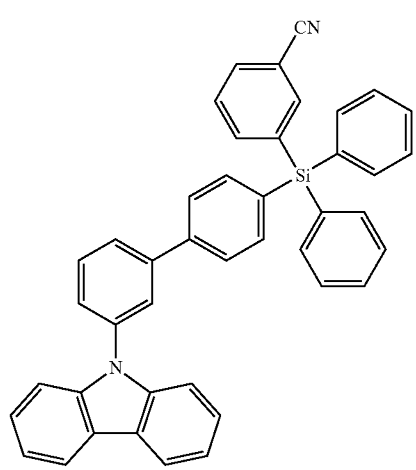

73
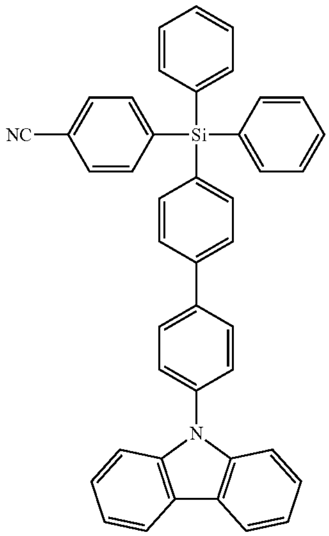
74
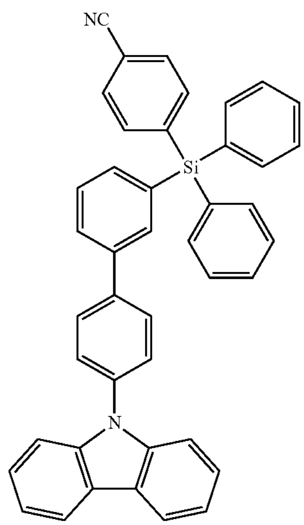
75
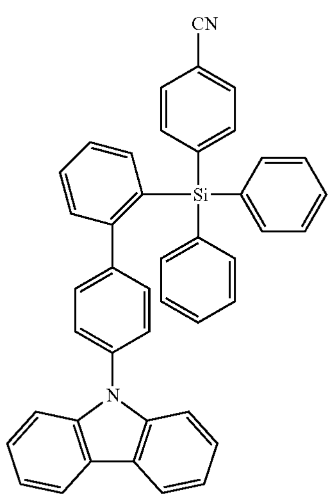
76
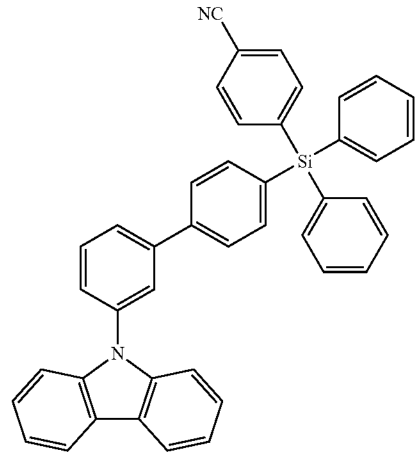
77
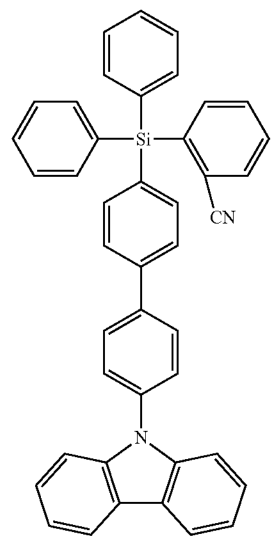
78
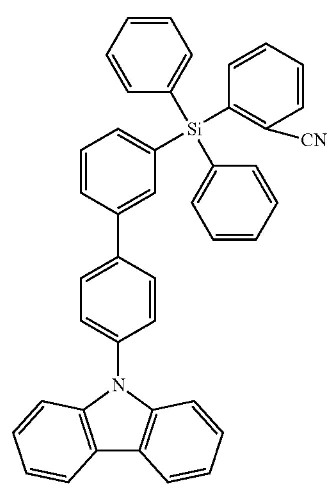

-continued
79
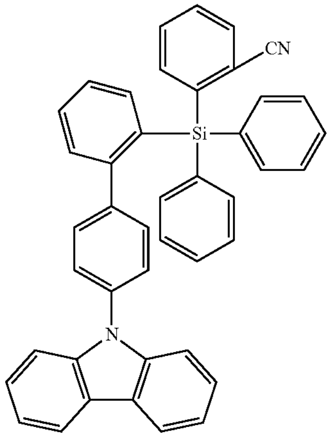
80
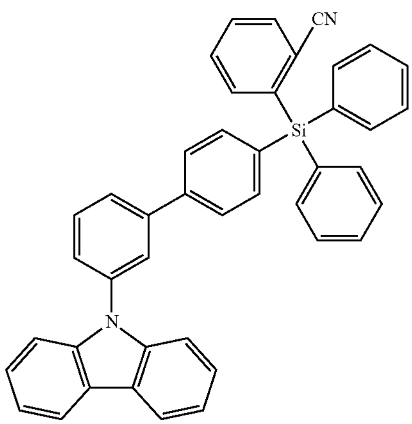
81
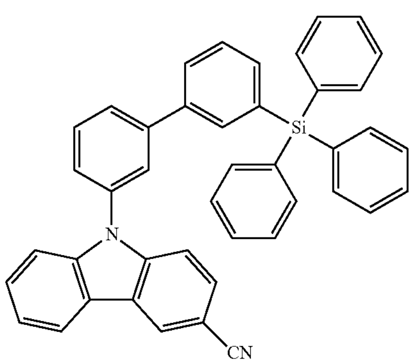
-continued
82
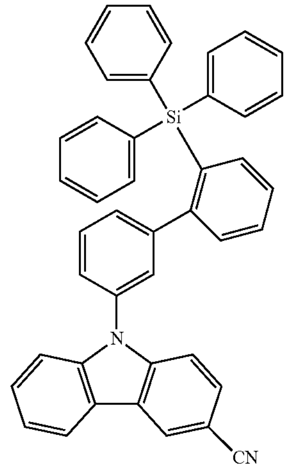
83
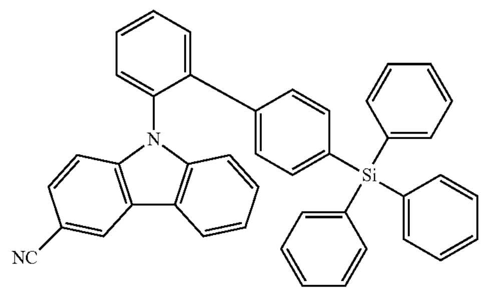
84
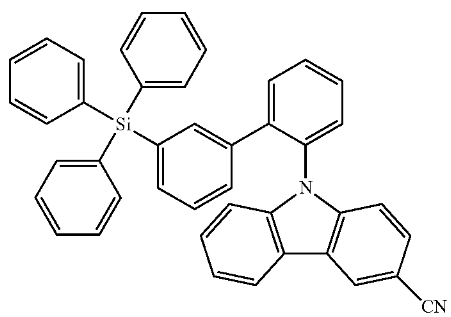
85
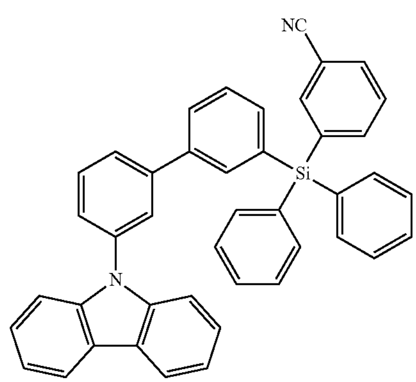

86
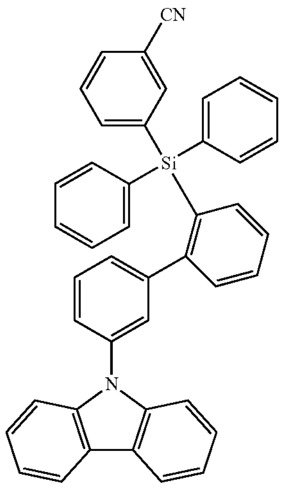
87
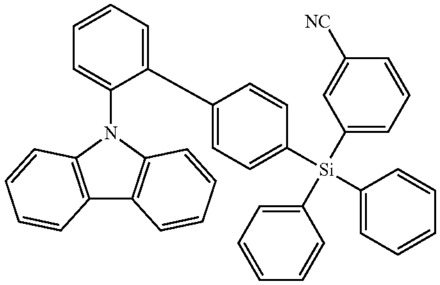
88
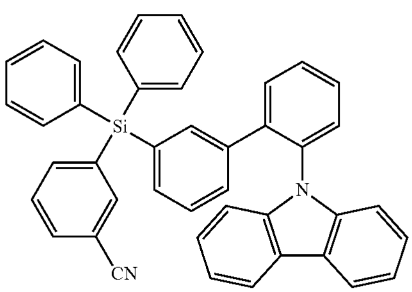
89
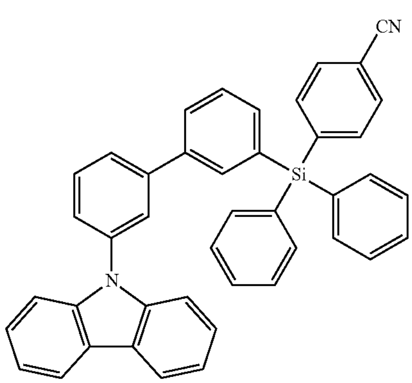
90
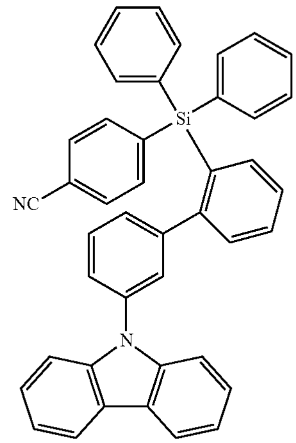
91
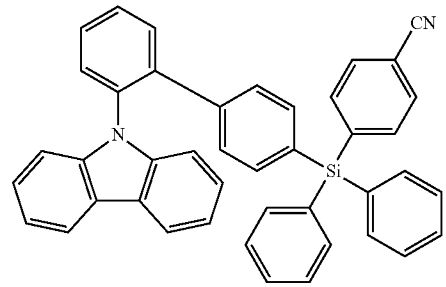
92
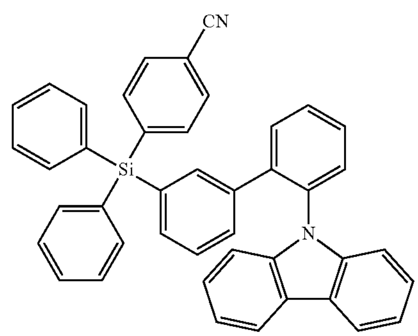
93
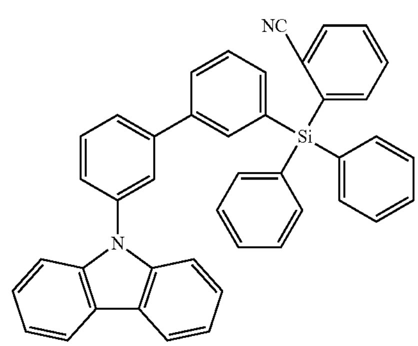

-continued
94
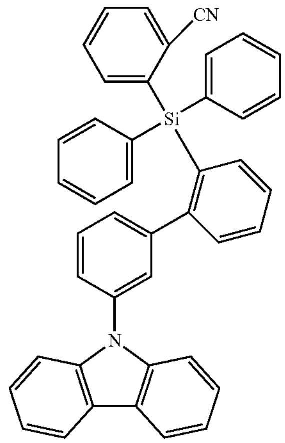
95
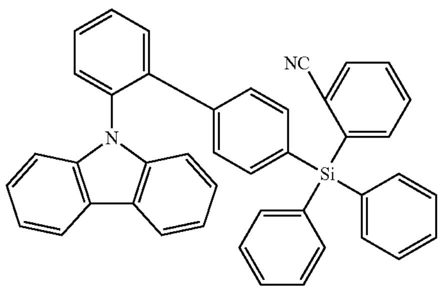
96
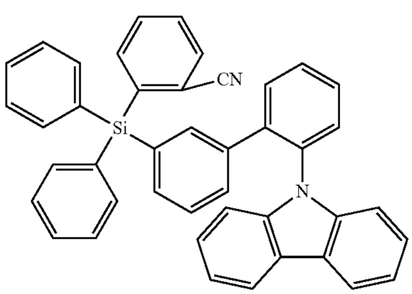
97
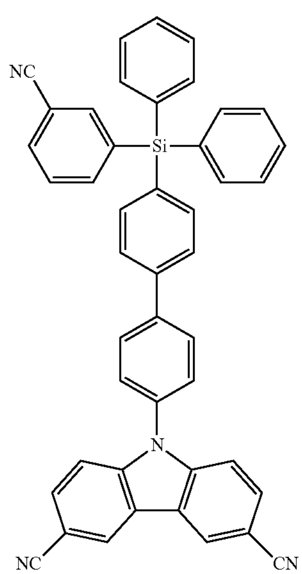
-continued
98
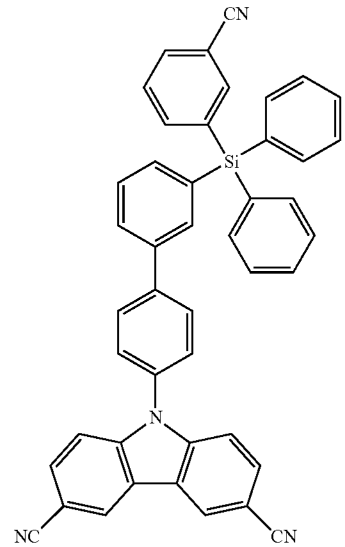
99
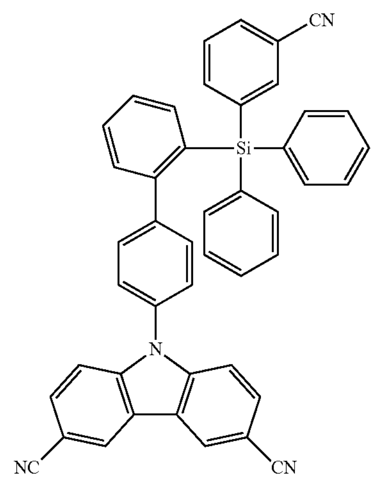
100
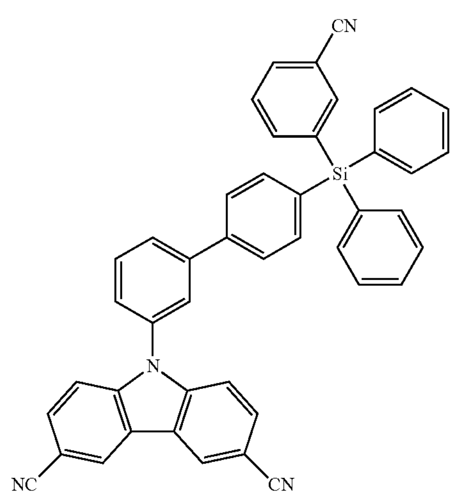

-continued
101
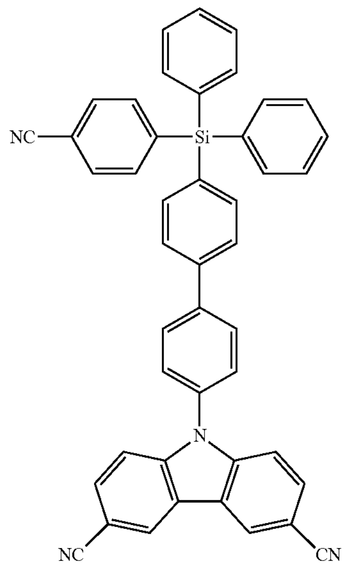
102
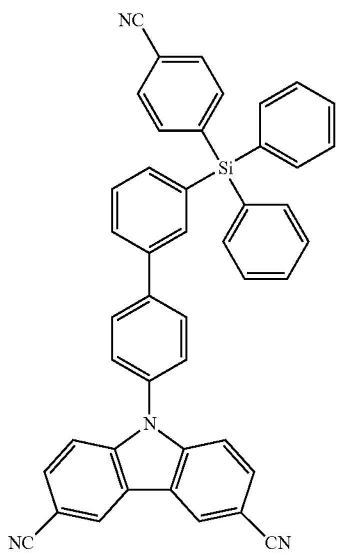
103
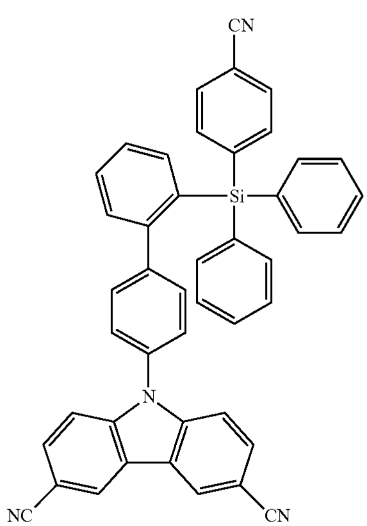
-continued
104
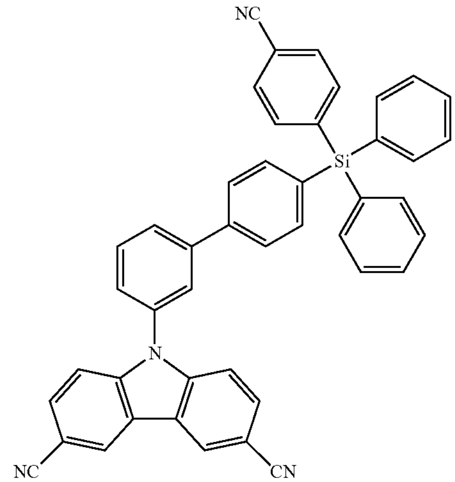
105
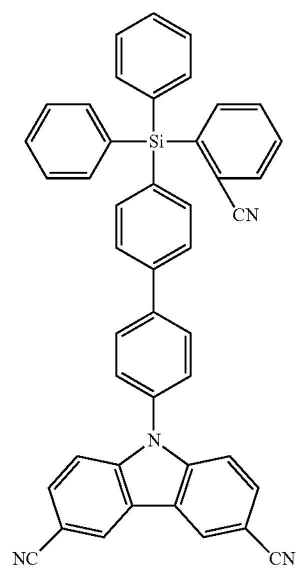
106
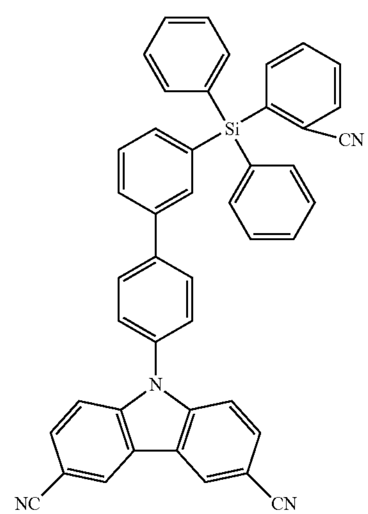

-continued
107
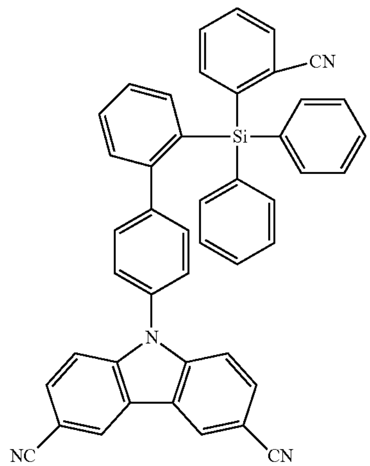
108
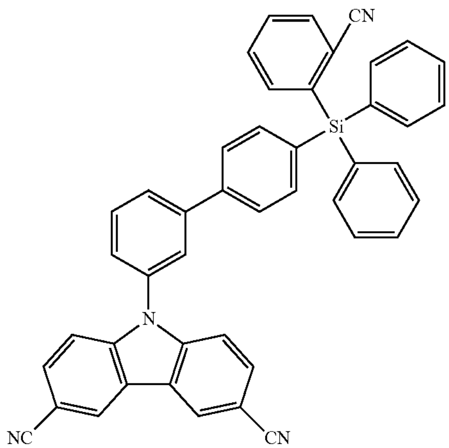
109
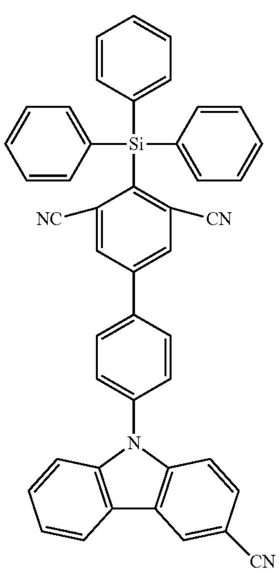
-continued
110
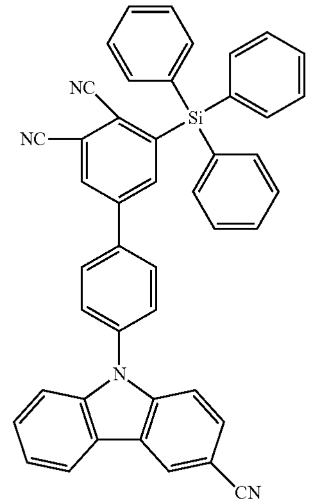
111
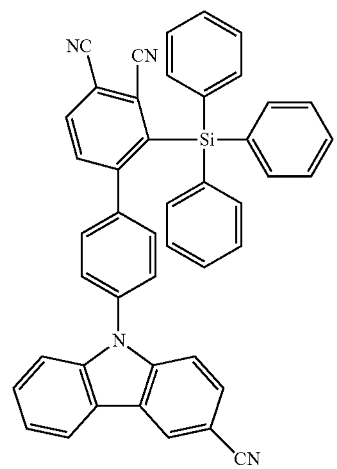
112
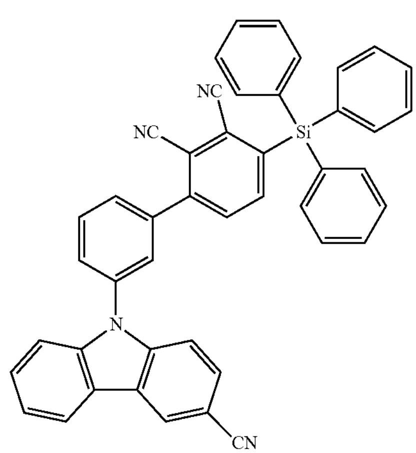

113
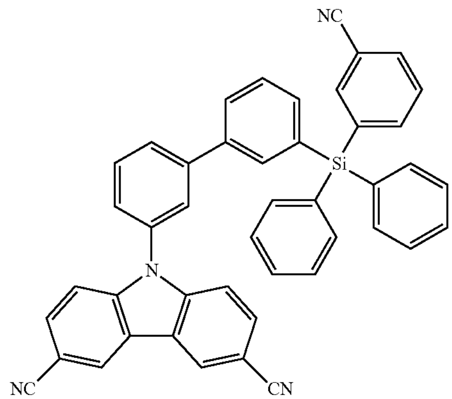
114
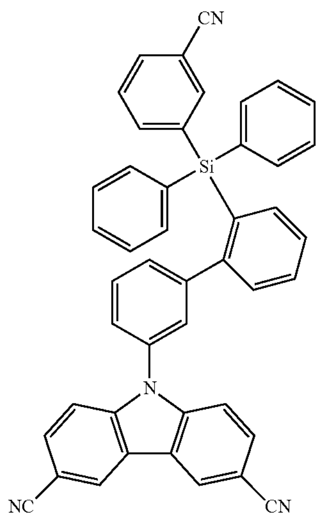
115
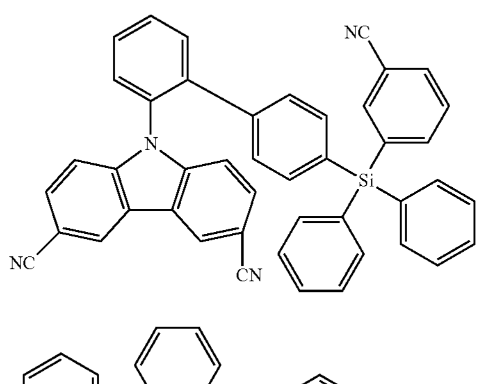
116
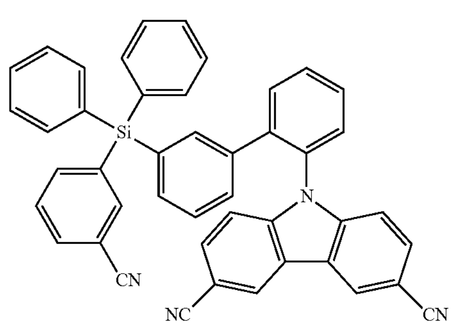
117
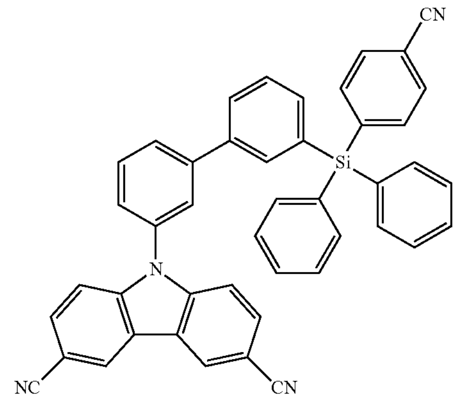
118
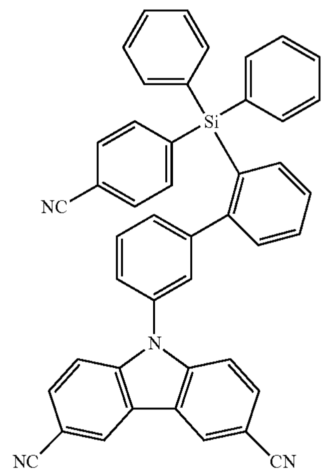
119
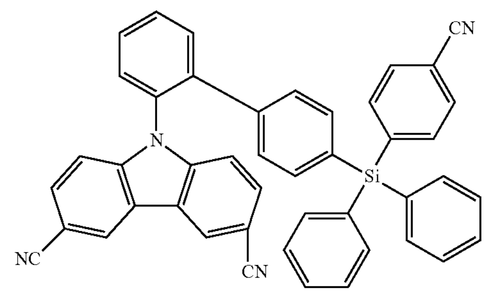
120
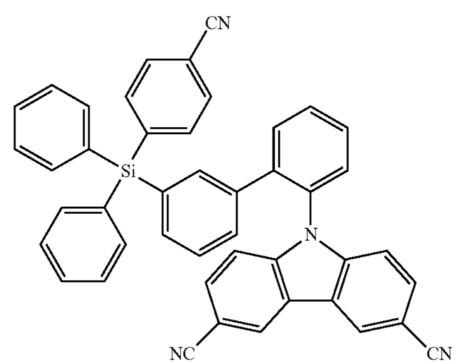

-continued
121
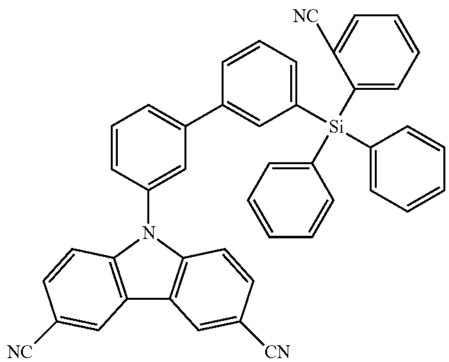
122
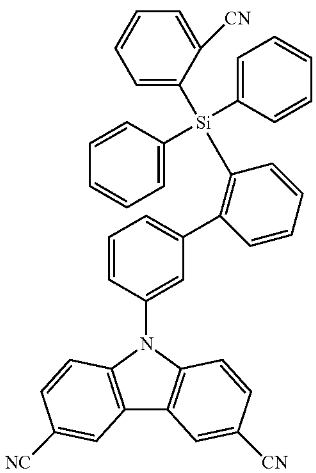
123
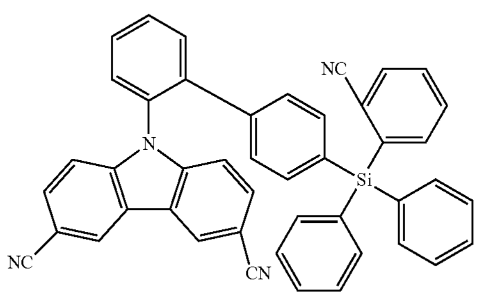
124
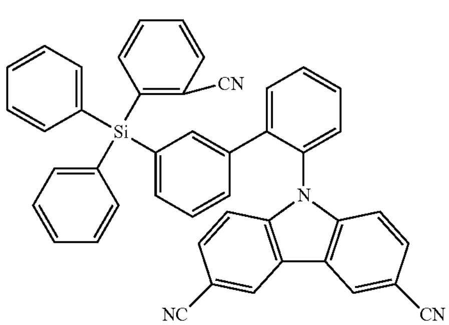
-continued
125
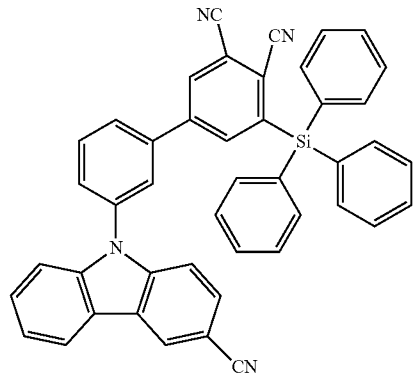
126
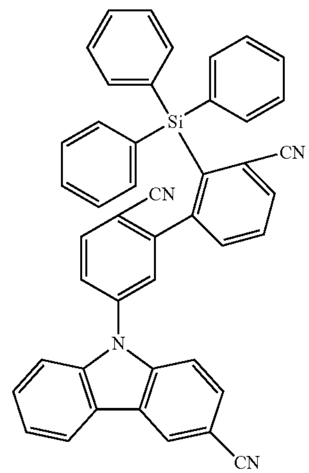
127
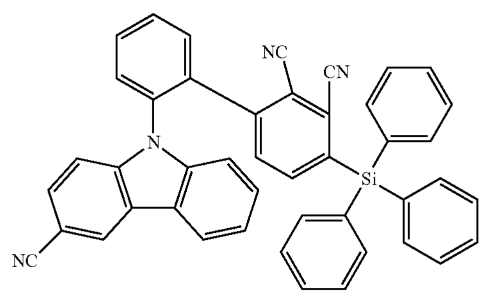
128
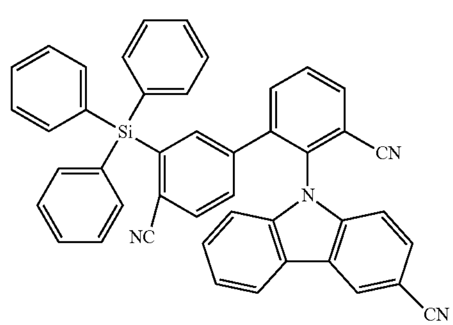

-continued
129
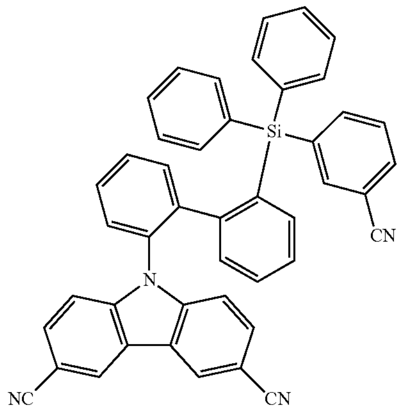
130
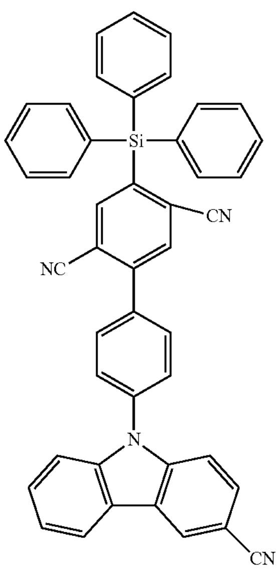
131
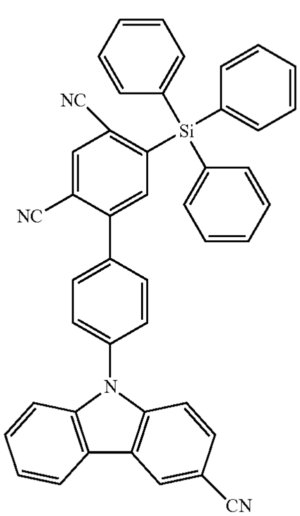
132
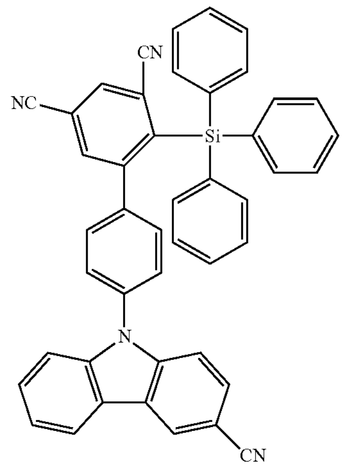
133
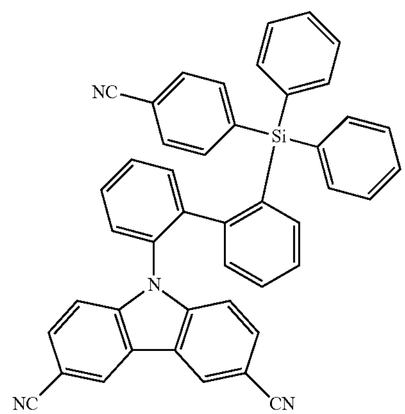
134
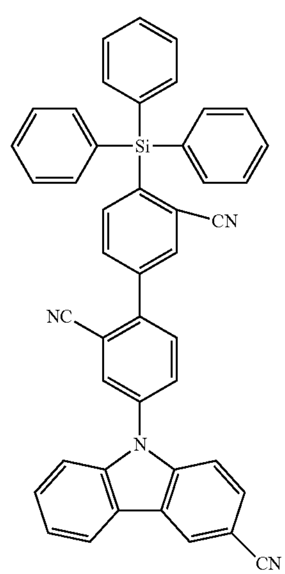

-continued
135
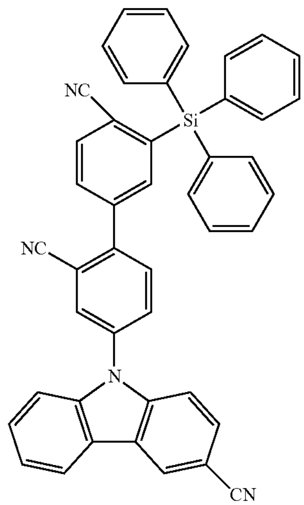
136
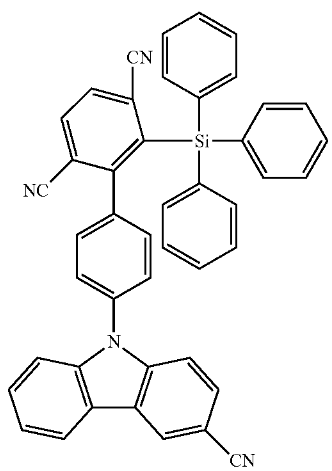
137
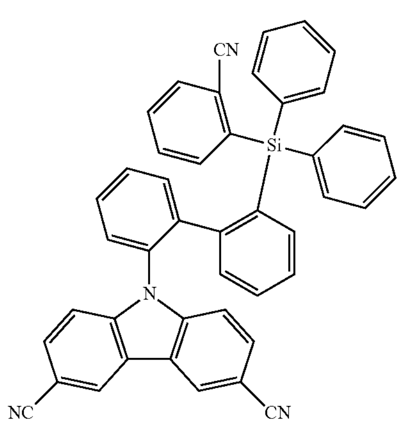
-continued
138
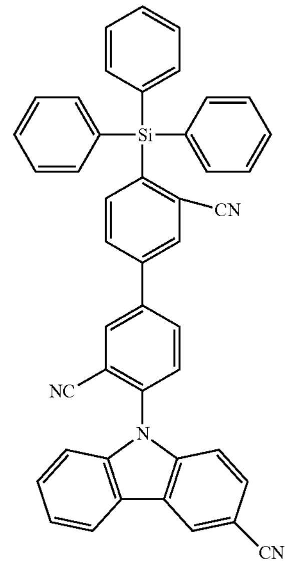
139
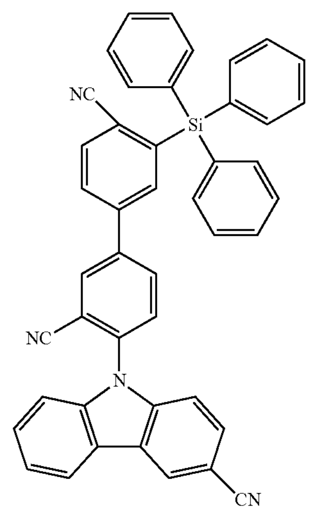
140
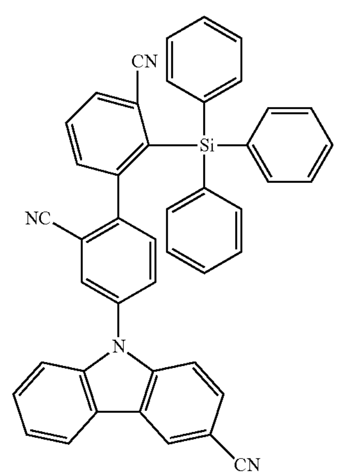

-continued
141
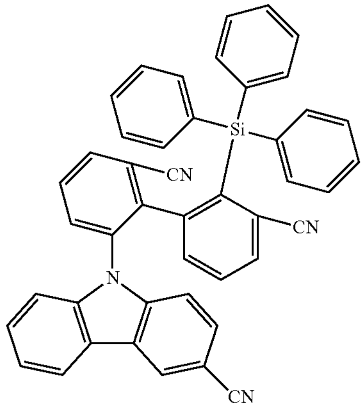
142
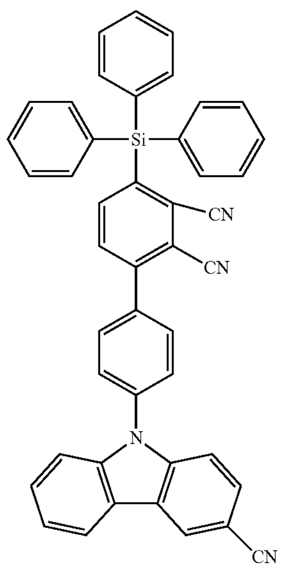
143
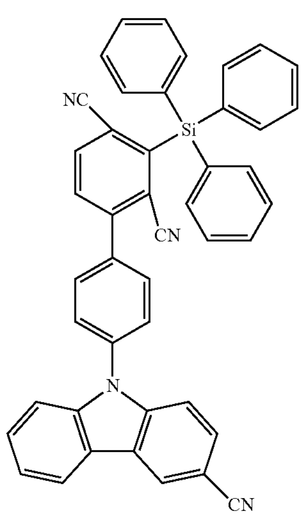
-continued
144
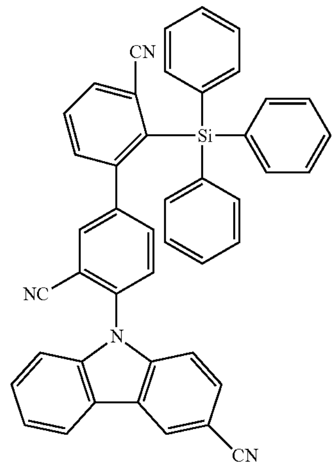
145
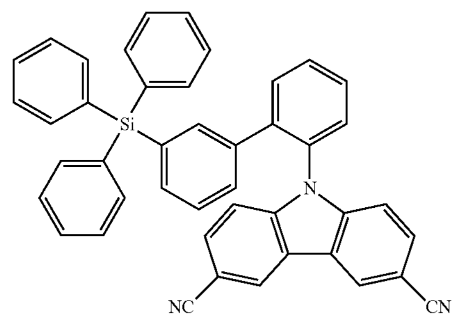
146
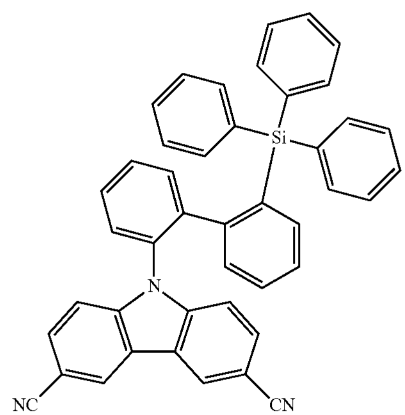
147
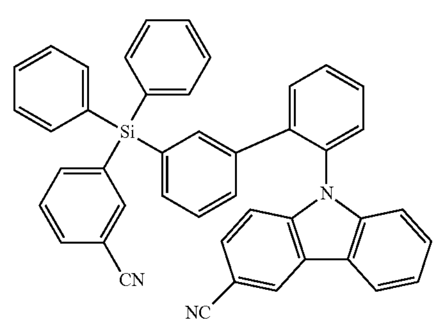

-continued
148
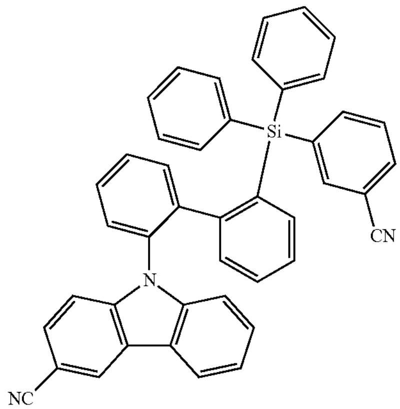
149
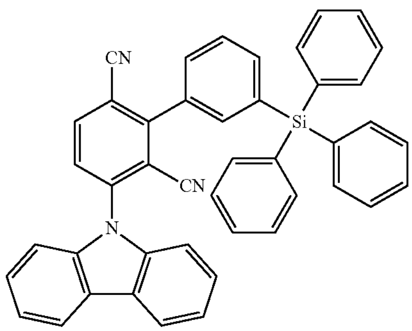
150
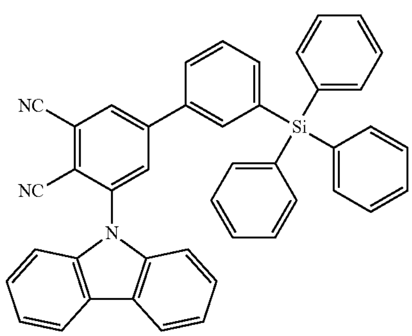
151
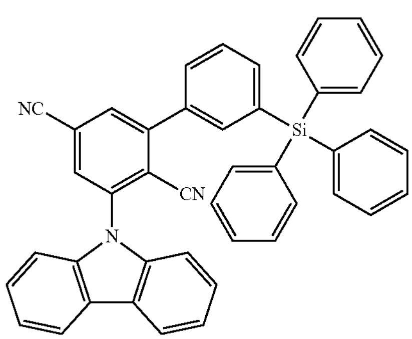
-continued
152
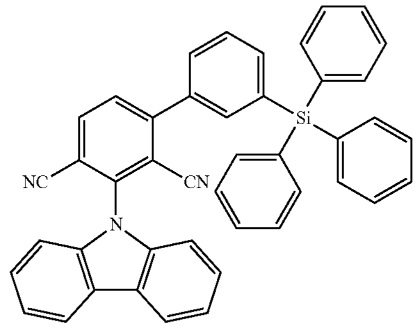
153
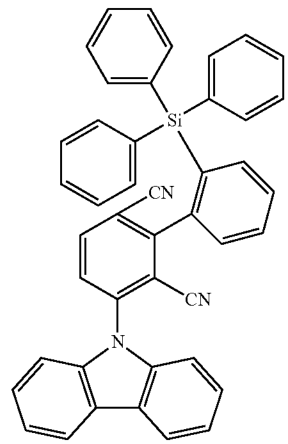
154
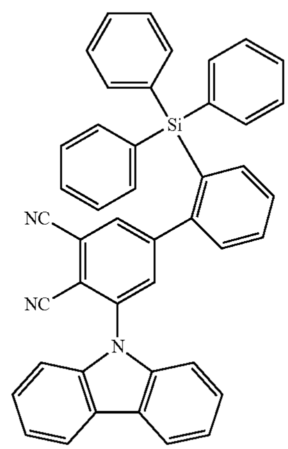
155
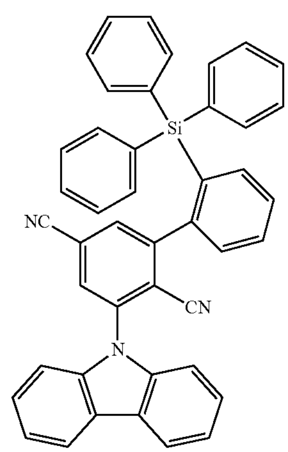

-continued
156
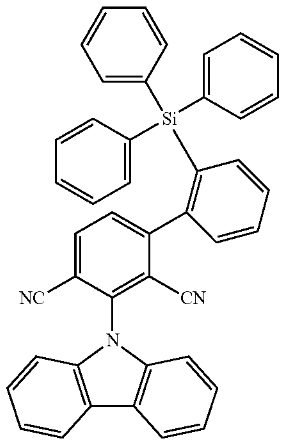
157
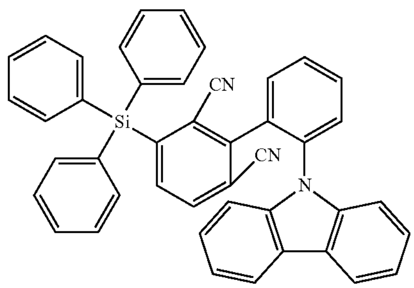
158
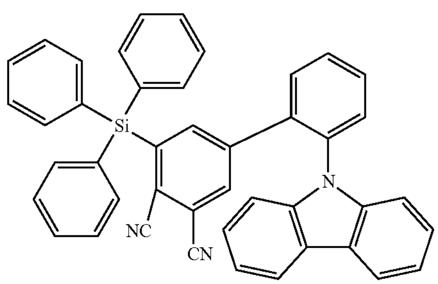
159
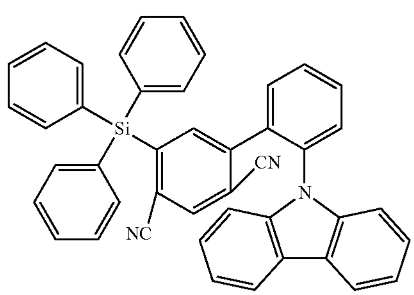
160
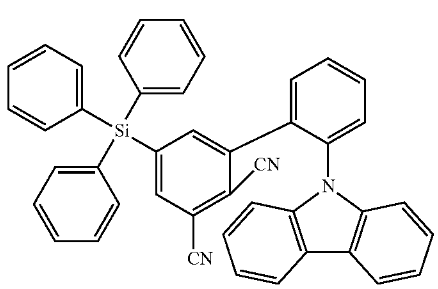
-continued
161
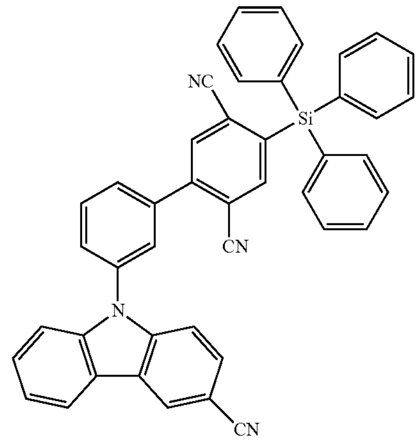
162
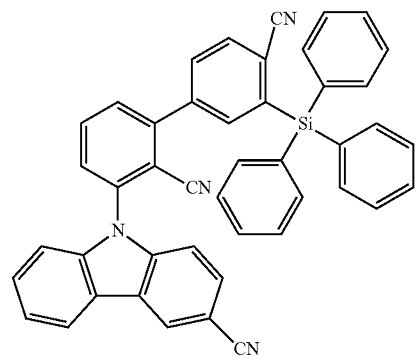
163
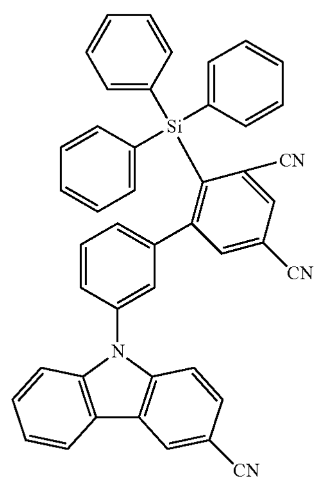
164
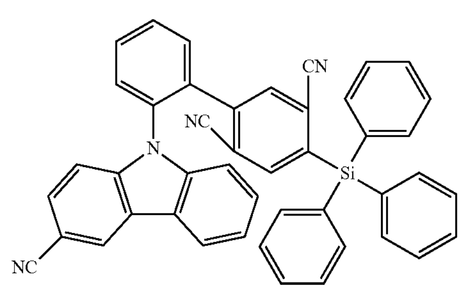

-continued
165
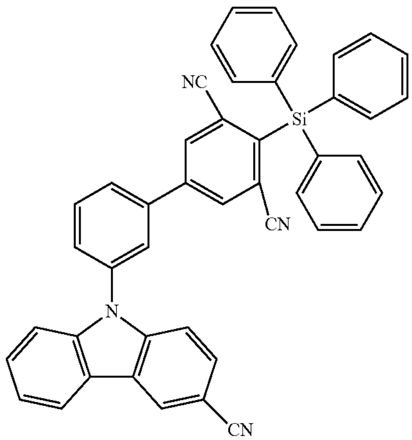
166
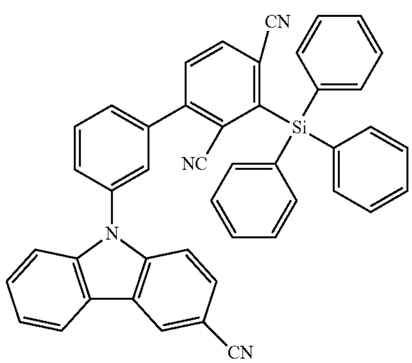
167
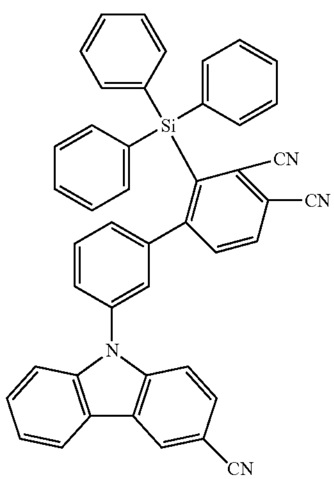
168
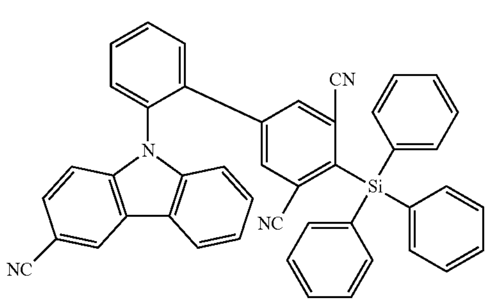
-continued
169
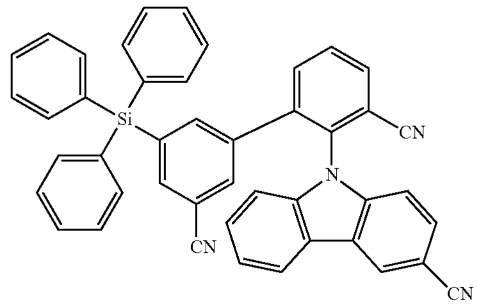
170
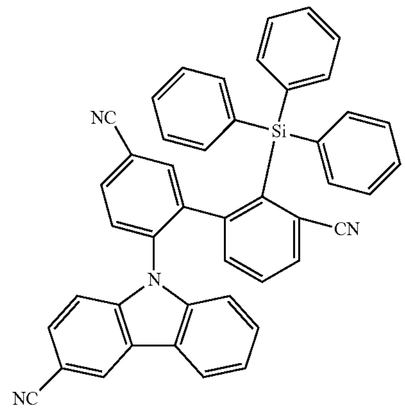
171
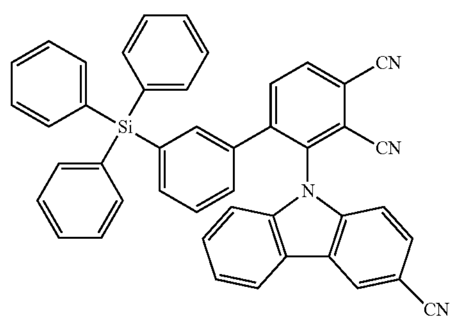
172
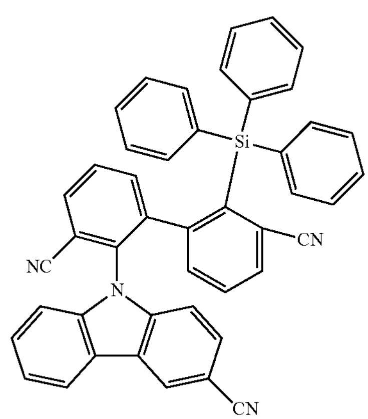

-continued
173
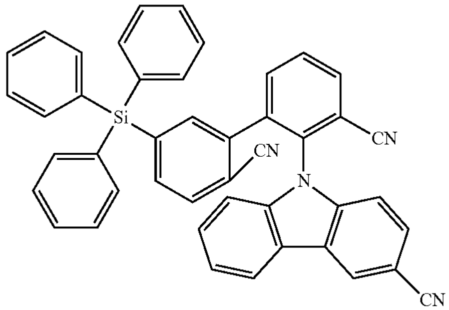
174
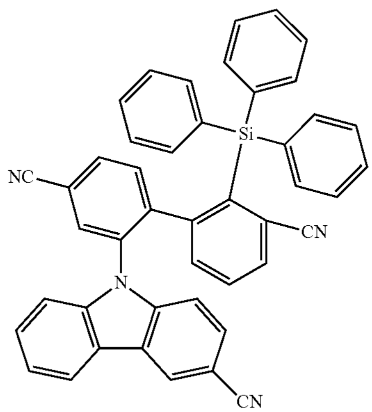
175
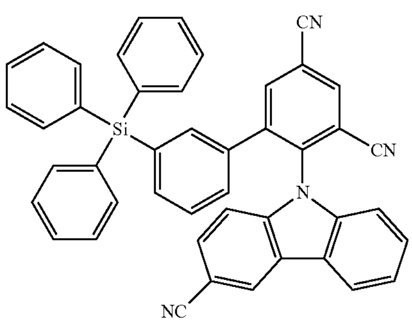
176
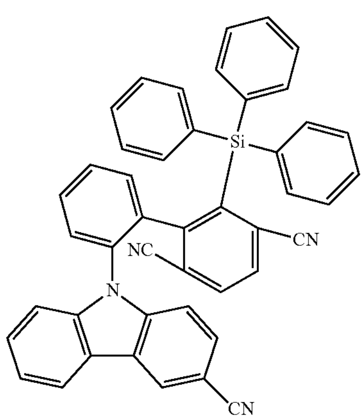
-continued
177
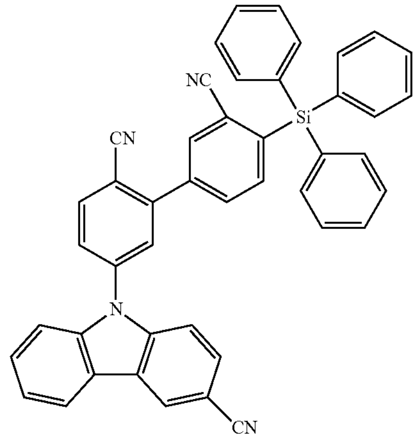
178
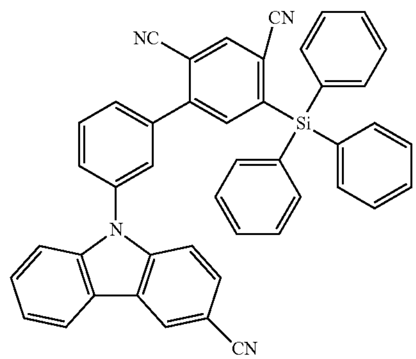
179
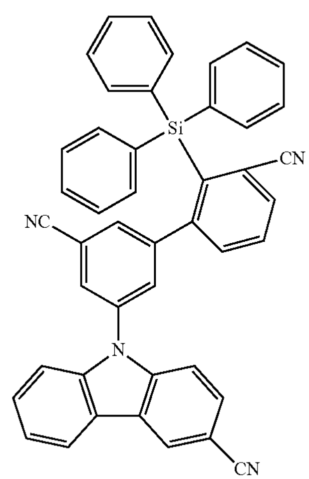
180
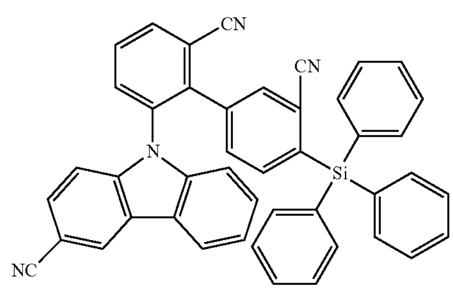

181
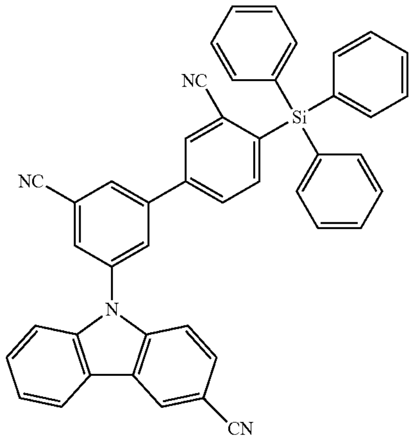
182
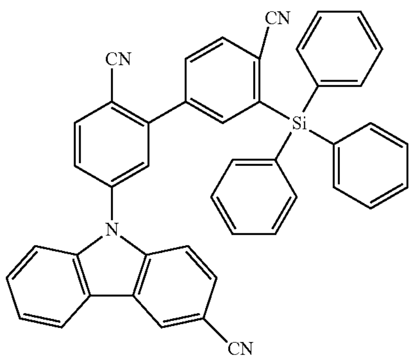
183
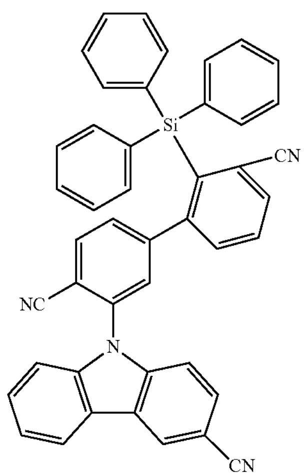
184
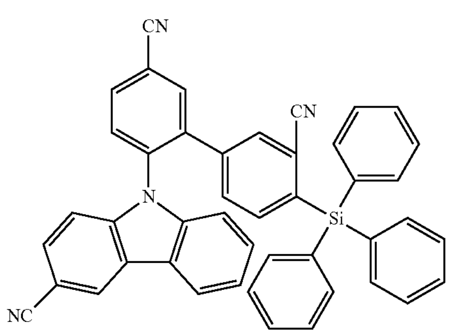
185
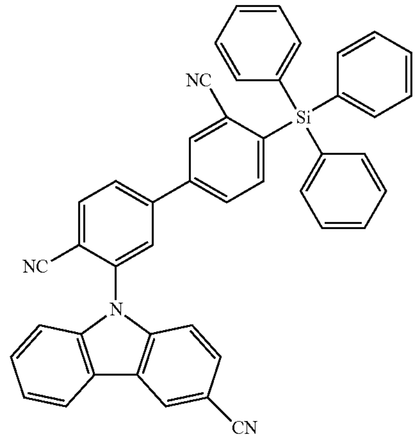
186
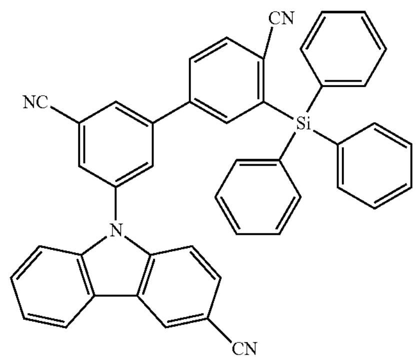
187
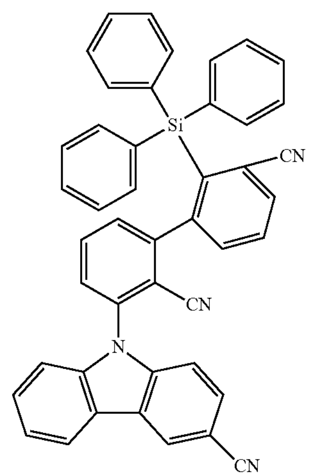
188
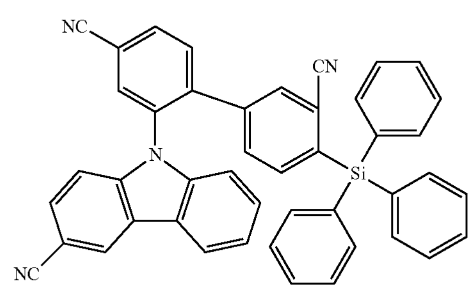

189
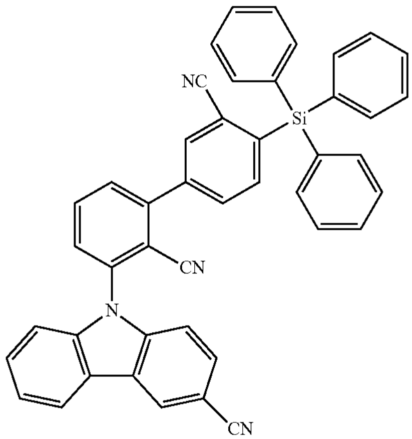
190
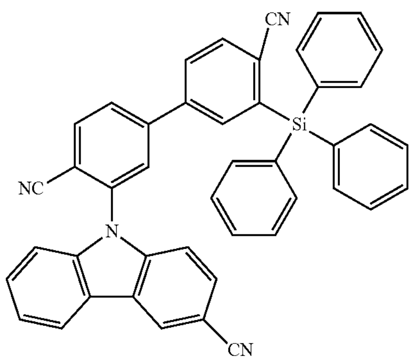
191
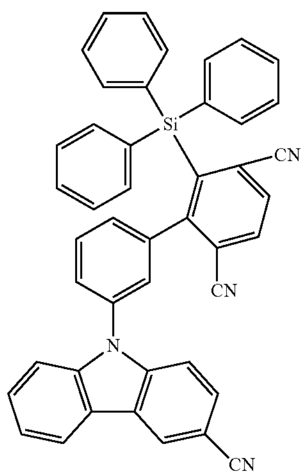
192
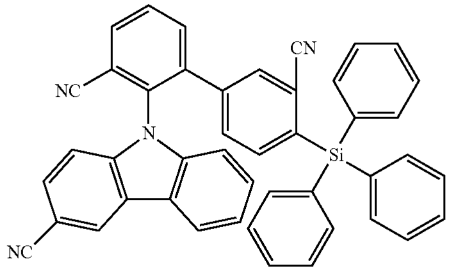
193
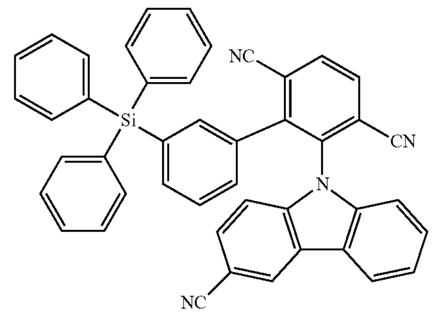
194
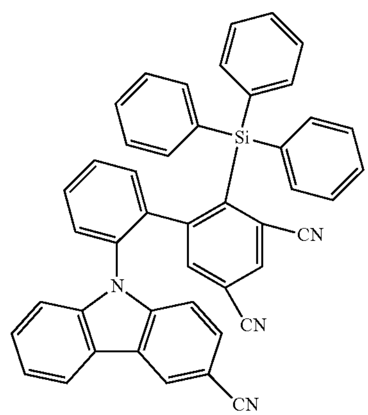
195
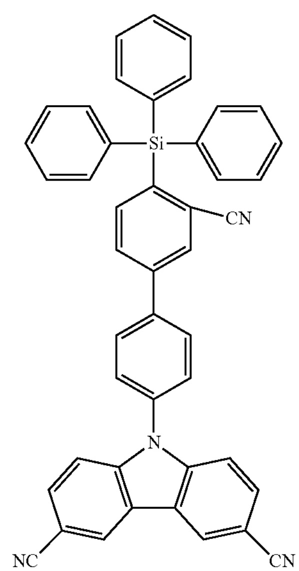

-continued
196
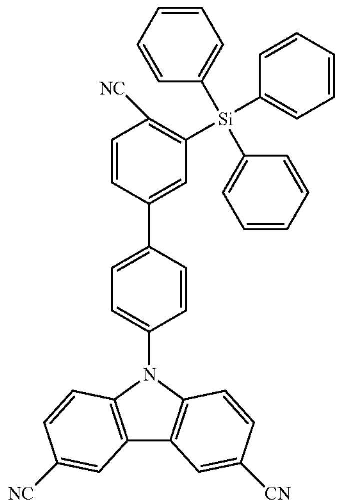
197
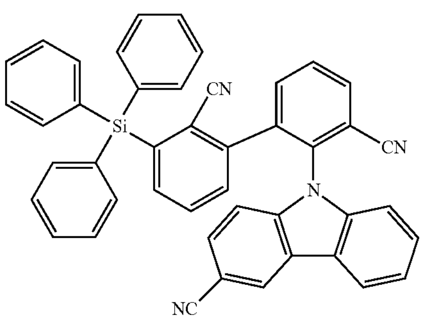
198
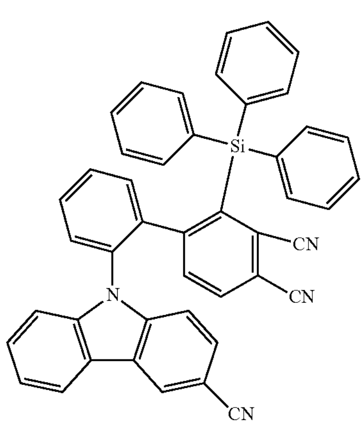
-continued
199
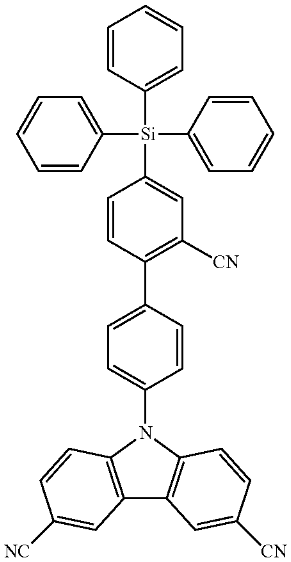
200
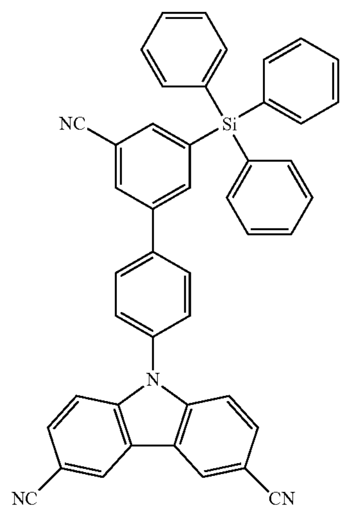
201
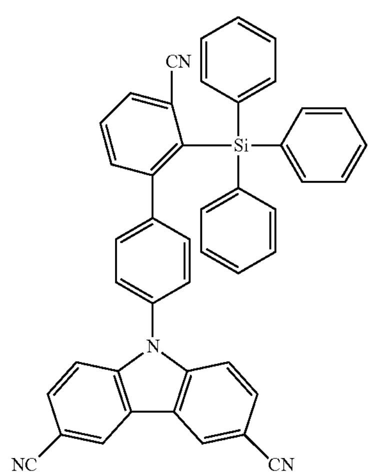

-continued
202
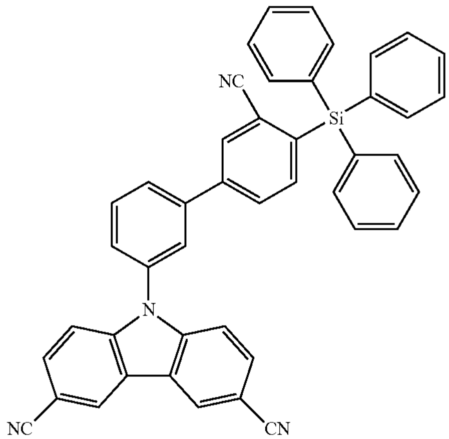
203
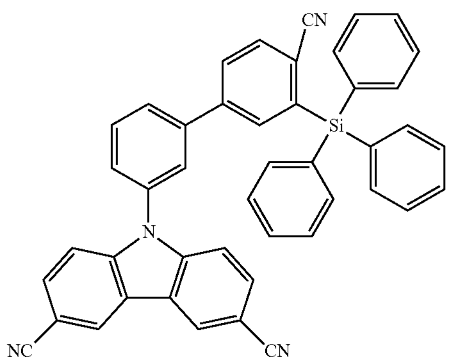
204
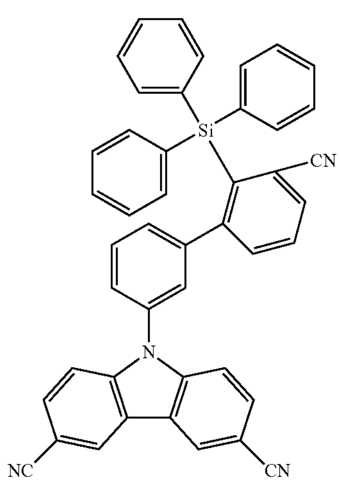
-continued
205
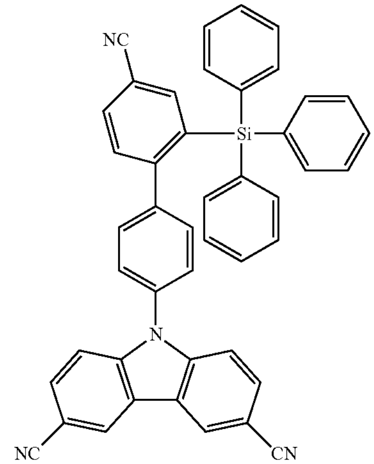
206
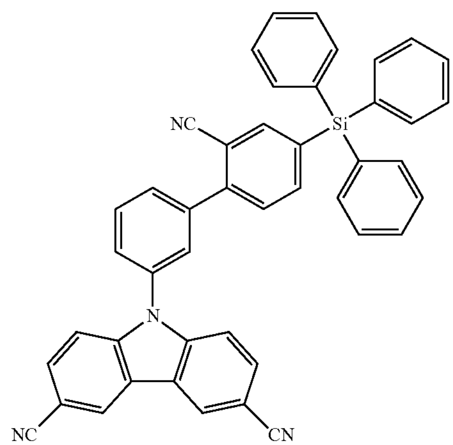
207
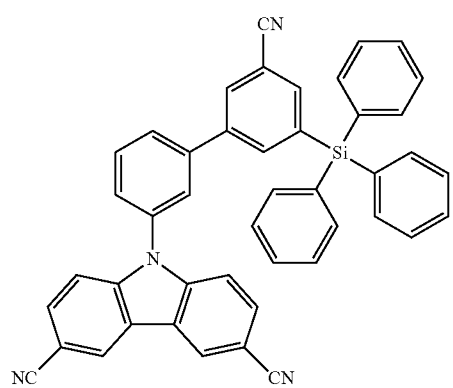

-continued
208
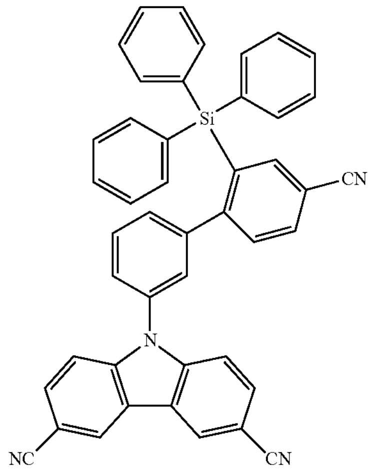
209
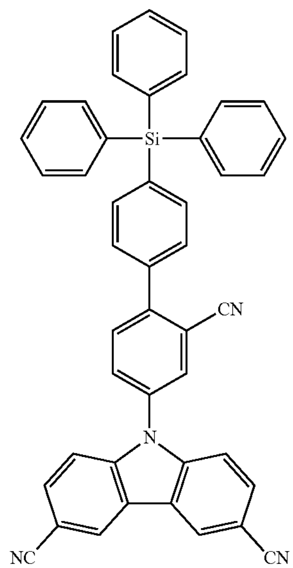
210
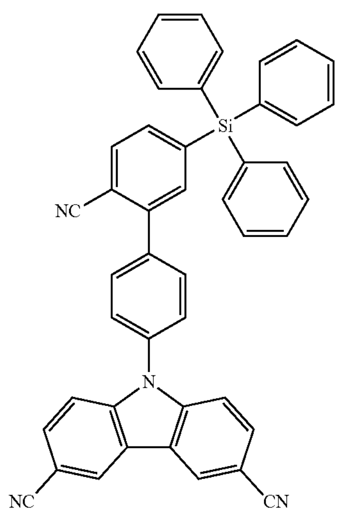
-continued
211
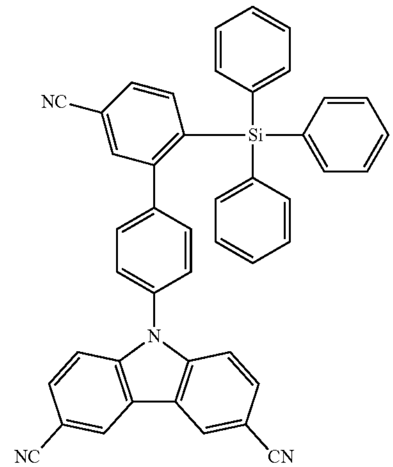
212
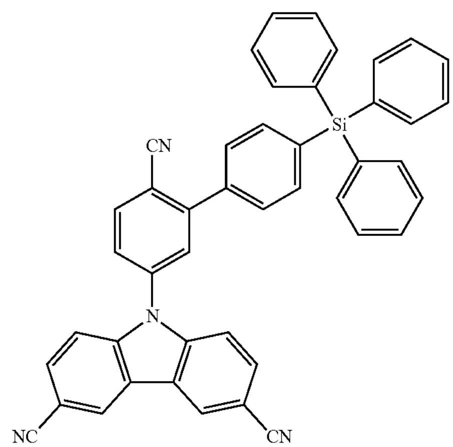
213
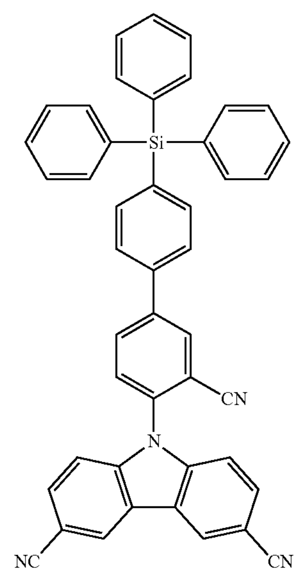

-continued
214
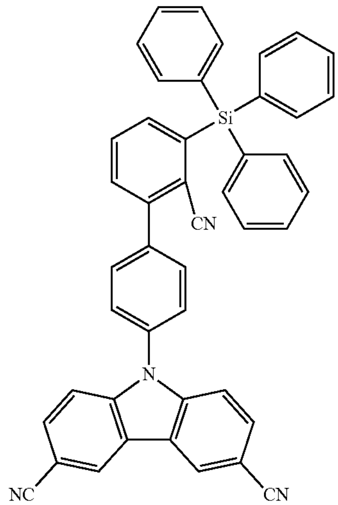
215
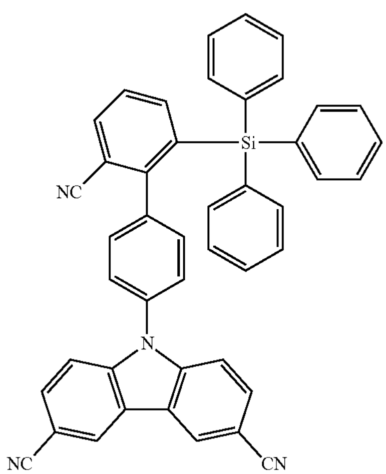
216
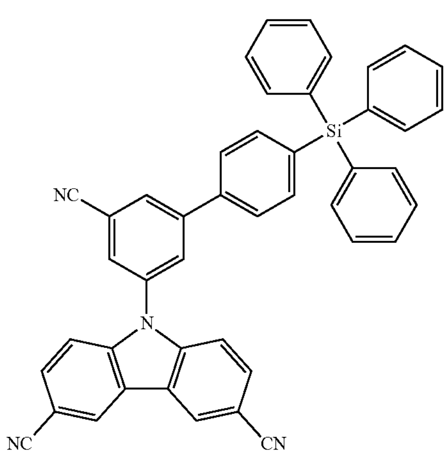
-continued
217
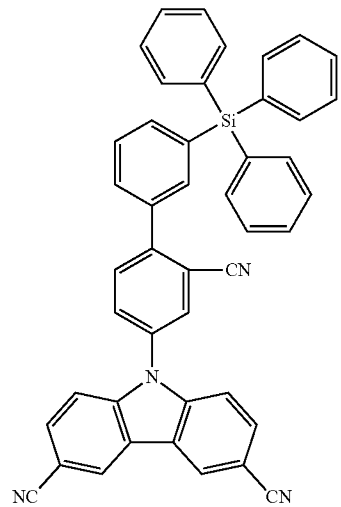
218
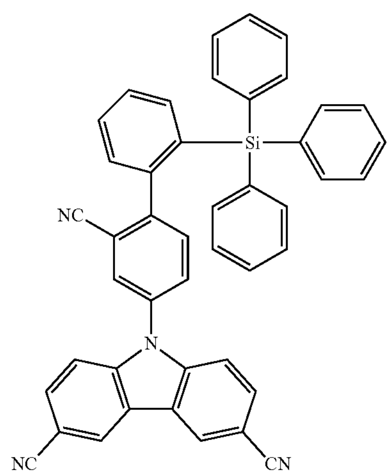
219
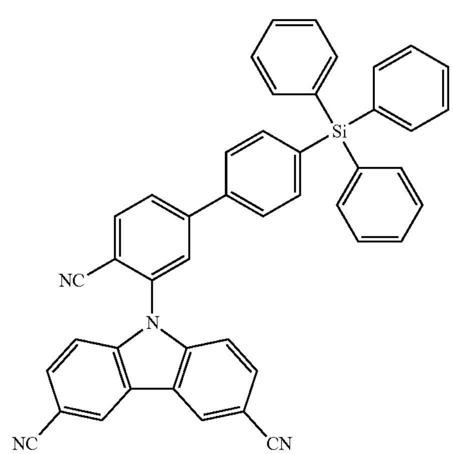

-continued
220
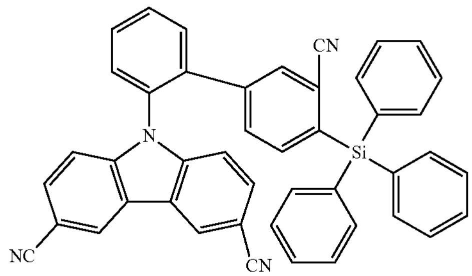
221
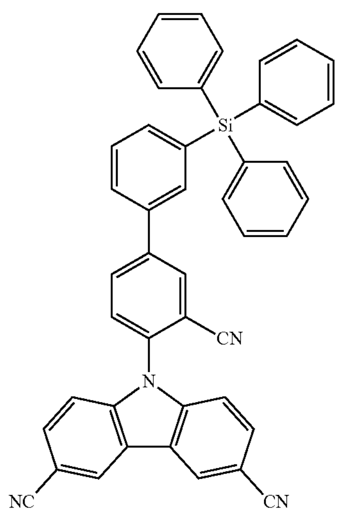
222
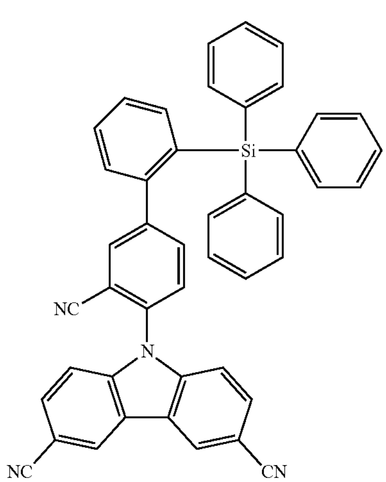
-continued
223
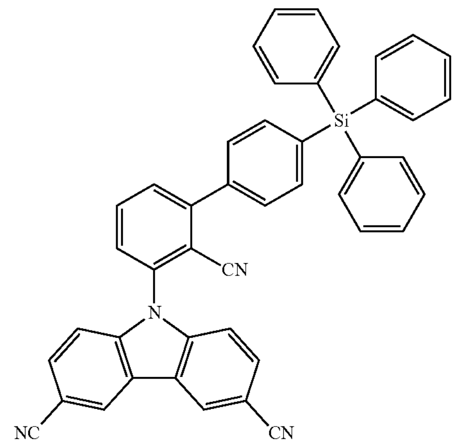
224
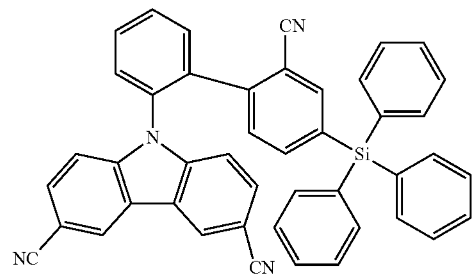
225
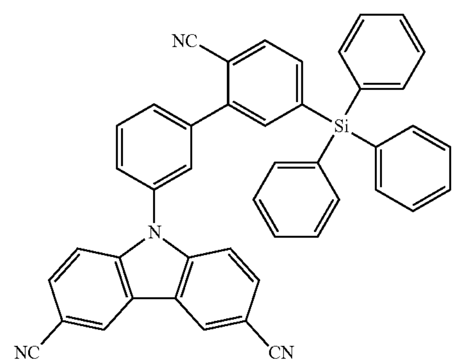
226
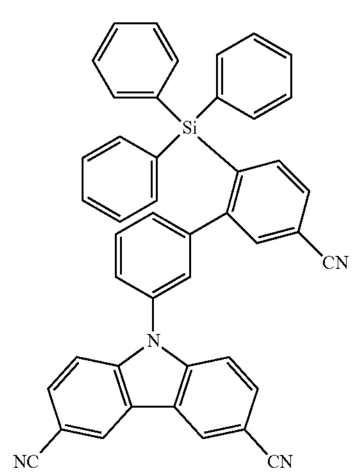

-continued
227
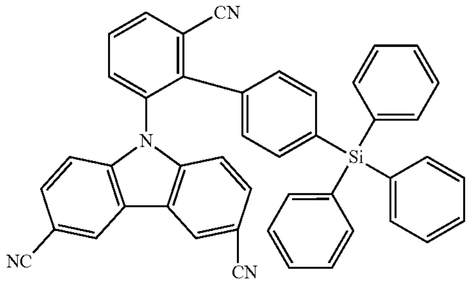
228
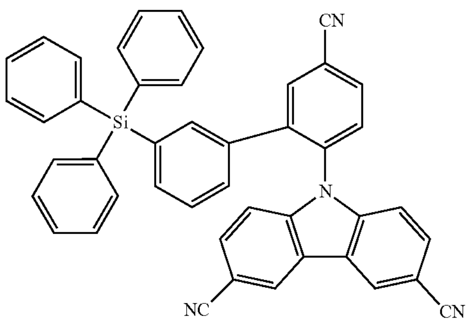
229
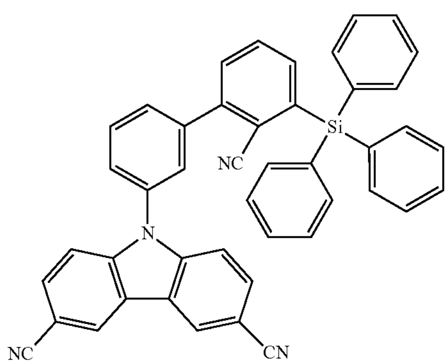
230
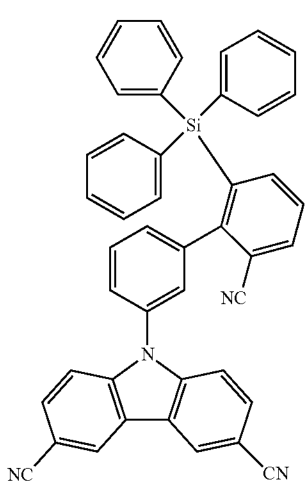
-continued
231
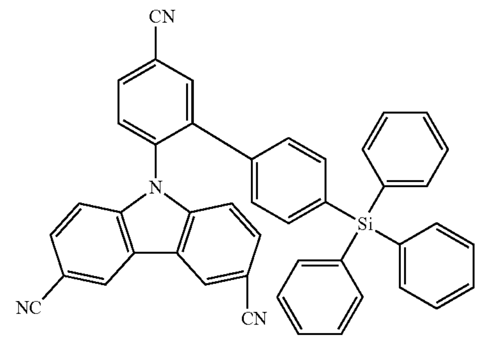
232
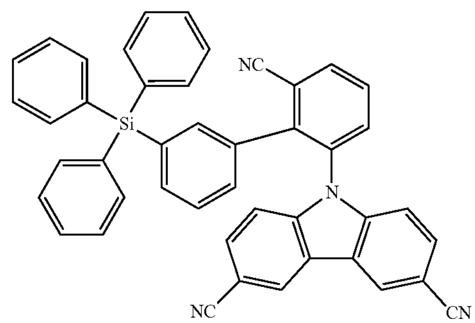
233
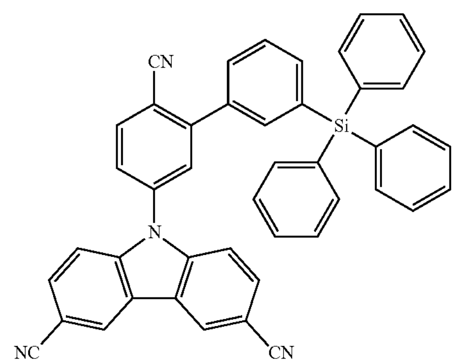
234
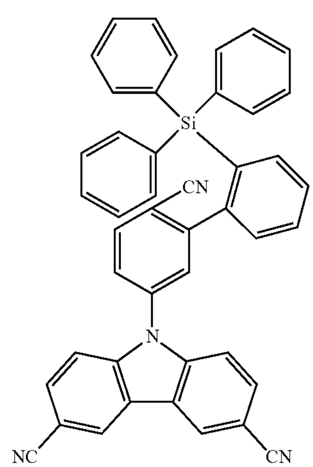

-continued
235
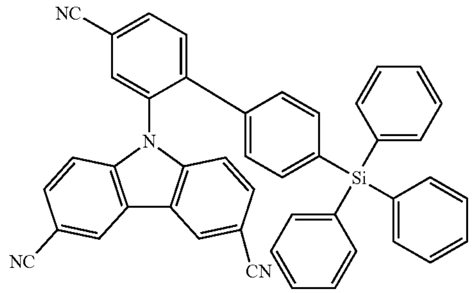
236
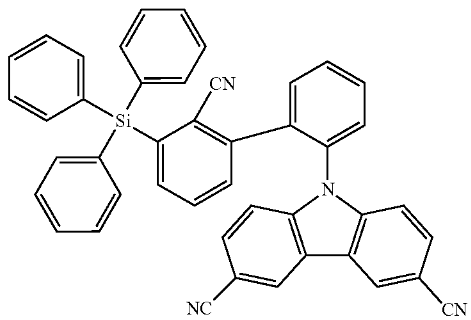
237
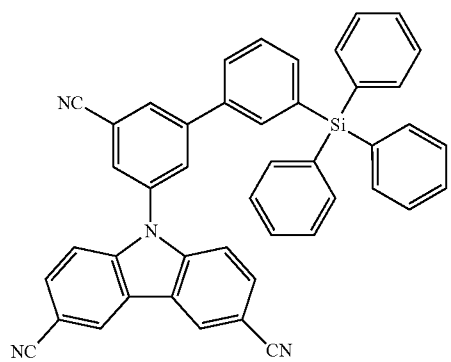
238
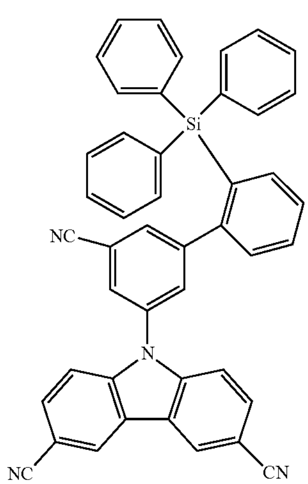
-continued
239
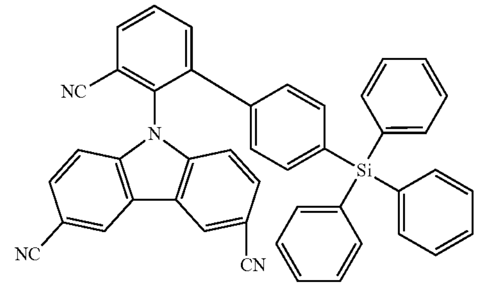
240
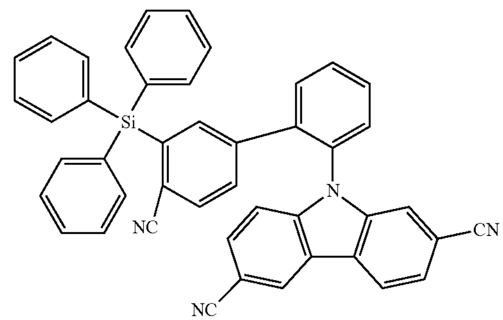
241
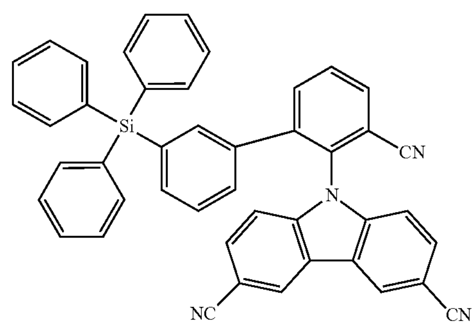
242
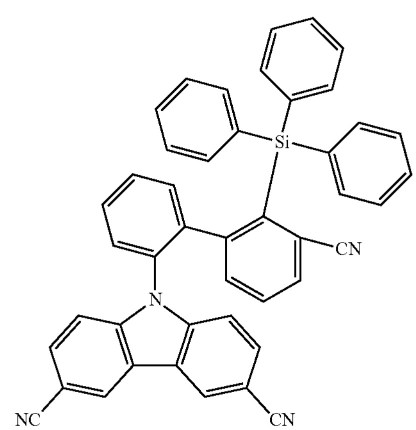

-continued
243
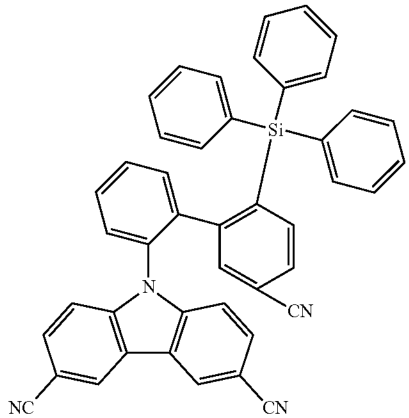
244
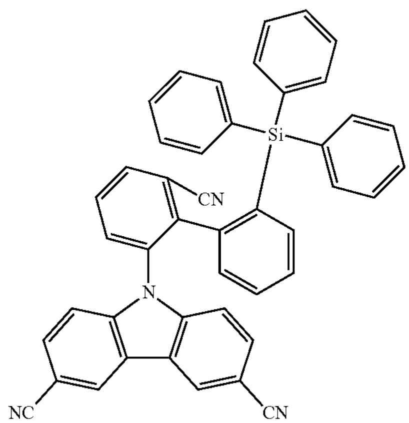
245
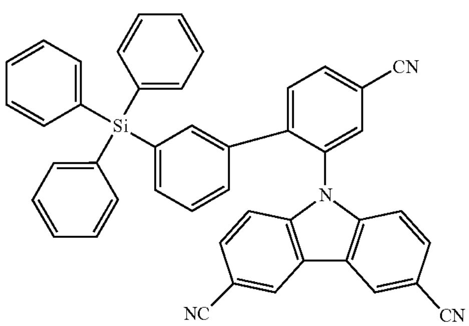
246
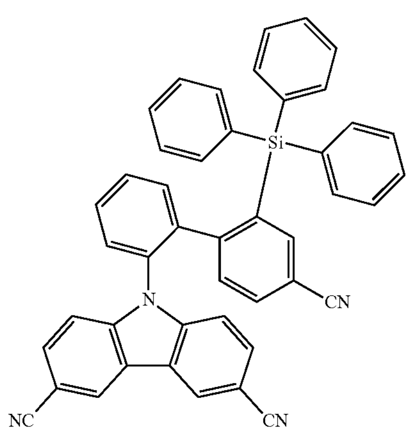
-continued
247
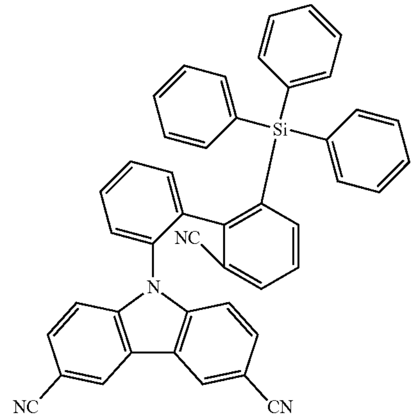
248
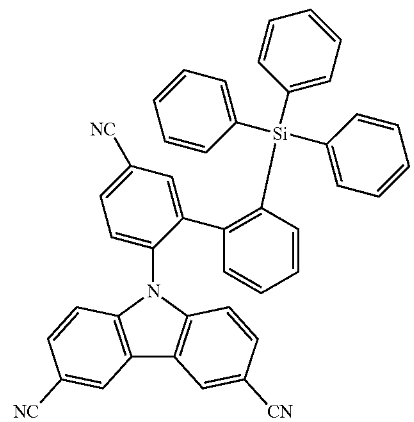
249
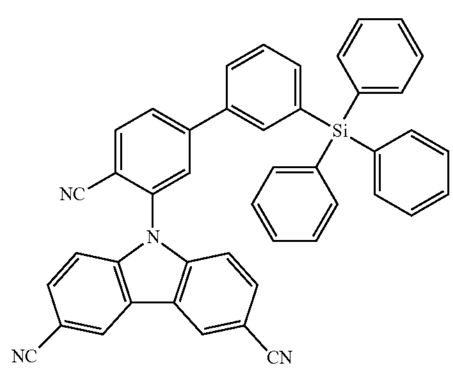

-continued
250
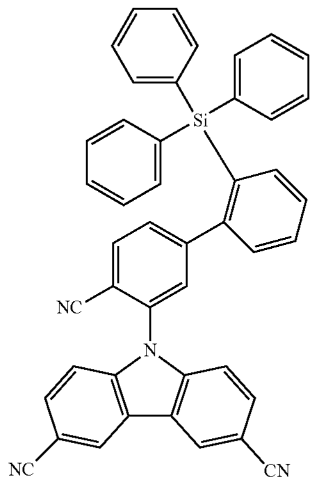
251
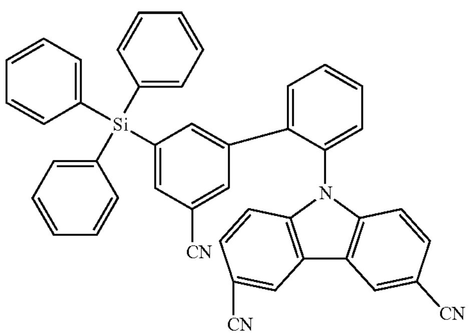
252
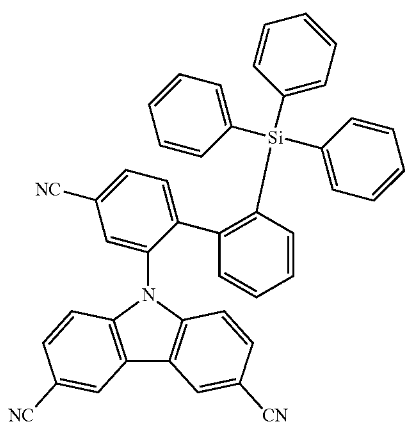
253
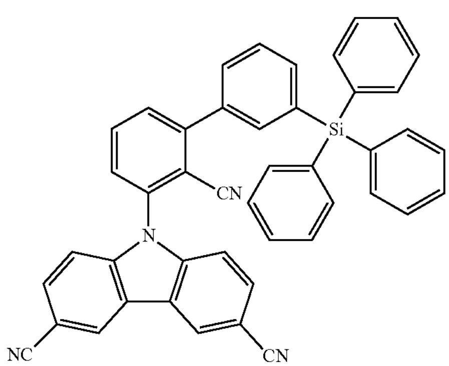
-continued
254
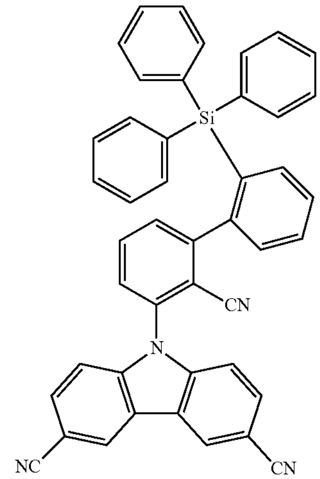
255
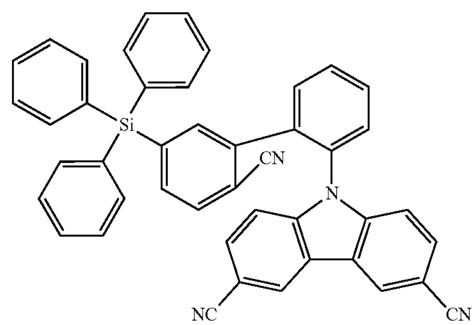
256
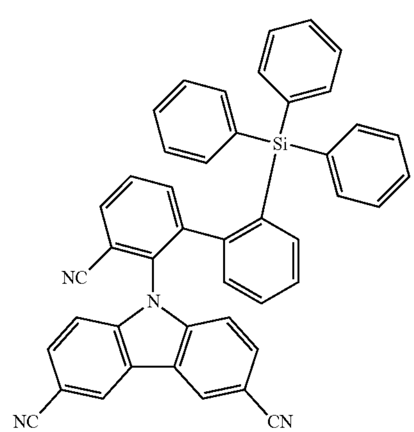

-continued
257
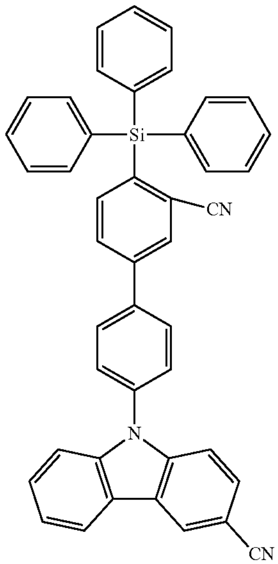
258
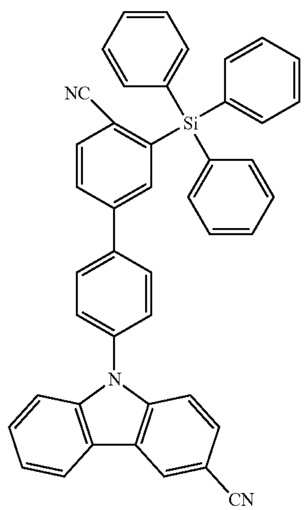
259
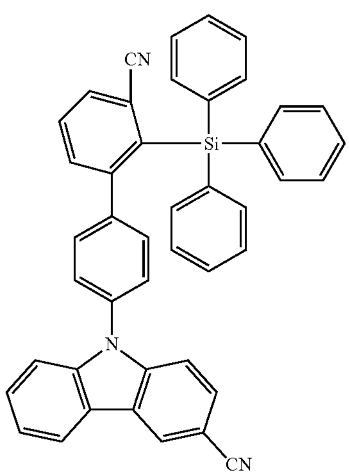
-continued
260
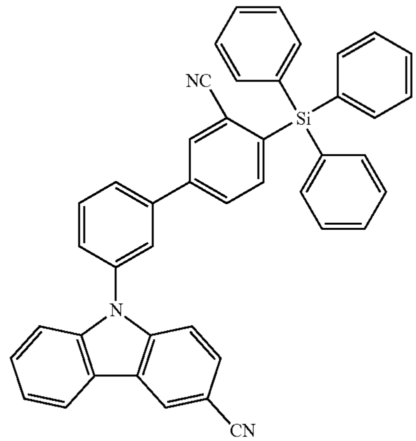
261
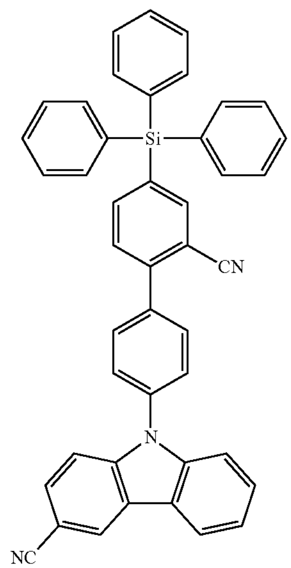
262
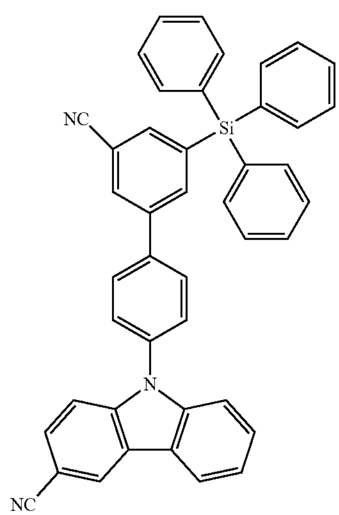

-continued
263
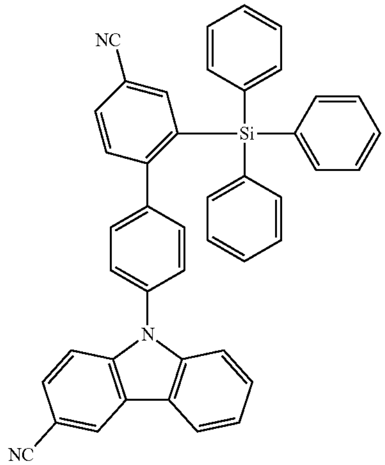
264
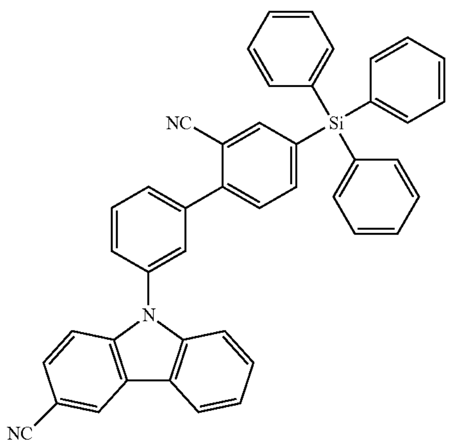
265
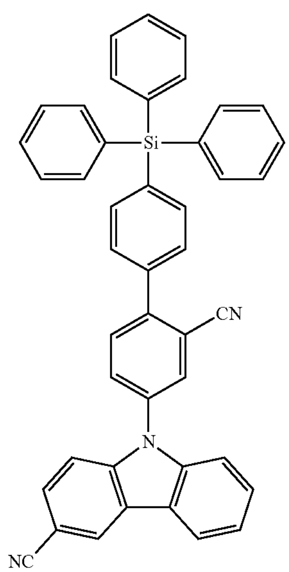
-continued
266
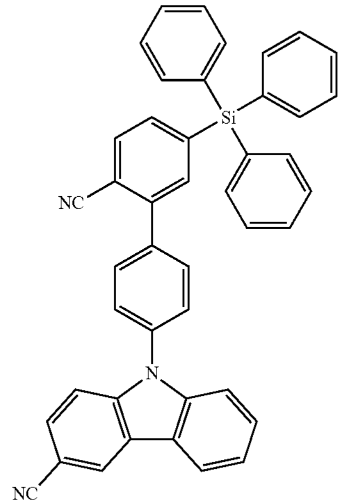
267
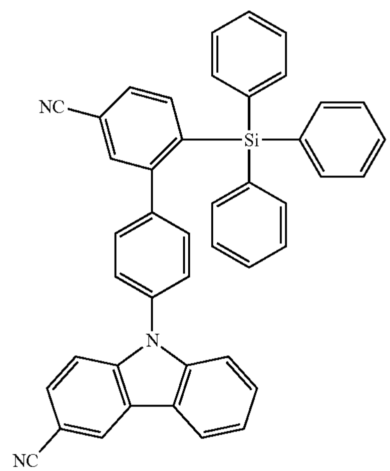
268
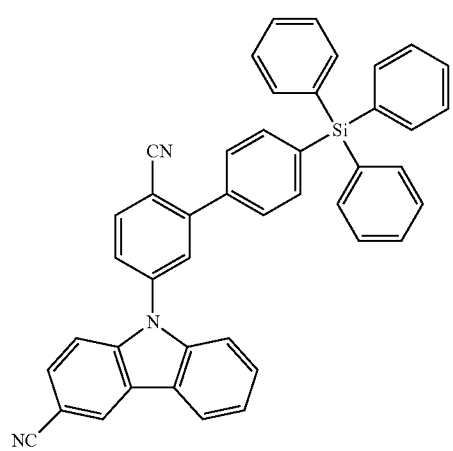

-continued
269
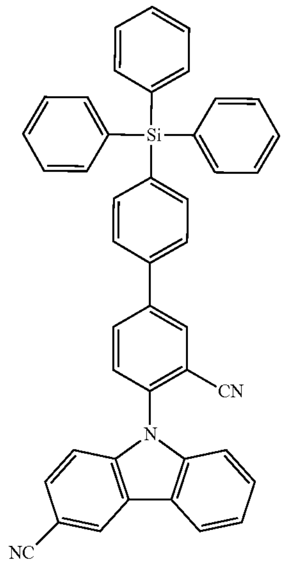
270
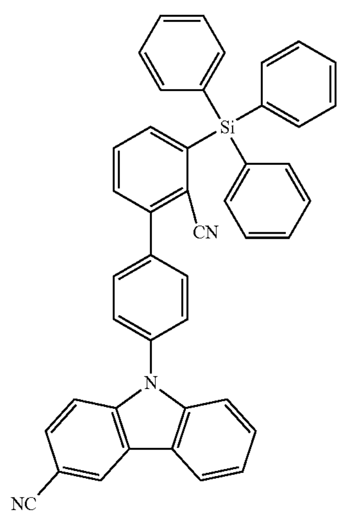
271
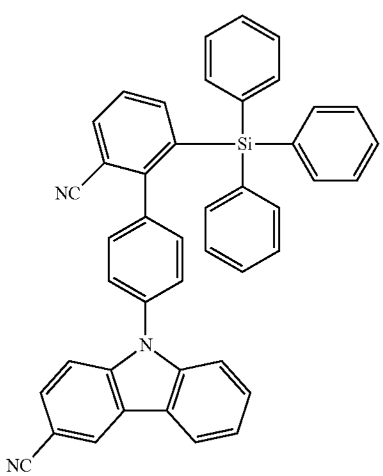
-continued
272
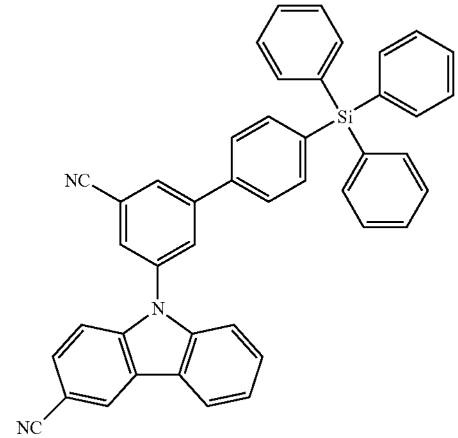
273
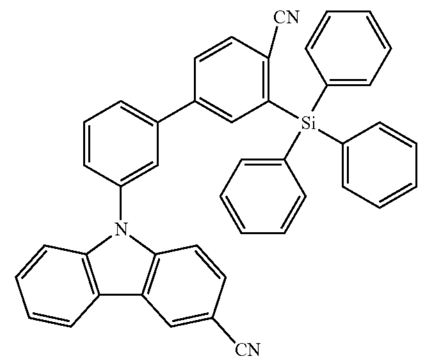
274
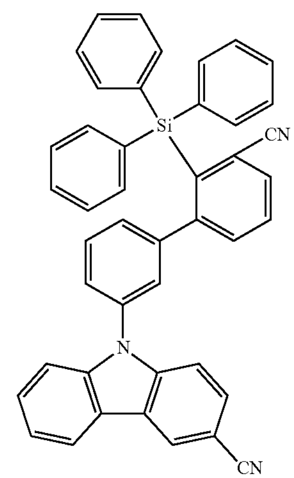
275
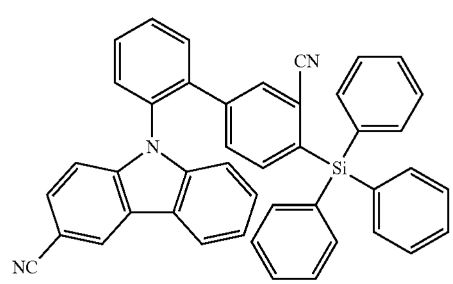

-continued
276
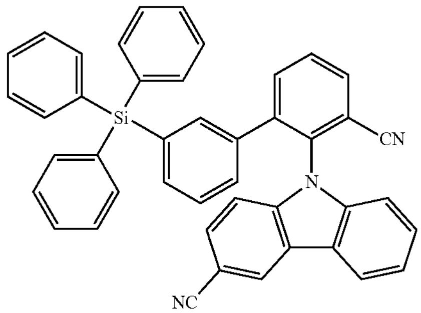
277
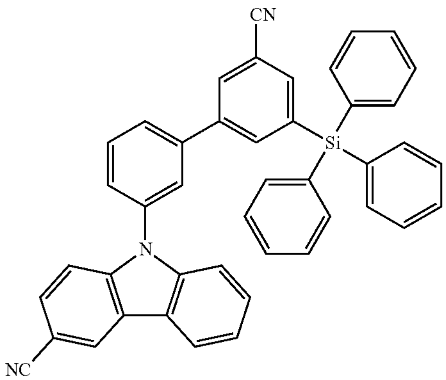
278
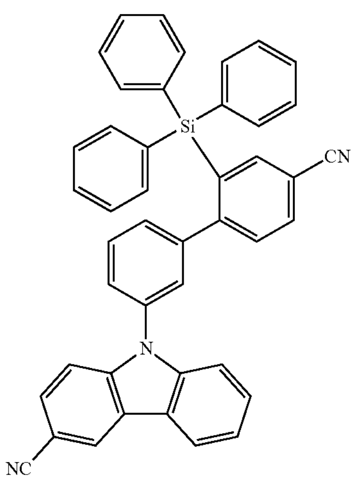
279
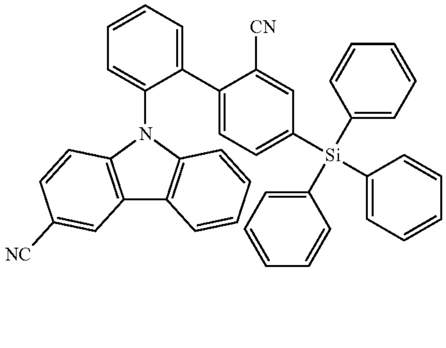
-continued
280
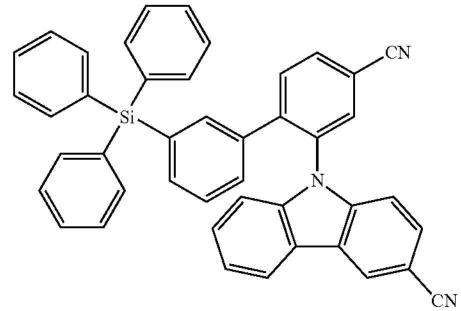
281
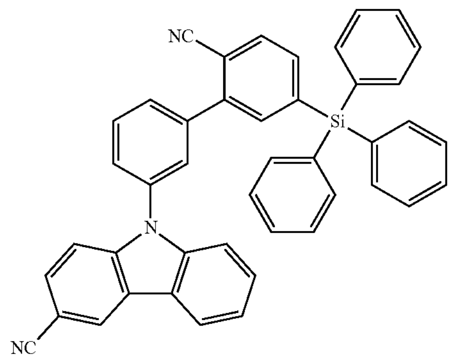
282
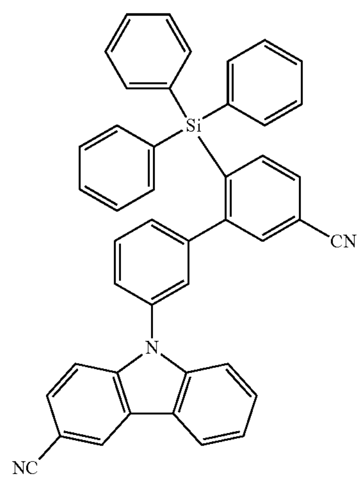
283
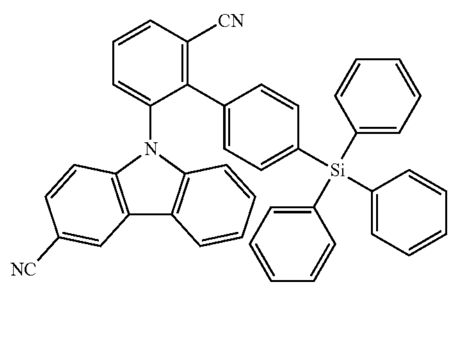

-continued
284
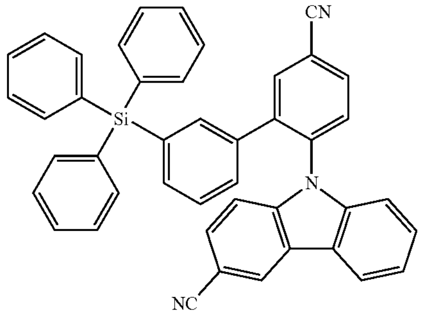
285
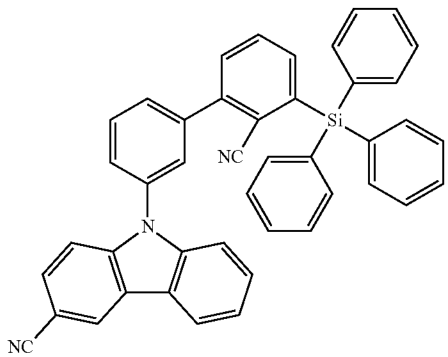
286
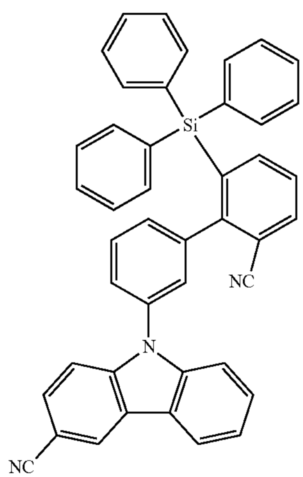
287
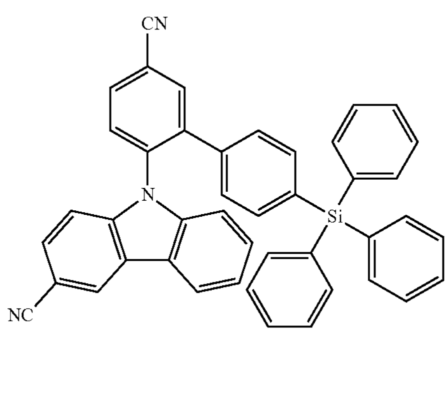
-continued
288
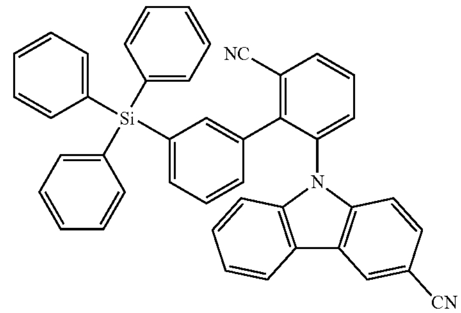
289
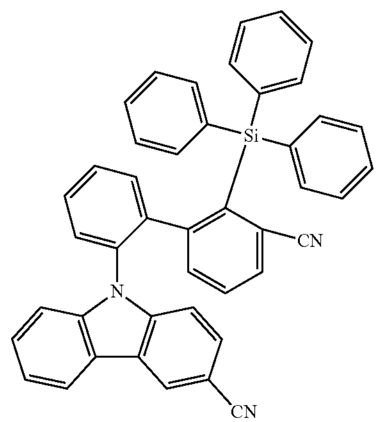
290
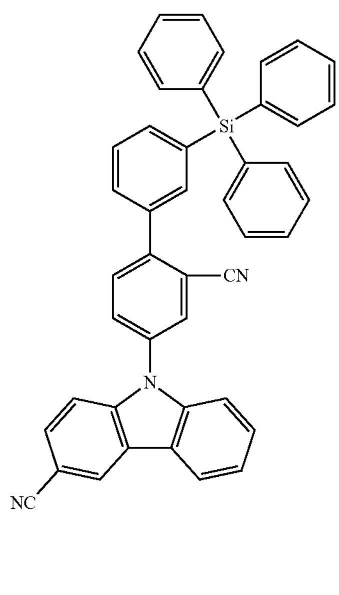

291
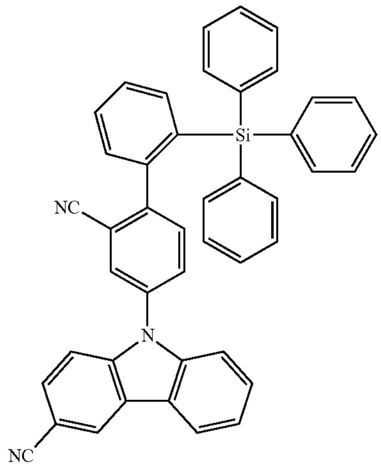
292
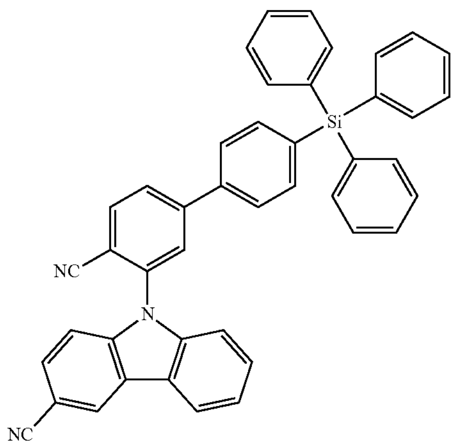
293
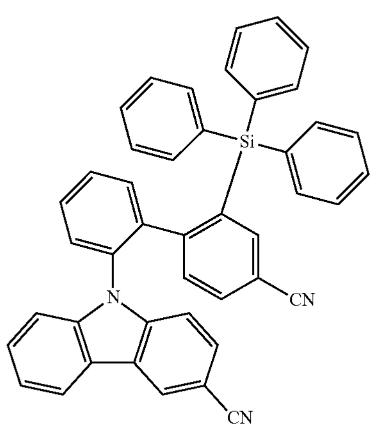
294
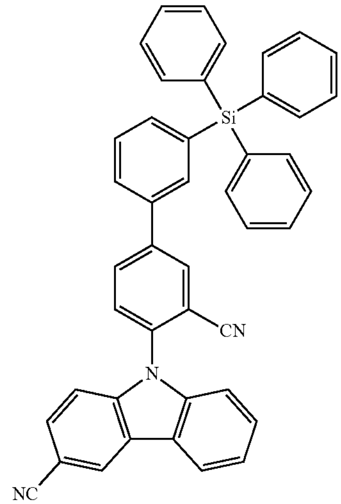
295
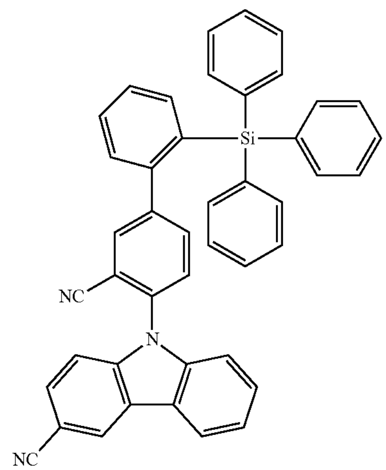
296
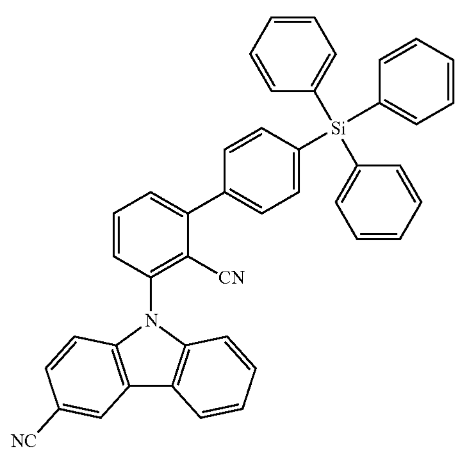

-continued
297
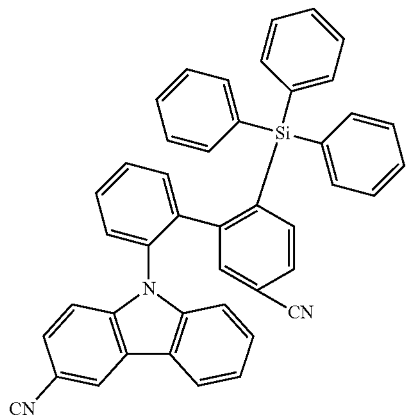
298
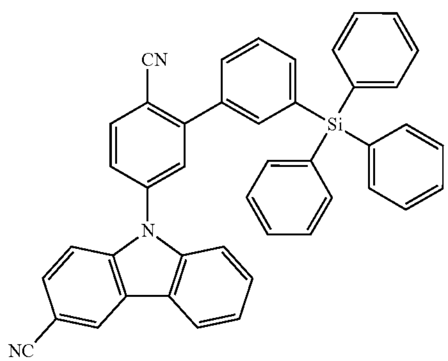
299
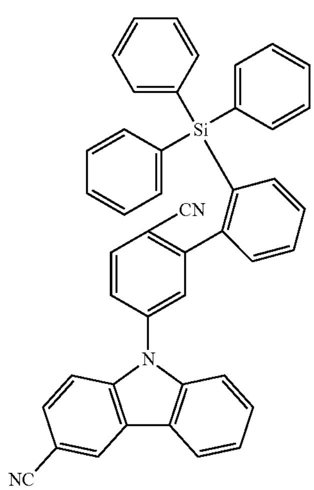
300
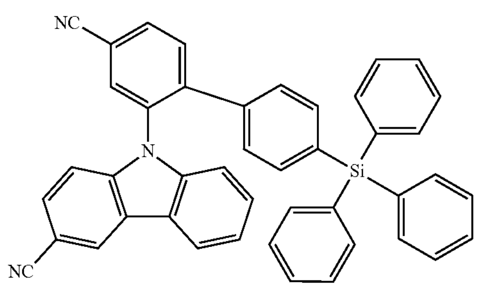
-continued
301
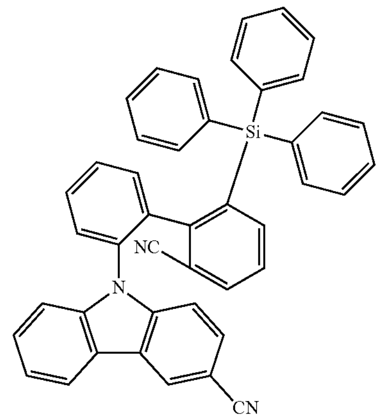
302
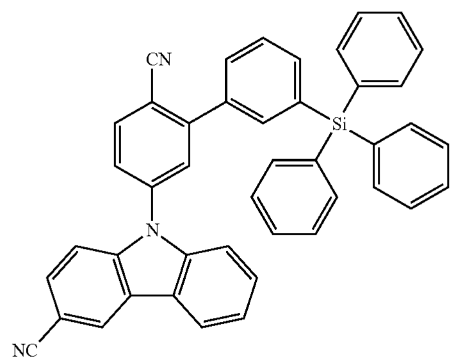
303
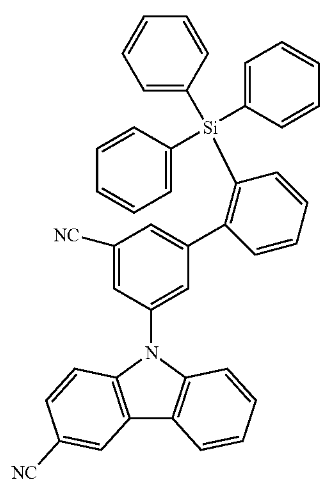
304
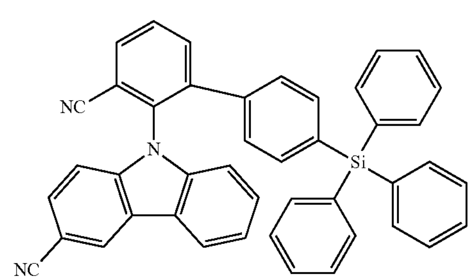

305
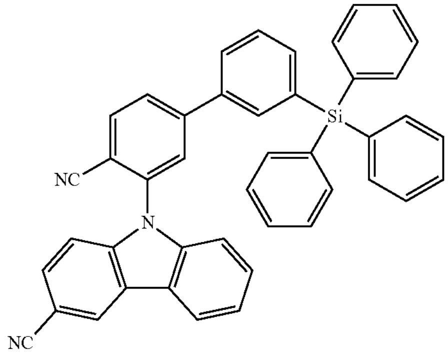
306
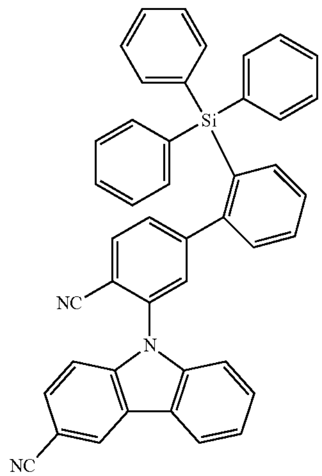
307
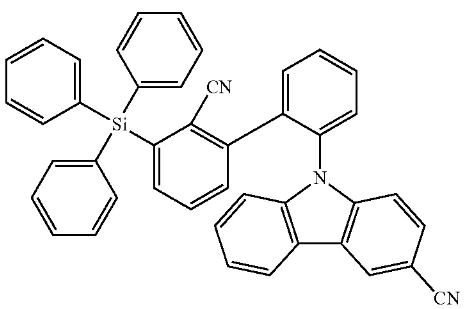
308
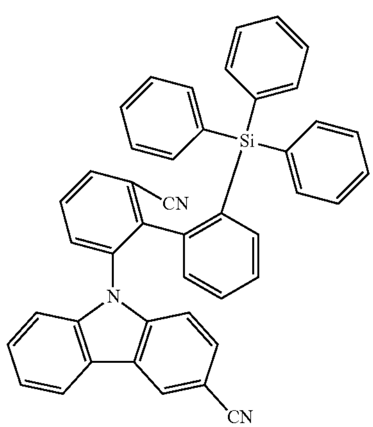
309
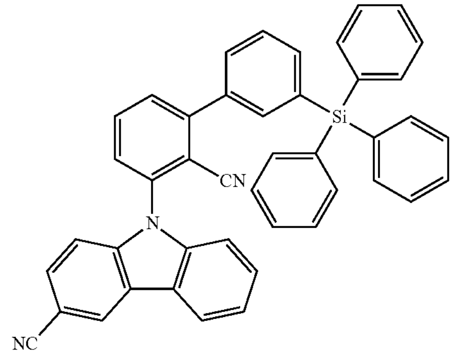
310
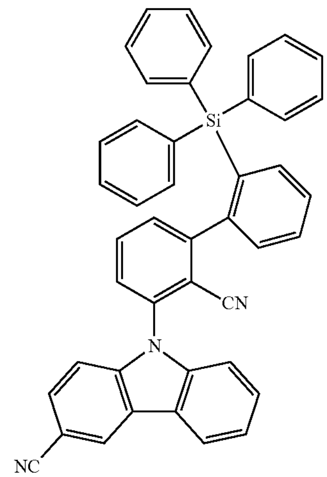
311
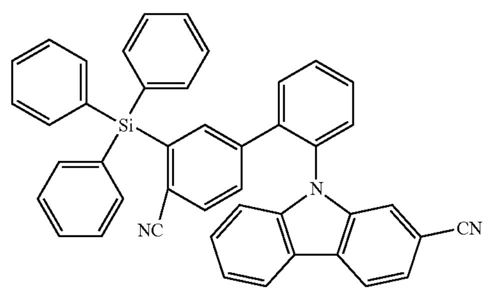
312
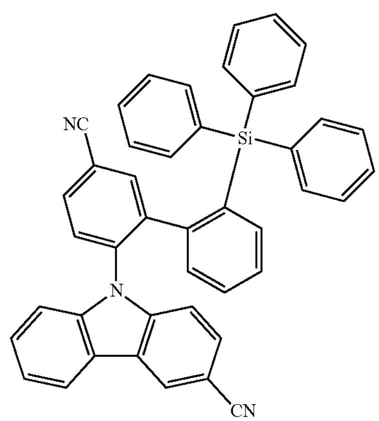

-continued
313
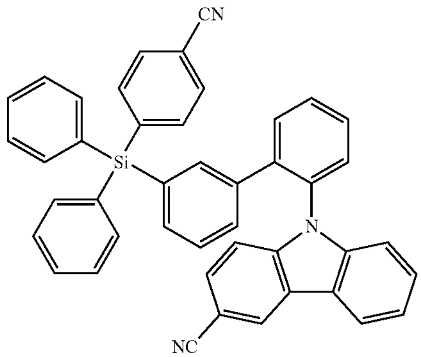
314
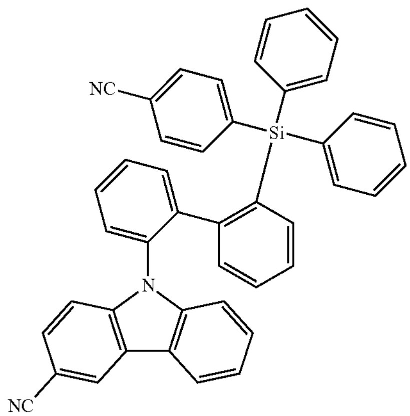
315
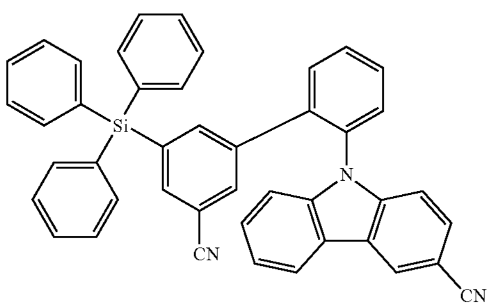
316
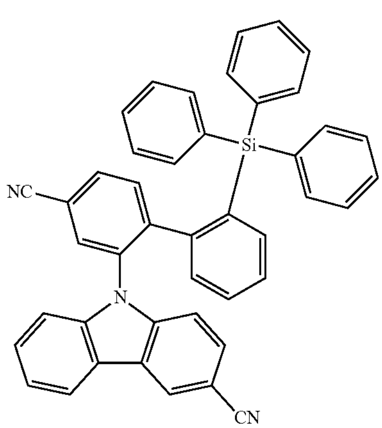
-continued
317
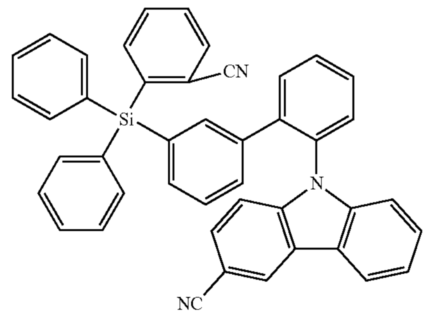
318
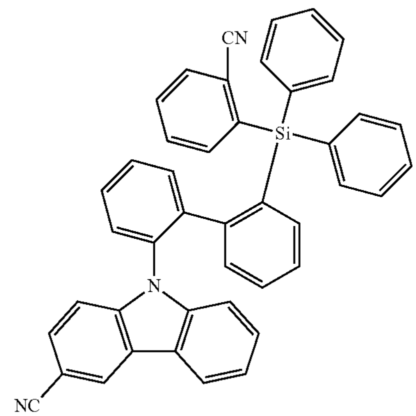
319
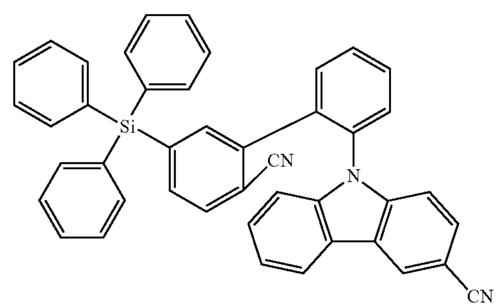
320
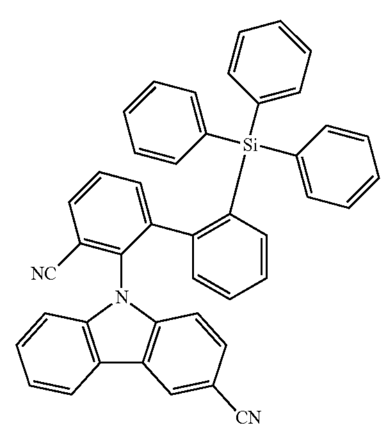

-continued
321
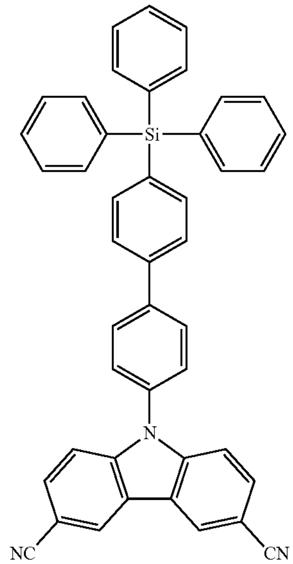
322
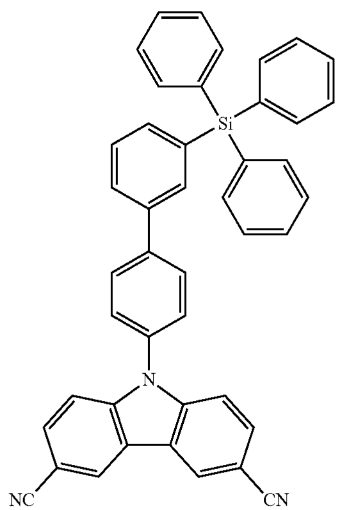
323
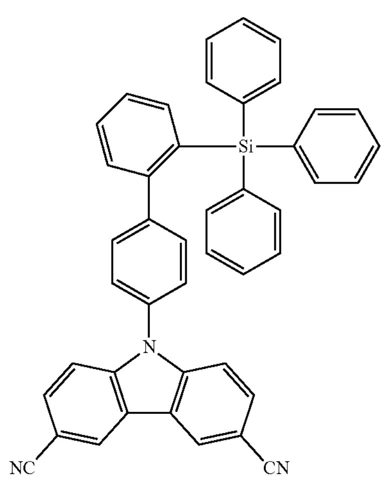
-continued
324
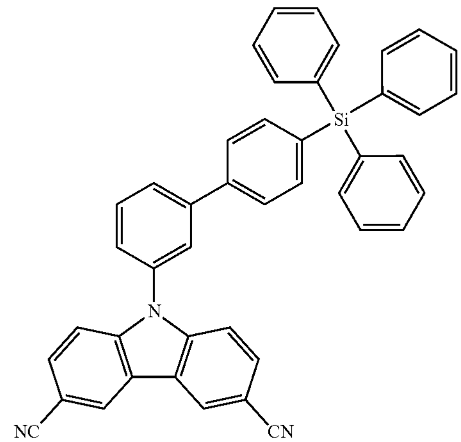
325
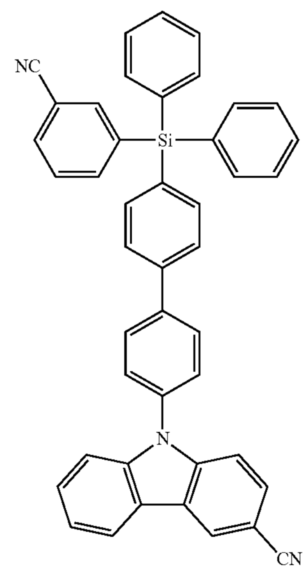
326
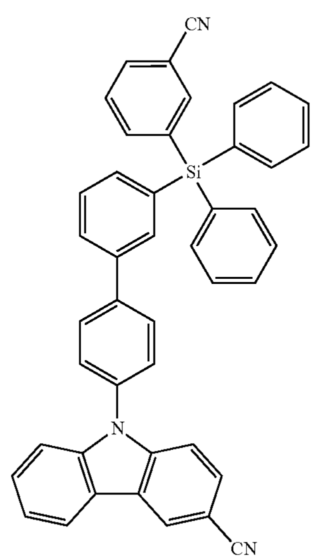

-continued
327
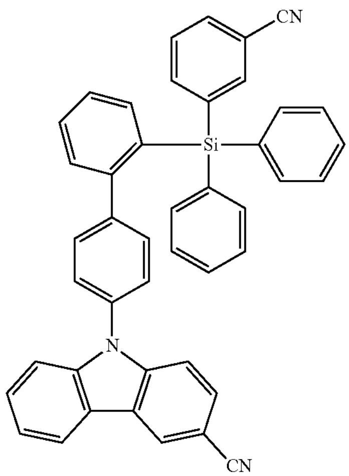
328
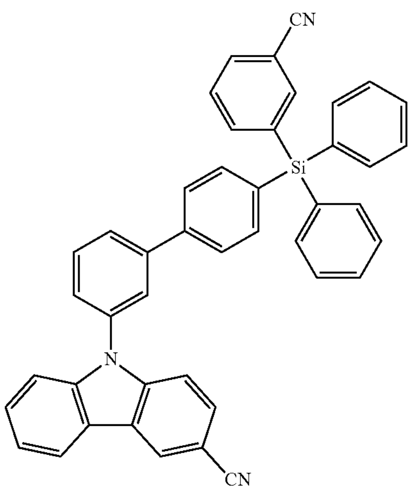
329
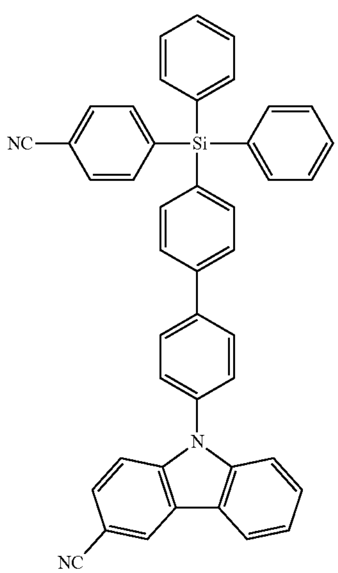
-continued
330
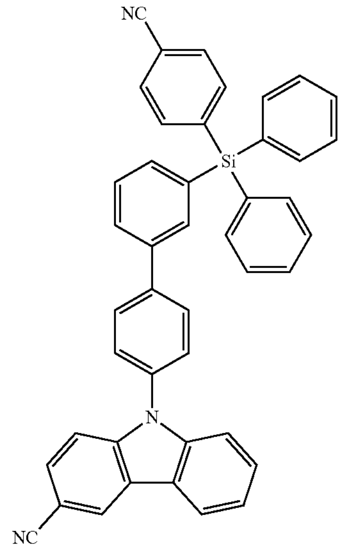
331
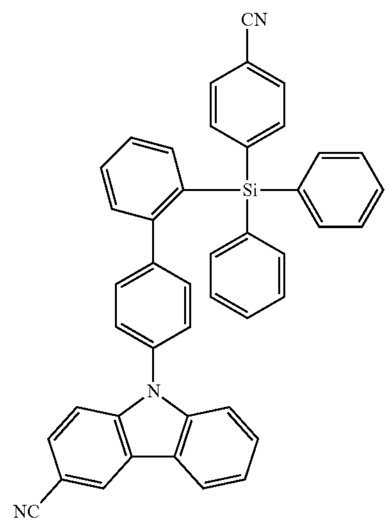
332
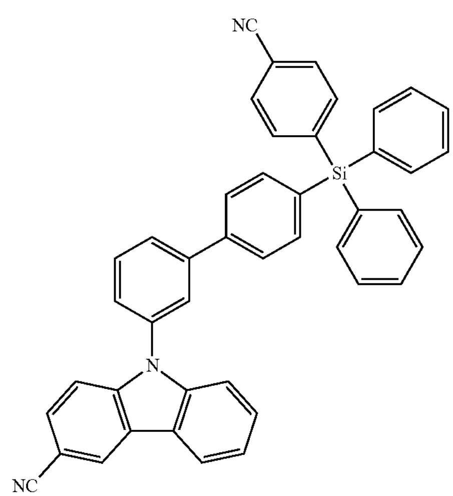

-continued
333
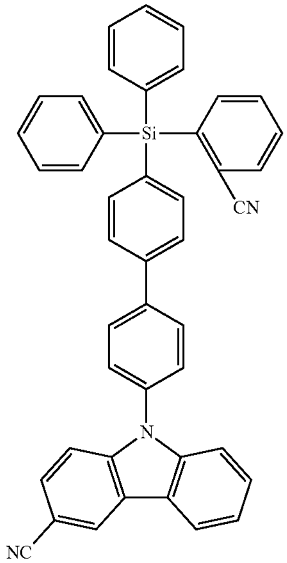
334
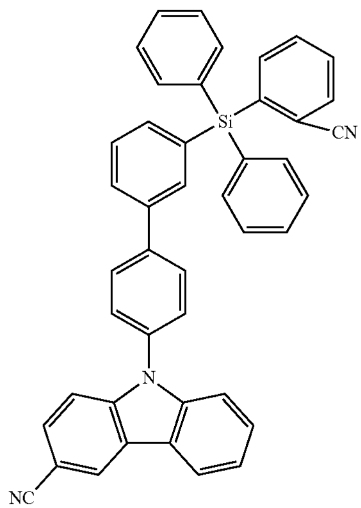
335
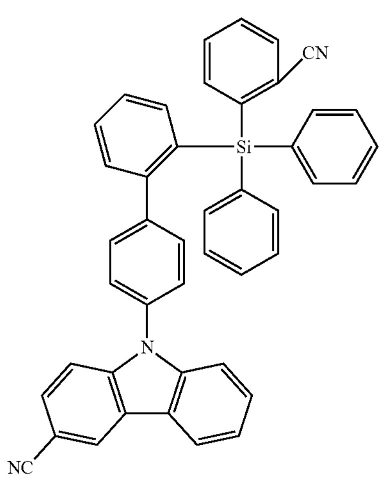
-continued
336
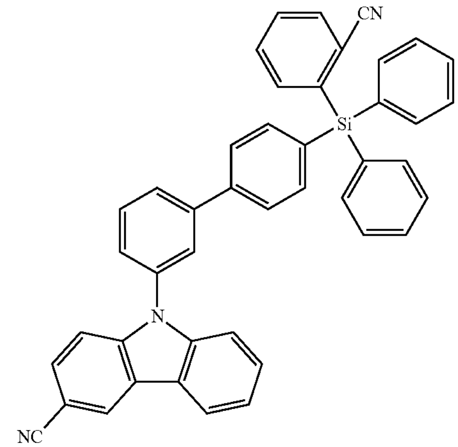
337
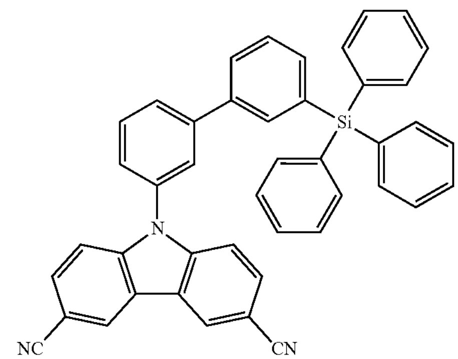
338
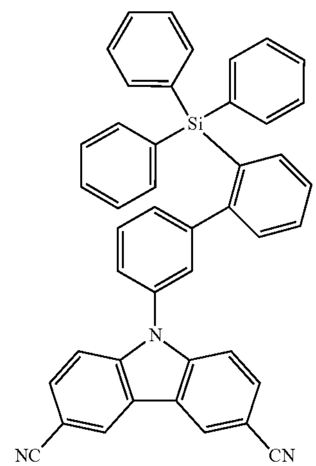
339
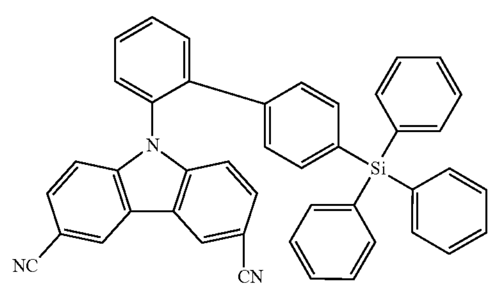

-continued
340
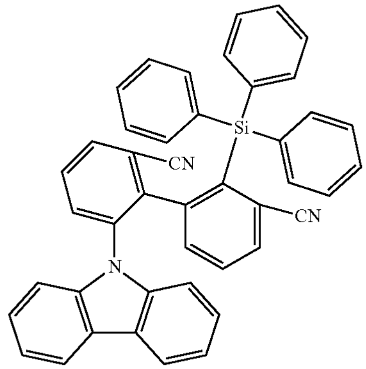
341
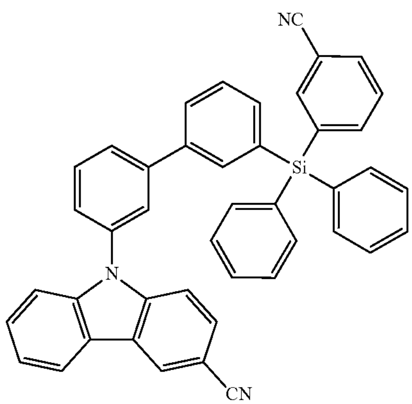
342
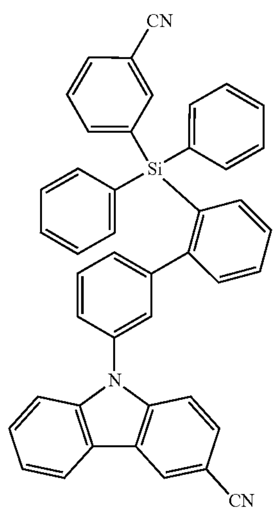
343
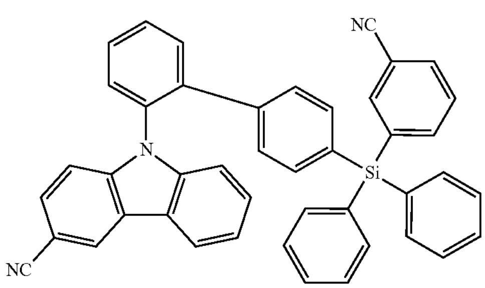
-continued
344
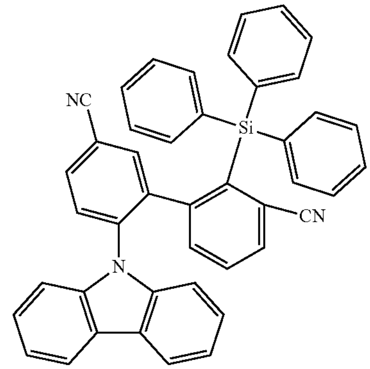
345
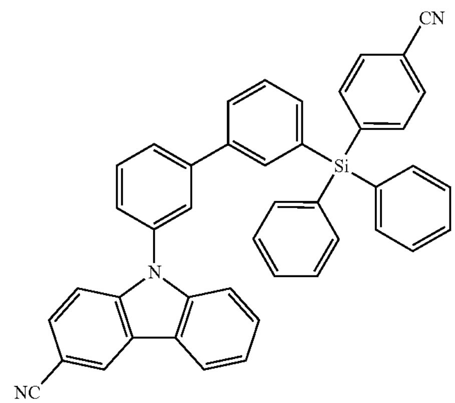
346
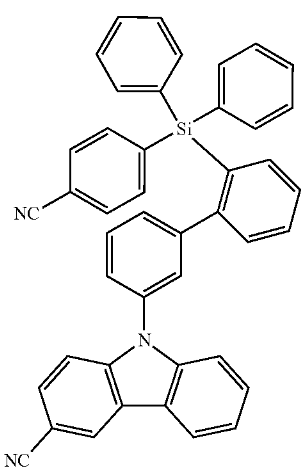
347
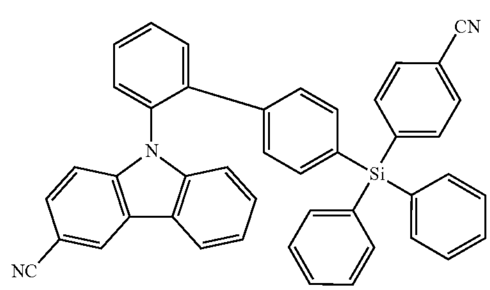

-continued
348
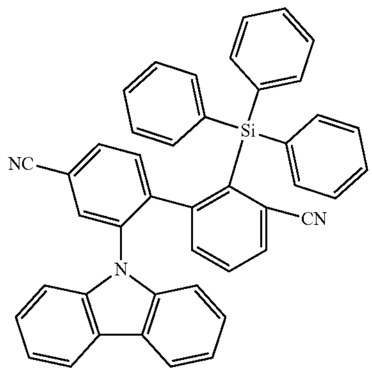
349
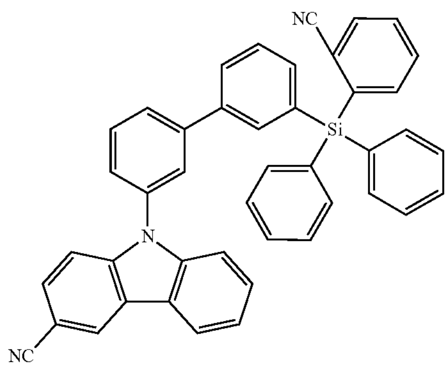
350
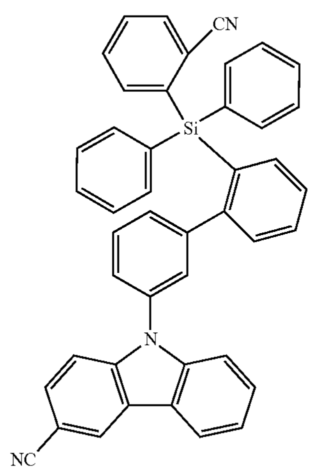
351
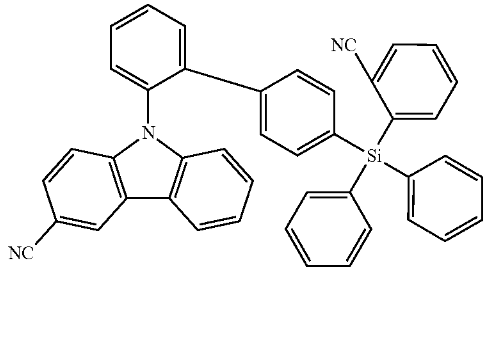
-continued
352
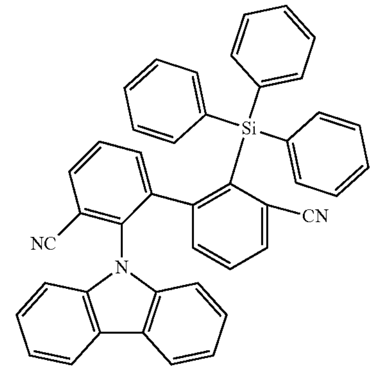
353
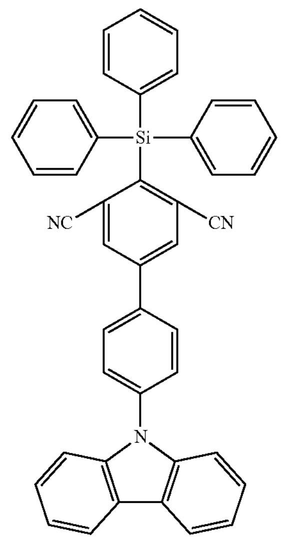
354
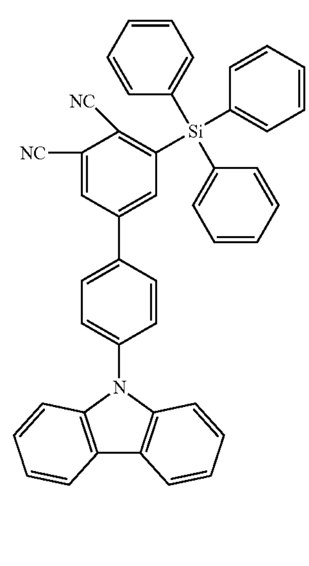

-continued
355
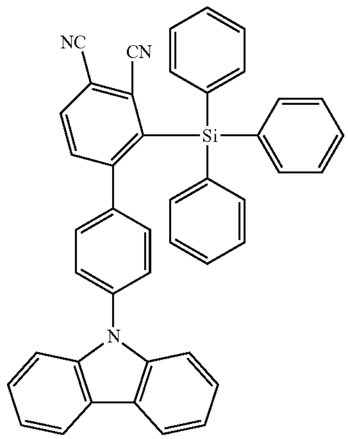
356
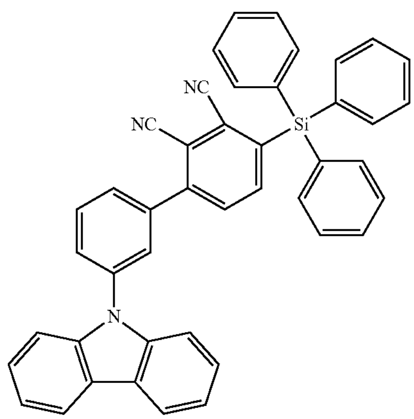
357
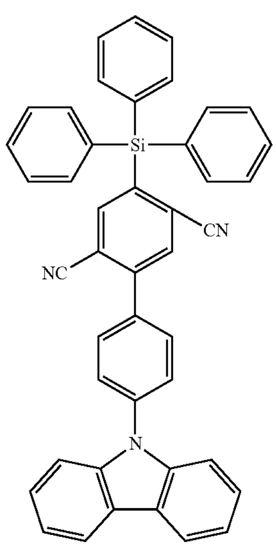
-continued
358
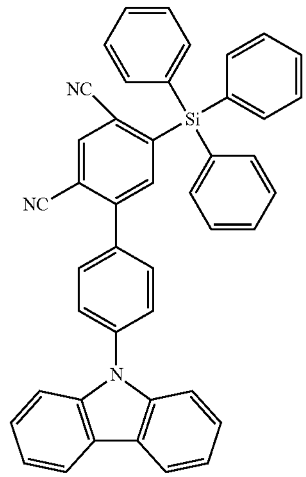
359
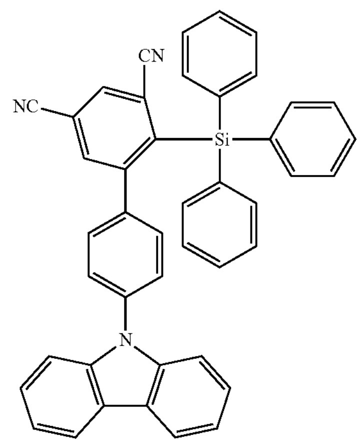
360
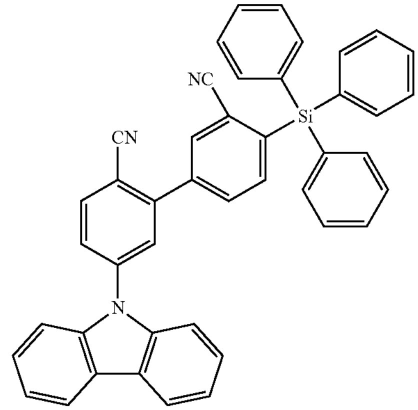

-continued
361
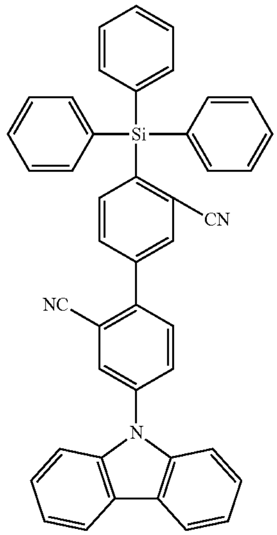
362
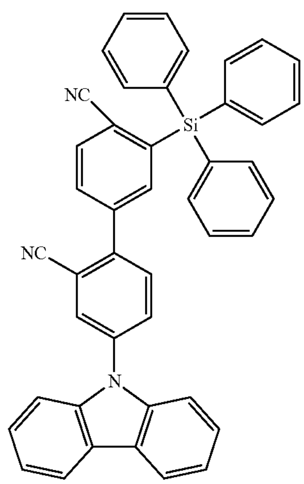
363
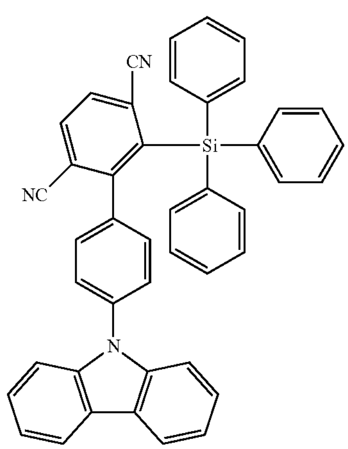
-continued
364
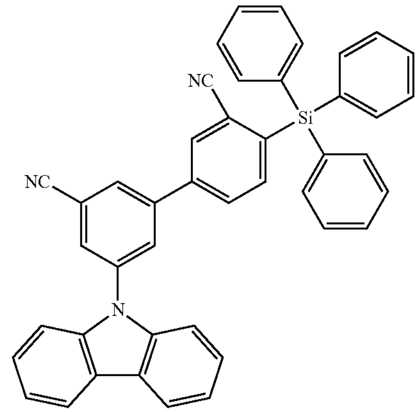
365
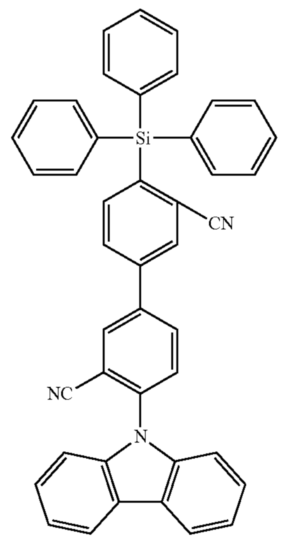
366
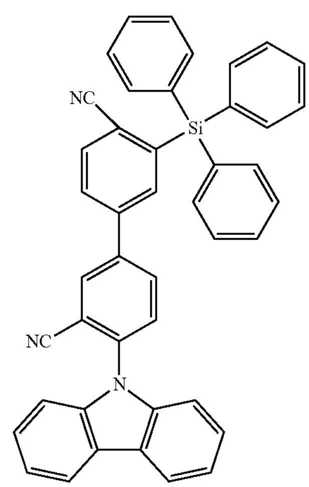

367
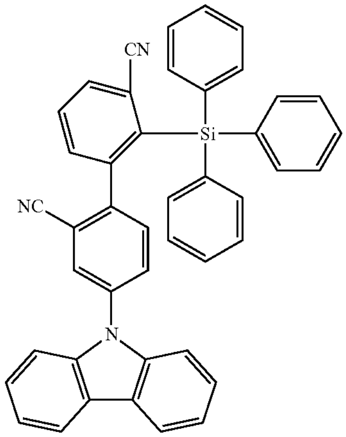
368
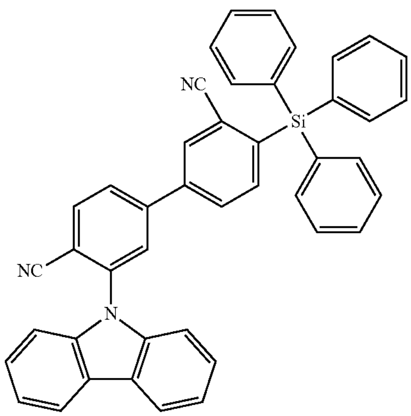
369
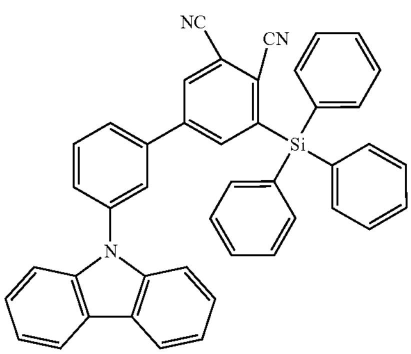
370
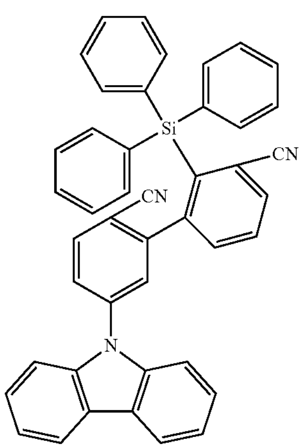
371
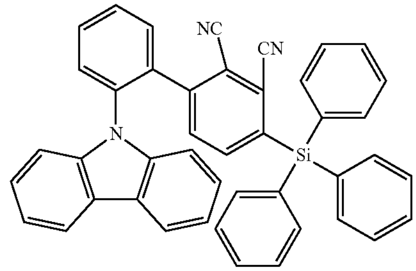
372
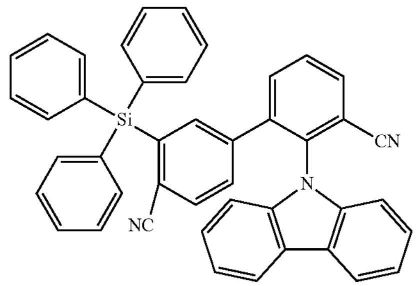
373
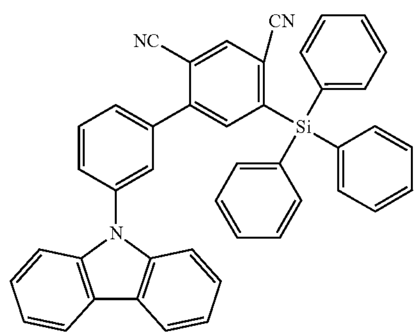
374
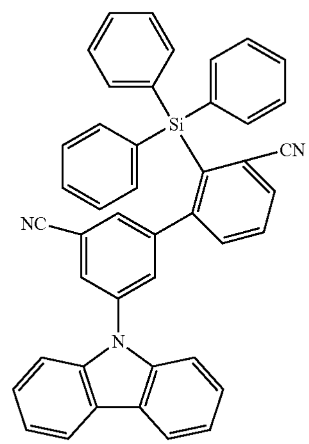
375
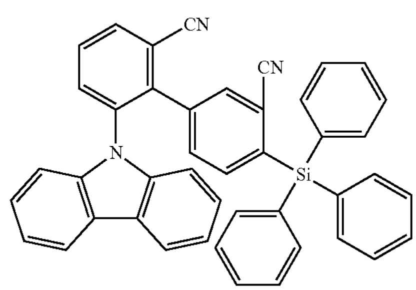

-continued
376
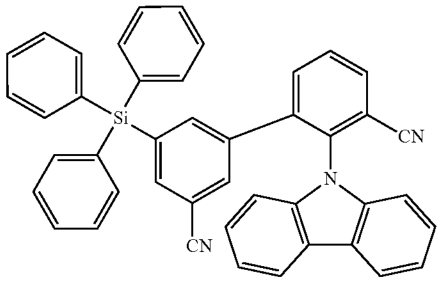
377
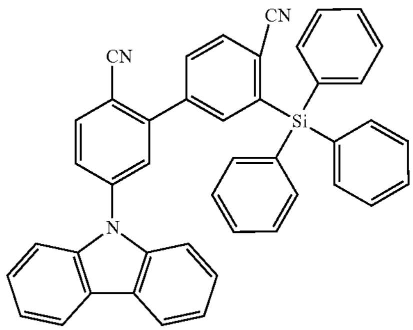
378
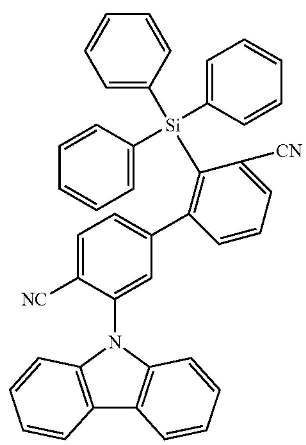
379
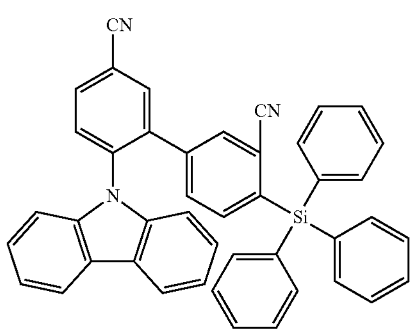
-continued
380
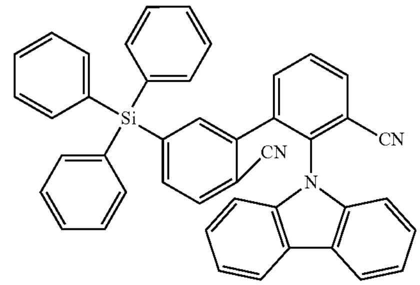
381
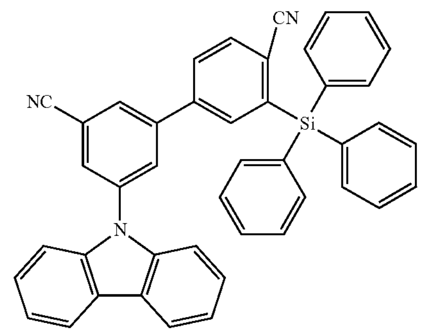
382
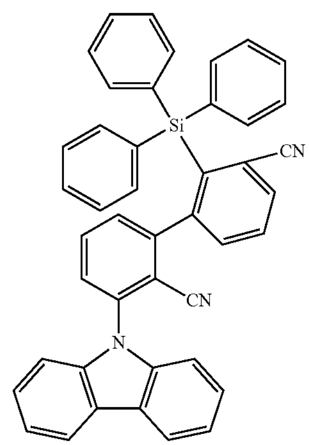
383
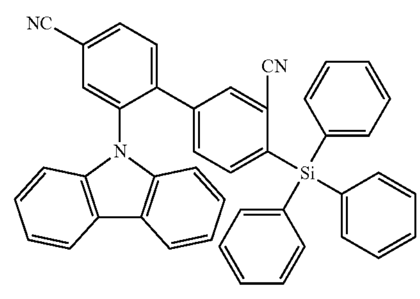
384
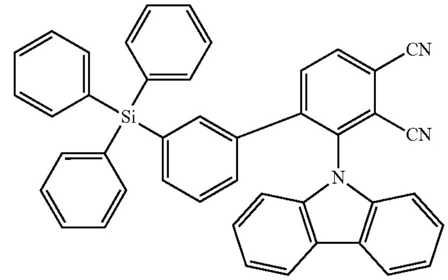

385
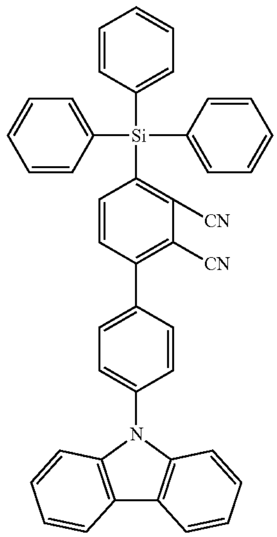
386
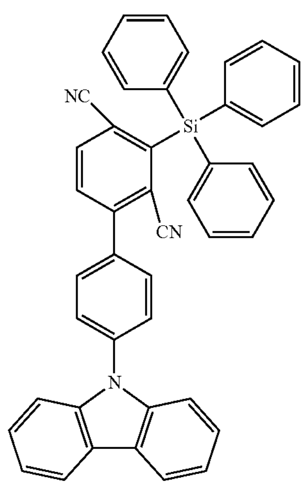
387
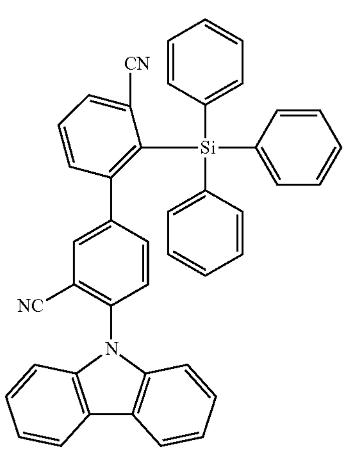
388
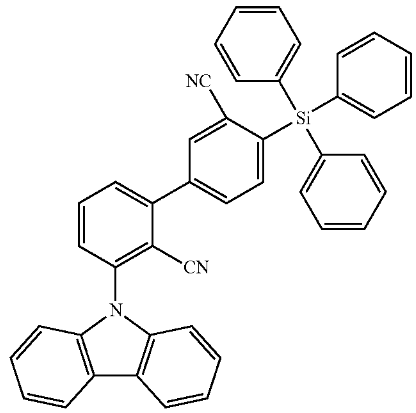
389
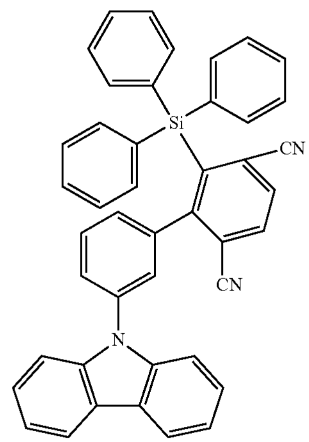
390
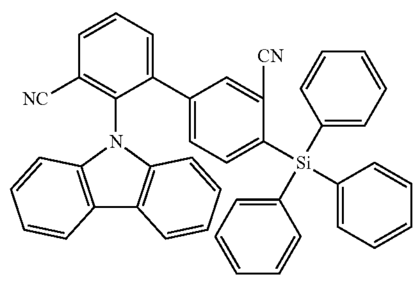
391
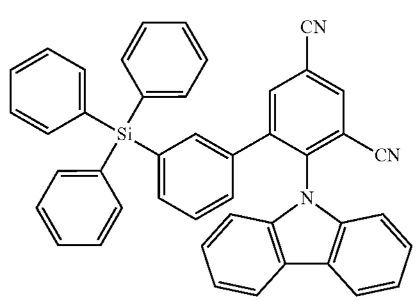

-continued
392
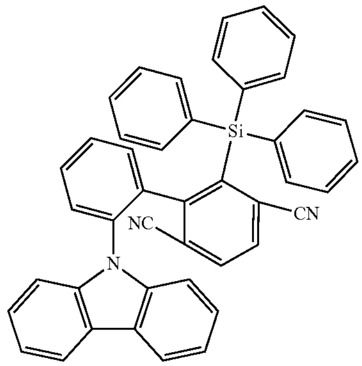
393
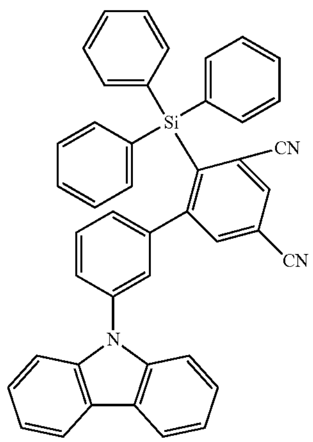
394
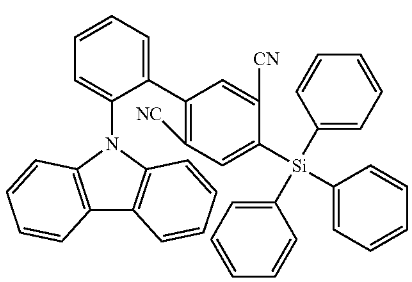
395
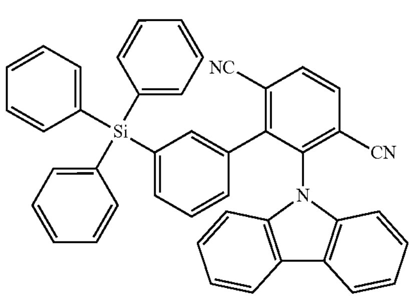
-continued
396
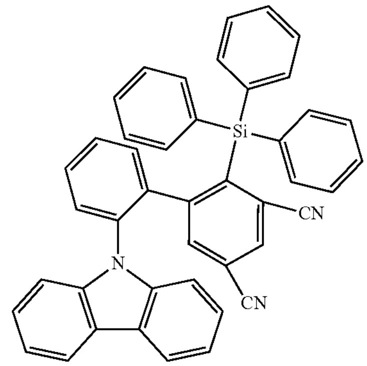
397
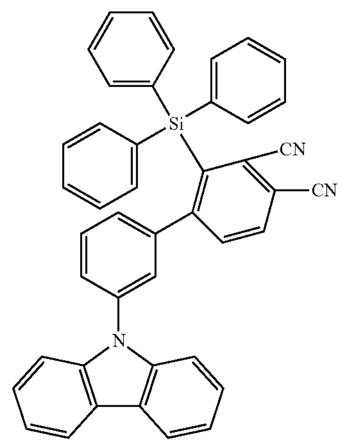
398
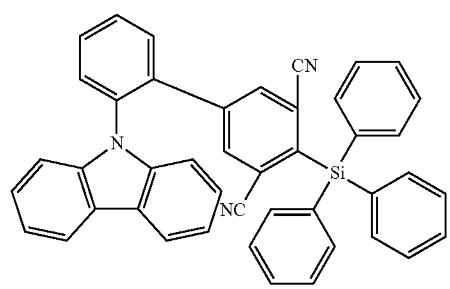
399
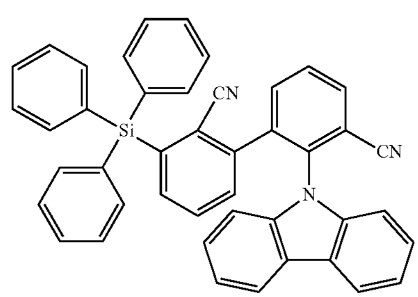

-continued
400
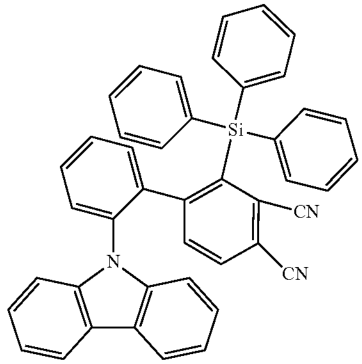
401
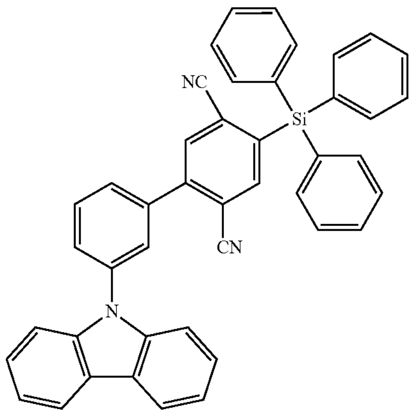
402
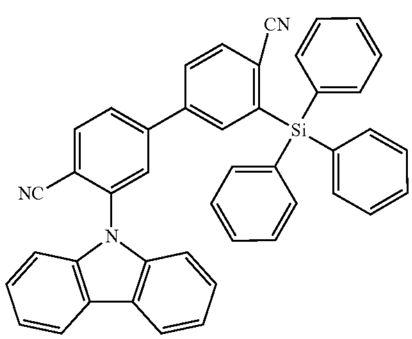
403
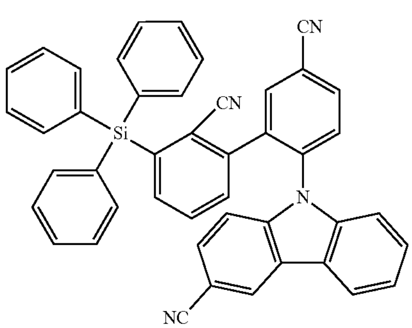
-continued
404
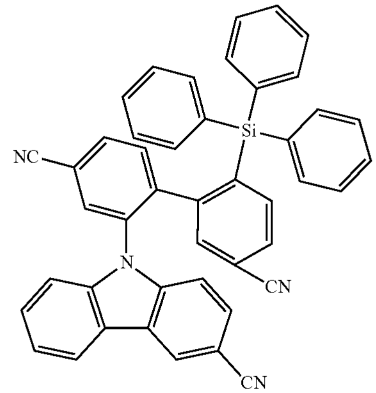
405
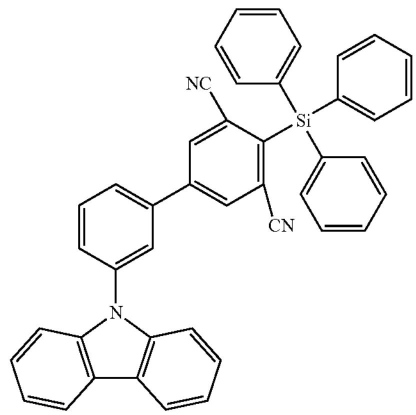
406
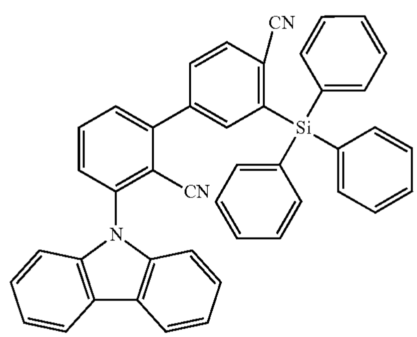
407
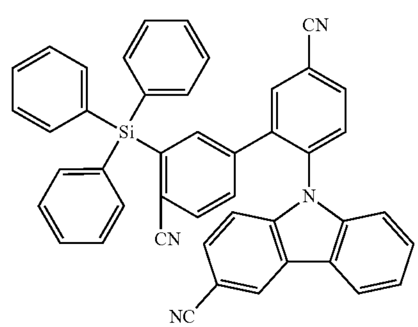

-continued
408
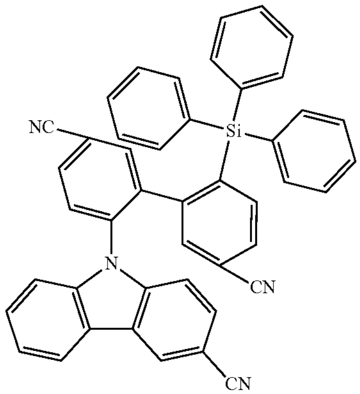
409
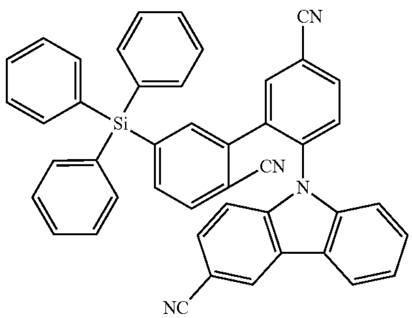
410
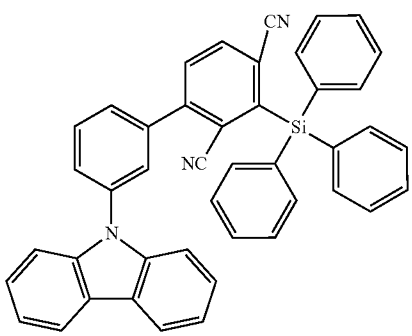
411
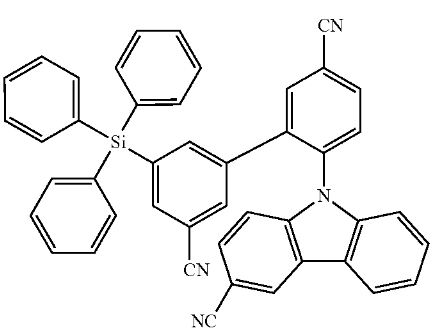
-continued
412
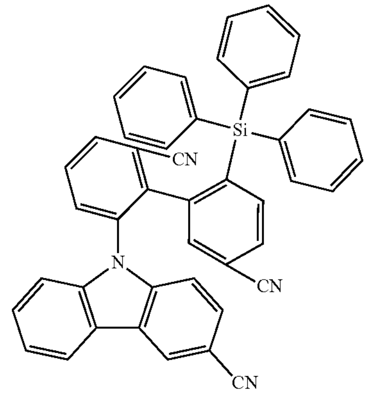
413
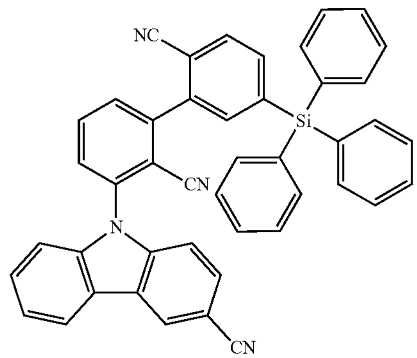
414
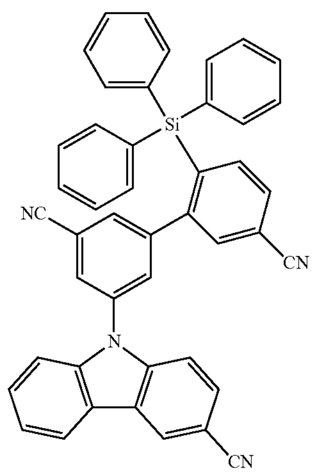
415
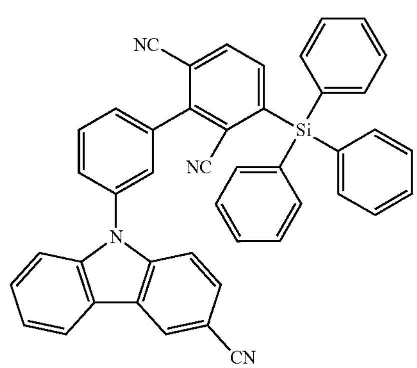

416
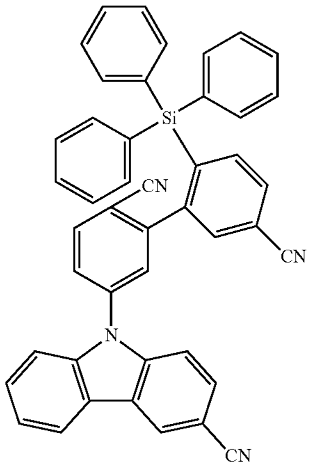
417
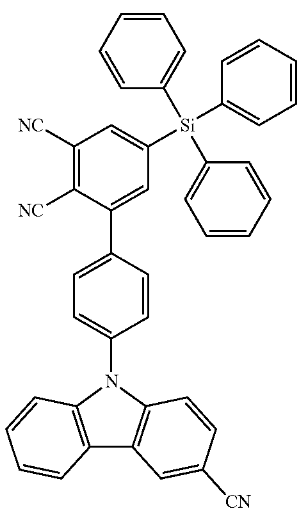
418
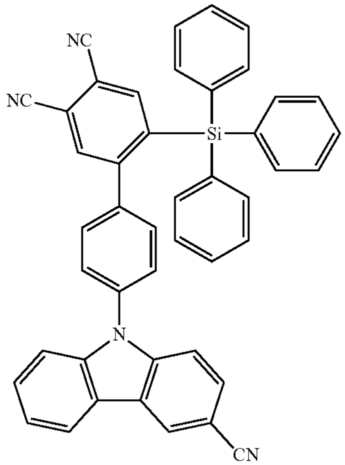
419
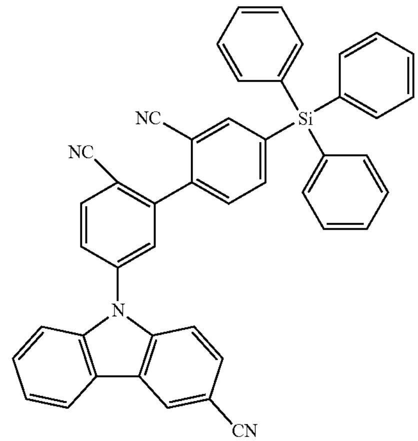
420
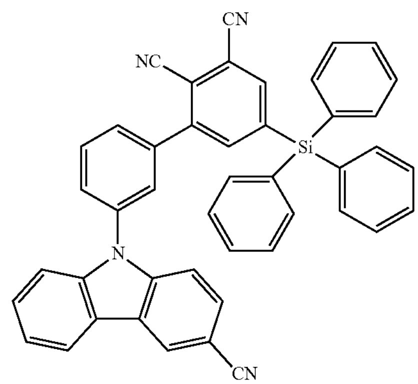
421
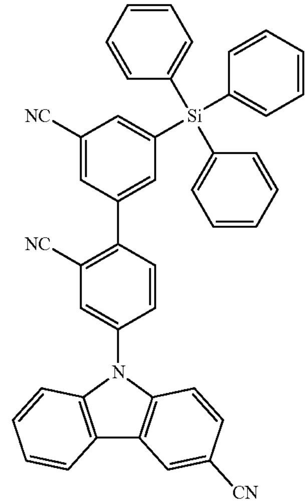

-continued
422
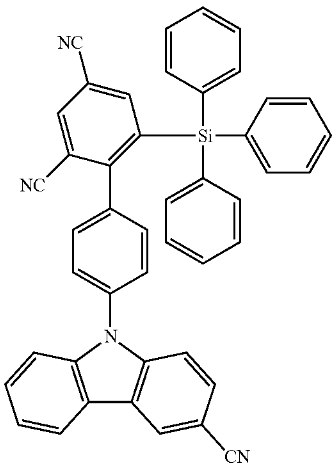
423
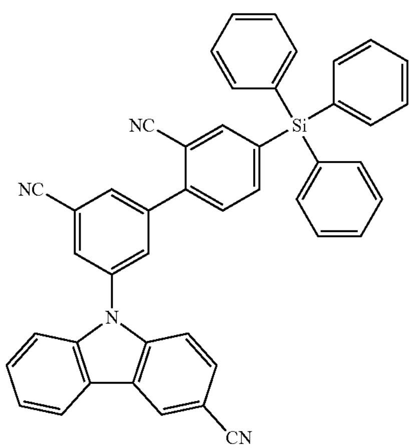
424
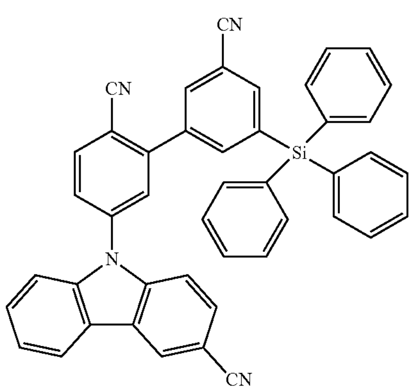
-continued
425
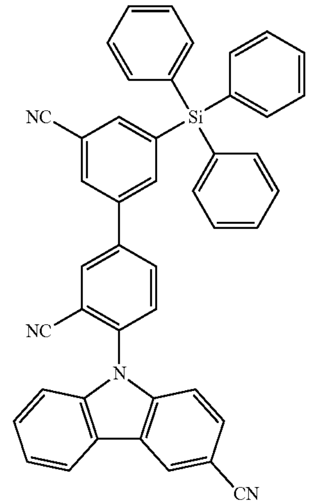
426
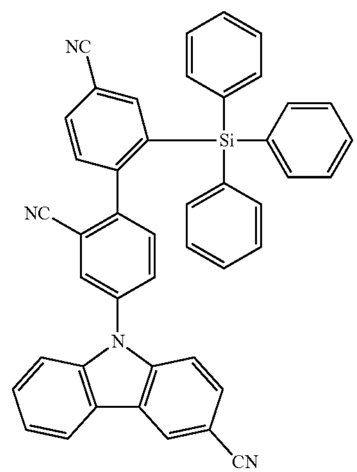
427
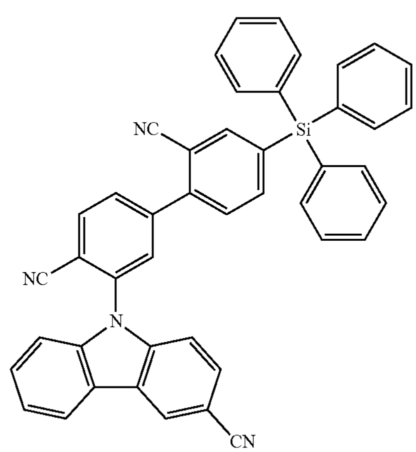

-continued
428
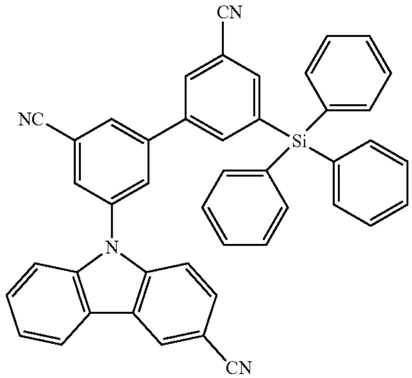
429
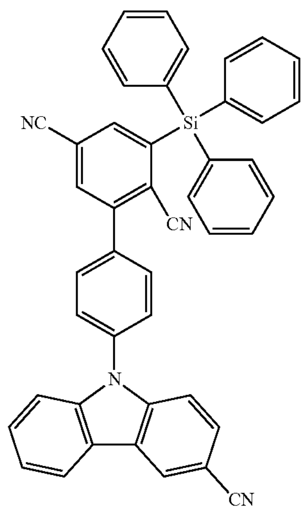
430
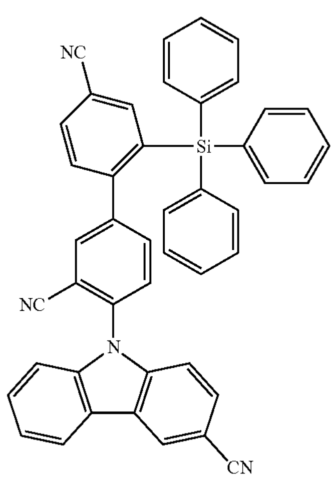
-continued
431
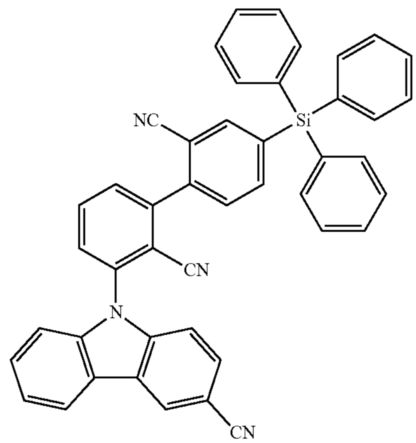
432
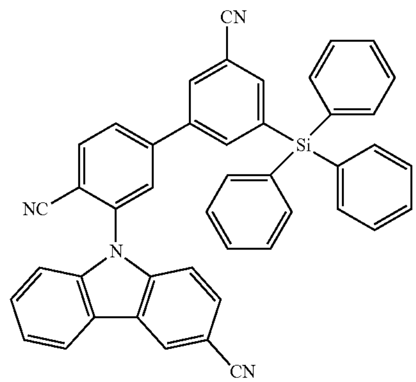
433
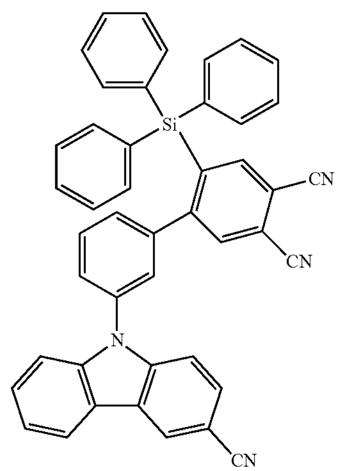
434
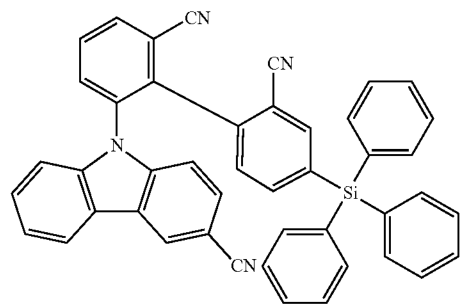

-continued
435
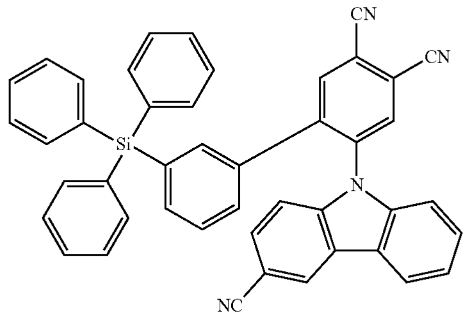
436
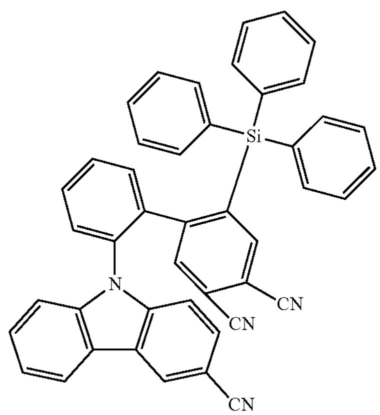
437
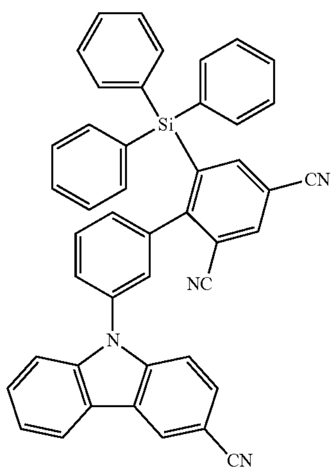
438
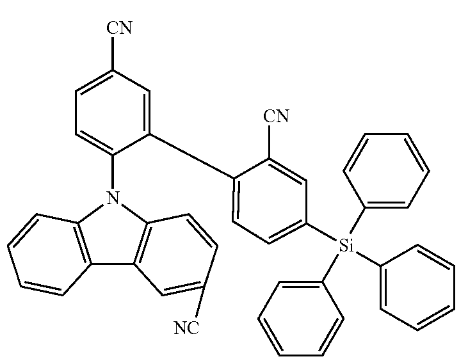
-continued
439
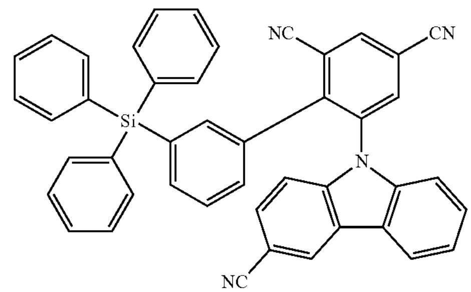
440
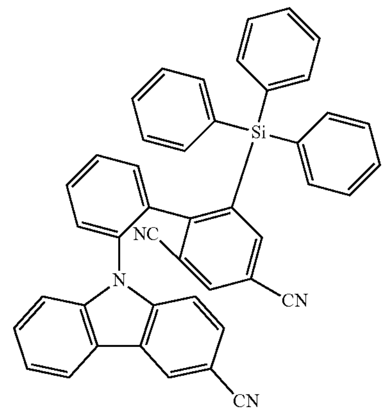
441
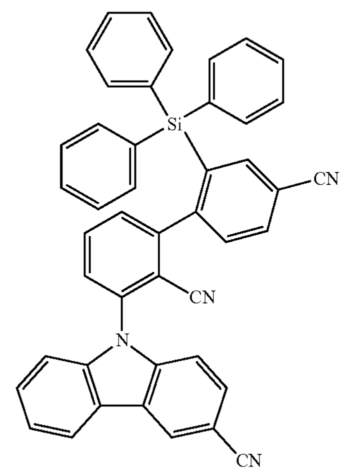
442
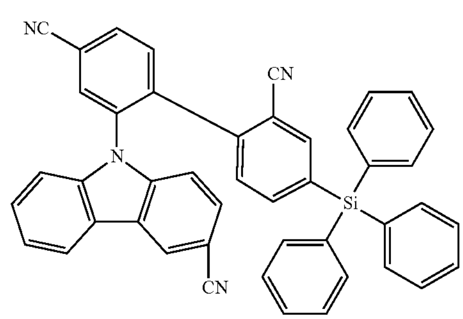

443
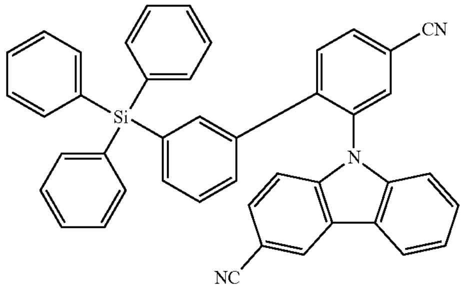
444
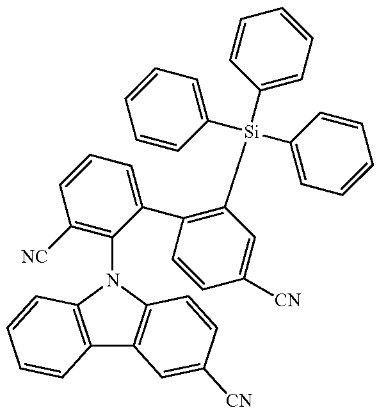
445
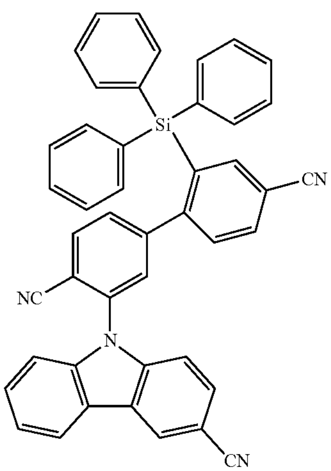
446
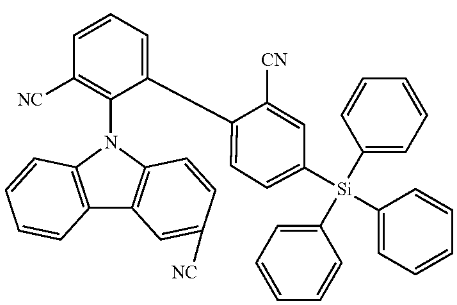
447
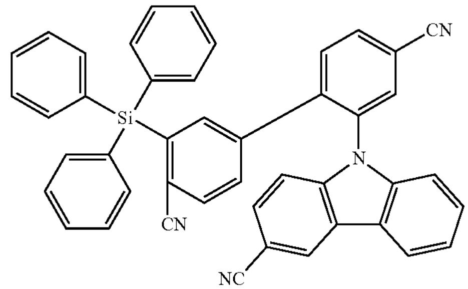
448
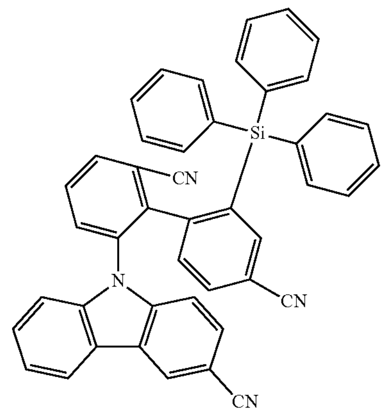
449
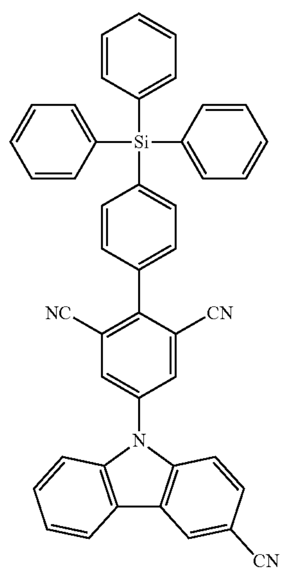

-continued
450
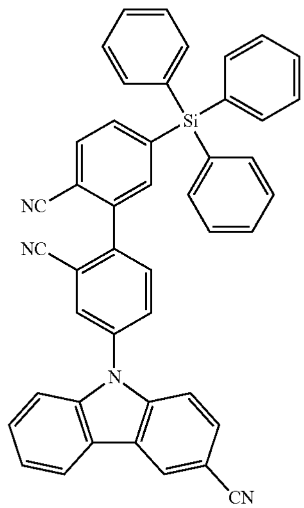
451
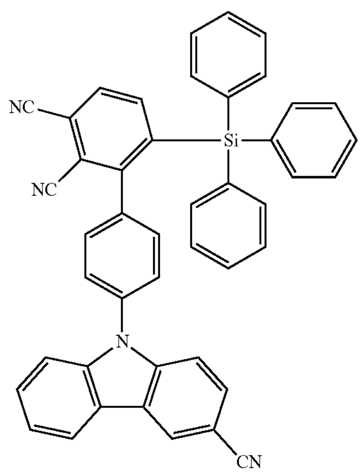
452
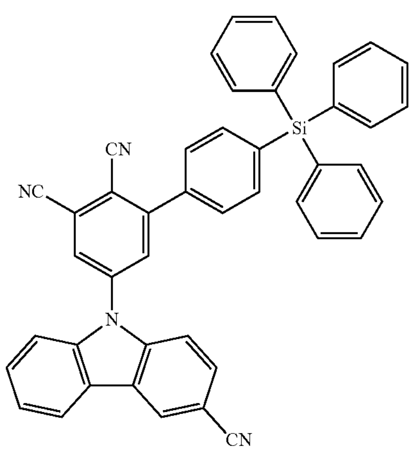
-continued
453
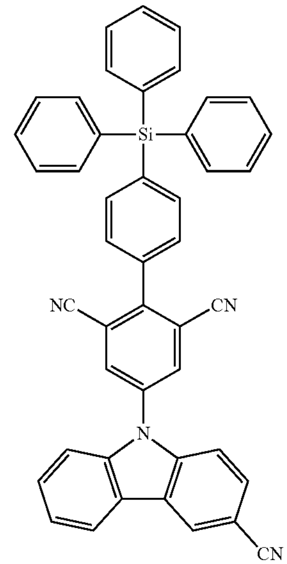
454
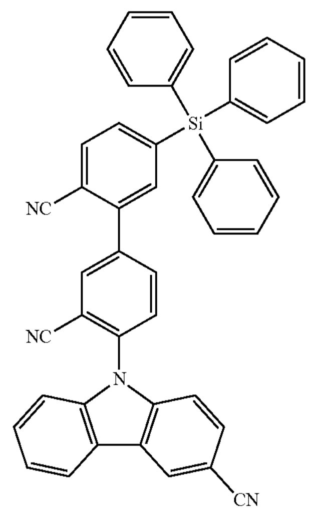
455
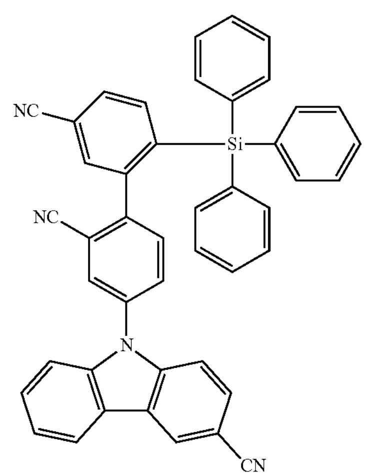

-continued
456
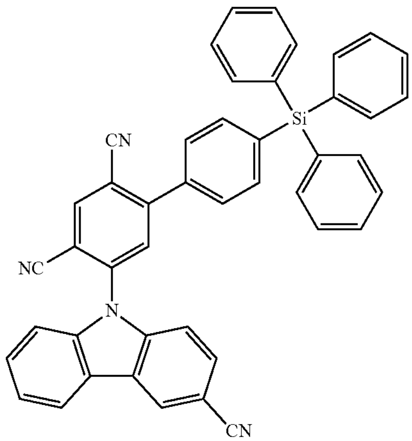
457
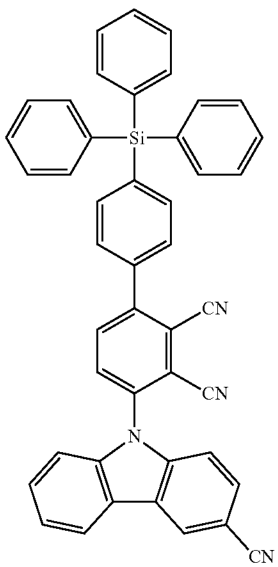
458
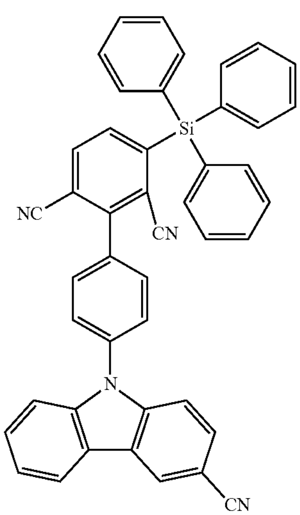
-continued
459
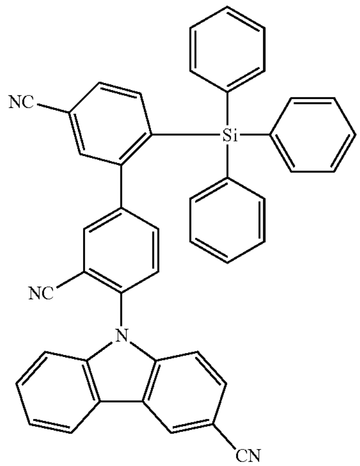
460
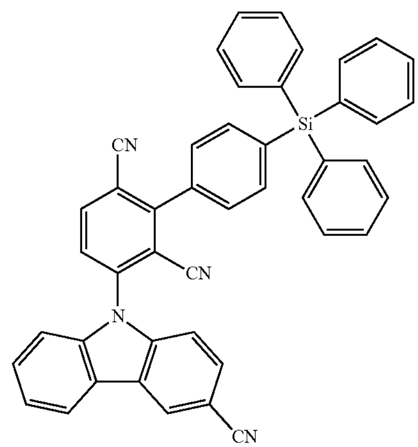
461
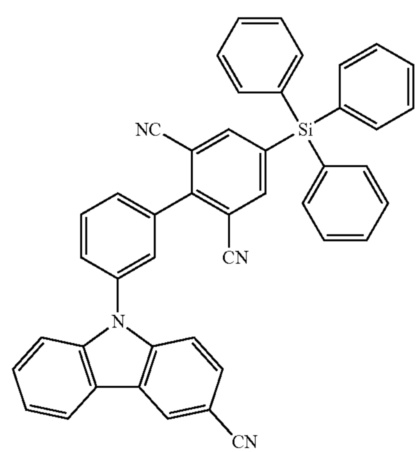

-continued
462
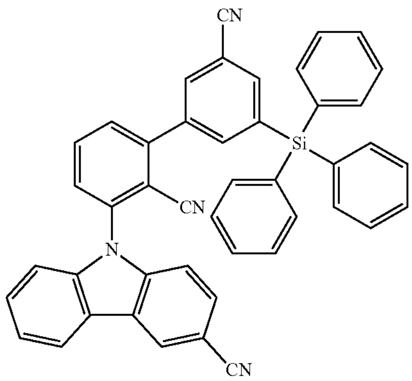
463
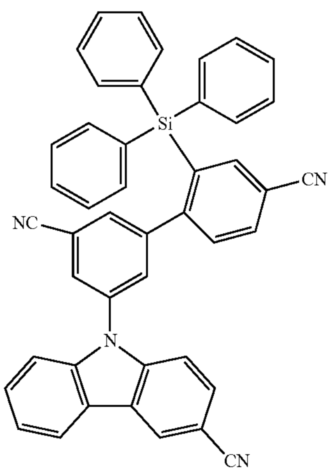
464
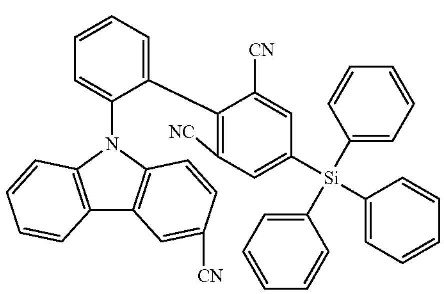
465
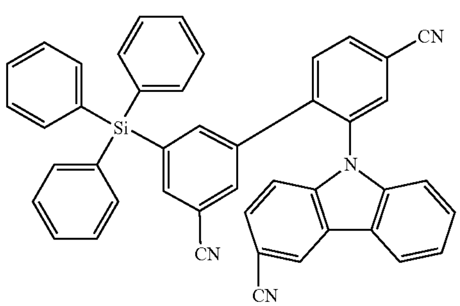
-continued
466
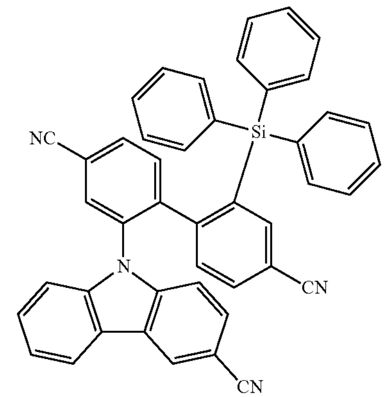
467
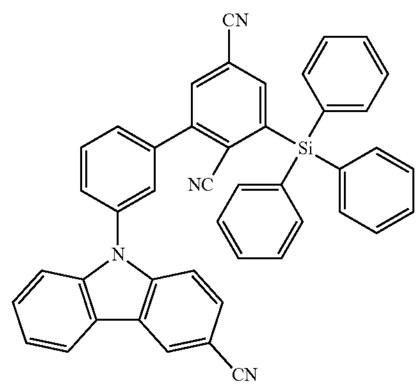
468
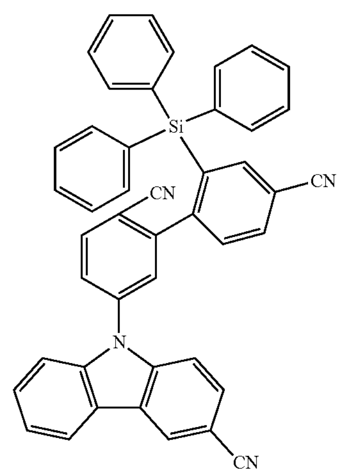
469
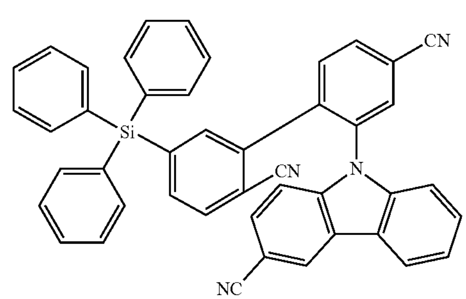

-continued
470
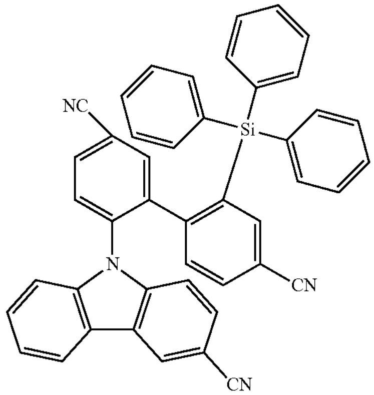
471
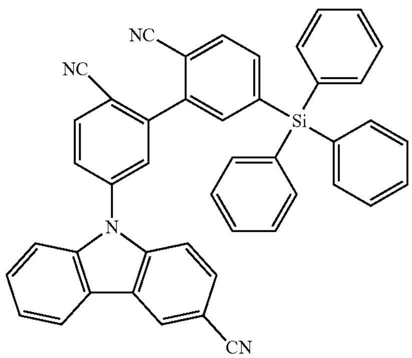
472
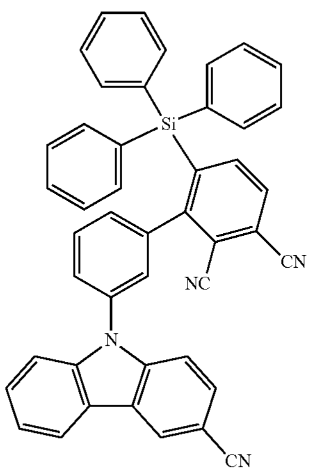
473
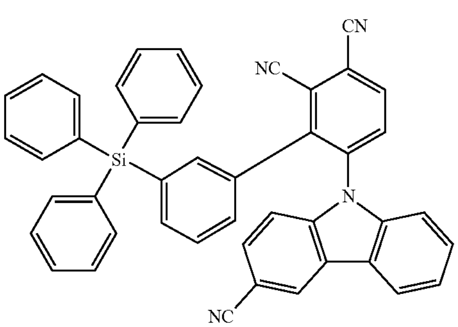
-continued
474
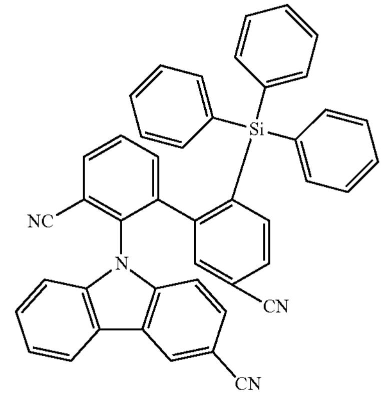
475
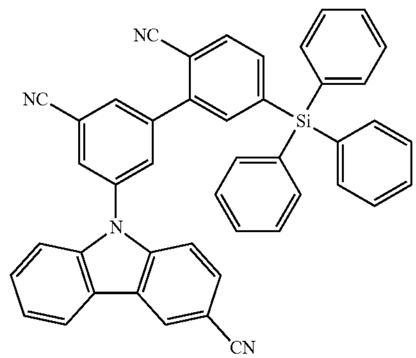
476
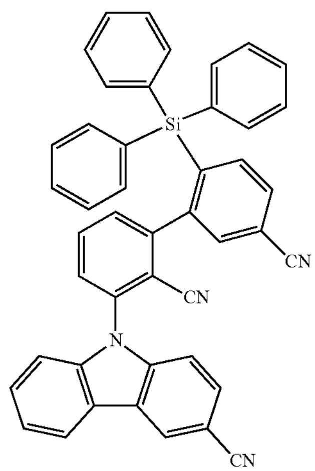
477
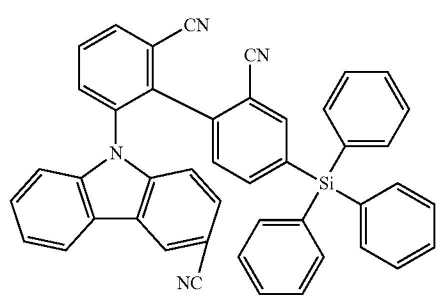

-continued
478
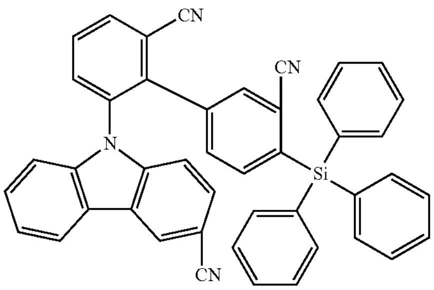
479
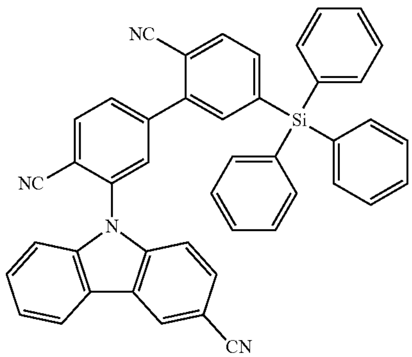
480
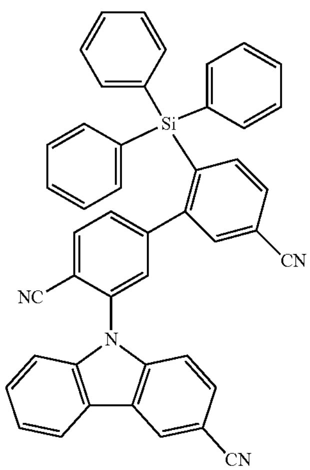
481
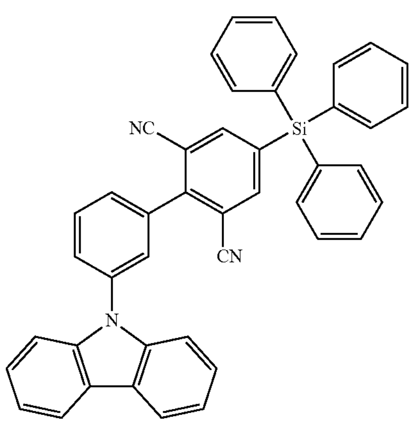
-continued
482
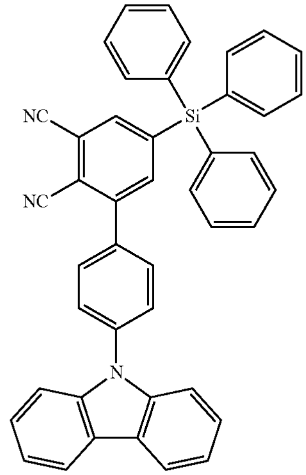
483
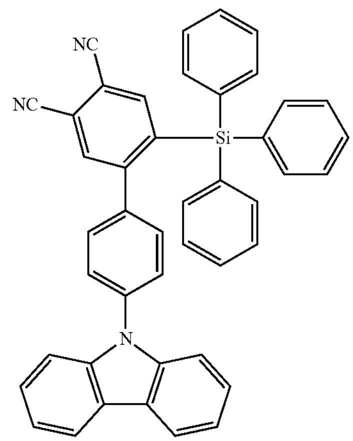
484
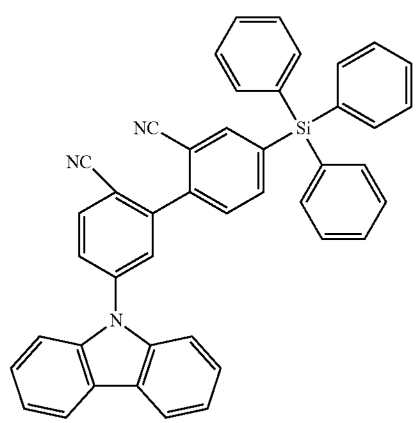

-continued
485
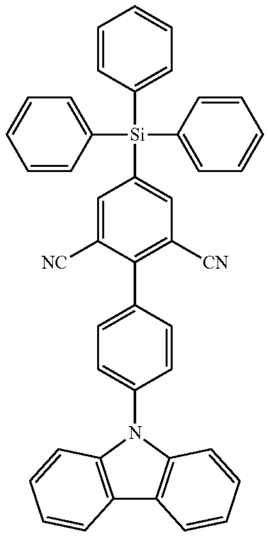
486
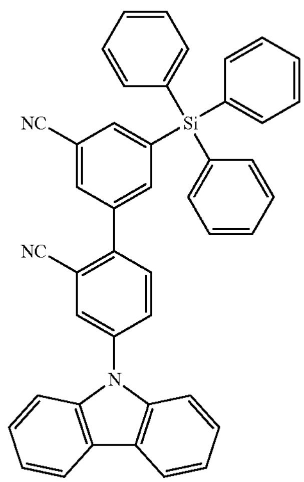
487
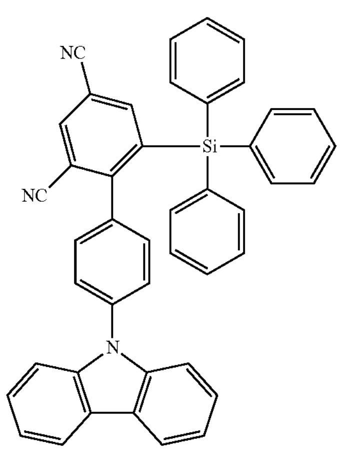
-continued
488
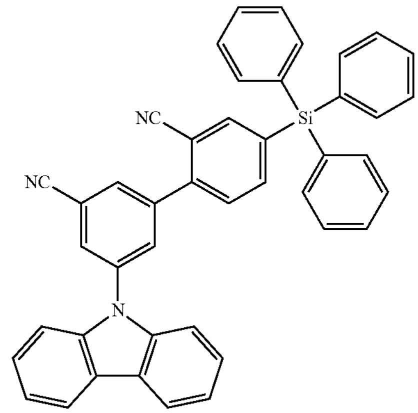
489
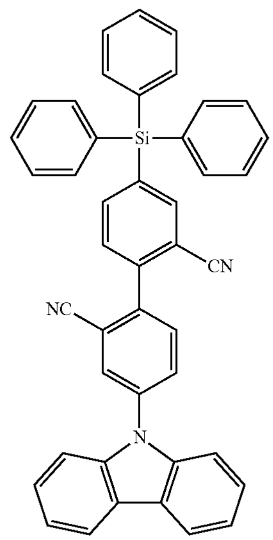
490
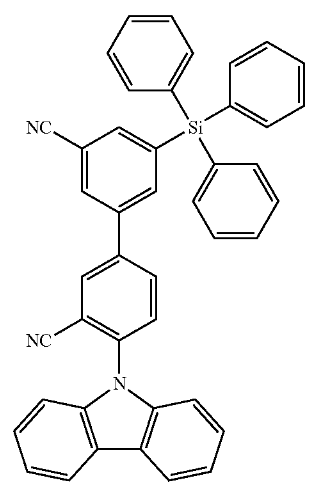

-continued
491
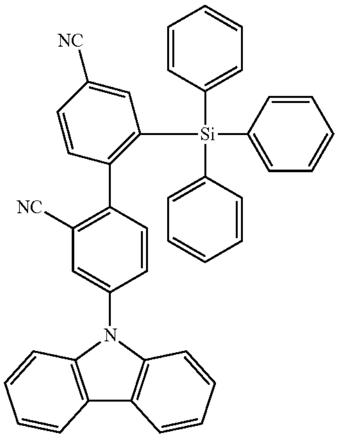
492
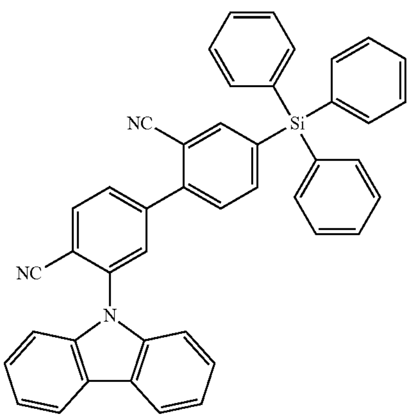
493
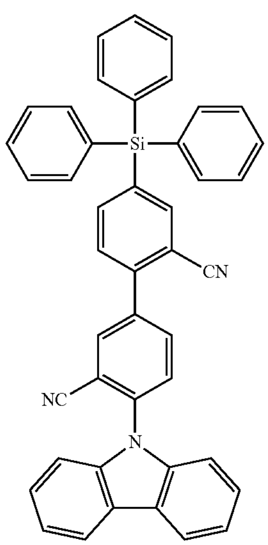
-continued
494
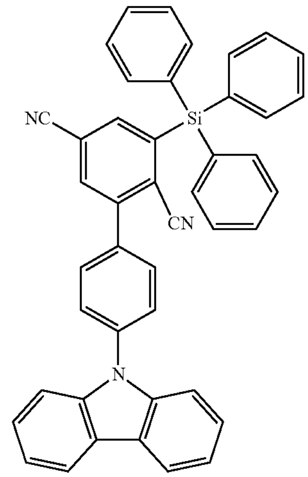
495
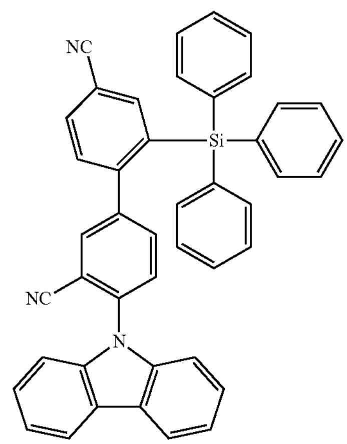
496
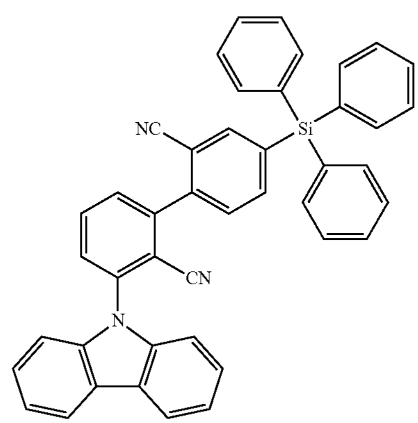

-continued
497
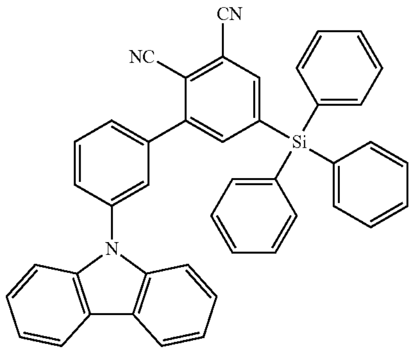
498
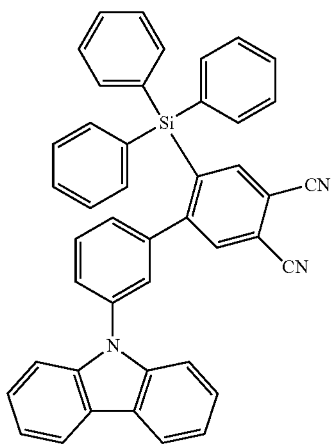
499
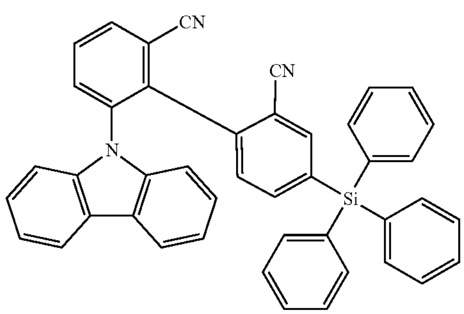
500
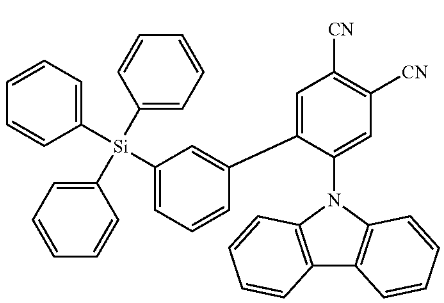
-continued
501
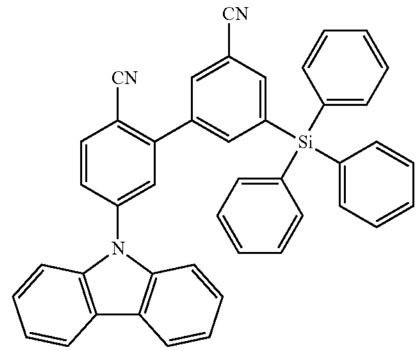
502
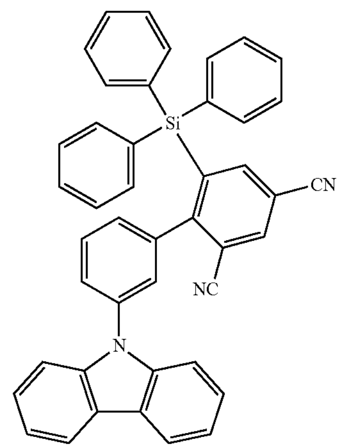
503
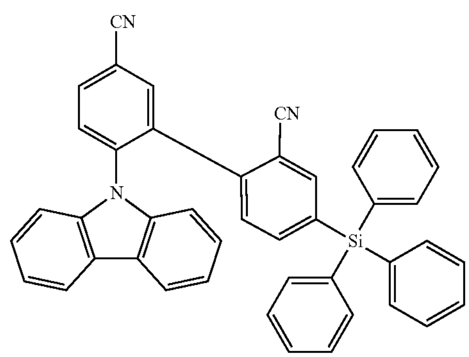
504
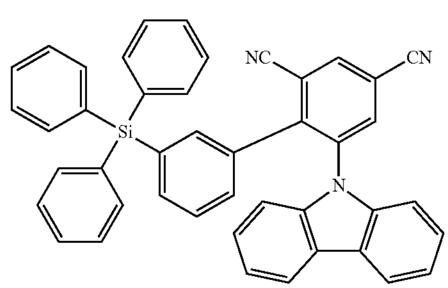

-continued
505
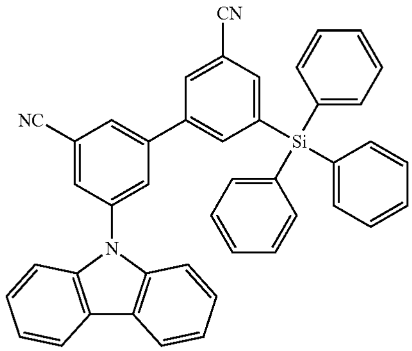
506
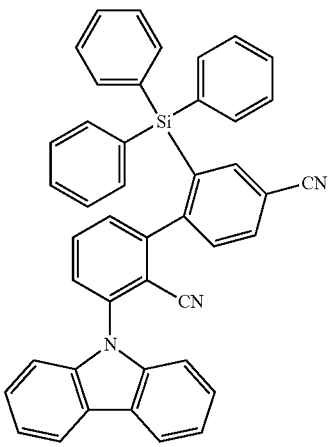
507
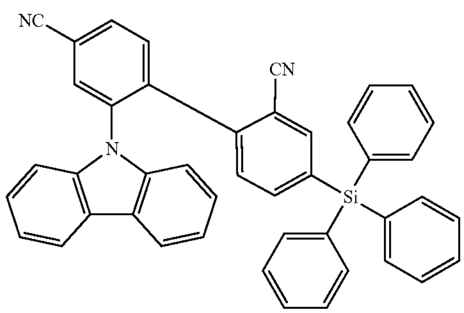
508
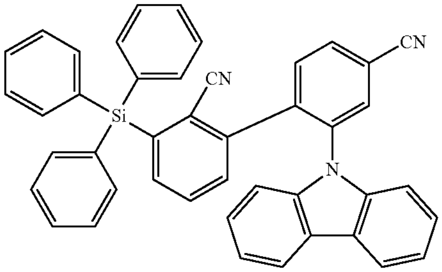
-continued
509
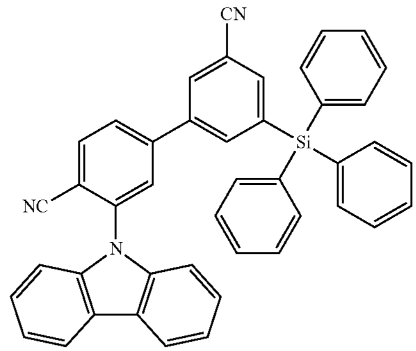
510
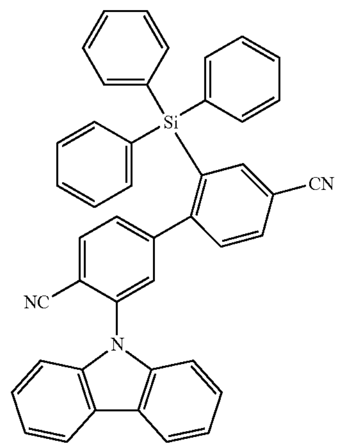
511
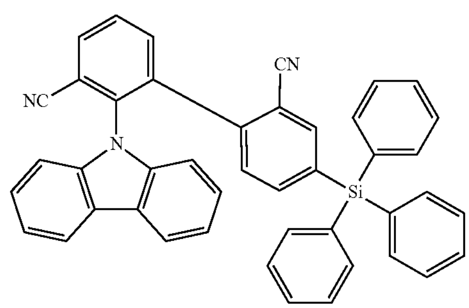
512
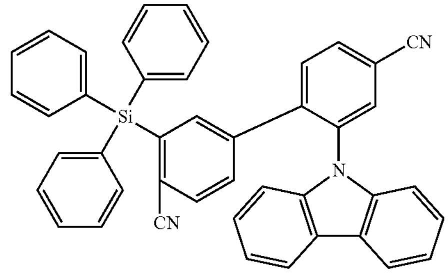

-continued
513
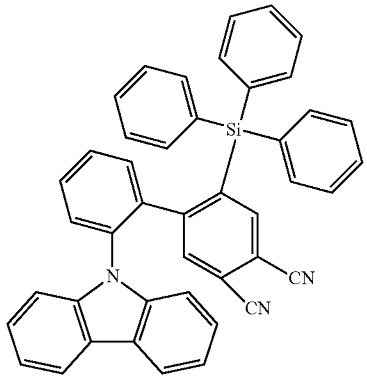
514
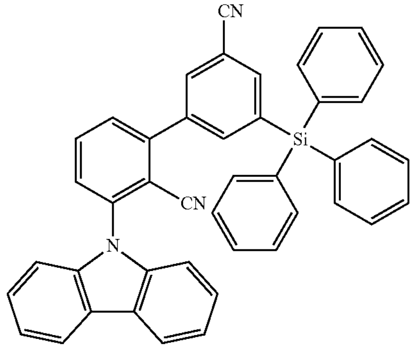
515
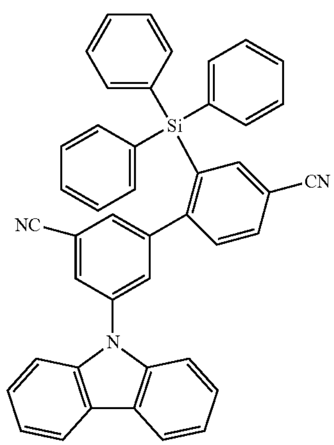
516
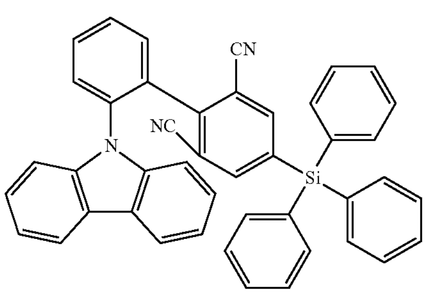
-continued
517
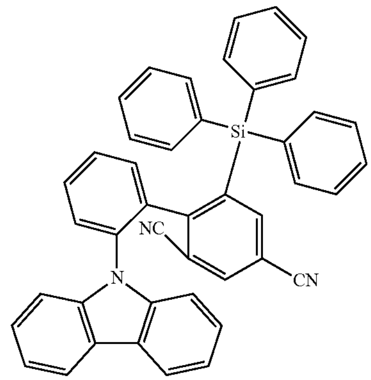
518
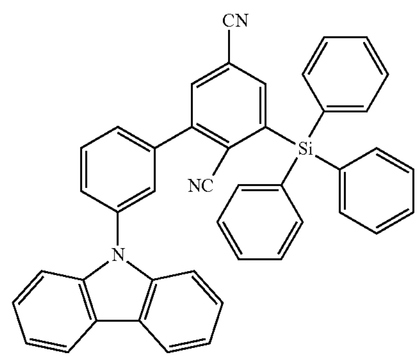
519
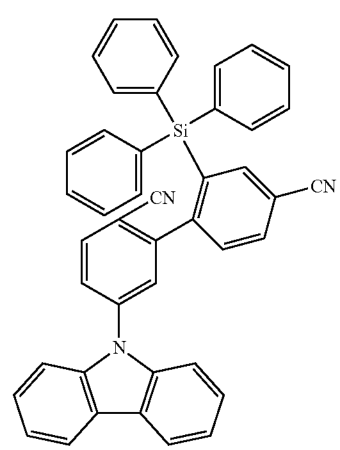

-continued
520
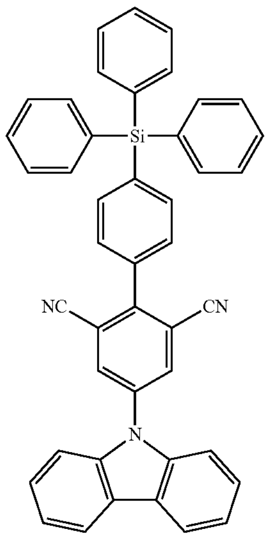
521
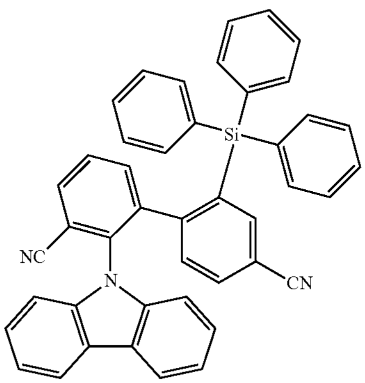
522
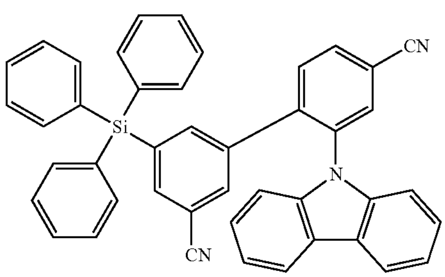
523
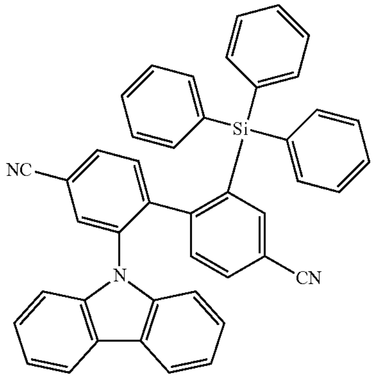
-continued
524
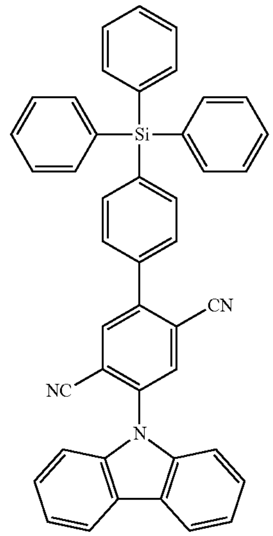
525
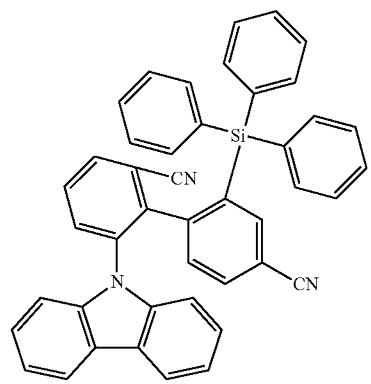
526
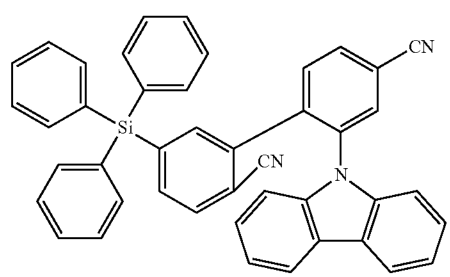
527
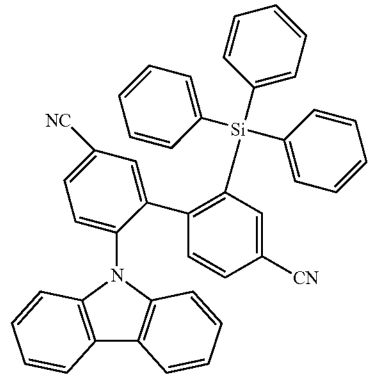

-continued
528
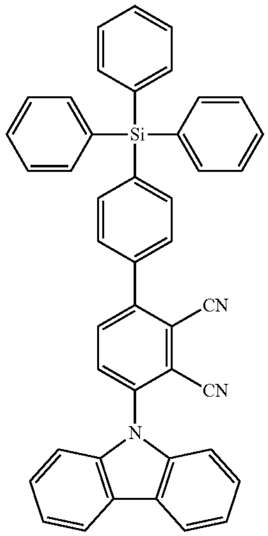
529
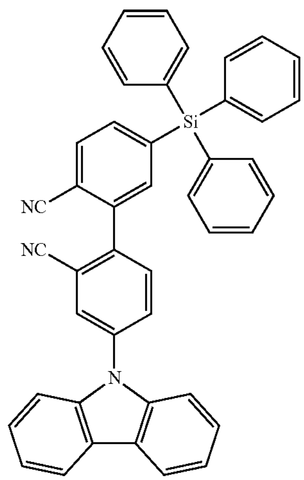
530
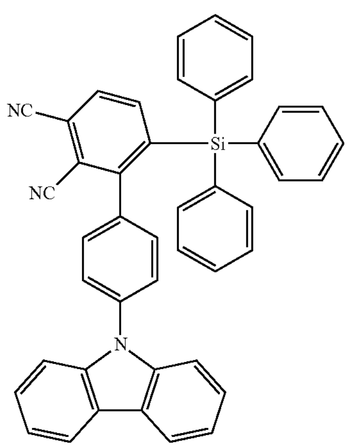
-continued
531
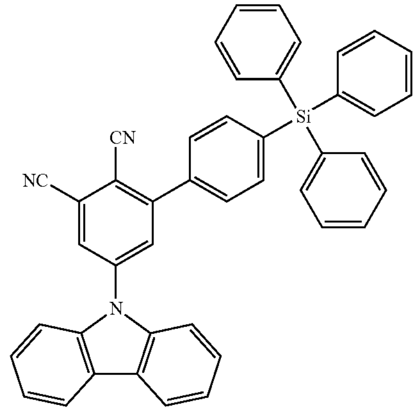
532
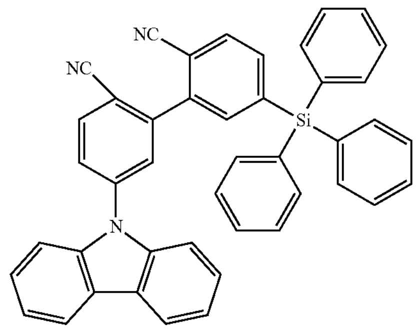
533
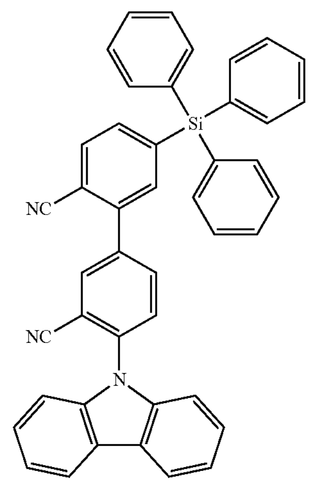
534
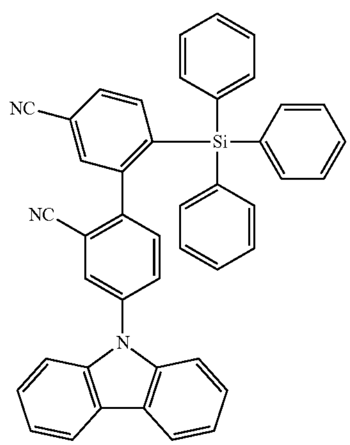

-continued
535
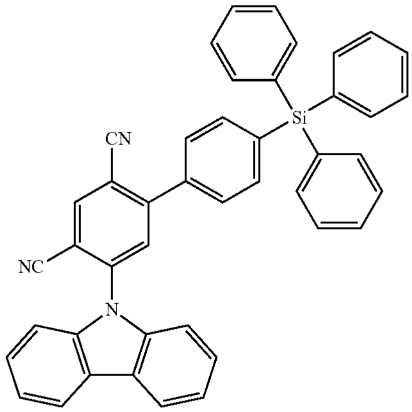
536
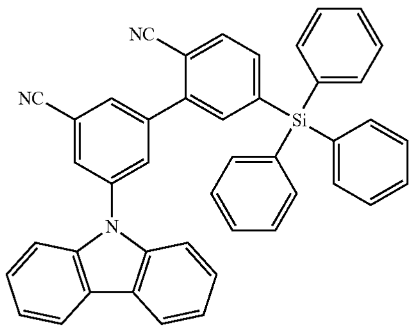
537
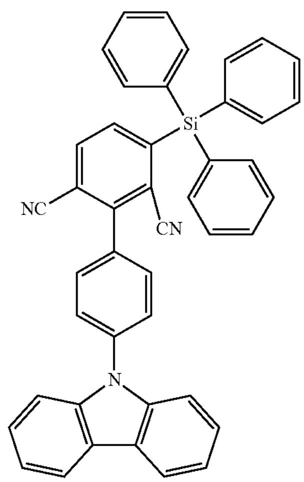
538
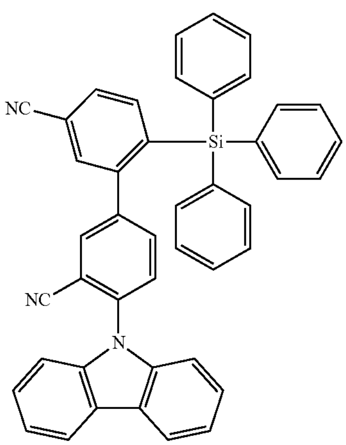
-continued
539
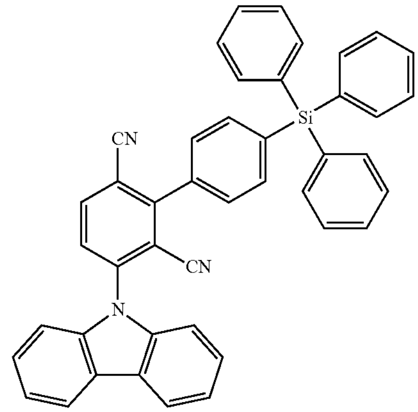
540
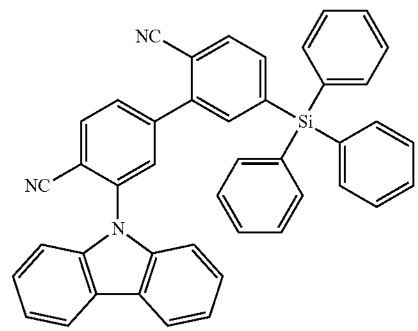
541
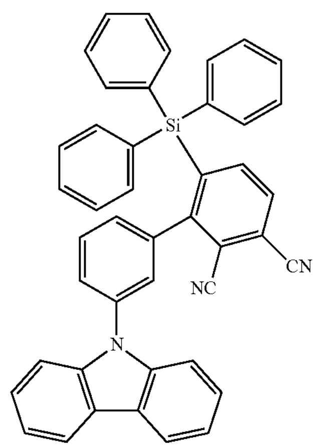
542
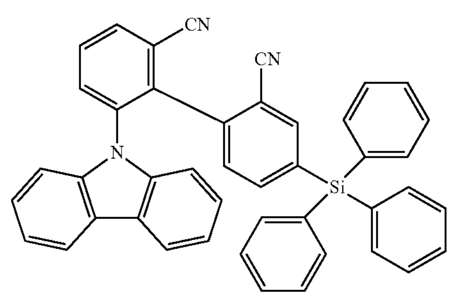

543
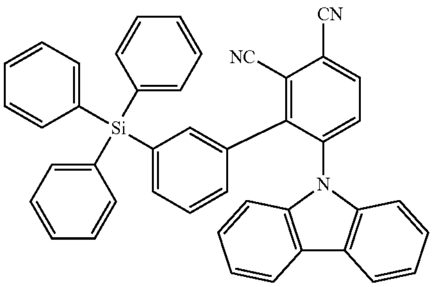
544
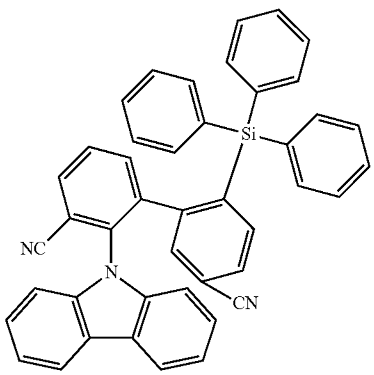
545
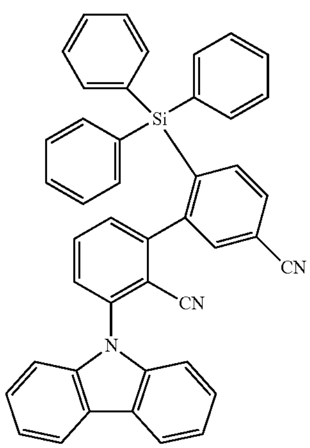
546
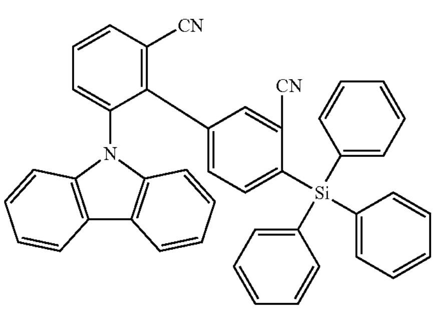
547
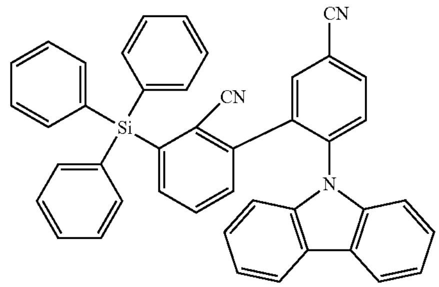
548
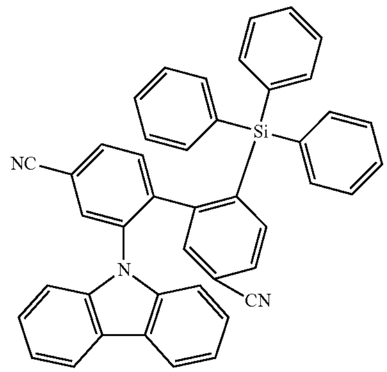
549
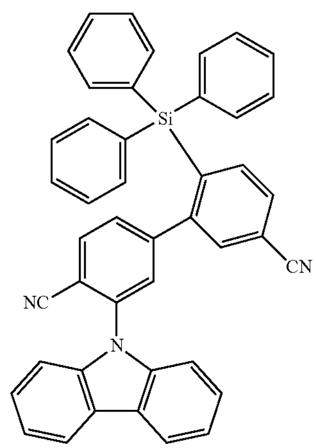
550
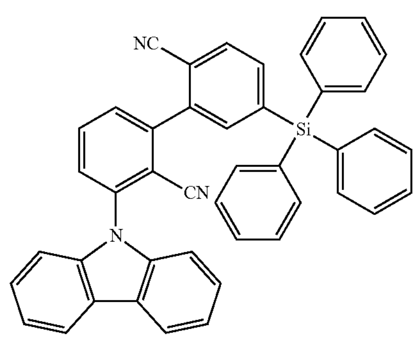

551
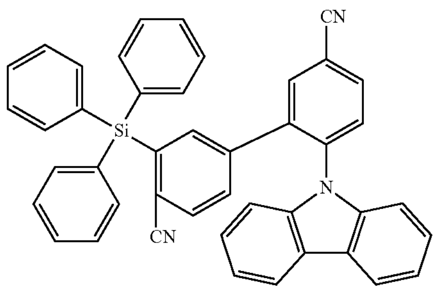
552
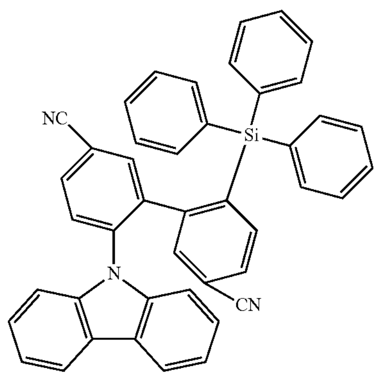
553
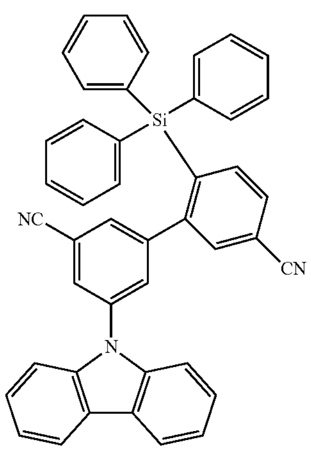
554
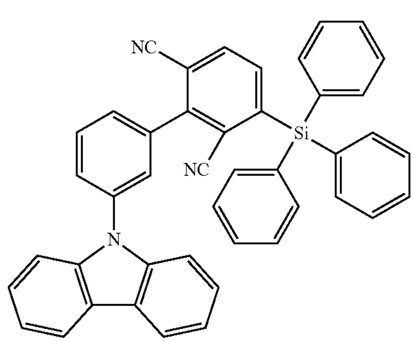
555
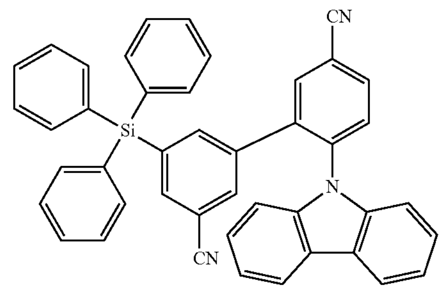
556
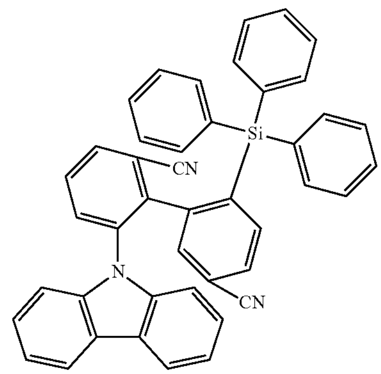
557
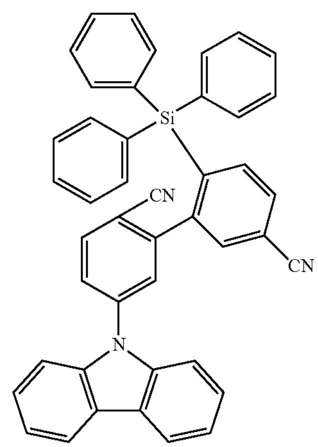
558
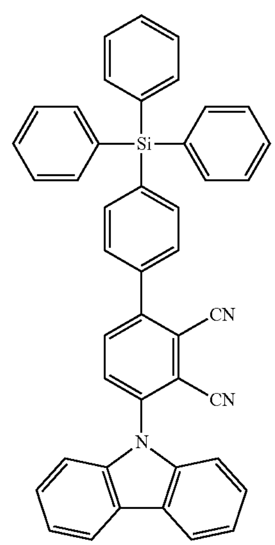

-continued
559
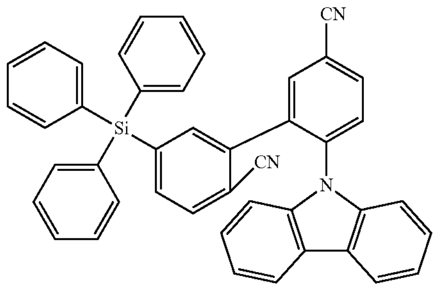
560
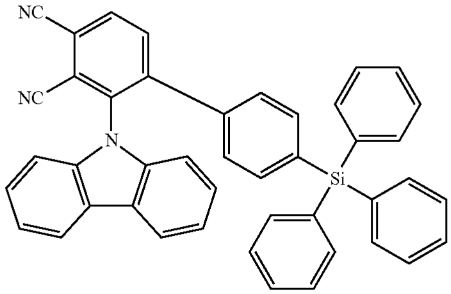
561
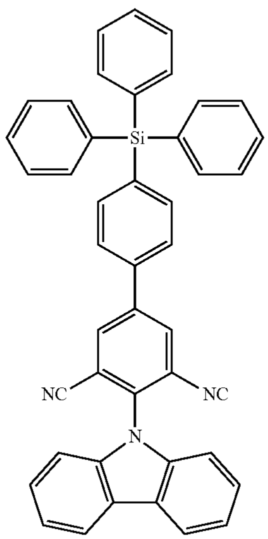
562
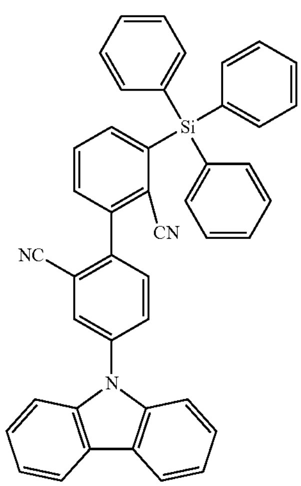
-continued
563
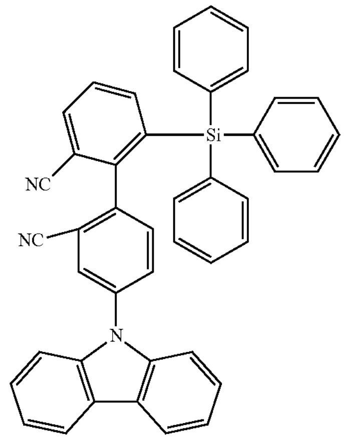
564
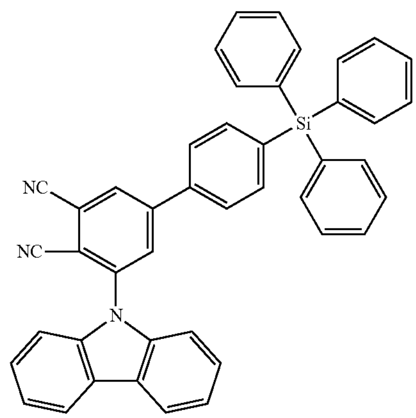
565
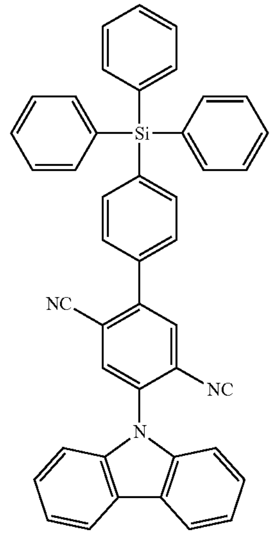

-continued
566
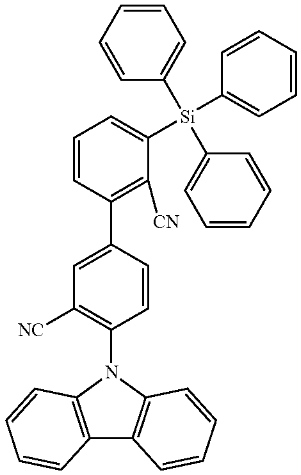
567
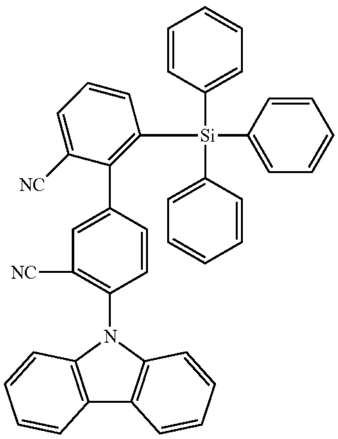
568
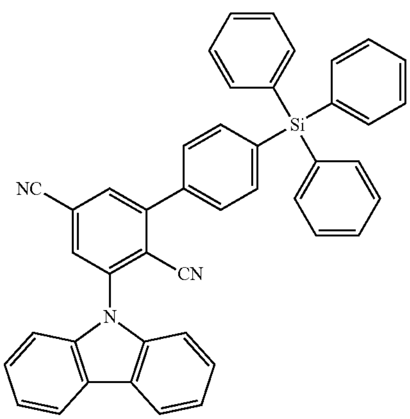
569
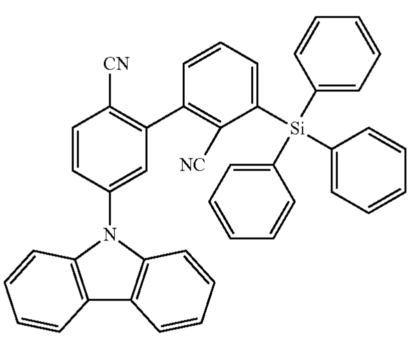
-continued
570
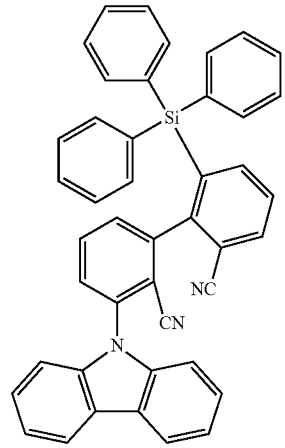
571
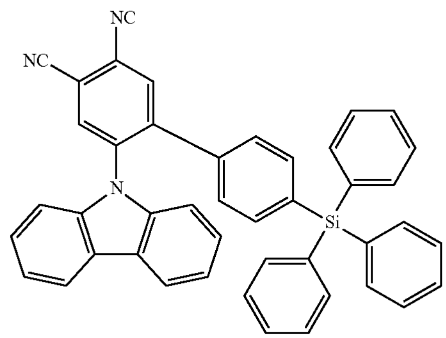
572
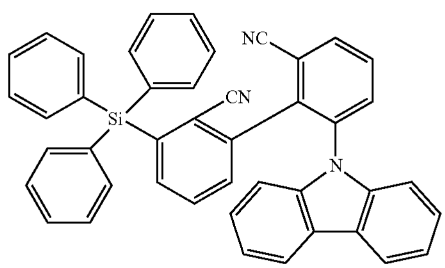
573
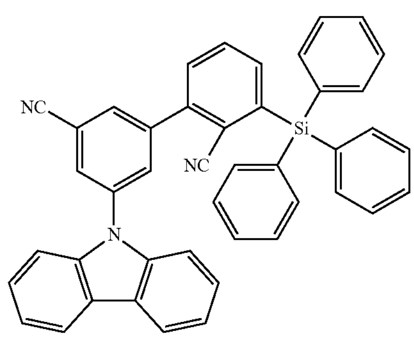

-continued
574
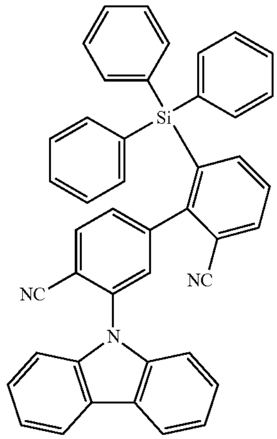
575
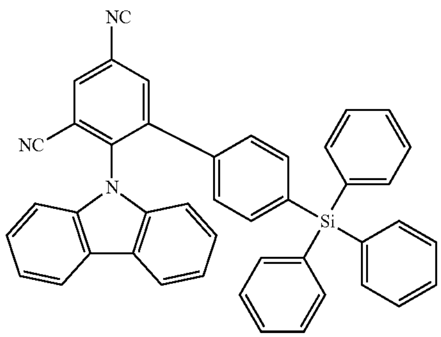
576
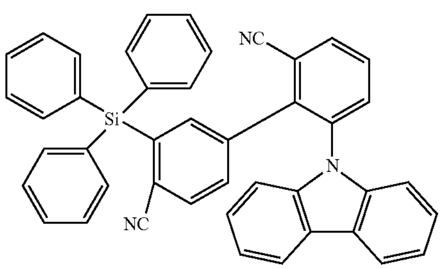
577
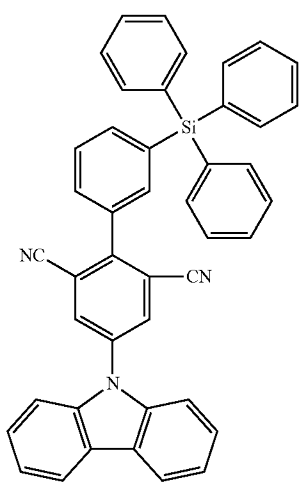
-continued
578
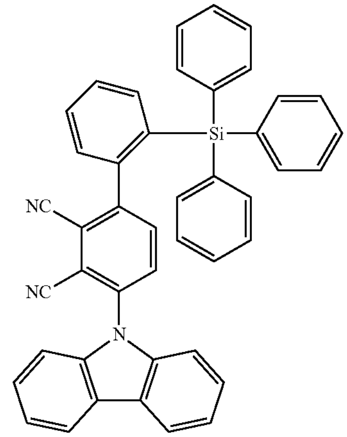
579
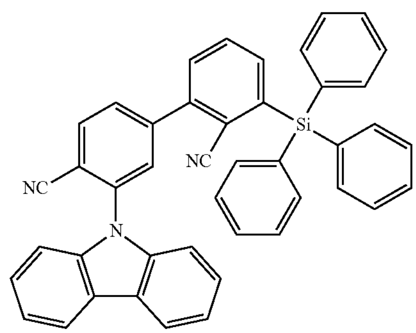
580
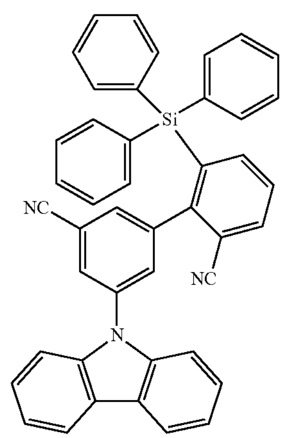

-continued
581
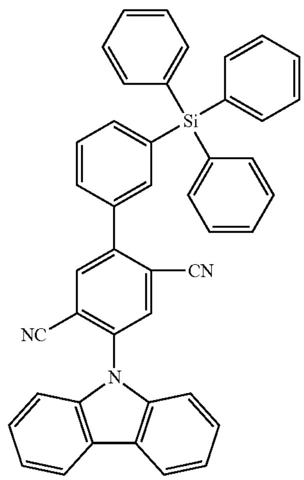
582
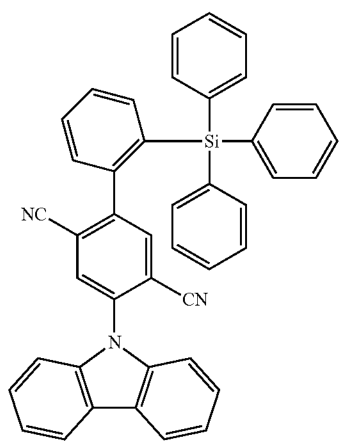
583
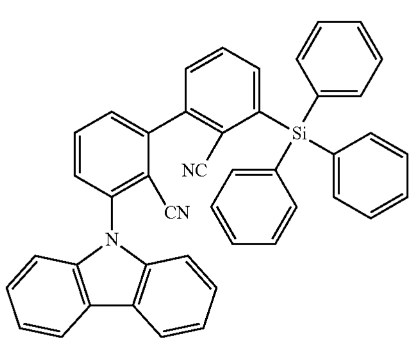
-continued
584
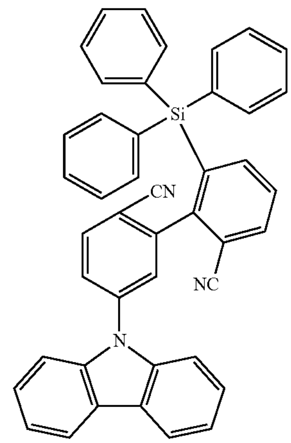
585
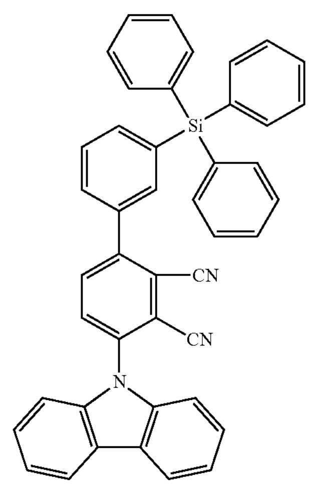
586
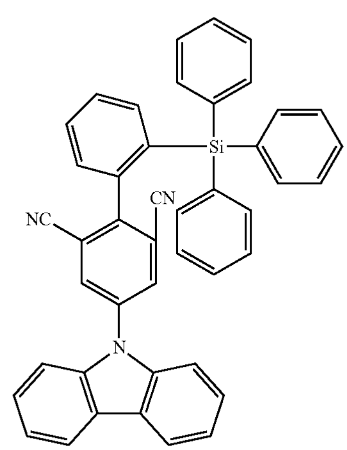

-continued
587
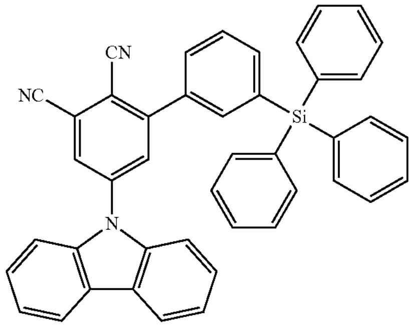
588
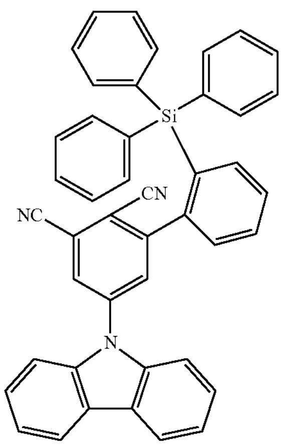
589
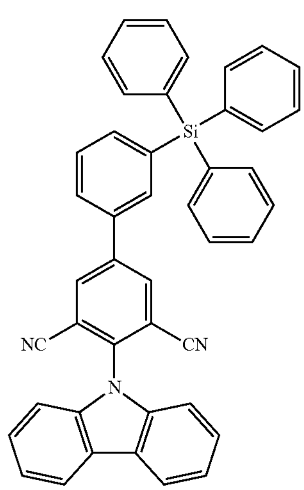
-continued
590
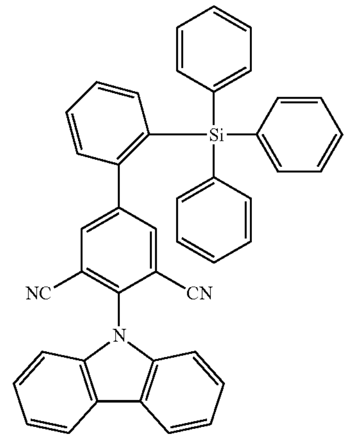
591
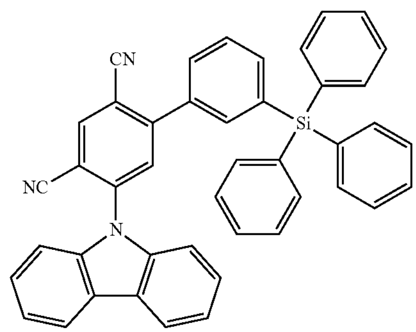
592
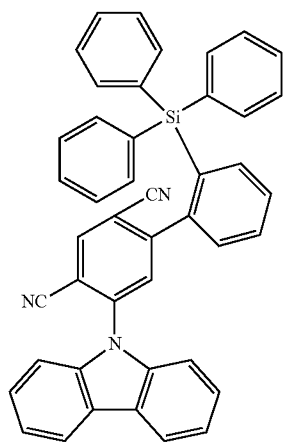
593
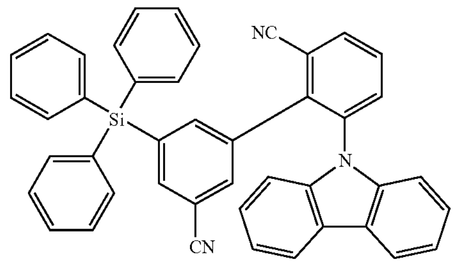

-continued
594
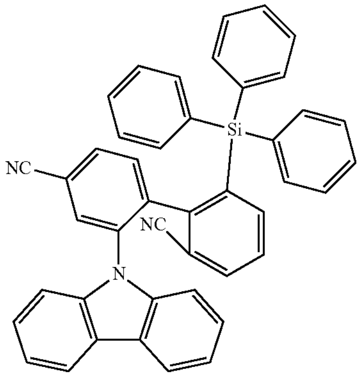
595
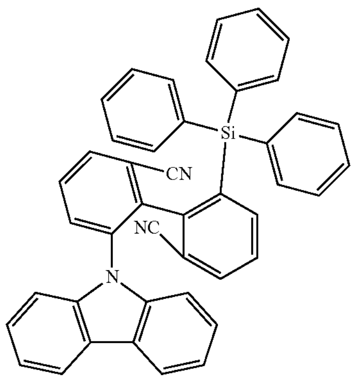
596
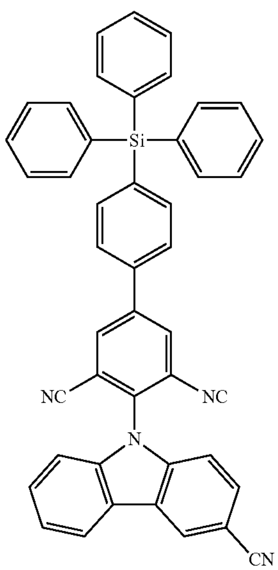
597
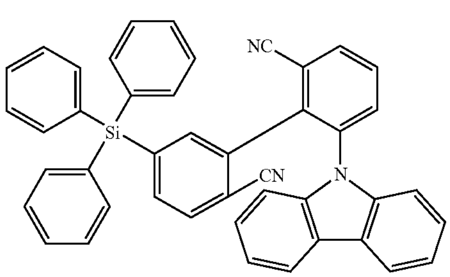
-continued
598
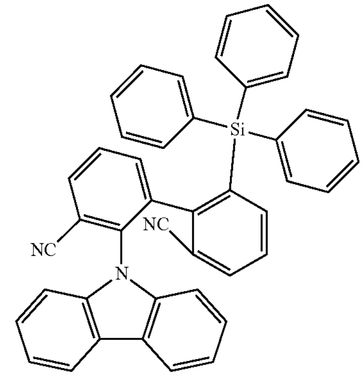
599
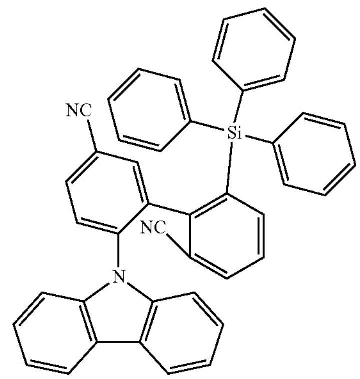
600
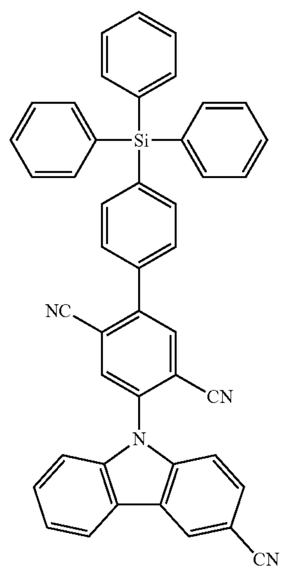
601
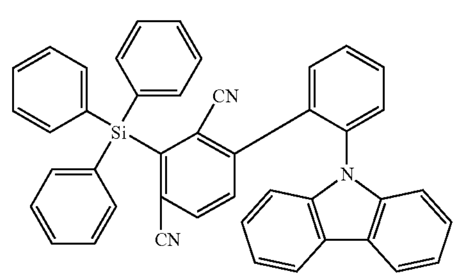

602
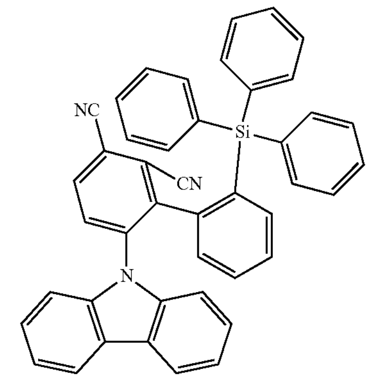
603
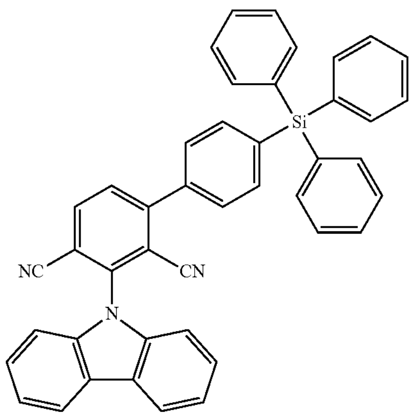
604
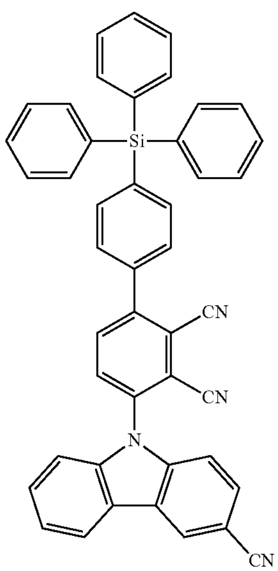
605
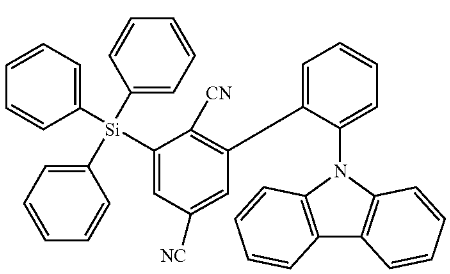
606
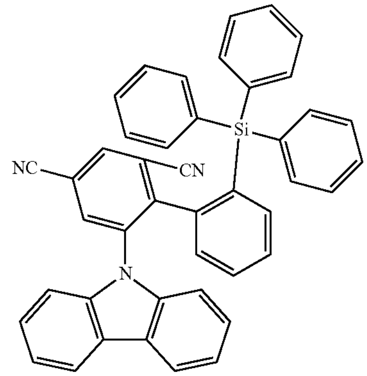
607
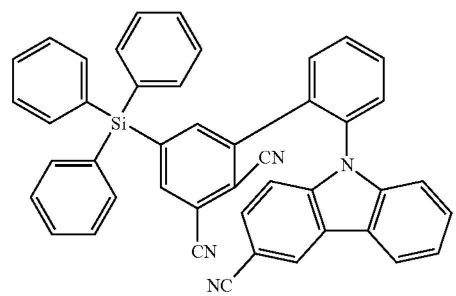
608
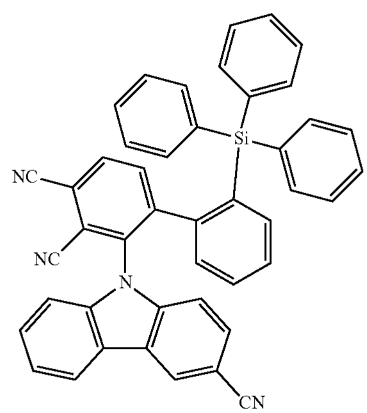
609
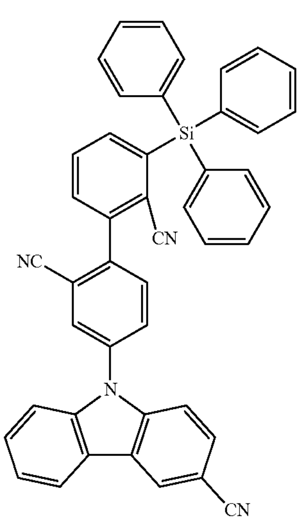

-continued
610
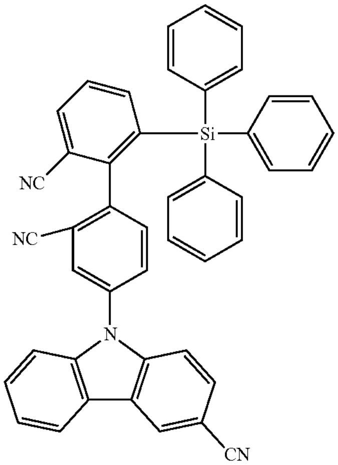
611
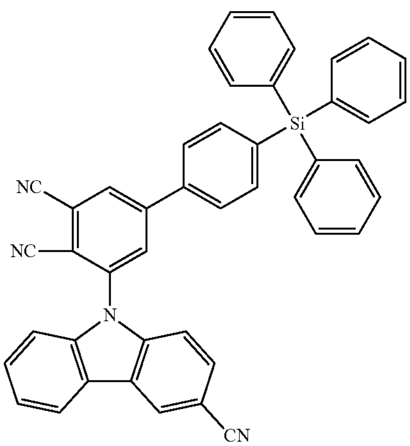
612
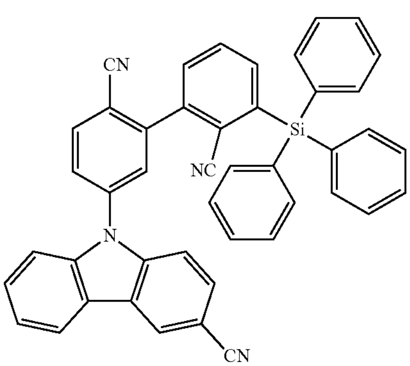
-continued
613
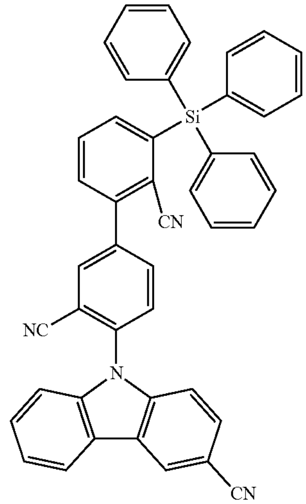
614
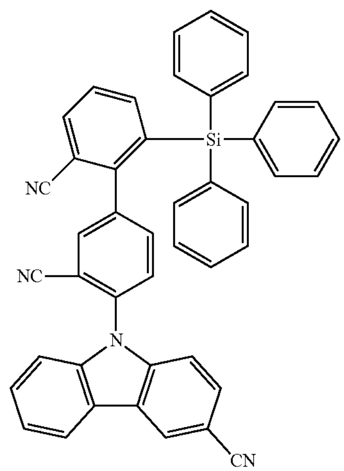
615
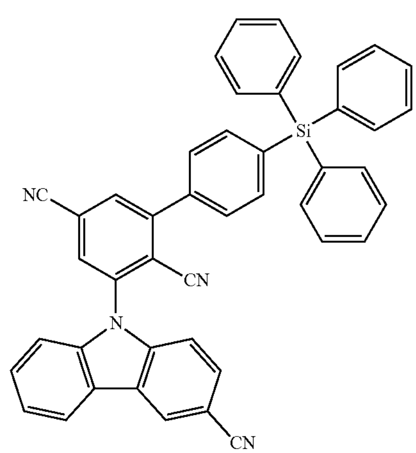

-continued
616
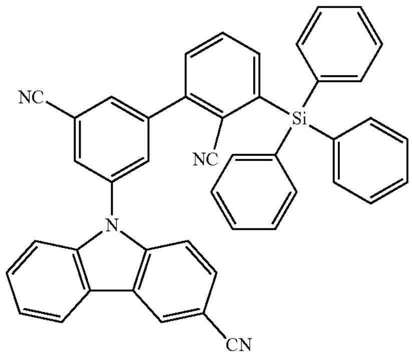
617
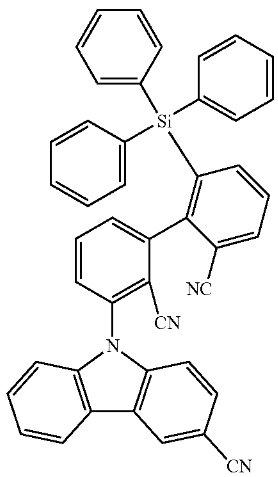
618
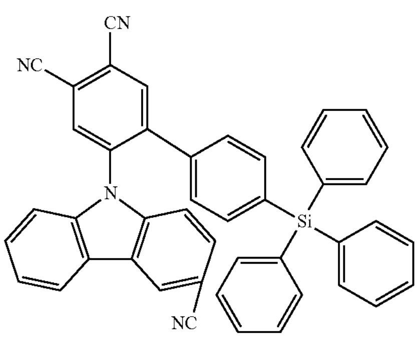
619
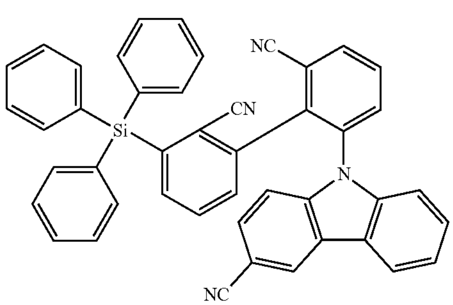
-continued
620
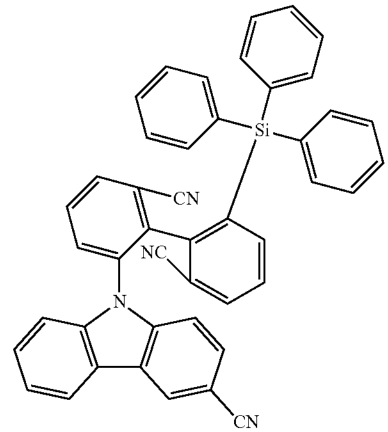
621
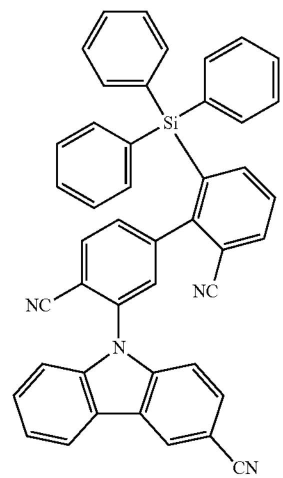
622
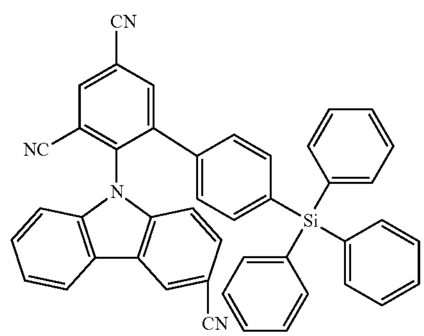
623
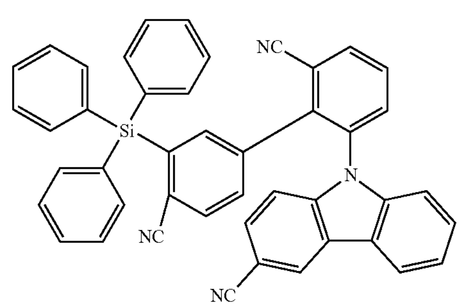

-continued
624
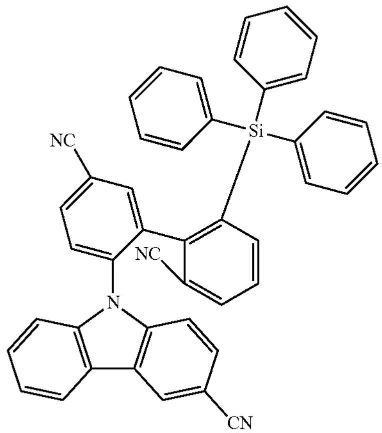
625
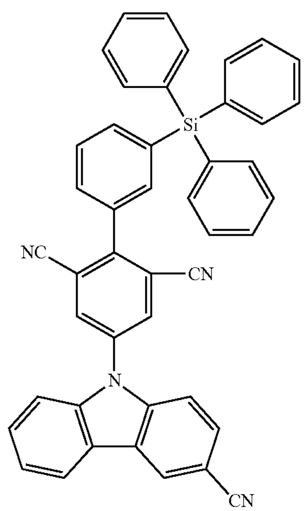
626
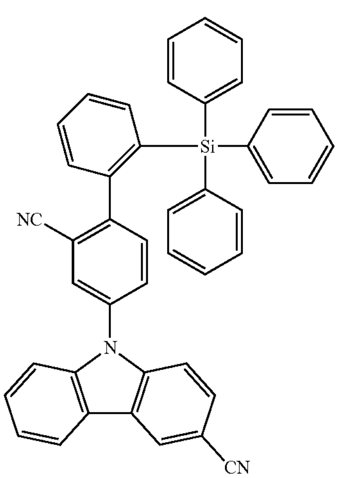
-continued
627
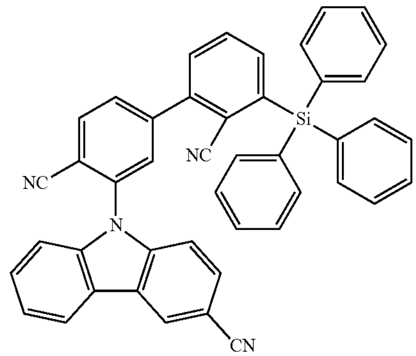
628
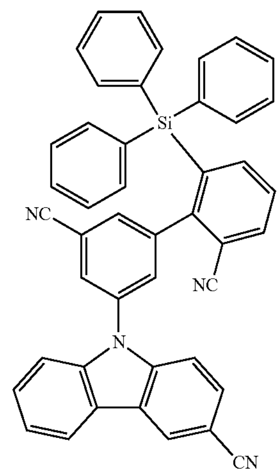
629
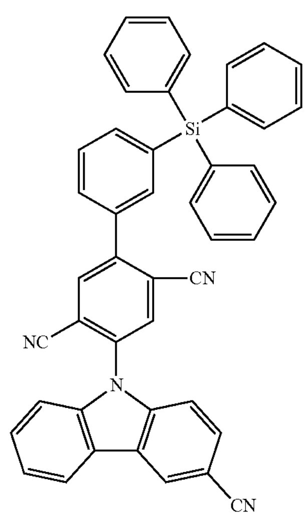

-continued
630
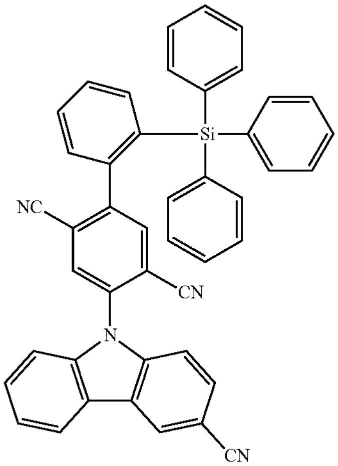
631
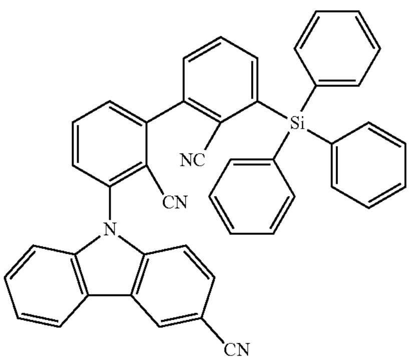
632
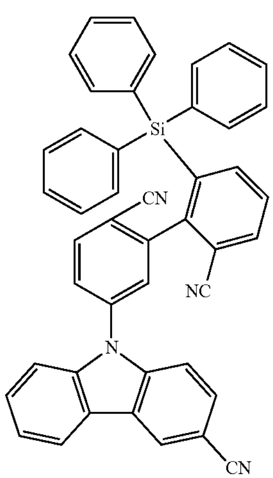
-continued
633
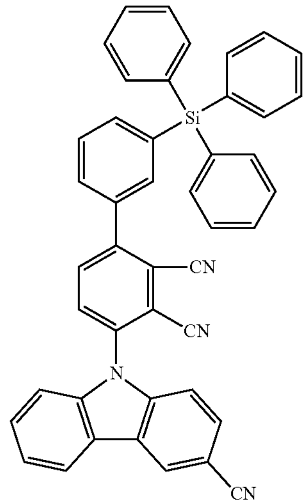
634
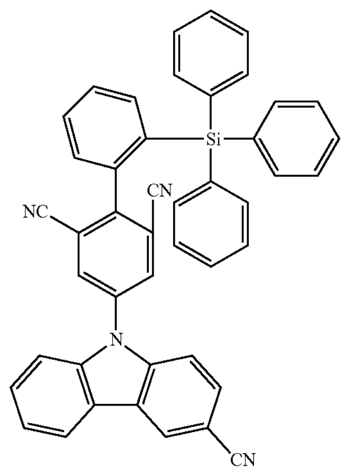
635
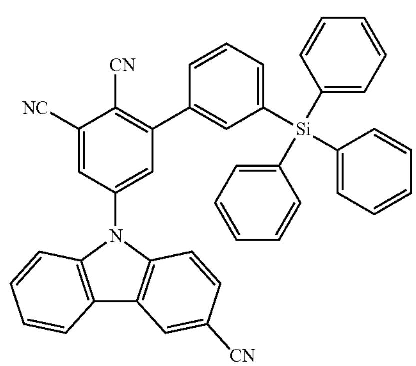

-continued
636
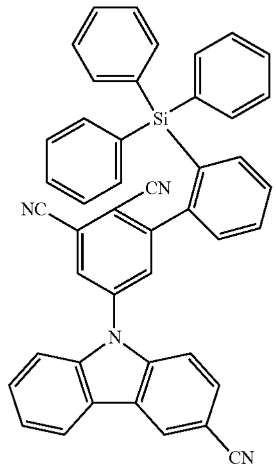
637
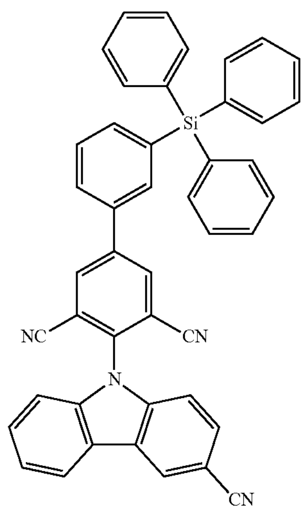
638
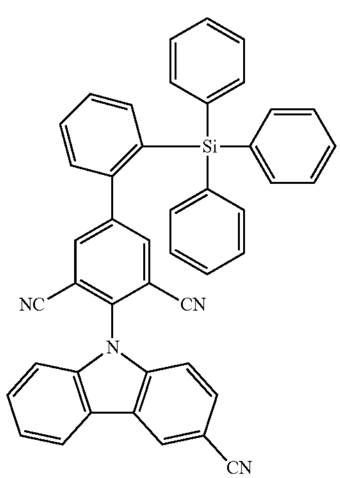
-continued
639
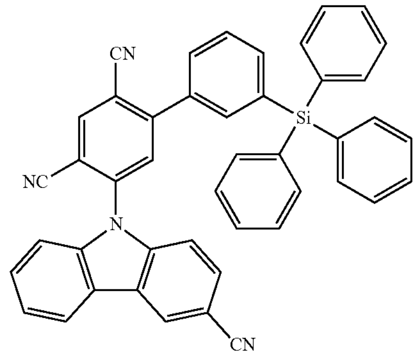
640
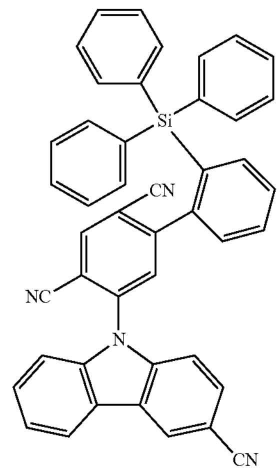
641
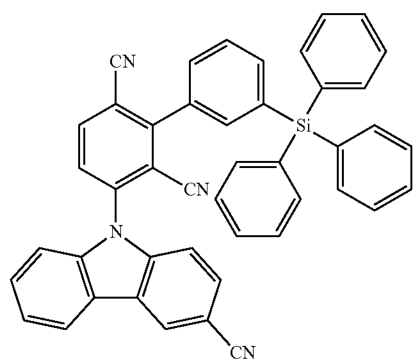
642
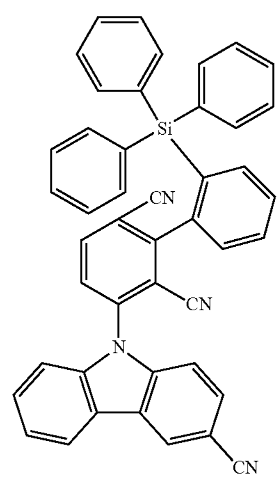

643
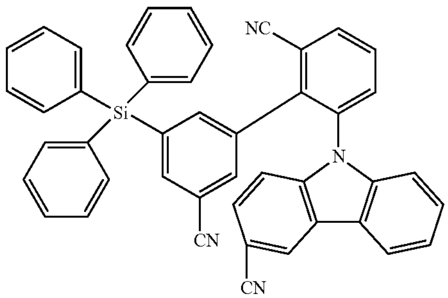
644
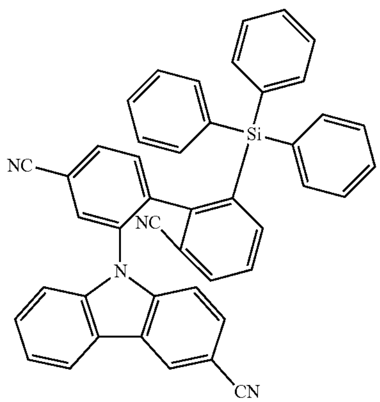
645
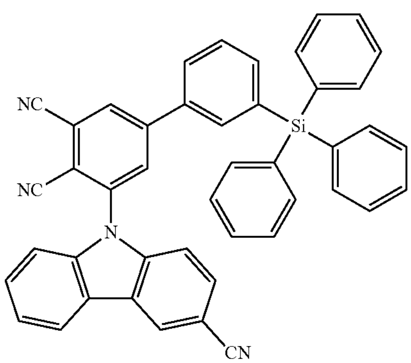
646
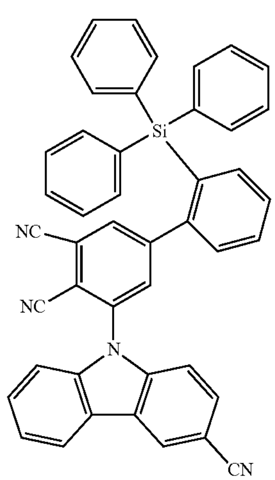
647
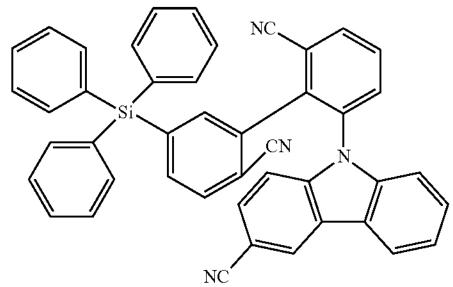
648
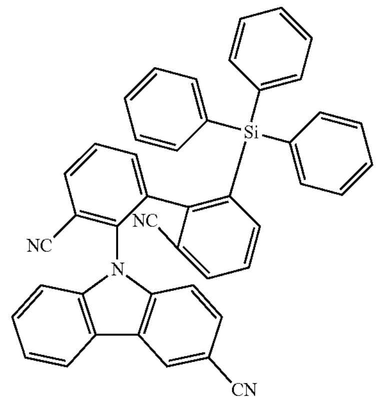
649
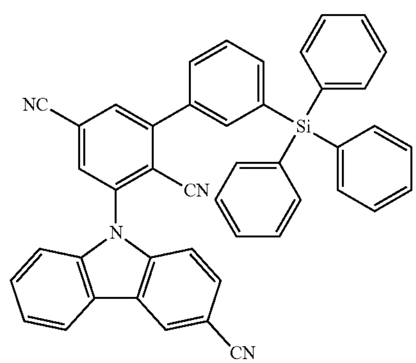
650
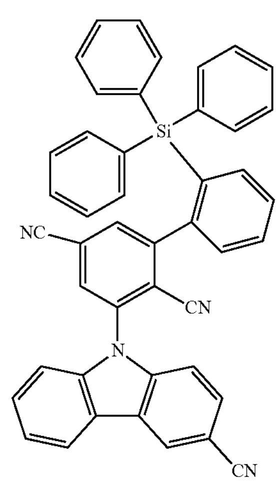

-continued
651
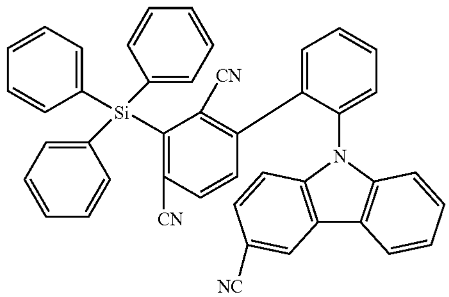
652
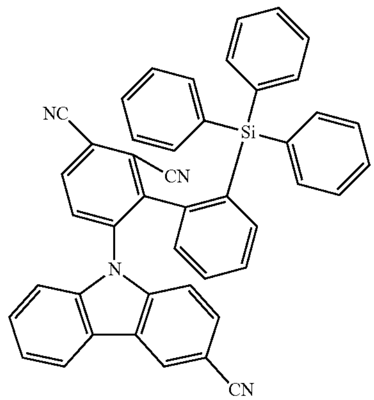
653
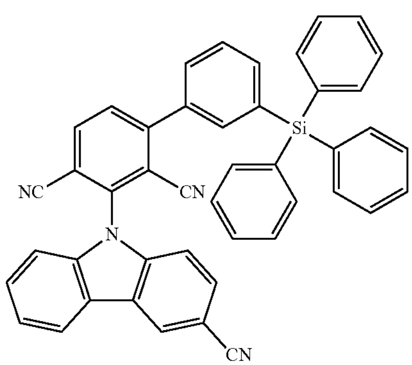
654
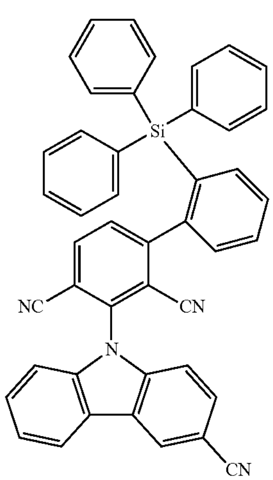
-continued
655
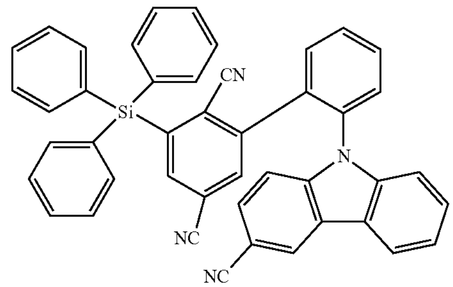
656
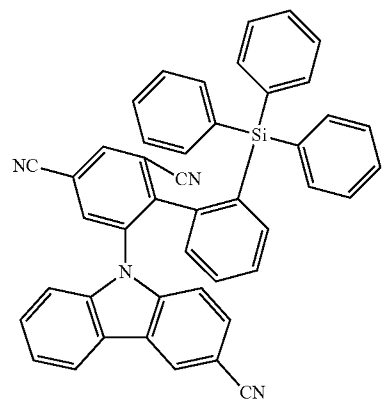
657
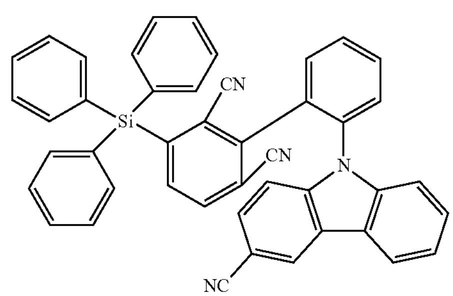
658
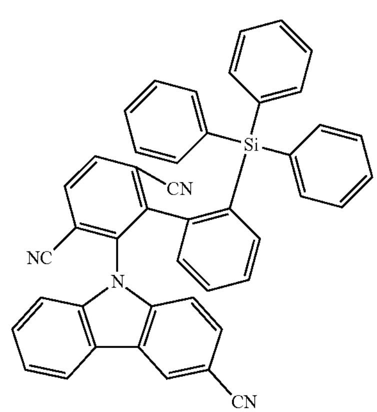

-continued
659
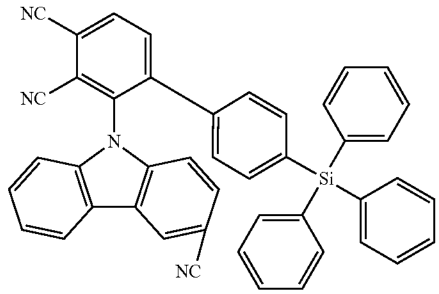
660
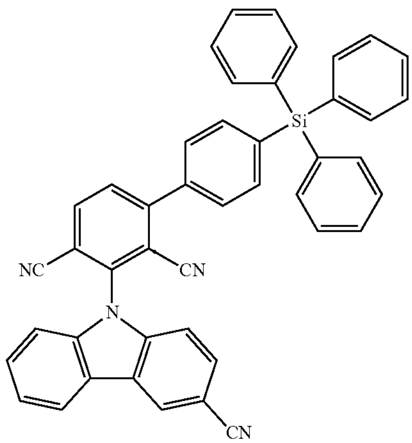
661
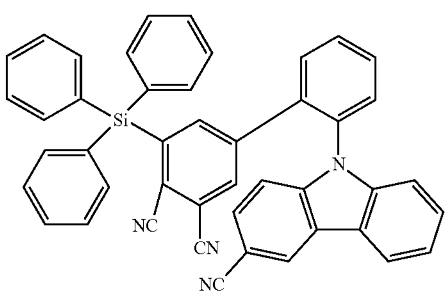
662
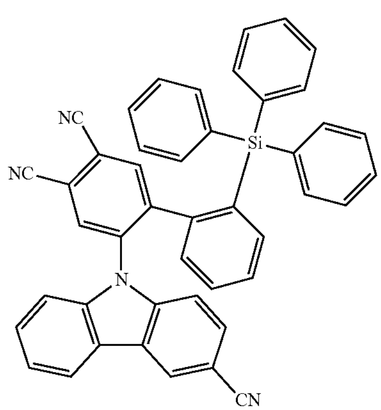
-continued
663
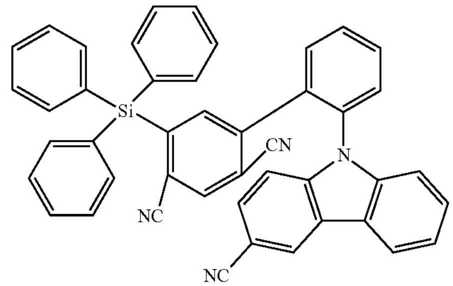
664
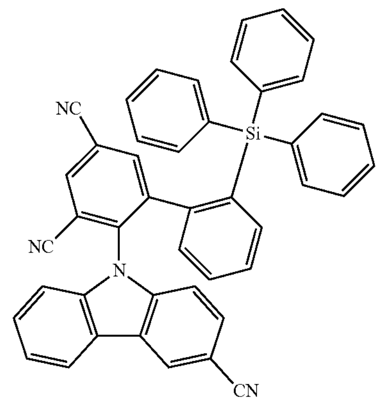
665
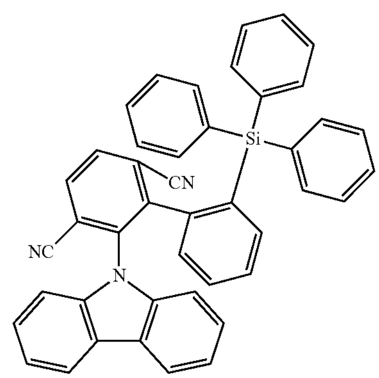
666
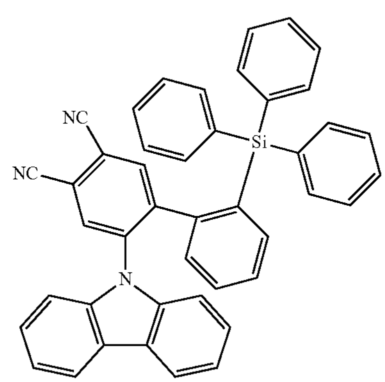

-continued

667

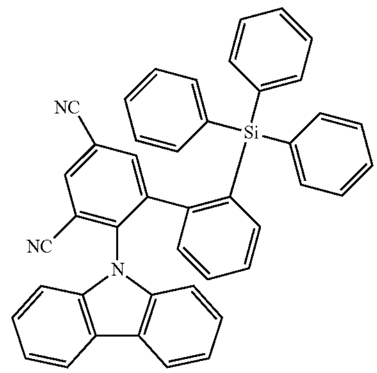

668

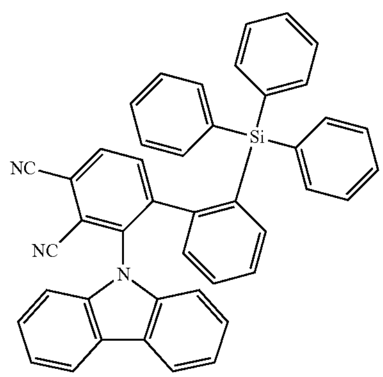

669

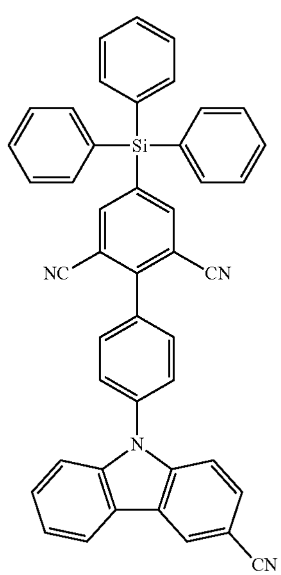

-continued

670

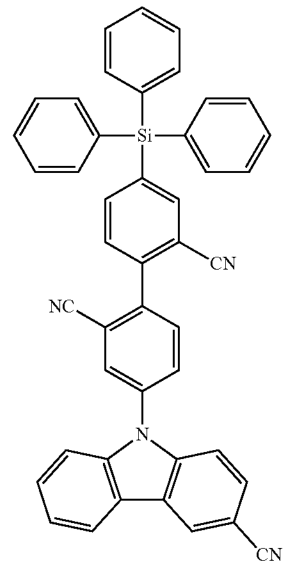

671

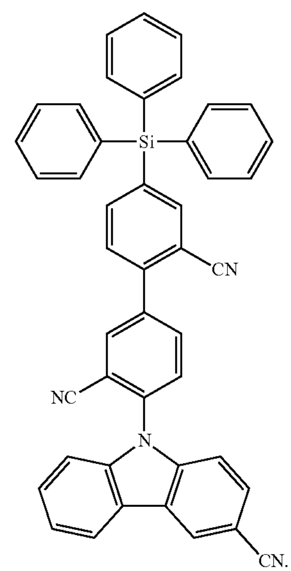

15. An organic light-emitting device comprising:

a first electrode;

a second electrode; and an organic layer disposed between the first electrode and the second electrode, wherein the organic layer comprises an emission layer and at least one condensed cyclic compound represented by Formula 1 of claim 1.

16. The organic light-emitting device of claim 15, wherein the first electrode is an anode, and the second electrode is a cathode, the organic layer comprises a hole transport region between the first electrode and the emission layer and an electron transport region between the emission layer and the second electrode, wherein the hole transport region comprises at least one selected from a hole injection layer, a hole transport layer, and an electron blocking layer, and wherein the electron transport region comprises at least one selected from a hole blocking layer, an electron transport layer, and an electron injection layer.

17. The organic light-emitting device of claim 15, wherein the emission layer comprises the condensed cyclic compound represented by Formula 1.

18. The organic light-emitting device of claim 17, wherein the emission layer further comprises a dopant, and wherein the dopant comprises a phosphorescent dopant.

19. The organic light-emitting device of claim 16, wherein the hole transport region comprises the condensed cyclic compound represented by Formula 1.

20. The organic light-emitting device of claim 16, wherein the electron transport region comprises the condensed cyclic compound represented by Formula 1.

* * * * *